US009166073B2

(12) United States Patent
Sato et al.

(10) Patent No.: US 9,166,073 B2
(45) Date of Patent: Oct. 20, 2015

(54) METHOD FOR PRODUCING CONJUGATED POLYMER, CONJUGATED POLYMER, PHOTOELECTRIC CONVERSION ELEMENT, SOLAR CELL, AND SOLAR CELL MODULE

(71) Applicant: MITSUBISHI CHEMICAL CORPORATION, Chiyoda-ku (JP)

(72) Inventors: Wataru Sato, Kanagawa (JP); Rieko Fujita, Kanagawa (JP); Jyunya Kawai, Kanagawa (JP); Kenichi Satake, Kanagawa (JP); Mitsunori Furuya, Kanagawa (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 14/268,315

(22) Filed: May 2, 2014

(65) Prior Publication Data

US 2014/0243488 A1    Aug. 28, 2014

Related U.S. Application Data

(63) Continuation of application No. PCT/JP2012/078542, filed on Nov. 2, 2012.

(30) Foreign Application Priority Data

Nov. 2, 2011  (JP) .................................. 2011-241499
Nov. 29, 2011 (JP) .................................. 2011-260973

(51) Int. Cl.
C08G 75/00    (2006.01)
H01L 31/0216  (2014.01)
(Continued)

(52) U.S. Cl.
CPC ........ *H01L 31/02167* (2013.01); *C08G 61/123* (2013.01); *C08G 61/124* (2013.01);
(Continued)

(58) Field of Classification Search
CPC .. C08G 61/123; C08G 61/124; C08G 61/126; H01L 51/36; H01L 51/43; H01L 51/42; H01L 51/53
USPC ......................................................... 136/261
See application file for complete search history.

(56) References Cited

U.S. PATENT DOCUMENTS

2008/0207851 A1   8/2008  Schulte et al.
2008/0233429 A1   9/2008  Oguma et al.
2008/0274303 A1  11/2008  Agata et al.

FOREIGN PATENT DOCUMENTS

JP   2003-226743   8/2003
JP   2006-344719  12/2006
(Continued)

OTHER PUBLICATIONS

International Search Report issued Jan. 15, 2013 in PCT/JP2012/078542 filed Nov. 2, 2012.
(Continued)

Primary Examiner — Shane Fang
(74) Attorney, Agent, or Firm — Oblon, McClelland, Maier & Neustadt, L.L.P.

(57) ABSTRACT

The invention addresses a problem of obtaining a conjugated polymer having a higher molecular weight through coupling reaction of monomers using a transition metal catalyst. The invention relates to a method for producing a conjugated polymer, which comprises polymerizing one or more monomers through a coupling reaction, wherein the coupling reaction of the monomer is carried out by using one or more kinds of homogeneous transition metal complex catalysts and one or more kinds of heterogeneous transition metal complex catalysts in combination.

7 Claims, 2 Drawing Sheets

(51) Int. Cl.
*C08G 61/12* (2006.01)
*H01L 51/00* (2006.01)
*H01L 51/42* (2006.01)

(52) U.S. Cl.
CPC .......... *C08G61/126* (2013.01); *H01L 51/0036* (2013.01); *H01L 51/0043* (2013.01); *C08G 2261/1412* (2013.01); *C08G 2261/3241* (2013.01); *C08G 2261/3243* (2013.01); *C08G 2261/3246* (2013.01); *C08G 2261/344* (2013.01); *C08G 2261/411* (2013.01); *C08G 2261/91* (2013.01); *H01L 51/0053* (2013.01); *H01L 51/0094* (2013.01); *H01L 51/42* (2013.01); *Y02E 10/549* (2013.01)

(56) References Cited

FOREIGN PATENT DOCUMENTS

| JP | 2008-525603 | 7/2008 |
|----|-------------|--------|
| JP | 2010-147487 | 7/2010 |
| JP | 2010-150418 | 7/2010 |
| JP | 2011-99010 | 5/2011 |
| WO | WO 2011/051292 A1 | 5/2011 |
| WO | 2011/063534 | 6/2011 |

OTHER PUBLICATIONS

Bridget Carsten, et al., "Stille Polycondensation for Synthesis of Functional Materials", Chem. Rev. 2011, 111, 1493-1528.

Yong Zhang, et al., "Conjugated polymers based on C, Si and No-bridged dithiophene and thienopyrroledione units . . . ", J. Mater. Chem., 2011, 21, 3895-3902.

Chad M. Amb, et al., "Dithienogermole as a Fused Electron Donor in Bulk Heterojunction Solar Cells", J. Am. Chem. Soc. 2011, 133, 10062-10065.

Ta-Ya Chu, et al., "Bulk Heterojunction Solar Cells Using Thieno[3,4-c]pyrrole-4, 6-dione and Dithieno[3,2-b:2',3'-d]silole Copolymer with a Power Conversion efficiency of 7.3%", J. Am. Chem. Soc. 2011, 133, 4250-4253.

Extended European Search Report issued Oct. 7, 2014 in Patent Application No. 12845530.0.

Lunxiang Yin et al., "Carbon-Carbon Coupling Reactions Catalyzed by Heterogeneous Palladium Catalysts", Chemical Reviews, vol. 107, No. 1. XP-002722113, Jan. 10, 2007, pp. 133-173.

Light

METHOD FOR PRODUCING CONJUGATED POLYMER, CONJUGATED POLYMER, PHOTOELECTRIC CONVERSION ELEMENT, SOLAR CELL, AND SOLAR CELL MODULE

TECHNICAL FIELD

The present invention relates to a method for producing a conjugated polymer, a conjugated polymer, a photoelectric conversion element, a solar cell, and a solar cell module.

BACKGROUND ART

As semiconductor materials for devices such as organic EL devices, organic thin film transistors, organic light-emitting sensors and the like, conjugated polymers are used, and above all, attention is focused on application thereof to polymer organic solar cells.

As a method for producing a conjugated polymer, there is known a method of coupling monomers by the use of a transition metal complex catalyst.

For example, there has been disclosed a method of obtaining a copolymer having an imidothiophene skeleton and a dithienocyclopentadiene skeleton according to a Stille coupling process that uses a homogeneous transition metal complex catalyst of tetrakis(triphenylphosphine)palladium(0) or tetrakis(triorthotolylphosphine)palladium(0) (PTL 1, NPL 1, NPL 2, NPL 3).

There has also been disclosed a method of obtaining a copolymer having a fluorene skeleton and a benzidine skeleton according to a Suzuki coupling process that uses a homogeneous transition metal complex catalyst of tetrakis(triorthotolylphosphine)palladium(0) or bis(1,5-cyclooctadiene)nickel(0) (PTL 2, PTL 3).

Further, there has been described a capability of employing a heterogeneous transition metal complex catalyst as a catalyst for use in a method of producing a conjugated polymer (PTL 2).

CITATION LIST

Patent Literature

PTL 1: WO2011/063534
PTL 2: JP-T 2008-525603
PTL 3: JP-A 2010-147487

Non-Patent Literature

NPL 1: Journal of the American Chemical Society (2011), 133 (12), 4250-4253.
NPL 2: Journal of the American Chemical Society (2011), 133 (26), 10062-10065.
NPL 3: Journal of Materials Chemistry (2011), 21 (11), 3895-3902.
NPL 4: Chem. Rev., 2011, 111, 1493-1528.

SUMMARY OF INVENTION

Technical Problem

For developing a higher-performance device, it is desired to obtain a conjugated polymer having a larger molecular weight. However, according to the above-mentioned prior art technology, no one knows a method of obtaining a conjugated polymer having a sufficiently large molecular weight through coupling reaction of monomers, especially monomers that are thermally and/or chemically unstable by the use of a transition metal complex catalyst.

An object of the present invention is to obtain a conjugated monomer having a larger molecular weight through coupling reaction of monomers using a transition metal complex catalyst.

Solution to Problem

For solving the above-mentioned problems, the present inventors have assiduously studied and, as a result, have found that, when monomers are polymerized through coupling reaction using one or more kinds of homogeneous transition metal complex catalysts and one or more kinds of heterogeneous transition metal complex catalysts in combination, then a conjugated monomer having a larger molecular weight can be obtained, and have completed the present invention.

Specifically, the gist of the invention is as follows:
1. A method for producing a conjugated polymer, which comprises polymerizing one or more monomers through a coupling reaction, wherein the coupling reaction of the monomer is carried out by using one or more kinds of homogeneous transition metal complex catalysts and one or more kinds of heterogeneous transition metal complex catalysts in combination.
2. The method for producing a conjugated polymer according to the item 1 above, wherein the coupling reaction is carried out in the coexistence of the one or more kinds of homogeneous transition metal complex catalysts and the one or more kinds of heterogeneous transition metal complex catalysts.
3. The method for producing a conjugated polymer according to the item 1 or 2 above, wherein the heterogeneous transition metal complex catalyst includes a transition metal complex supported by a carrier.
4. The method for producing a conjugated polymer according to any one of the items 1 to 3, wherein each transition metal that constitutes the homogeneous transition metal complex catalyst and the heterogeneous transition metal complex catalyst is a late transition metal.
5. The method for producing a conjugated polymer according to any one of the items 1 to 4 above, wherein the monomer is a conjugated compound or an aromatic compound.
6. The method for producing a conjugated polymer according to the item 5 above, wherein the aromatic compound includes a condensed aromatic compound.
7. The method for producing a conjugated polymer compound according to the item 5 or 6 above, wherein the aromatic compound is an aromatic compound (Ar(n)) having n (n is an integer of 2 or more and 4 or less) active groups and satisfying the following requirement:

Requirement: When 5 ml of a hexane solution containing 1.0 g of the aromatic compound (Ar(n)) is charged in a column (having an inner diameter of 15 mm and a length of 5 cm, and charged with 50 mL of a hexane solution containing 20 g of silica gel (spherical, neutral (pH 7.0±0.5), and having a particle size of from 63 to 210 μm) and 2 g of anhydrous potassium carbonate), and developed with a developing solvent of hexane (at a flow rate of 50 ml/min), the total proportion of the aromatic compound in which the number of the active groups is smaller than n, in the solution having passed through the column in 3 minutes at room temperature is 5 mol % or more relative to the aromatic compound (Ar(n)) before charged in the column.

8. The method for producing a conjugated polymer according to the item 7 above, wherein the active group is a group having an atom selected from Li, Mg, Zn, B and Group 14 elements of the Periodic Table.

9. The method for producing a conjugated polymer according to the item 7 or 8 above, wherein the aromatic compound (Ar(n)) contains an aromatic hetero ring and the active group bonds to the aromatic hetero ring.

10. The method for producing a conjugated polymer according to any one of the items 7 to 9 above, wherein the (Ar(n)) is an aromatic compound represented by the following general formula (A4) or (A4'):

[Chem. 1]

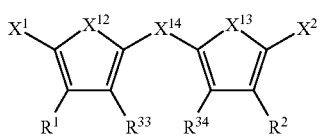
(A4)

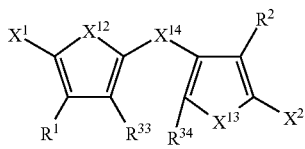
(A4')

(In the formula (A4) and the formula (A4'), $R^1$ and $R^2$ each independently represent a hydrogen atom, a halogen atom, an alkyl group optionally having a substituent, an alkenyl group optionally having a substituent, an alkynyl group optionally having a substituent or an aromatic group optionally having a substituent, or $R^1$ and $R^{33}$, or $R^2$ and $R^{34}$ may bond to each other to from a ring, $R^{33}$ and $R^{34}$ each independently represent a hydrogen atom, a halogen atom, or an organic group having an atom selected from Group 14 elements of the Periodic Table, or may bond to each other to form a ring, $X^1$ and $X^2$ each independently represent an active group, $X^{12}$ and $X^{13}$ each independently represent an atom selected from Group 16 elements, $X^{14}$ represents a group that links the two conjugated systems of five-membered rings bonding thereto, or a direct bond, and $R^{33}$ and $R^{34}$ may bond to each other to form a ring.)

11. The method for producing a conjugated polymer according to the item 10 above, wherein the compound represented by the general formula (A4) or (A4') is a compound represented by the following general formula (A6) or (A6'):

[Chem. 2]

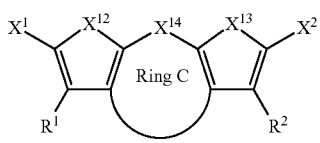
(A6)

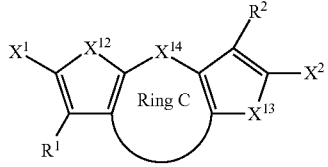
(A6')

(In the formulae (A6) and (A6'), $R^1$, $R^2$, $X^1$, $X^2$, $X^{12}$, $X^{13}$ and $X^{14}$ have the same meanings as those in the formula (A4), and the Ring C represents a ring optionally having a substituent.)

12. The method for producing a conjugated polymer according to the item 11 above, wherein the Ring C is a 5-membered or 6-membered single ring, or a condensed ring of from 2 to 6 such rings.

13. The method for producing a conjugated polymer according to any one of the items 10 to 12 above, wherein the monomer further includes an aromatic compound selected from the group consisting of compounds represented by the following formulae (A11), (A12), (A13) and (A17):

[Chem. 3]

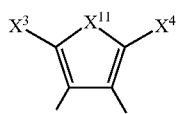
(A11)

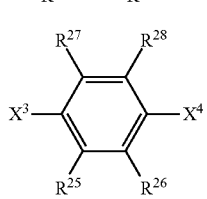
(A12)

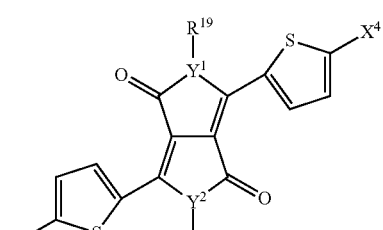
(A13)

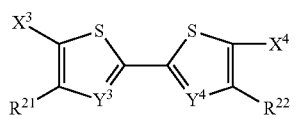
(A17)

In the formula (A11), the formula (A12), the formula (A13) or the formula (A17), $X^3$ and $X^4$ each represent a halogen atom, an alkylsulfonyloxy group, or an arylsulfonyloxy group, in the formula (A11), $R^{31}$ and $R^{32}$ each represent a hydrogen atom, a hydrocarbon group having from 1 to 20 carbon atoms and optionally having a substituent, an aromatic heterocyclic group having from 2 to 20 carbon atoms and optionally having a substituent, an acyl group optionally having a substituent, an alkoxy group optionally having a substituent, or an aryloxy group optionally having a substituent, in the formula (A12), $R^{25}$ and $R^{26}$ each represent a hydrogen atom, a halogen atom, a hydrocarbon group having from 1 to 20 carbon atoms and optionally having a substituent, an aromatic heterocyclic group having from 2 to 20 carbon atoms and optionally having a substituent, or an acyl group optionally having a substituent, $R^{27}$ and $R^{28}$ each represent a hydrogen atom, a halogen atom, a hydrocarbon group having from 1 to 20 carbon atoms and optionally having a substituent, or an aromatic heterocyclic group having from 2 to 20 carbon atoms and optionally having a substituent, in the formula (A13), $Y^1$ and $Y^2$ each independently represent an atom selected from Group 15 elements of the Periodic Table, $R^{19}$ and $R^{20}$ each represent a hydrogen atom, a halogen atom, or a hydrocarbon group having from 1 to 20 carbon atoms and optionally having a substituent, in the formula (A17), $Y^3$ and $Y^4$ each independently represent a nitrogen atom, or a carbon atom having one substituent ($C(R^{43})$), $R^{43}$ represents a hydrogen atom, a halogen atom, a hydrocarbon group having from 1 to 20 carbon atoms and optionally having a substituent, or an aromatic heterocyclic group having from 2 to 20 carbon atoms and optionally having a substituent, $R^{21}$ and $R^{22}$ each represent a hydrogen atom, a halogen atom, a hydrocarbon group having from 1 to 20 carbon atoms and optionally having a substituent, or an aromatic heterocyclic group having from 2 to 20 carbon atoms and optionally having a substituent.

14. A photoelectric conversion element that comprises the conjugated polymer obtained by the production method according to the items 1 to 13 above.

15. A solar cell that comprises the photoelectric conversion element obtained according to the item 14 above.

16. A solar cell module that comprises the solar cell obtained according to the item 15 above.

Advantageous Effects of Invention

A conjugated polymer having a larger molecular weight can be obtained through coupling reaction of monomers using homogenous and heterogeneous transition metal catalysts in combination. Also, since by using the conjugated polymer having a larger molecular weight, a photoelectric conversion element having an excellent photoelectric conversion efficiency can be obtained, it is preferable for use of the solar cell and the solar cell module to use the conjugated polymer.

DESCRIPTION OF EMBODIMENTS

Figure 1:
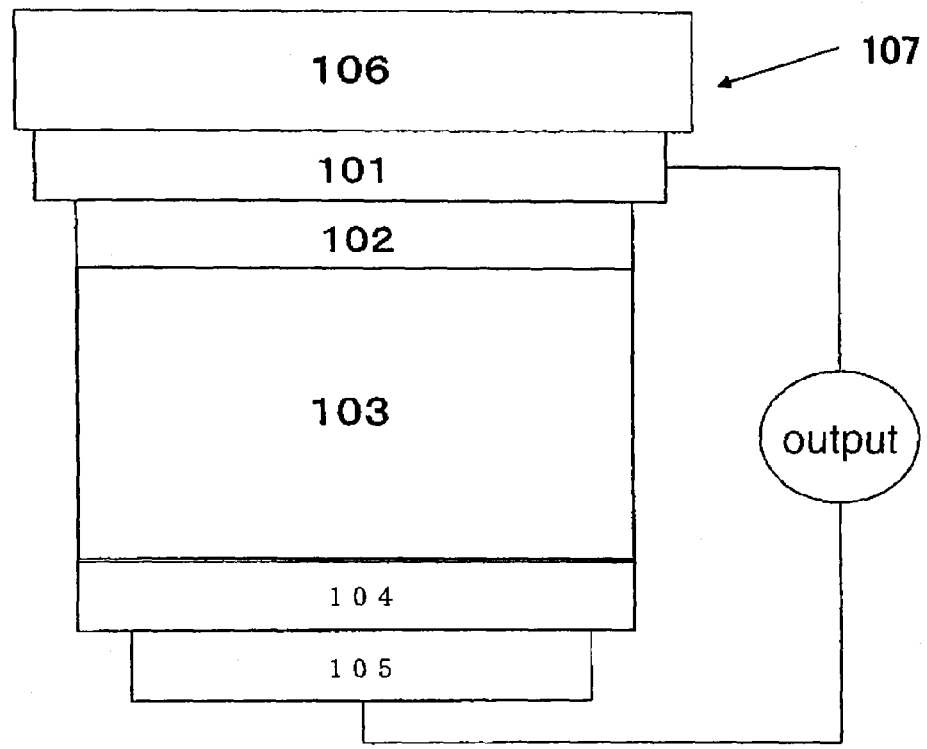
FIG. 1 This is a cross-sectional view schematically showing the constitution of a photoelectric conversion element as one embodiment of the invention.

Embodiments of the invention are described in detail hereinunder. The following description is for some typical examples of embodiments of the invention, and the invention is not limited to the contents, so far as not to overstep the scope and the spirit thereof.

The production method for a conjugated polymer of the invention is a method for producing a conjugated polymer that includes a step of polymerizing one or more monomers through coupling reaction, wherein the coupling reaction of monomer is carried out by the use of one or more kinds of homogeneous transition metal complex catalysts and one or more kinds of heterogeneous transition metal complex catalysts in combination.

Heretofore, as a catalyst in coupling reaction, generally used is a homogeneous transition metal complex catalyst alone or a heterogeneous transition metal complex catalyst alone. The advantage in using a homogeneous transition metal complex catalyst is first that since the catalyst is kept dissolved in a solution, the frequency of contact thereof with a monomer is high and the reactivity thereof is generally high. In addition, since the ligand can be freely selected in accordance with the reactivity thereof, the catalyst of the type is advantageous in planning catalyst compounds. On the other hand, however, the transition metal complex catalyst has a problem in that it is difficult to recover from the solution thereof.

However, use of a homogeneous transition metal complex catalyst and a heterogeneous transition metal complex catalyst in combination, especially coexistence of a homogeneous transition metal complex catalyst and a heterogeneous transition metal complex catalyst in the reaction system could increase the reaction speed of producing a conjugated polymer through coupling reaction and enhances the reproducibility of the production, therefore providing a conjugated polymer having a large weight-average molecular weight. In particular, the method is effective for monomers that are thermally and/or chemically unstable.

The reason why the coupling reaction speed could be increased according to the production method of the invention is not clear. For example, it may be considered that the reaction of producing a conjugated polymer could be promoted owing to the difference in TOF (turnover frequency) and TON (turnover number) between the homogeneous transition metal complex catalyst and the heterogeneous transition metal complex catalyst to be used, and the reaction speed could be thereby increased.

For example, it may be considered that a monomer could be converted into an oligomer within a short period of time by a heterogeneous transition metal complex catalyst having a large TOF, and subsequently the reaction could be promoted by a homogeneous transition metal complex catalyst having a large TON, and as a result, the reactivity of producing a conjugated polymer could be thereby enhanced. A transition metal complex catalyst having a large TOF may be a homogeneous transition metal complex catalyst and a transition metal complex having a large TON may be a heterogeneous transition metal complex catalyst.

<1. Coupling Reaction and Catalyst Therefor>

Examples of the coupling reaction in the invention include (1) oxidative homocoupling reaction, (2) C—H bond activation reaction, (3) cross-coupling reaction, (4) C-hetero atom coupling reaction, etc.

As coupling reaction, there have been developed a number of various reactions, concretely such as Suzuki-Miyaura reaction, Negishi reaction, Stille reaction, Hiyama reaction, Hect reaction, Sonogashira reaction, Buchwald-Hartwig reaction, Fu reaction, Nolan reaction, Guram reaction, Beller reaction, Plenio reaction, Bedford reaction, Najera reaction, etc. (For example, "Metal-Catalyzed Cross-Coupling Reactions" edited by Meijere, Diederich (published by Willey-VCH); "Topics in Current Chemistry" edited by Miyaura, Vol. 219 (published by Springer), "Handbook of Organopalladium Chemistry for Organic Synthesis" edited by Negishi (published by Wiley); "Application of Transition Metal Catalysts in Organic Synthesis" edited by Brandsma et al. (published by Springer), etc.)

In the coupling reaction in the invention, one or more kinds of homogeneous transition metal complex catalysts and one or more kinds of heterogeneous transition metal complex catalysts are used in combination.

In the reaction system, one or more kinds of homogeneous transition metal complex catalysts and one or more kinds of heterogeneous transition metal complex catalysts may be put both at a time, or either one of homogeneous transition metal complex catalysts and heterogeneous transition metal complex catalysts may be first put into the reaction system and thereafter the remaining one may be put thereinto.

However, a homogeneous transition metal complex catalyst and a heterogeneous transition metal complex catalyst may not exist at the same time in the reaction system. Above all, from the viewpoint of increasing the reaction speed and simplifying the reaction operation, it is desirable that the coupling reaction is carried out in the coexistence of one or more kinds of homogeneous transition metal complex catalysts and one or more kinds of heterogeneous transition metal complex catalysts.

In this description, the transition metal complex catalyst means a combination of a transition metal salt and an organic ligand that forms a transition metal complex with the transition metal salt. On the other hand, a transition metal salt not having an organic ligand is not within the scope of the transition metal complex catalyst in the invention.

Examples of the transition metal salt not having an organic ligand include transition metal inorganic salts that are used as a promoter in Stille coupling, such as $Cu_2O$, $CuO$, $CuI$, $CuBr$, $CuCl$, $CuCl_2$, $CuBr_2$, $CuI_2$, etc.; as well as transition metal inorganic salts that are used as a promoter in Sonogashira coupling.

In the coupling reaction in the invention, it is desirable that at least one catalyst is a heterogeneous metal complex catalyst from the viewpoint of rapidly converting the unstable monomer into an oligomer under the coupling reaction condition. After converted into the oligomer, the polymerization reaction speed with a heterogeneous metal catalyst would lower, and therefore it is desirable the reaction of inducing the oligomer into a polymer is carried out in the presence of at least one type of a homogeneous metal catalyst from the viewpoint of obtaining a polymer having a high molecular weight.

For attaining the effect of increasing the reaction speed, it is desirable that one or more kinds of homogeneous transition metal complex catalysts and one or more kinds of heterogeneous transition metal complex catalysts can catalyze the coupling reaction each alone. Here, one example of using one or more kinds of homogeneous transition metal complex catalysts and one or more kinds of heterogeneous transition metal complex catalysts is a case where transition metal complex catalysts each having a different structure are used in combination.

In the case where one or more kinds of homogeneous transition metal complex catalysts and one or more kinds of heterogeneous transition metal complex catalysts are used in combination, each transition metal catalyst active species may be formed through reaction of a transition metal salt and a ligand, and then put into the coupling reaction system, or the transition metal catalyst active species may be formed through reaction of a transition metal salt and a ligand in the reaction system.

Two or more kinds of homogeneous transition metal complex catalysts may be used here, and two or more kinds of heterogeneous transition metal complex catalysts may be used.

Different kinds of homogeneous transition metal complexes include, for example, those that differ in the type of the transition metal, those that differ in the type as well as the number of the ligand, and those that differ in those multiple points. Different kinds of heterogeneous transition metal complexes include, for example, those that differ in the type of the transition metal, those that differ in the type as well as the number of the ligand, those that differ in the type of the carrier, and those that differ in those multiple points.

<1.1 Homogeneous Transition Metal Complex Catalyst>

Homogeneous transition metal complex catalysts usable in the coupling reaction in the invention are described below. For smoothly promoting the coupling reaction, it is desirable that a transition metal catalyst for coupling is used as the homogeneous transition metal complex, and especially it is desirable that a late transition metal is used as the transition metal.

In this description, the late transition metal means an element of Groups 8 to 11 of the Periodic Table. Of the late transition metals, especially preferred is use of homogeneous transition metal complexes containing any of palladium, nickel, iron and copper from the viewpoint of increasing the reactivity. Here, the Periodic Table indicates that in Recommendations of IUPAC 2006.

Palladium is preferred as widely usable in various cross-coupling reactions and having a high reactivity. Nickel is preferred in point of the cost, and can be used in carrying out the cross-coupling reactions in place of palladium.

In case where a Grignard reagent is used as a monomer in carrying out coupling reaction, use of nickel is preferred to use of palladium in point of the reactivity thereof. Combined use of a nickel complex catalyst and a palladium complex catalyst for cross-coupling reaction is also preferred from the viewpoint of attaining high reactivity and from the viewpoint of obtaining a polymer having a large molecular weight.

Iron is preferably used in the coupling reaction that generally uses a Grignard reagent as a monomer. Iron is also preferred as usable in oxidative coupling. Copper is preferred as capable of promoting Ullmann coupling at a lower temperature than usual, by mixing a suitable ligand thereinto.

As the late transition metal, use of ruthenium, rhodium and iridium is also preferred as promoting, for example, the coupling reaction of a boric acid derivative with an aromatic compound at the C—H bond therein.

The organic ligand that the homogeneous transition metal complex catalyst has is one that is formed of a typical element of from Group 13 to Group 16 of the Periodic Table and has a carbon atom. In this description, the Periodic Table indicates that in Recommendations of IUPAC 2006.

The transition metal complex catalyst may partly have a halogen atom and a hydrogen atom. The organic ligand of the type is preferred as improving the function of the transition metal complex catalyst. Specific examples include organic ligands described in J. Hartwig, "Organotransition Metal Chemistry", published by University Science Books (2010) and described in the references cited in the literature; and organic ligands described in "Metal Catalysts for Organic Synthesis" (2011) by Strem. Organic ligands that are favorable for each transition metal may be suitably selected. Selection of organic ligands for transition metals is described in detail hereinunder.

(Palladium Complex)

A palladium complex has palladium(0) as the important catalyst species therein, but in general it is unstable in air and is readily decomposed. On the other hand, palladium(II) is stable and coexisting with a ligand, it is readily converted into palladium(0) and generates an active species in the system. In case where an active palladium(0) complex is formed from a palladium(II) complex and a ligand in the system, it is considered that two kinds of complexes of a palladium(II) complex and a palladium(0) complex are not used but one type of a palladium complex would be used.

Concrete examples of palladium reagents include 0-valent or 2-valent complexes such as $Pd(PPh_3)_4$, $Pd(P(o\text{-tol})_3)_4$, $Pd(P(t\text{-Bu})_3)_4$, $Pd_2(dba)_3$, $Pd_2(dba)_3CHCl_3$, $Pd(dba)_2$, $Pd(MeCN)_4(BF_4)_2$, $PdCl_2$, $PdBr_2$, $Pd(acac)_2$, $Pd(TFA)_2$, $Pd(allyl)Cl_2$, $[Pd(allyl)Cl]_2$, $Pd(PCy_3)_2Cl_2$, $Pd(P(o\text{-tol})_3)_2Cl_2$, $Pd(OAc)_2$, $PdCl_2(dppf)$, $PdCl_2(dppf)CH_2Cl_2$, $Pd(MeCN)_2Cl_2$, $Pd(amPhos)Cl_2$, $PdCl_2(dtbpf)$, $PdCl_2(PPh_3)_2$, etc.

In addition, the following compounds are also mentioned as examples of palladium reagents.

[Chem. 4]

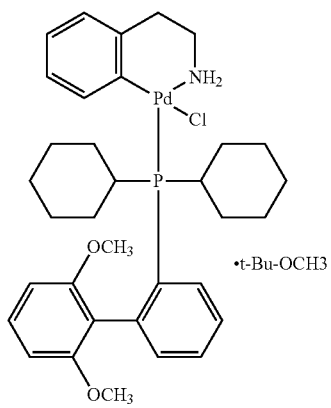

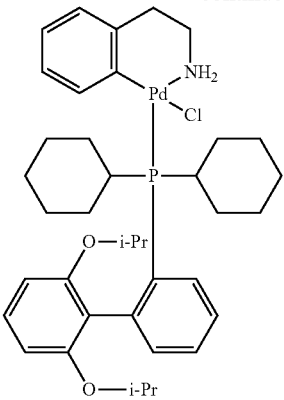

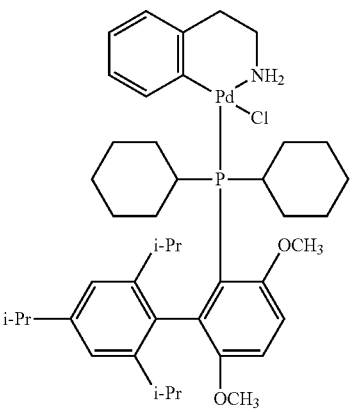

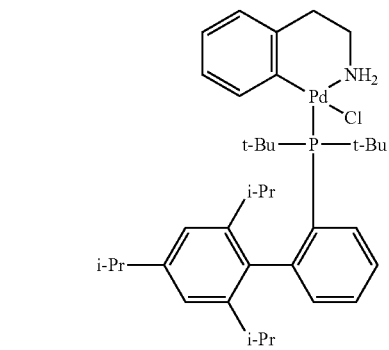

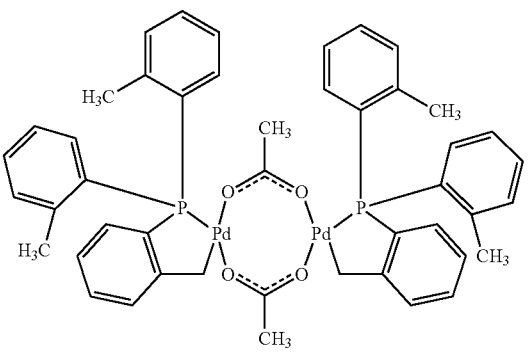

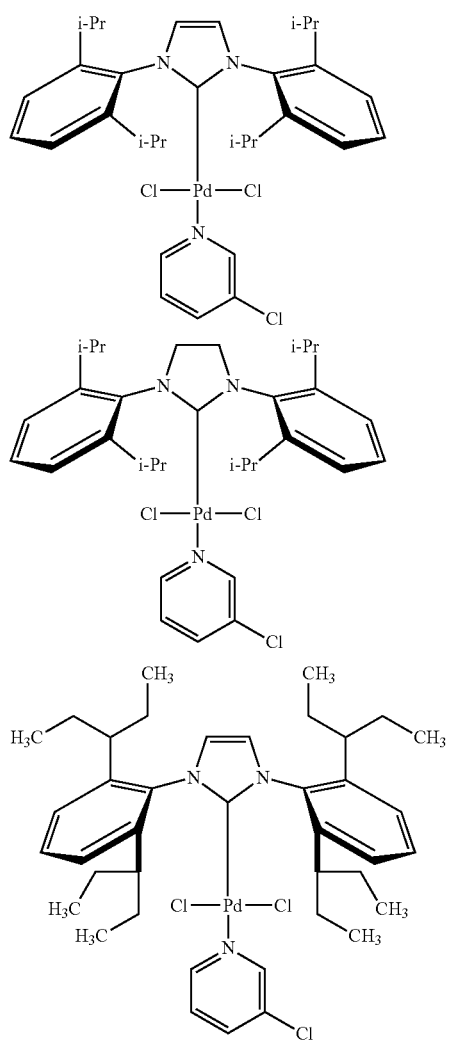
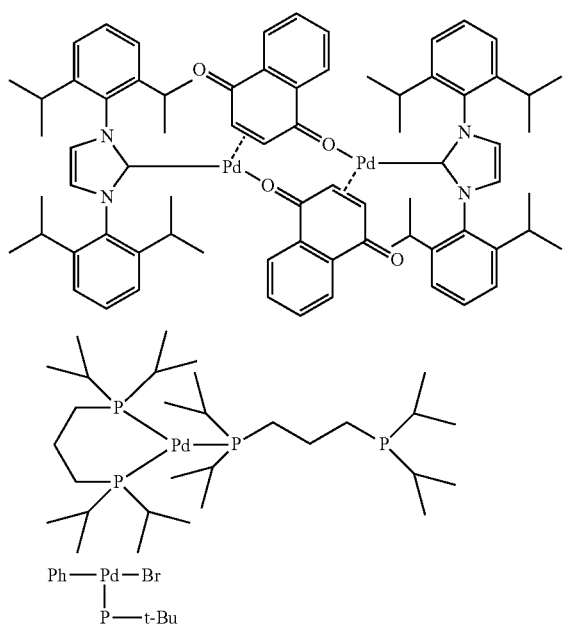
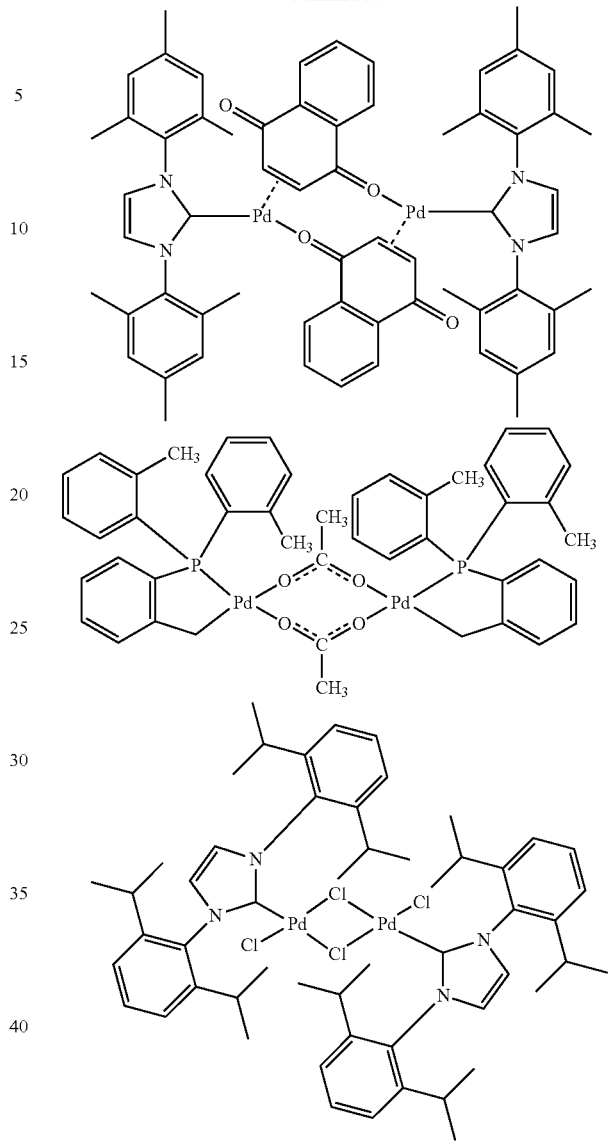

A divalent palladium complex and dibenzylideneacetone palladium may be mixed with various kinds of ligands to form active Pd(0) complexes. Concrete examples of the ligands include $PPh_3$, dppf, dba, $P(t-Bu)_3$, $P(Cy)_3$, $AsPh_3$, $P(o-tol)_3$, etc.

Other examples of ligands include Buchwald-type biphenyl compounds (biphenyl phosphine derivatives) (for example, those mentioned in Acc. Chem. Res., 41, 1461-1473, 2008, and in Chem. Sci., 2, 27-50, 2011); Nolan-type carbene compounds (for example, those mentioned in Chem. Rev., 109, 3612-3676; and in Acc. Chem. Res., 41, 1440-1449); Fu-type aliphatic phosphine compounds (for example, those mentioned in Acc. Chem. Res., 41, 1555-1564); Organ et al's PEPPSI-type compounds, Beller-type compounds, palladacycle-type compounds (for example, those mentioned in DuPont et al's Chem. Rev., 105, 2527-2571 (2005); and in Nolan et al's Acc. Chem. Res., 41, 1440-1449 (2008)), etc. From the viewpoint of improving the reactivity thereof, phosphine ligands are preferably used.

(Nickel Catalyst)

As the nickel catalyst, usable here are those described in Negishi et al's Chemistry of Organozinc Compounds (Pt. 1), pp. 457-553 (2006); Takahashi et al's Modern Organonickel Chemistry, pp. 41-55 (2005), etc.

An Ni(0) complex is unstable in air as compared with a Pd(0) complex; and therefore, it is desirable to prepare an Ni(0) complex by reducing stable Ni(II) from the viewpoint that the catalyst is hardly inactivated. Nickel catalysts are preferred to palladium catalysts from the viewpoint of the cost thereof and the easiness in removal thereof after used in reaction.

Concrete examples of nickel catalysts include 0-valent or 2-valent catalysts such as Ni(PPh$_3$)$_4$, NiBr$_2$(PPh$_3$)$_2$, NiCl$_2$(dppf), NiCl$_2$(PPh$_3$)$_2$, NiCl$_2$, NiI$_2$, Ni(acac)$_2$, Ni(cod)$_2$, NiCl$_2$(glyme), Ni(py)$_4$Cl$_2$, NiCl$_2$(dppp), NiCl$_2$(dppe), etc. A divalent nickel can be converted to a 0-valent one to be an active species.

(Iron Catalyst)

Examples of iron catalysts include Fe(acac)$_3$, Fe(dmb)$_3$, [Fe(C$_2$H$_4$)$_4$][Li(tmeda)]$_2$, [(FeCl$_3$)$_2$(tmeda)$_3$], etc.

In addition, FeCl$_3$ may be combined with any of organic ligands described in publications (for example, those described in "Iron Catalysts in Organic Chemistry; Reactions and Applications" edited by Plietker (published by Wiley-VCH) (2008)). Iron is an inexpensive metal and is easy to remove after used in reaction, and use of iron is preferred.

(Copper Catalyst)

Examples of copper catalysts include CuOAc, (CuOTf)$_2$, CuTC, Cu(MeCN)$_4$PF$_6$, CuBr.Me$_2$S, Cu(neocup)(PPh$_3$), etc.

In addition, CuI, CuCN, CuSO$_4$.5H$_2$O, CuCl, CuBr or the like may be combined with any of organic ligands described in publications (for example, those described in Beleskaya, et al's Cord. Chem. Rev., 248, 2337-2364 (2004); Nonnier et al's Angew. Chem. Int. Ed., Engl., 48, 6954-6971 (2009); Buchwald et al's Chemical Science, 1, 13-31 (2010), etc.).

Copper catalysts are preferred as securing Ullmann coupling at a lower temperature than usual and as capable of being used in C—N bond forming reaction at a hetero-ring atom for which the reactivity of palladium catalysts may lower.

In case where two or more different kinds of transition metals are used, for example, in case where Ni(0) and Pd(0) are used in cross-coupling reaction, each metal salt may be reacted with the corresponding ligand to prepare an active species, and the resulting active species may be put into the coupling reaction solution.

In case where two or more kinds of transition metal complexes each having the same ligand but having a different transition metal are used, such two or more kinds of transition metal salts and the ligand may be put into the coupling reaction solution. Preferred is the method of separately preparing the individual active species.

<1.2 Heterogeneous Transition Metal Complex Catalyst>

The heterogeneous transition metal complex catalyst usable in the coupling reaction in the invention is described below. For smoothly promoting the coupling reaction, it is desirable that a transition metal catalyst for coupling is used as the heterogeneous transition metal complex, and especially it is desirable that a late transition metal is used as the transition metal. Of late transition metals, especially preferred is use of heterogeneous transition metal complexes containing palladium, nickel, iron or copper from the viewpoint of improving the reactivity.

As the organic ligand that the heterogeneous transition metal complex catalyst has, the same ones as those described for the homogeneous transition metal complex catalyst hereinabove may be used. In addition, organic ligands described in a publication (Strem's "Heterogeneous Catalysts" (2011)) are also usable here.

From the viewpoint of easiness in operation, the heterogeneous transition metal complex catalyst is preferably supported by a carrier. Examples of the carrier include metals, nanocolloids, nanoparticles, magnetic compounds, metal oxides, glass, microporous substances, mesoporous substances, active charcoal, silica gel, alumina, zeolite, clay, polymers, dendrimers, etc.

Above all, more preferred is use of a heterogeneous transition metal complex catalyst supported by active charcoal, silica gel, alumina, zeolite, clay, polymer or the like, since the heterogeneous transition metal complex catalyst is easy to recover.

Also more preferably, the carrier of the heterogeneous transition metal complex catalyst is a porous carrier from the viewpoint of promoting the reaction. The porous carrier includes porous glass, activated charcoal, silica gel, alumina, zeolite, and porous polymer. Above all, preferred is porous glass or porous polymer for the carrier of the heterogeneous transition metal complex catalyst.

Porous glass includes glass wool, etc. Porous polymer includes polystyrene, polyethylene, urea resin, etc. Concretely mentioned here are those described in publications, Recoverable and Recyclable Catalysts (written by Benaqlia, M., published by Wiley, 2009), Chemical Reviews, 107, 133-173 (2007), Chemical Reviews, 111, 2251-2320 (2011), Chemical Reviews, 109, 594-642 (2009), and Chemical Reviews, 109, 815-838 (2009).

As specific examples of the heterogeneous transition metal complex catalyst, mentioned here are those described in Liebscher et al's Chem. Rev., 107, 133-173 (2007), Molnar's Chem. Rev., 111, 2251-2320 (2011), Polshettiwar et al's Chem. Rev., 111, 3036-3075 (2011), Adv. Synth. Catal., 346, 1553-1582 (2006), Adv. Synth. Catal., 348, 609-679 (2008), Alonso et al's Tetrahedron, 64, 3047-3101 (2008), Tetrahedron, 61, 11771-11835 (2005), Polshettiwar et al's Tetrahedron, 63, 6949-6976 (2007), Coord. Chem. Rev., 253, 2599-2626 (2009), Kobayashi et al's Chem. Rev., 109, 594-642 (2009), etc.

More concrete examples of the heterogeneous transition metal complex catalyst include FibreCat 1001, FibreCat 1007, FibreCat 1026, P1 Palladium, Palladium-Nanocage, Palladium(II)-Hydrotalcite(m), Palladium(II)-Hydrotalcite (all by Wako Pure Chemicals), Pd EnCat® 30, Pd EnCat® 40, Pd EnCat® TPP, Pd EnCat® TOTPP30, Pd EnCat® BINAP, PS-TPP$_2$PdCl$_2$, PS-TPP$_2$Pd(OAc)$_2$, PS-TPP$_2$PdTPP$_2$, Pd-containing ChemDose Tablet (all by Aldrich), SiliaCat S-Pd, SiliaCat DPP-Pd (both by SiliCycle), etc.

As more concrete examples of the heterogeneous transition metal complex catalyst, mentioned here are those having the following structures. In the following formulae, PS indicates polystyrene. In place of polystyrene, usable is any other polymer such as polyethylene, urea resin, etc. In the following formulae, TPP indicates triphenyl phosphine, and Ac indicates an acetyl group.

[Chem. 7]

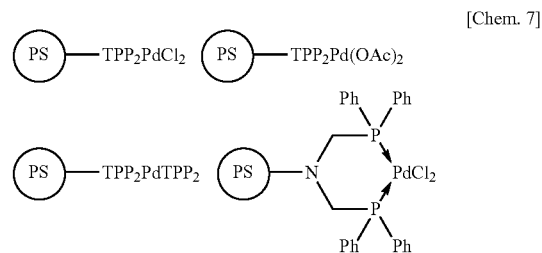

-continued

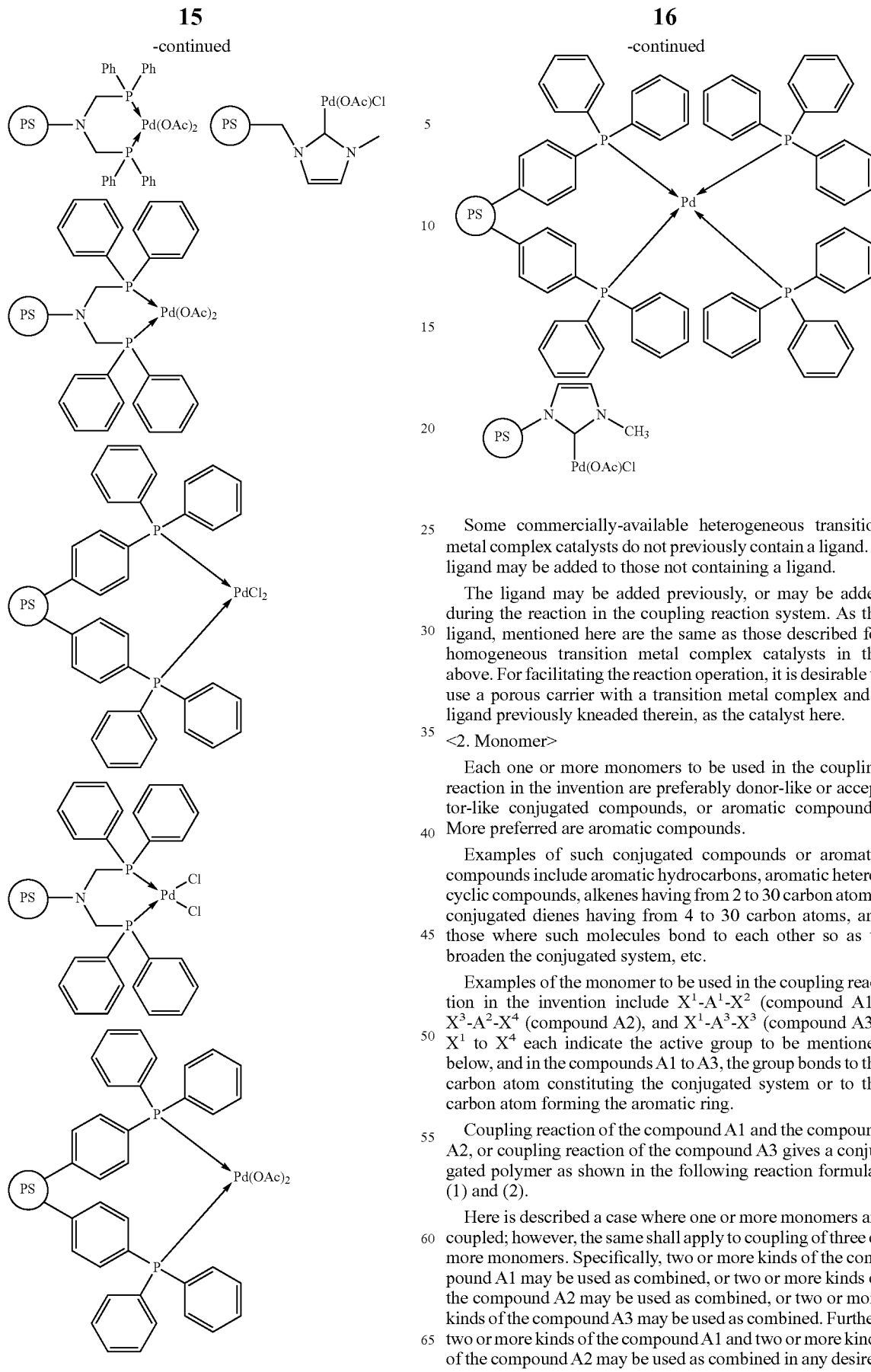

Some commercially-available heterogeneous transition metal complex catalysts do not previously contain a ligand. A ligand may be added to those not containing a ligand.

The ligand may be added previously, or may be added during the reaction in the coupling reaction system. As the ligand, mentioned here are the same as those described for homogeneous transition metal complex catalysts in the above. For facilitating the reaction operation, it is desirable to use a porous carrier with a transition metal complex and a ligand previously kneaded therein, as the catalyst here.

<2. Monomer>

Each one or more monomers to be used in the coupling reaction in the invention are preferably donor-like or acceptor-like conjugated compounds, or aromatic compounds. More preferred are aromatic compounds.

Examples of such conjugated compounds or aromatic compounds include aromatic hydrocarbons, aromatic heterocyclic compounds, alkenes having from 2 to 30 carbon atoms, conjugated dienes having from 4 to 30 carbon atoms, and those where such molecules bond to each other so as to broaden the conjugated system, etc.

Examples of the monomer to be used in the coupling reaction in the invention include $X^1$-$A^1$-$X^2$ (compound A1), $X^3$-$A^2$-$X^4$ (compound A2), and $X^1$-$A^3$-$X^3$ (compound A3). $X^1$ to $X^4$ each indicate the active group to be mentioned below, and in the compounds A1 to A3, the group bonds to the carbon atom constituting the conjugated system or to the carbon atom forming the aromatic ring.

Coupling reaction of the compound A1 and the compound A2, or coupling reaction of the compound A3 gives a conjugated polymer as shown in the following reaction formulae (1) and (2).

Here is described a case where one or more monomers are coupled; however, the same shall apply to coupling of three or more monomers. Specifically, two or more kinds of the compound A1 may be used as combined, or two or more kinds of the compound A2 may be used as combined, or two or more kinds of the compound A3 may be used as combined. Further, two or more kinds of the compound A1 and two or more kinds of the compound A2 may be used as combined in any desired ratio.

[Chem. 8]

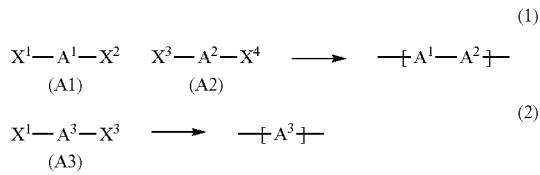

(1)
(2)

A1 to A3 (hereinafter these may be referred to as monomer units) each independently represent any divalent substituent, and is preferably a donor-like conjugated divalent substituent, an acceptor-like conjugated divalent substituent, or a divalent aromatic group. The monomer unit may have three or more active groups.

From the viewpoint of improving the semiconductor characteristics of the conjugated polymer obtained through coupling reaction, it is desirable that at least one of one or more monomer units is a donor-like one and at least one is an acceptor-like one.

In the invention, "monomer unit" represents the recurring unit derived from the starting monomer for the conjugated polymer, and a simple term "unit" means the partial structure contained in the monomer unit. The expressions donor-like property and acceptor-like property of monomer units are relative.

In this description, the donor-like monomer unit is a monomer unit of which the highest occupied molecular orbital (HOMO) level is higher than the HOMO level of the other monomer unit.

Also in this description, the acceptor-like monomer unit is a monomer unit of which the lowest unoccupied molecular orbital (LUMO) level is lower than the LUMO level of the other monomer unit.

For example, in the case of the reaction formula (1), it is desirable that one of the compound A1 and the compound A2 has a donor-like property and the other has an acceptor-like property. From the same viewpoint, in the case of the reaction formula (2), the compound A3 has a structure of multiple units linked together, in which it is desirable that at least one unit of those multiple units has a donor-like property and at least one unit has an acceptor-like property.

In an organic molecule, electrons participating in electric conductivity are π electrons and unshared electron pairs, and the molecular orbital to be formed by these is important. Of those, in the donor (electron donor)-like monomer unit, HOMO participates in conductivity, while in the acceptor (electron acceptor)-like monomer unit, LUMO participates in conductivity. Consequently, by combining the donor-like monomer unit and the acceptor-like monomer unit, it is possible to plan a novel conjugated polymer through control of the HOMO and LUMO energy of the organic molecule.

From the viewpoint of improving the semiconductor characteristics of the conjugated polymer to be obtained through coupling reaction, it is desirable that at least one of one or more monomer units is an aromatic hydrocarbon compound or an aromatic heterocyclic compound, more preferably an aromatic heterocyclic compound, and even more preferably, all the monomers are aromatic heterocyclic compounds.

Preferably, the aromatic hydrocarbon compound has from 6 to 30 carbon atoms, concretely including benzene and the like monocyclic aromatic hydrocarbon compounds; biphenyl and the like ring-connected aromatic hydrocarbon compounds; naphthalene, anthracene, fluorene and the like ring-condensed polycyclic aromatic hydrocarbon compounds, etc.

The condensed polycyclic aromatic hydrocarbon compounds include compounds formed through condensation of a monocyclic aromatic hydrocarbon compound such as benzene or the like and an alicyclic hydrocarbon compound such as cyclopentadiene or the like.

Above all, it is desirable that at least one of one or more monomers is a condensed polycyclic aromatic hydrocarbon compound. The aromatic hydrocarbon compounds may further have a substituent.

The aromatic heterocyclic compounds are preferably those having from 2 to 30 carbon atoms, and concretely, specific examples thereof include monocyclic aromatic heterocyclic compounds such as thiophene, furan, pyrrole, thiazole, oxazole, imidazole, pyrazole, isoxazole, isothiazole, thiadiazole, oxadiazole, triazole, pyridine, pyrazine, pyrimidine, pyridazine, etc.; ring-connected aromatic heterocyclic compounds such as bithiophene, terthiophene, quaterthiophene, bifuran, terfuran, quaterfuran, bipyrrole, terpyrrole, quaterpyrrole, bisthiazole, terthiazole, quaterthiazole, bisilol, tersilol, bigermole, biphosphole, terphosphole, bialsol, teralsol, biselenophene, terselenophene, bitellurophene, tertellurophene, etc.; condensed polycyclic aromatic heterocyclic compounds such as benzothiophene, benzodithiophene, benzofuran, indole, benzoxazole, benzothiazole, benzimidazole, benzopyrazole, benzisoxazole, benzisothiazole, benzothiadiazole, benzoxadiazole, benzotriazole, benzoselenophene, benzotellurophene, benzophosphole, arsindole, silaindene, benzogermole, benzoborole, indacenodithiophene, thienothiophene, imidothiophene, quinoxaline, difuranofluorene, difuranosilol, difuranogermole, difuranostannole, difuranopyranebole, difuranopyrrole, difuraophosphole, difuranoarsole, difuranofuran, difuranothiophene, difuranoselenole, difuranotellurole, difuranoborole, dipyrrolofluorene, dipyrrolosilol, dipyrrologermole, dipyrrolostannole, dipyrrolopyranebole, dipyrrolopyrrole, dipyrrolophosphole, dipyrroloarsole, dipyrrolofuran, dipyrrolothiophene, dipyrroloselenole, dipyrrolotellurole, dipyrroloborole, dithienofluorene, dithienosilol, dithienogermole, dithienostannole, dithienopyranebole, dithienopyrrole, dithienophosphole, dithienoarsole, dithienofuran, dithienothiophene, dithienoselenole, dithienotellurole, dithienoborole, diselenosilol, diselenogermole, diselenostannole, diselenopyranebole, diselenopyrrole, diselenophosphole, diselenoarsole, diselenofuran, diselenothiophene, diselenoselenole, diselenotellurole, diselenoborole, ditellurosilol, ditellurogermole, ditellurostannole, ditelluropyranebole, ditelluropyrrole, ditellurophosphole, ditelluroarsole, ditellurofuran, ditellurothiophene, ditelluroselenole, ditellurotellurole, ditelluroborole, etc. The condensed polycyclic aromatic heterocyclic compounds include compounds formed through condensation of a monocyclic aromatic heterocyclic compound such as thiophene or the like and an alicyclic compound such as cyclopentadiene or the like.

Above all, it is desirable that at least one of one or monomers is a condensed polycyclic aromatic heterocyclic compound. The aromatic heterocyclic compounds may further have a substituent.

Of the aromatic heterocyclic compounds, especially preferred are aromatic heterocyclic compounds having an atom selected from Group-16 elements as a hetero atom; more preferred are aromatic heterocyclic compounds having an oxygen atom or a sulfur atom as a hetero atom; and even more preferred are aromatic heterocyclic compounds having a sulfur atom as a hetero atom. From the viewpoint of the reactivity thereof, the aromatic hetero ring having an oxygen atom or a sulfur atom as a hetero atom is preferably a 5-membered ring.

From the viewpoint of improving the semiconductor characteristics of the conjugated polymer obtained through coupling reaction, it is desirable that at least one of one or more monomer units has an atom selected from elements of Group 14 of the Periodic Table, especially a silicon atom or a germanium atom. More preferably, at least one of one or more monomers is an aromatic compound having a silicon atom or a germanium atom, and even more preferably a condensed polycyclic aromatic heterocyclic compound having a silicon atom or a germanium atom.

$X^1$ to $X^4$ each are an active group and can be suitably selected in accordance with the type of the coupling reaction. Examples of $X^1$ and $X^2$ include a hydrogen atom, or a group having Li, Mg, Zn, B or an atom selected from elements of Group 14 of the Periodic Table.

From the viewpoint of the reactivity, it is desirable that $X^1$ and $X^2$ each are a lithium atom, or a group having Mg, Zn, B or an atom selected from elements of Group 14 of the Periodic Table. Above all, especially preferred is a group having B or an atom selected from elements of Group 14 of the Periodic Table. The atom selected from elements of Group 14 of the Periodic Table is preferably Si, Sn, Ge or Pb, more preferably Si or Sn, even more preferably Sn.

The group having Mg includes, for example, a magnesium halide group.

The group having Zn includes, for example, a zinc halide group.

The group having B includes, for example, a boric acid group, a borate salt group, or a borate ester group. The boric acid group includes, for example, —B(OH)$_2$. The borate salt group includes, for example, —BF$_3$K. Examples of the borate salt group and the borate ester groups are mentioned below.

[Chem. 9]

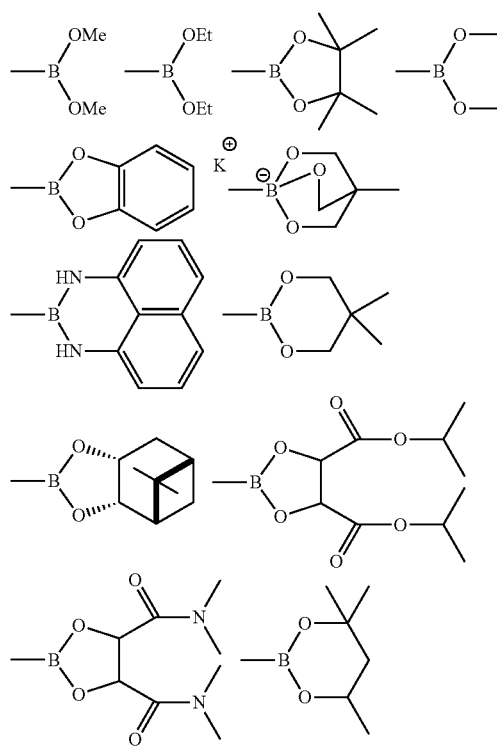

The group with an atom selected from elements of Group 14 of the Periodic Table includes a silicon-containing group, a tin-containing group, a germanium-containing group, a lead-containing group, etc. Of those, a silicon-containing group or a tin-containing group is preferred from the point of reactivity thereof, and a tin-containing group is more preferred. To that effect, it is more desirable that at least one of one or more monomers is an aromatic compound having a tin-containing group, especially a condensed polycyclic aromatic heterocyclic compound having the group. Of the tin-containing group, an alkylstannyl group or an arylstannyl group is more preferred form the point of reactivity, and an alkylstannyl group is more preferred. Examples of the alkylstannyl group are mentioned below.

[Chem. 10]

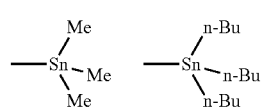

The silicon-containing group includes a silyl group optionally having a substituent, and, for example, usable here are those reported in publications (Pharmaceutical Process Chemistry (2011), 101-126; Accounts of Chemical Research (2008), 41, 1486-1499).

As specific examples, there are mentioned —SiMe$_2$F, —SiEtF$_2$, —SiEtCl$_2$, —SiF$_3$, —SiMe(OEt)$_2$, —Si(OMe)$_3$, —SiMe$_2$OH, —SiMe$_2$OK, —SiMe$_2$ONa, —SiMe$_3$, —SiMe$_2$Ph, —SiMe$_2$(allyl), —SiMe$_2$Bn, —Si(i-Pr)$_2$Bn, —SiCy$_3$, etc. (In these, Me means a methyl group, Et means an ethyl group, Pr means a propyl group, Ph means a phenyl group, allyl means an allyl group, Bn means a benzyl group, Cy means a cyclohexyl group.) Other examples are mentioned below.

[Chem. 11]

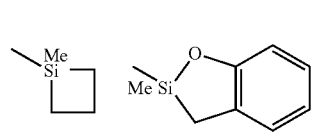

Examples of $X^3$ and $X^4$ include a halogen atom, an alkylsulfonyloxy group, an arylsulfonyloxy group, etc. The halogen atom is preferably an iodine atom, a bromine atom or a chlorine atom, and is more preferably a bromine atom or an iodine atom from the point of reactivity.

As in the above, it is desirable that at least one of one or more monomers is an aromatic compound having a halogen atom, especially a condensed polycyclic aromatic compound having a halogen atom.

The alkylsulfonyloxy group is preferably a methylsulfonyloxy group; and the arylsulfonyloxy group is preferably a phenylsulfonyloxy group. The alkylsulfonyloxy group and the arylsulfonyloxy group may be substituted with a substituent, for example, a halogen atom such as a fluorine atom or the like, or an alkyl group such as a methyl group or the like.

Above all, from the viewpoint of improving the coupling reactivity, the alkylsulfonyloxy group having a substituent is preferably a methylsulfonyloxy group or a trifluoromethylsulfonyloxy group, and the arylsulfonyloxy group having a substituent is preferably a p-toluenesulfonyloxy group.

In the case of oxidative coupling reaction, it is desirable that $X^1$ to $X^4$ each are a lithium atom, a magnesium halide group (Mg-hal (where hal is a halogen atom)), or a hydrogen atom.

In the case of C—H bond activating reaction, $X^1$ and $X^2$ are generally hydrogen atoms, and $X^3$ and $X^4$ are preferably a boric acid group, a borate salt group or a borate ester group.

In the case of cross-coupling reaction, it is desirable that $X^1$ and $X^2$ each are a substituent that may undergo transmetalation, and $X^3$ and $X^4$ each are a substituent that may undergo oxidative addition.

Examples of $X^1$ and $X^2$ include a magnesium halide group (Mg-hal (where hal is a halogen atom)), a zinc halide group (Zn-hal (where hal is a halogen atom)), a boric acid group, a borate salt group, a borate ester group, a silyl group optionally having a substituent, a stannyl group optionally having a substituent, etc.

$X^3$ and $X^4$ each are preferably a halogen atom, an alkylsulfonyloxy group, or an arylsulfonyloxy group.

In the case of cross-coupling reaction, $X^1$ and $X^2$ each are preferably a trialkylstannyl group or Zn-hal (where hal is a halogen atom) from the viewpoint of increasing the catalyst cycle efficiency, more preferably a trimethylstannyl group or a tri(n-butyl)stannyl group.

From the viewpoint of green chemistry, $X^1$ and $X^2$ each are preferably a boric acid group, a borate salt group, a borate ester group, or a silyl group optionally having a substituent.

Further, from the viewpoint of increasing the reactivity, $X^3$ and $X^4$ each are preferably a bromine atom, an iodine atom, a methylsulfonyloxy group, a trifluoromethylsulfonyloxy group or a p-toluenesulfonyloxy group.

In the case of C-hetero atom coupling reaction, examples of $X^1$ and $X^2$ include a hydrogen atom and a stannyl group optionally having a substituent. Examples of $X^3$ and $X^4$ include a halogen atom, an alkylsulfonyloxy group, an arylsulfonyloxy group, etc. In this case, a Buchwald-type catalyst, an Fu-type catalyst or the like is preferably used as the catalyst.

Above all, in the case where the active group ($X^1$ to $X^4$) in the monomer (A1 to A3) is easy to remove thermally and/or chemically (for example, in the case of Examples to be mentioned below), a conjugated polymer having a high molecular weight can be efficiently obtained according to the production method of the invention.

This theory applies to the case where the monomer units (A1 to A3) are condensed aromatic heterocyclic compounds, or to the case where the monomer units are other aromatic compound, or to the case where the monomer units are other conjugated compounds, and therefore it is considered that the production method of the invention is applicable similarly to any and every case where the monomer units have any indefinite structure. In particular, for the case where a compound having an active group that is thermally and/or chemically unstable is used, the production method of the invention is effective.

The case where the monomer unit is an aromatic compound, or that is, the case where an aromatic compound having an active group that is thermally and/or chemically unstable is used as the monomer is described in detail hereinunder.

The aromatic compound having an active group that is thermally and/or chemically unstable is an aromatic compound having at least n (n is an integer of 2 or more and 4 or less) active groups (hereinafter this may be referred to as Ar(n)) and satisfying the following requirement.

Requirement: When 5 ml of a hexane solution containing 1.0 g of the aromatic compound (Ar(n)) is charged in a column (having an inner diameter 15 mm and a length 5 cm, and charged with 50 mL of a hexane solution containing 20 g of silica gel (spherical, neutral (pH 7.0±0.5), and having a particle size of from 63 to 210 µm) and 2 g of anhydrous potassium carbonate and developed with a developing solvent of hexane (at a flow rate of 50 ml/min), the proportion of the aromatic compound in which the number of the active groups is smaller than n in the solution having passed through the column in 3 minutes at room temperature is 5 mol % or more relative to the aromatic compound (Ar(n)) before charged in the column.

In particular, in the above requirement, the proportion of the aromatic compound in which the number of the active groups is smaller than n in the solution having passed through the column is preferably 20 mol % or more, more preferably 40 mol % or more, even more preferably 60 mol % or more, further preferably 75% or more, further more preferably 90 mol % or more relative to the aromatic compound (Ar(n)) before charged in the column. When the production method of the invention is employed in the preferred case, a conjugated polymer having a high molecular weight can be produced more effectively.

The silica gel to be used under the above condition is spherical and neutral (having pH of 7.0±0.5) and has a particle size of from 63 to 210 µm. Concretely, for example, a commercial product, Silica Gel 60N (spherical neutral, for column chromatography, produced by Kanto Chemical) is usable.

n indicates the number of the active groups that the monomer unit has, and is an integer of 2 or more. On the other hand, the number is an integer of 4 or less, preferably an integer of 3 or less.

The active group that the aromatic compound (Ar(n)) has may have the same meaning as that of the above-mentioned $X^1$ to $X^4$. Above all, preferred is a halogen atom, an alkylsulfonyloxy group, an arylsulfonyloxy group, or a group having Li, Mg, Zn, B or an atom selected from elements of Group 14 of the Periodic Table; more preferred is a group having B or an atom selected from elements of Group 14 of the Periodic Table; even more preferred is a group having an atom selected from elements of Group 14 of the Periodic Table; still more preferred is a silicon-containing group or a tin-containing group; and further more preferred is a tin-containing group.

Specific examples of the aromatic compound (Ar(n)) are the same as those of the aromatic compound mentioned in the section of the monomer hereinabove. Preferably, the aromatic compound (Ar(n)) is an aromatic heterocyclic compound, and is more preferably an aromatic heterocyclic compound in which the active group bonds to the aromatic hetero ring, from the viewpoint of improving the reactivity in coupling reaction. Especially preferred is an aromatic heterocyclic compound in which the group having Li, Mg, B or an atom selected from elements of Group 14 of the Periodic Table bonds to the aromatic hetero ring.

Examples of the monomer usable in the coupling reaction in the invention are described in detail hereinunder. The compound A1 having substituents of $X^1$ and $X^2$, and the compound A2 having substituents of $X^3$ and $X^4$ are described for example.

Preferred examples of the compound A1 include compounds (compounds A4) represented by the following formula (A4) or (A4'):

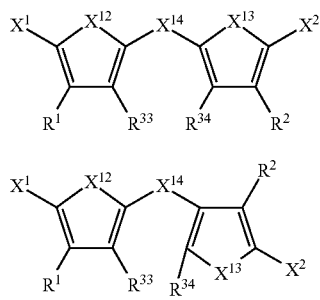

(A4)

(A4')

In the formula (A4) and the formula (A4'), $R^1$ and $R^2$ each independently represent a hydrogen atom, a halogen atom, an alkyl group optionally having a substituent, an alkenyl group optionally having a substituent, an alkynyl group optionally having a substituent or an aromatic group optionally having a substituent, or $R^1$ and $R^{33}$, or $R^2$ and $R^{34}$ may bond to each other to from a ring. $R^{33}$ and $R^{34}$ each independently represent a hydrogen atom, a halogen atom, or an organic group having an atom selected from Group 14 elements of the Periodic Table, or may bond to each other to form a ring. $X^1$ and $X^2$ each independently represent an active group, $X^{12}$ and $X^{13}$ each independently represent an atom selected from Group 16 elements, $X^{14}$ represents a group that links the two conjugated systems of five-membered rings bonding to each other, or a direct bond. $R^{33}$ and $R^{34}$ may bond to each other to form a ring.

In the formula (A4), $X^1$ and $X^2$ are the same as those mentioned in the section of the monomer hereinabove.

In the formula (A4), $X^{12}$ and $X^{13}$ each independently represent an atom selected from Group 16 elements. From the viewpoint of the semiconductor characteristics of the conjugated polymer to be obtained, $X^{12}$ and $X^{13}$ each are preferably an oxygen atom or a sulfur atom, and more preferably a sulfur atom.

The substituents in the formula (A4) and the formula (A4') have the same meanings.

In the formula (A4), $X^{14}$ represents a group that links the two conjugated systems of five-membered rings bonding to each other, or a direct bond. Specific examples of $X^{14}$ include a direct bond, a divalent aromatic group, a divalent alkenediyl group, or a divalent group to be derived from a conjugated diene. When $X^{14}$ is such a group or a direct bond, the conjugated system could be broadened and therefore it is considered that the semiconductor characteristics of the conjugated polymer to be obtained by the use of the compound A5 could be thereby improved.

In the formula (A4), $R^1$ and $R^2$ each independently represent a hydrogen atom, a halogen atom, an alkyl group optionally having a substituent, an alkenyl group optionally having a substituent, an alkynyl group optionally having a substituent or an aromatic group optionally having a substituent.

The halogen atom includes a fluorine atom, a chlorine atom, a bromine atom or an iodine atom; and of those, preferred is an iodine atom.

The number of the carbon atoms constituting the alkyl group is generally 1 or more, preferably 3 or more, more preferably 4 or more, and is, on the other hand, generally 20 or less, preferably 16 or less, more preferably 12 or less, even more preferably 10 or less.

The alkyl group of the type includes, for example, a linear alkyl group such as a methyl group, an ethyl group, an n-propyl group, an n-butyl group, an n-pentyl group, an n-hexyl group, an n-octyl group, an n-nonyl group, an n-decyl group, an n-lauryl group, etc.; a branched alkyl group such as an iso-propyl group, an iso-butyl group, a tert-butyl group, a 3-methylbutyl group, a 2-ethylhexyl group, a 3,7-dimethyloctyl group, etc.; a cyclic alkyl group such as a cyclopropyl group, a cyclobutyl group, a cyclopentyl group, a cyclohexyl group, a cycloheptyl group, a cyclooctyl group, a cyclononyl group, a cyclolauryl group, a cyclodecyl group, etc. Of those, as the linear alkyl group, preferred is an n-propyl group, an n-butyl group, an n-pentyl group, an n-hexyl group, an n-heptyl group, an n-octyl group, an n-nonyl group, an n-decyl group, or an n-lauryl group; as the branched alkyl group, preferred is an iso-propyl group, an iso-butyl group, a tert-butyl group, a 3-methylbutyl group, a 2-ethylhexyl group, or a 3,7-dimethyloctyl group; and as the cyclic alkyl group, preferred is a cyclopropyl group, a cyclobutyl group, a cyclopentyl group, a cyclohexyl group, a cycloheptyl group, or a cyclolauryl group. More preferred are an n-butyl group, an iso-propyl group, an iso-butyl group, a tert-butyl group, an n-pentyl group, a 3-methylbutyl group, a cyclopentyl group, an n-hexyl group, a cyclohexyl group, a 2-ethylhexyl group, a cyclooctyl group, an n-nonyl group, a 3,7-dimethyloctyl group, a cyclononyl group, an n-decyl group, and a cyclodecyl group.

The number of the carbon atoms constituting the alkenyl group is generally 1 or more, preferably 3 or more, more preferably 4 or more, and is, on the other hand, generally 20 or less, preferably 16 or less, more preferably 12 or less, even more preferably 10 or less. The alkenyl group of the type includes, for example an ethene group, a propene group, a butene group, a pentene group, a hexene group, a heptene group, an octene group, a nonene group, a decene group, an undecene group, a dodecene group, a tridecene group, a tetradecene group, a pentadecene group, a hexadecene group, a heptadecene group, an octadecene group, a nonadecene group, an eicosene group, a geranyl group, etc. Preferred is a propene group, a butene group, a pentene group, a hexene group, a heptene group, an octene group, a nonene group, a decene group, an undecene group and a dodecene group; and more preferred is a butene group, a pentene group, a hexene group, a heptene group, an octene group, a none group or a decene group.

The carbon number of the alkynyl group is generally 2 or more, preferably 3 or more, more preferably 4 or more, and is, on the other hand, generally 20 or less, preferably 16 or less, even more preferably 12 or less, still more preferably 10 or less. The alkynyl group of the type includes, for example, an ethynyl group, a propynyl group, a butynyl group, a pentynyl group, a hexynyl group, a heptynyl group, an octynyl group, a nonynyl group, a decynyl group, an undecynyl group, a dodecynyl group, a tridecynyl group, a tetradecynyl group, a pentadecynyl group, a hexadecynyl group, a heptadecynyl group, an octadecynyl group, a nonadecynyl group, an eicosynyl group, etc.

The number of the carbon atoms constituting the aromatic group is generally 2 or more and is, on the other hand, generally 60 or less, preferably 20 or less, more preferably 14 or less. The aromatic group of the type includes, for example, an aromatic hydrocarbon group such as a phenyl group, a naphthyl group, an indanyl group, an indenyl group, a fluorenyl group, an anthracenyl group or an azulenyl group, etc.; an aromatic heterocyclic group such as a thienyl group, a furyl group, a pyridyl group, a pyrimidyl group, a thiazolyl group, an oxazolyl group, a triazinyl group, a benzothiophenyl group, a benzofuranyl group, a benzothienyl group, a benzothiazolyl group, a benzoxazolyl group, a benzotriazolyl group, etc. Above all, preferred are a phenyl group, a naphthyl group, a thienyl group, a pyridyl group, a pyrimidyl group, a thiazolyl group and an oxazolyl group.

The substituent that the alkyl group, the alkenyl group, the alkynyl group or the aromatic group may have is, though not specifically defined, preferably a halogen atom, a hydroxyl group, a cyano group, an amino group, an ester group, an alkylcarbonyl group, an acetyl group, a sulfonyl group, a silyl group, a boryl group, a nitrile group, an alkyl group, an alkenyl group, an alkynyl group, an alkoxy group, an aromatic hydrocarbon group or an aromatic heterocyclic group. Of those, the adjacent substituents may bond to each other to form a ring. In particular, the substituent that the aromatic group may have includes an alkoxy group having from 1 to 12 carbon atoms, or an alkyl group having from 1 to 12 carbon atoms. The halogen atom includes a fluorine atom, a chlorine atom, a bromine atom or an iodine atom, and is especially preferably a fluorine atom.

In the formula (A4), $R^{33}$ and $R^{34}$ each independently represent a hydrogen atom, a halogen atom, or a group having an atom selected from Group 14 elements of the Periodic Table. The group having an atom selected from Group 14 elements of the Periodic Table includes, for example, an alkyl group optionally having a substituent, an alkenyl group optionally having a substituent, an alkynyl group optionally having a substituent, an aromatic group optionally having a substituent, a silyl group optionally having a substituent, etc. The halogen atom, the alkyl group optionally having a substituent, the alkenyl group optionally having a substituent, the alkynyl group optionally having a substituent, and the aromatic group optionally having a substituent may be the same as those mentioned for $R^1$ and $R^2$ hereinabove.

The silyl group alkyl group optionally having a substituent includes an alkylsilyl group such as a trimethylsilyl group, etc.; an arylsilyl group such as a triphenylsilyl group, etc.; an alkylarylsilyl group such as a dimethylphenylsilyl group, etc.

$R^{33}$ and $R^{34}$ may bond to each other to form a ring. $R^{33}$ and $R^{34}$ may bond to $R^1$ or $R^2$ to form a ring. The structure to be formed by $R^{33}$ and $R^{34}$ bonding to each other includes, for example, the following structures: —O—, —S—, —N(R)—, —C(R)(R')—, —Si(R)(R')—, —Ge(R)(R')—, etc. (In these, R and R' each represent a hydrogen atom, an alkyl group or an aromatic group.) From 2 to 6 these structures may bond to each other to be the structure as referred to herein. The compounds may have these as the substituents of $R^{33}$ and $R^{34}$.

Of the compounds represented by the formula (A4) or the formula (A4'), preferred are the compounds represented by the following formula (A6) or formula (A6').

[Chem. 13]

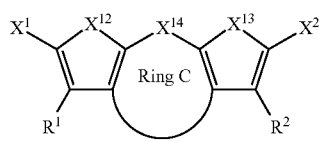
(A6)

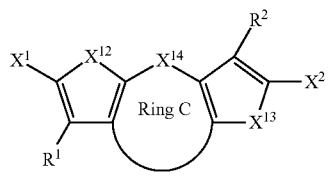
(A6')

In the formulae (A6) and (A6'), $R^1$, $R^2$, $X^1$, $X^2$, $X^{12}$, $X^{13}$ and $X^{14}$ have the same meanings as those in the formula (A4), and the ring C represents any ring optionally having a substituent.

The substituents in the compounds represented by the formula (A6) or the formula (A6') are also the same as those mentioned above. The compound represented by the formula (A6) is a compound of the formula (A4) in which $R^{33}$ and $R^{34}$ bond to each other to form the ring C that contains $X^{14}$.

The ring C is any ring optionally having a substituent. Especially preferred is a 5-membered or 6-membered single ring, or a condensed ring formed through condensation of from 2 to 6 these rings.

The 5-membered single ring includes a 5-membered aromatic ring or a 5-membered aliphatic ring. The 5-membered aromatic ring includes, for example, a 5-membered aromatic hetero ring such as a thiophene ring, a furan ring, a pyrrole ring, a thiazole ring, an oxazole ring, an imidazole ring, a pyrazole ring, an isoxazole ring, an isothiazole ring, a thiadiazole ring, an oxadiazole ring, a triazole ring, a selenole ring, a tellurole ring, etc.

Above all, especially preferred is a 5-membered aromatic hetero ring, and more preferred is a 5-membered aromatic hetero ring containing a sulfur atom, such as a thiophene ring, a thiazole ring, an isothiazole ring, a thiadiazole ring, etc. Even more preferred is a thiophene ring.

The 5-membered aliphatic ring includes a 5-membered aliphatic hydrocarbon ring such as a cyclopentane ring, a cyclopentadiene ring, etc.; a 5-membered aliphatic hetero ring such as a tetrahydrofuran ring, a pyrrolidine ring, a borole ring, a silole ring, a germole ring, a stannole ring, a pyranebole ring, a phosphole ring, an arsole ring, etc.

The 6-membered single ring includes, for example, a 6-membered aromatic ring and a 6-membered aliphatic ring. The 6-membered aromatic ring includes, for example, a 6-membered aromatic hydrocarbon ring such as a benzene ring, etc.; a 6-membered aromatic hetero ring such as a pyridine ring, a pyrazine ring, a pyrimidine ring, a pyridazine ring, etc.

The 6-membered aliphatic ring includes, for example, a 6-membered aliphatic hydrocarbon ring such as a cyclohexane ring, etc.; a 6-membered aliphatic hetero ring such as an oxane ring, a dioxane ring, a piperidine ring, a piperazine ring, etc.

The ring formed through condensation of from 2 to 6 these rings includes, for example, a polycyclic condensed aromatic hydrocarbon ring, and a polycyclic condensed aromatic hetero ring.

The polycyclic condensed aromatic hydrocarbon ring has, for example, from 2 to 6 condensed rings, concretely including a naphthalene ring, an anthracene ring, a fluorene ring, an indacene ring, etc.

The polycyclic condensed aromatic hetero ring has, for example, from 2 to 6 condensed rings, concretely including a quinolyl group, an acridinyl group, an indolyl group, an isoquinolyl group, a quinoxalinyl group, a carbazolyl group, etc.

The substituent that the ring C may have is not specifically defined, and concrete examples thereof include a halogen atom, a hydrocarbon group, an aromatic heterocyclic group, an alkylcarbonyl group, an arylcarbonyl group, an alkyloxycarbonyl group, an aryloxycarbonyl group, an alkylaminocarbonyl group, an arylaminocarbonyl group, an alkoxy group, an aryloxy group, etc.

The hydrocarbon group, the aromatic heterocyclic group, the alkylcarbonyl group, the arylcarbonyl group, the alkyloxycarbonyl group, the aryloxycarbonyl group, the alkylaminocarbonyl group, the arylaminocarbonyl group, the alkoxy group and the aryloxy group may further have a substituent.

Of the compounds represented by the formula (A6) or the formula (A6'), the compounds mentioned below are preferred examples of the monomer.

[Chem. 14]

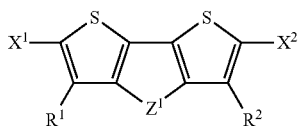
(A7)

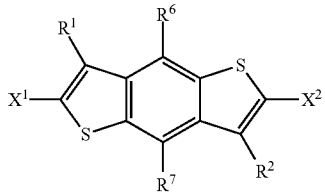
(A8)

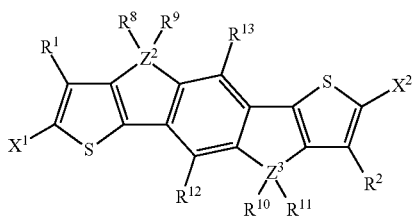
(A9)

[Chem. 15]

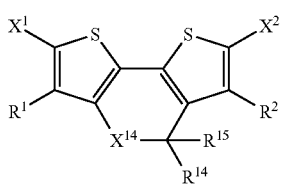
(A10)

The compounds represented by (A7) to (A10) are described below.

[Chem. 16]

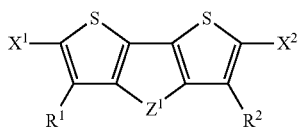
(A7)

In the formula (A7), $X^1$ and $X^2$ are the same as in the formula (A4). In the formula (A7), $R^1$ and $R^2$ are the same as in the formula (A4). The formula (A7) corresponds to the formula (A4) where $X^{12}$ and $X^{13}$ are sulfur atoms.

In the formula (A7), $Z^1$ represents $Z^{11}(R^3)(R^4)$, $Z^{12}(R^5)$ or $Z^{13}$. Above all, from the viewpoint of improving the semiconductor characteristics, preferred is $Z^{11}(R^3)(R^4)$ or $Z^{13}$, and more preferred is $Z^{11}(R^3)(R^4)$.

$Z^{11}$ represents an atom selected from Group 14 elements of the Periodic Table. $Z^{11}$ is preferably a carbon atom, a silicon atom or a germanium atom. From the viewpoint of improving the semiconductor characteristics of the conjugated polymer to be produced by the use of the compound A7, $Z^{11}$ is more preferably a silicon atom or a germanium atom.

As $R^3$ and $R^4$, there are mentioned the same substituents as those mentioned hereinabove for $R^1$ and $R^2$. Preferred substituents are described in the section of the conjugated polymer that has a recurring unit represented by the formula (P1) to be described below.

$R^3$ and $R^4$ may bond to each other to form a ring, or may bond to $R^1$ or $R^2$ to form a ring.

$Z^{12}$ represents an atom selected from Group 15 elements of the Periodic Table. $Z^{12}$ is preferably a nitrogen atom, a phosphorus atom or an arsenic atom, and from the viewpoint of improving the semiconductor characteristics of the conjugated polymer produced by the use of the compound A7, $Z^{12}$ is more preferably a nitrogen atom or a phosphorus atom, even more preferably a nitrogen atom.

As $R^5$, there are mentioned the same substituents as those mentioned hereinabove for $R^3$ and $R^4$. Preferred is an alkyl group optionally having a substituent or an aromatic group optionally having a substituent. $R^5$ may bond to $R^1$ or $R^2$ to form a ring.

$Z^{13}$ represents an atom selected from Group 16 elements of the Periodic Table. $Z^{13}$ is preferably an oxygen atom, a sulfur atom or a selenium atom, and from the viewpoint of improving the semiconductor characteristics of the conjugated polymer to be produced by the use of the compound A7, $Z^{13}$ is more preferably an oxygen atom or a sulfur atom, even more preferably a sulfur atom.

[Chem. 17]

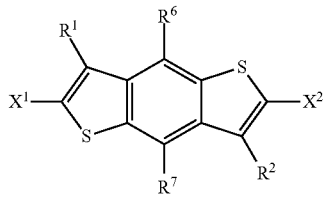
(A8)

In the formula (A8), $X^1$ and $X^2$ are the same as those in the formula (A4). $R^1$ and $R^2$ are also the same as those in the formula (A4).

The formula (A8) corresponds to the formula (A4) where $X^{12}$ and $X^{13}$ are sulfur atoms. In the formula (A8), $R^6$ and $R^7$ each represent a hydrogen atom, a halogen atom, an alkyl group optionally having a substituent, an alkenyl group optionally having a substituent, an alkynyl group optionally having a substituent, an aromatic group optionally having a substituent, an alkoxy group optionally having a substituent, or an aryloxy group optionally having a substituent. Above all, from the viewpoint of improving the solubility of the compound, preferred is an alkyl group optionally having a substituent; and from the viewpoint of facilitating the substituent introduction, preferred is an alkoxy group optionally having a substituent.

The halogen atom, the alkyl group, the alkenyl group, the alkynyl group and the aromatic group are the same as those described hereinabove for $R^1$ and $R^2$.

The alkoxy group is preferably one having from 1 to 20 carbon atoms, for example, a linear or branched alkoxy group such as a methoxy group, an ethoxy group, an n-propoxy group, an i-propoxy group, an n-butoxy group, an i-butoxy group, a t-butoxy group, a benzyloxy group, an ethylhexyloxy group, etc.

The aryloxy group is preferably one having from 2 to 20 carbon atoms, for example, including a phenoxy group, a naphthyloxy group, a pyridyloxy group, a thiazolyloxy group, an oxazolyloxy group, an imdiazolyloxy group, etc. Above all, preferred are a phenoxy group and a pyridyloxy group.

Examples of the substituent which the alkyl group, the alkenyl group, the alkynyl group, the aromatic group, the alkoxy group and the aryloxy group may be the same as those of the substituent which the alkyl group, the alkenyl group, the alkynyl group and the aromatic group of $R^1$ and $R^2$ may have.

[Chem. 18]

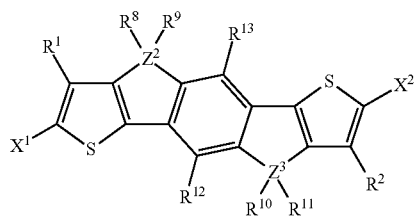

(A9)

In the formula (A9), $X^1$ and $X^2$ are the same as in the formula (A4). The formula (A9) corresponds to the formula (A4) where $X^{12}$ and $X^{13}$ are sulfur atoms.

In the formula (A9), $R^1$ and $R^2$ are the same as in the formula (A4).

In the formula (A9), as $R^8$ to $R^{11}$, there are mentioned the same groups as those mentioned hereinabove for $R^3$ and $R^4$. Above all, at least one of $R^8$, $R^9$, $R^{10}$ and $R^{11}$ is preferably an alkyl group or an aromatic group optionally having a substituent. $R^1$ and $R^8$, $R^2$ and $R^{11}$, $R^8$ and $R^9$, and $R^{10}$ and $R^{11}$ may bond to each other to form a ring.

In the formula (A9), as $R^{12}$ and $R^{13}$, there are mentioned the same groups as those mentioned hereinabove for $R^1$ and $R^2$. Above all, from the viewpoint of easiness in production of the compound, preferred is a hydrogen atom. $R^9$ and $R^{13}$, and $R^{10}$ and $R^{12}$ may bond to each other to form a ring.

In the formula (A9), $Z^2$ and $Z^3$ each independently represent an atom selected from Group 14 elements of the Periodic Table. $Z^2$ and $Z^3$ may be the same or different, but is the same from the viewpoint of the compound stability.

$Z^2$ and $Z^3$ each are preferably a carbon atom, a silicon atom or a germanium atom, and more preferably a silicon atom or a germanium atom from the viewpoint of improving the semiconductor characteristics of the conjugated polymer to be produced by the use of the compound A9.

[Chem. 19]

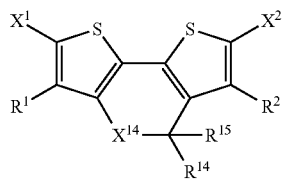

(A10)

In the formula (A10), $X^1$ and $X^2$ are the same as in the formula (A4). In the above formula (A10), $R^1$ and $R^2$ are the same as in the formula (A4). In the formula (A10), as $R^{14}$ and $R^{15}$, there are mentioned the same groups as those mentioned hereinabove for $R^3$ and $R^4$ in the formula (A7). Above all, preferred is an alkyl group optionally having a substituent.

The formula (A10) corresponds to the formula (A4) where $X^{12}$ and $X^{13}$ are sulfur atoms.

In the formula (A10), $X^{14}$ represents an atom selected from Group 16 elements of the Periodic Table. $X^{14}$ is preferably an oxygen atom, a sulfur atom or a selenium atom. From the viewpoint of improving the semiconductor characteristics of the conjugated polymer to be produced by the use of the compound A10, $X^{14}$ is more preferably an oxygen atom or a sulfur atom, even more preferably an oxygen atom.

Of the compounds represented by the above-mentioned formulae (A7) to (A 10) as the monomers for use in the invention, preferred are the compounds represented by the formula (A7) or the formula (A8) from the viewpoint of readily enhancing the conversion efficiency in use of the polymer to be mentioned below in a photoelectric conversion element, and more preferred are the compounds represented by the formula (A7).

The coupling reaction in the invention is preferably carried out between the compound represented by the above-mentioned formulae (A4) to (A10) and a compound having an acceptor property relative to the compound, especially a compound represented by the following formula (A11), (A12), (A13) or (A17).

The conjugated polymer to be produced through the reaction of the monomers have high-level semiconductor characteristics, and by further increasing the molecular weight thereof according to the production method of the invention, the characteristics can be favorably improved further more.

The compound represented by the following formula (A11), (A12), (A13) or (A17) corresponds to the compound represented by the formula (A2) in the above-mentioned reaction formula (1).

[Chem. 20]

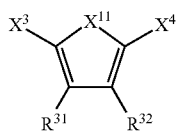

(A11)

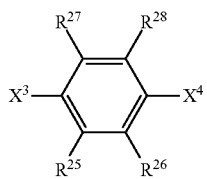

(A12)

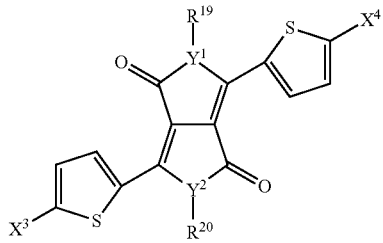

(A13)

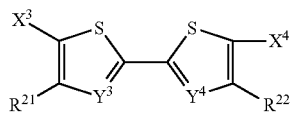

(A17)

In the formula (A11), $X^3$ and $X^4$ are the same as in the formula (A2).

$R^{31}$ and $R^{32}$ each represent a hydrogen atom, a hydrocarbon group having from 1 to 20 carbon atoms and optionally having a substituent, an aromatic heterocyclic group having from 2 to 20 carbon atoms and optionally having a substituent, an acyl group optionally having a substituent, an alkoxy group optionally having a substituent, or an aryloxy group optionally having a substituent. The substituent that the hydrocarbon group, the aromatic heterocyclic group, the acyl group, the alkoxy group and the aryloxy group may have includes, for example, a fluorine atom, etc.

The hydrocarbon group includes, for example, an aliphatic hydrocarbon group having from 1 to 20 carbon atoms or an aromatic hydrocarbon group having from 6 to 20 carbon atoms. Examples of the aliphatic hydrocarbon group include an alkyl group such as a methyl group, an ethyl group, an n-butyl group, an n-hexyl group, a 2-ethylhexyl group, an n-octyl group, etc.; an alkenyl group such as a crotyl group, an octenyl group, etc.; an alkynyl group such as a propynyl group, an octynyl group, etc. Examples of the aromatic hydrocarbon group include a phenyl group, a naphthyl group, an anthracenyl group, etc.

Examples of the aromatic heterocyclic group include a thienyl group, a furyl group, a pyrrolyl group, a thiazolyl group, etc.

Examples of the acyl group include an alkylcarbonyl group, an arylcarbonyl group, an alkyloxycarbonyl group, an aryloxycarbonyl group, an alkylaminocarbonyl group, an arylaminocarbonyl group, etc. Preferably, $R^{31}$ and $R^{32}$ each are an acyl group from the viewpoint of improving the acceptor property of the compound A11.

$R^{31}$ and $R^{32}$ may bond to each other to form a ring. The structure that $R^{31}$ and $R^{32}$ bonding to each other form includes, for example, the following structures: —O—, —S—, —N(R)—, —C(R)(R')—, —Si(R)(R')—, —Ge(R)(R')—, —C(=O)—N(R)—C(=O)—, =N—S—N=, —N=C—, etc. (In these, R and R' each represent a hydrogen atom, an alkyl group or an aromatic group.) From 2 to 6 these structures may bond to each other to be the structure as referred to herein. The compounds may have these as the substituents of $R^{31}$ and $R^{32}$.

Of the compounds of the formula (A11) where $R^{31}$ and $R^{32}$ bond to each other, the compounds represented by the following formula (A14) (compound A14) are preferred as examples of the monomer.

[Chem. 21]

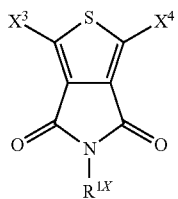

(A14)

In the formula (A14), $X^3$ and $X^4$ are the same as in the formula (A2). The formula (A14) corresponds to the formula (A11) where $X^{11}$ is a sulfur atom.

$R^{1x}$ represents an alkyl group optionally having a substituent, an alkenyl group optionally having a substituent, an alkynyl group optionally having a substituent, or an aromatic group optionally having a substituent. These groups have the same meaning as those described hereinabove for $R^1$ and $R^2$. Preferred substituents will be described in the section of the conjugated polymer having a recurring unit represented by the formula (P1) to be mentioned below.

[Chem. 22]

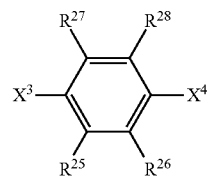

(A12)

In the formula (A12), $X^3$ and $X^4$ are the same as in the formula (A2).

$R^{25}$ and $R^{26}$ each represent a hydrogen atom, a halogen atom, a hydrocarbon group having from 1 to 20 carbon atoms and optionally having a substituent, an aromatic heterocyclic group having from 2 to 20 carbon atoms and optionally having a substituent, or an acyl group optionally having a substituent. The substituent that the hydrocarbon group, the aromatic heterocyclic group and the acyl group may have includes, for example, a fluorine atom, etc.

The a hydrocarbon group having from 1 to 20 carbon atoms and optionally having a substituent, the aromatic heterocyclic group having from 2 to 20 carbon atoms and optionally having a substituent, and the carbonyl group optionally having a substituent are the same as those defined for $R^{31}$ and $R^{32}$.

$R^{25}$ and $R^{26}$ may bond to each other to form a ring. The structure to be formed by $R^{25}$ and $R^{26}$ bonding to each other includes, for example, the following structures: —O—, —S—, —N(R)—, —C(R)(R')—, —Si(R)(R')—, —Ge(R)(R')—, —C(=O)—N(R)—C(=O)—, =N—S—N=, —N=C—, etc. (In these, R and R' each represent a hydrogen atom, an alkyl group or an aromatic group.) From 2 to 6 these structures may bond to each other to be the structure as referred to herein. The compounds may have these as the substituents of $R^{25}$ and $R^{26}$.

$R^{27}$ and $R^{28}$ each represent a hydrogen atom, a halogen atom, a hydrocarbon group having from 1 to 20 carbon atoms and optionally having a substituent, or an aromatic heterocyclic group having from 2 to 20 carbon atoms and optionally having a substituent. Above all, preferred is a halogen atom or a hydrocarbon group having from 1 to 20 carbon atoms and optionally having a substituent, and more preferred is a fluorine atom or an alkyl group having from 1 to 20 carbon atoms and optionally having a substituent.

The hydrocarbon group having from 1 to 20 carbon atoms and optionally having a substituent and the aromatic heterocyclic group having from 2 to 20 carbon atoms and optionally having a substituent are the same as those defined hereinabove for $R^{31}$ and $R^{32}$.

$R^{27}$ and $R^{28}$ may bond to each other. $R^{27}$ and $R^{28}$ may bond to each other to form a ring. The structure to be formed by $R^{31}$ and $R^{32}$ bonding to each other includes, for example, the following structures: —O—, —S—, —N(R)(R')—, —Si(R)(R')—, —Ge(R)(R')—, —C(=O)—N(R)—C(=O)—, =N—S—N=, —N=C—, etc. (In these, R and R' each represent a hydrogen atom, an alkyl group or an aromatic group.) From 2 to 6 these structures may bond to each other to be the structure as referred to herein. The compounds may have these as the substituents of $R^{27}$ and $R^{28}$.

The compounds with $R^{25}$ and $R^{26}$ bonding to each other, as represented by the following formula (A15), (compound A15) are preferred examples of the monomer.

[Chem. 23]

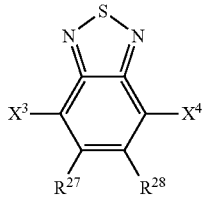

(A15)

In the formula (A15), $X^3$ and $X^4$ are the same as in the formula (A2). $R^{27}$ and $R^{28}$ are the same as in the formula (A12).

The compounds with $R^{25}$ and $R^{26}$ bonding to each other, as represented by the following formula (A16), (compound A16) are also preferred examples of the monomer.

[Chem. 24]

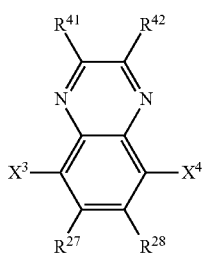

(A16)

In the formula (A16), $X^3$ and $X^4$ are the same as in the formula (A2). $R^{27}$ and $R^{28}$ are the same as in the formula (A12). $R^{41}$ and $R^{42}$ each represent a hydrogen atom, a halogen atom, a hydrocarbon group having from 1 to 20 carbon atoms and optionally having a substituent, an aromatic heterocyclic group having from 2 to 20 carbon atoms and optionally having a substituent, an alkoxy group optionally having a substituent, or an aryloxy group optionally having a substituent, and are the same as in the formula (A12).

$R^{41}$ and $R^{42}$ may bond to each other. The a halogen atom, the hydrocarbon group having from 1 to 20 carbon atoms and optionally having a substituent, the aromatic heterocyclic group having from 2 to 20 carbon atoms and optionally having a substituent, the alkoxy group optionally having a substituent and the aryloxy group optionally having a substituent are the same as those mentioned hereinabove for $R^6$ and $R^7$.

Above all, preferred are a hydrocarbon group optionally having a substituent, an alkoxy group optionally having a substituent and an aryloxy group optionally having a substituent from the viewpoint of improving the solubility of the compound; and more preferred are an alkoxy group optionally having a substituent and an alkyl group optionally having a substituent.

[Chem. 25]

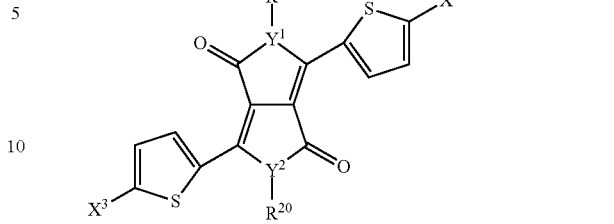

(A13)

In the formula (A13), $X^3$ and $X^4$ are the same as in the formula (A2). $Y^1$ and $Y^2$ each independently represent an atom selected from Group 15 elements of the Periodic Table. Above all, preferred are a nitrogen atom and a phosphorus atom, and more preferred is a nitrogen atom. $R^{19}$ and $R^{20}$ each represent a hydrogen atom, a halogen atom, or a hydrocarbon group having from 1 to 20 carbon atoms and optionally having a substituent. The halogen atom and the hydrocarbon group having from 1 to 20 carbon atoms and optionally having a substituent are the same as those described hereinabove for the substituents in the formula (A 12).

Above all, preferred is a hydrocarbon group having from 1 to 20 carbon atoms and optionally having a substituent, from the viewpoint of improving the solubility of the compound; and more preferred is an alkyl group having from 1 to 20 carbon atoms and optionally having a substituent.

[Chem. 26]

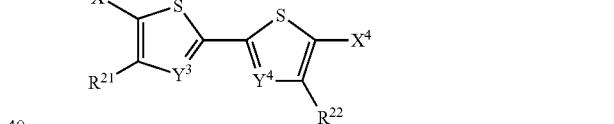

(A17)

In the formula (A17), $X^3$ and $X^4$ are the same as in the formula (A2).

$Y^3$ and $Y^4$ each independently represent a nitrogen atom or a carbon atom having one substituent ($C(R^{43})$). $Y^3$ and $Y^4$ may be the same or different but are preferably the same from the viewpoint of easiness in compound production. In case where $Y^3$ and $Y^4$ both are carbon atoms having one substituent ($C(R^{43})$), the substituents ($R^{43}$) may bond to each other to form a ring.

$R^{43}$ represents a hydrogen atom, a halogen atom, a hydrocarbon group having from 1 to 20 carbon atoms and optionally having a substituent, or an aromatic heterocyclic group having from 2 to 20 carbon atoms and optionally having a substituent, for which the description made for the formula (A12) may be referred to.

$R^{21}$ and $R^{22}$ each represent a hydrogen atom, a halogen atom, a hydrocarbon group having from 1 to 20 carbon atoms and optionally having a substituent, or an aromatic heterocyclic group having from 2 to 20 carbon atoms and optionally having a substituent, for which the description made for the formula (A12) may be referred to. Above all, preferred is a hydrocarbon group having from 1 to 20 carbon atoms and optionally having a substituent from the viewpoint of improving the solubility of the compound; and more preferred is an alkyl group having from 1 to 20 carbon atoms and optionally having a substituent.

As preferred examples of the compound of the formula (A17), mentioned are the following compounds.

[Chem. 27]

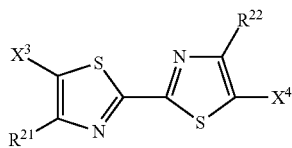
(A18)

In the formula (A18), $X^3$ and $X^4$ are the same as in the formula (A2). $R^{21}$ and $R^{22}$ are the same as in the formula (A17).

In case where $Y^3$ and $Y^4$ both are carbon atoms having one substituent ($C(R^{43})$), the substituents ($R^{43}$) may bond to each other to form a ring. Preferred compounds of the type are mentioned below.

[Chem. 28]

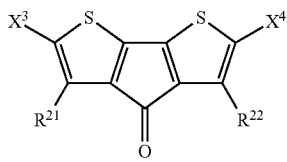
(A19)

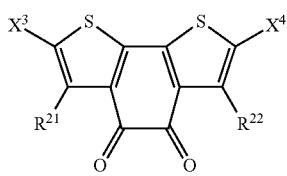
(A20)

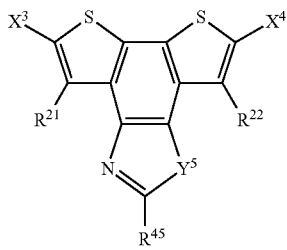
(A21)

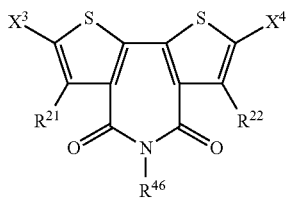
(A22)

In the formula (A19) to the formula (A22), $X^3$ and $X^4$ are the same as in the formula (A2). In the formula (A19) to the formula (A22), $R^{21}$ and $R^{22}$ are the same as in the formula (A17).

$Y^6$ represents an oxygen atom, a sulfur atom, or a nitrogen atom having a substituent ($N(R^{44})$). Above all, preferred is a sulfur atom from the point of improving the semiconductor characteristics of the compound. As $R^{44}$, there are mentioned the same groups as those mentioned hereinabove for $R^{43}$.

As $R^{45}$, there are mentioned the same groups as those mentioned hereinabove for $R^{43}$.

As $R^{46}$, there are mentioned the same groups as those mentioned hereinabove for $R^{1x}$.

Examples of the compound represented by the formula (A1) include, for example, the following:

[Chem. 29]

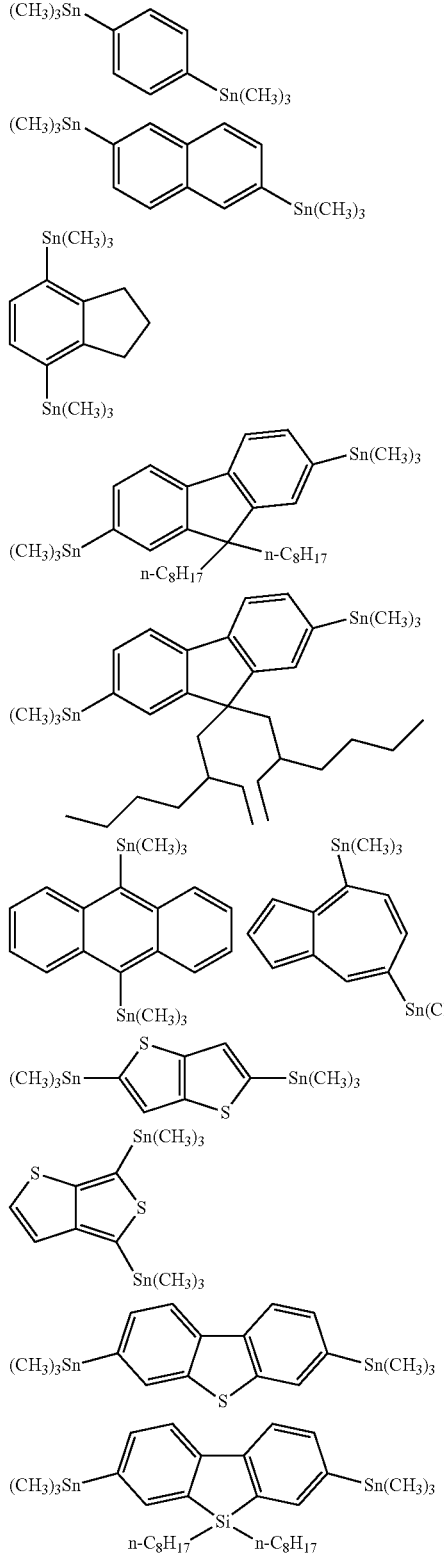

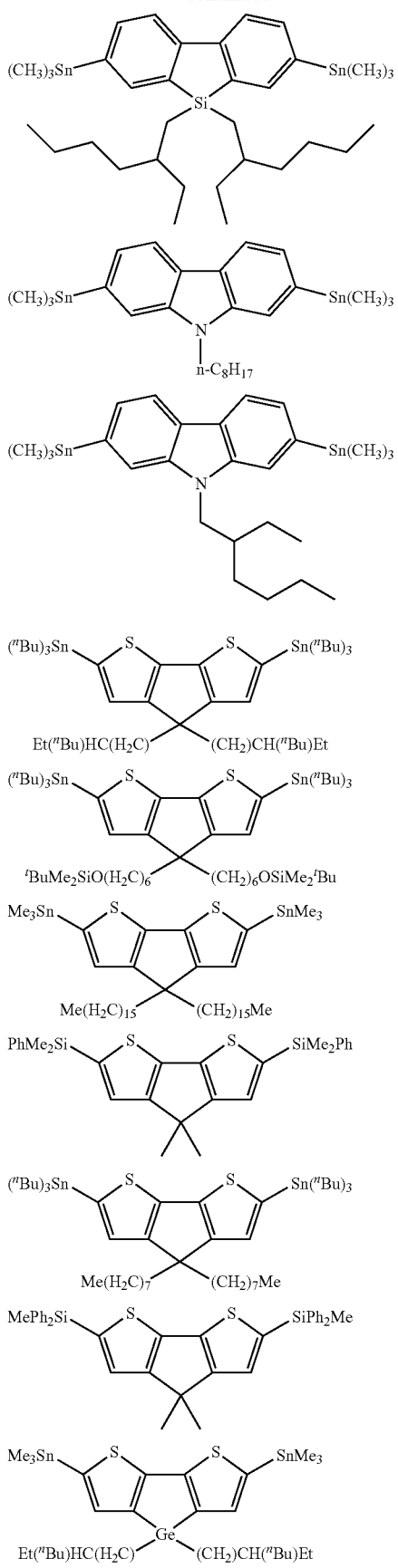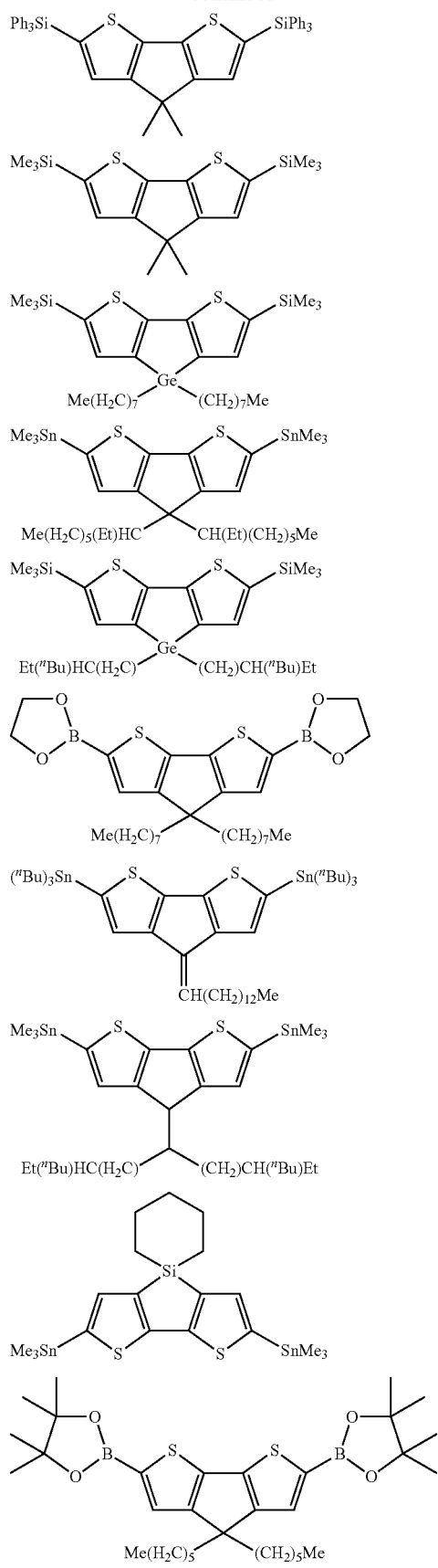

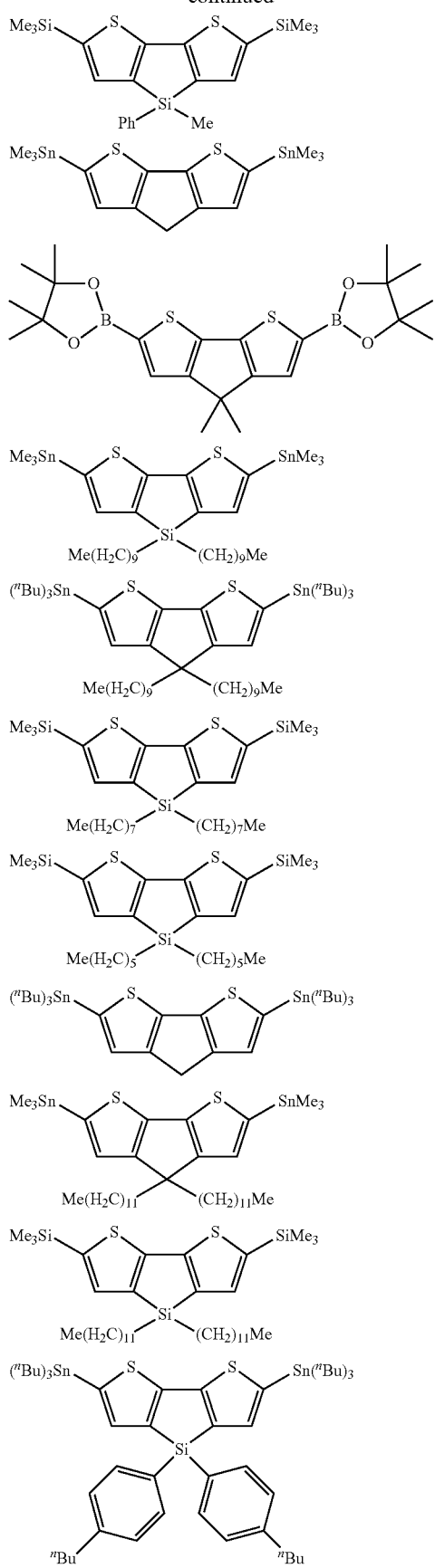
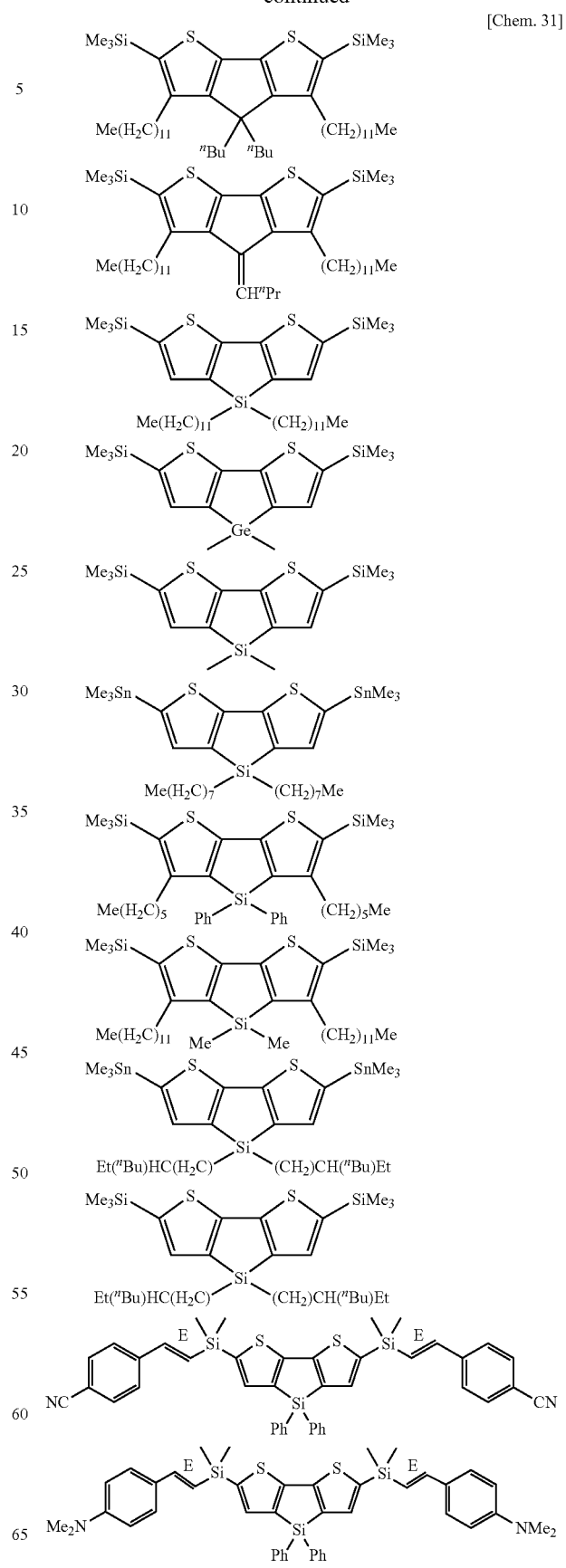

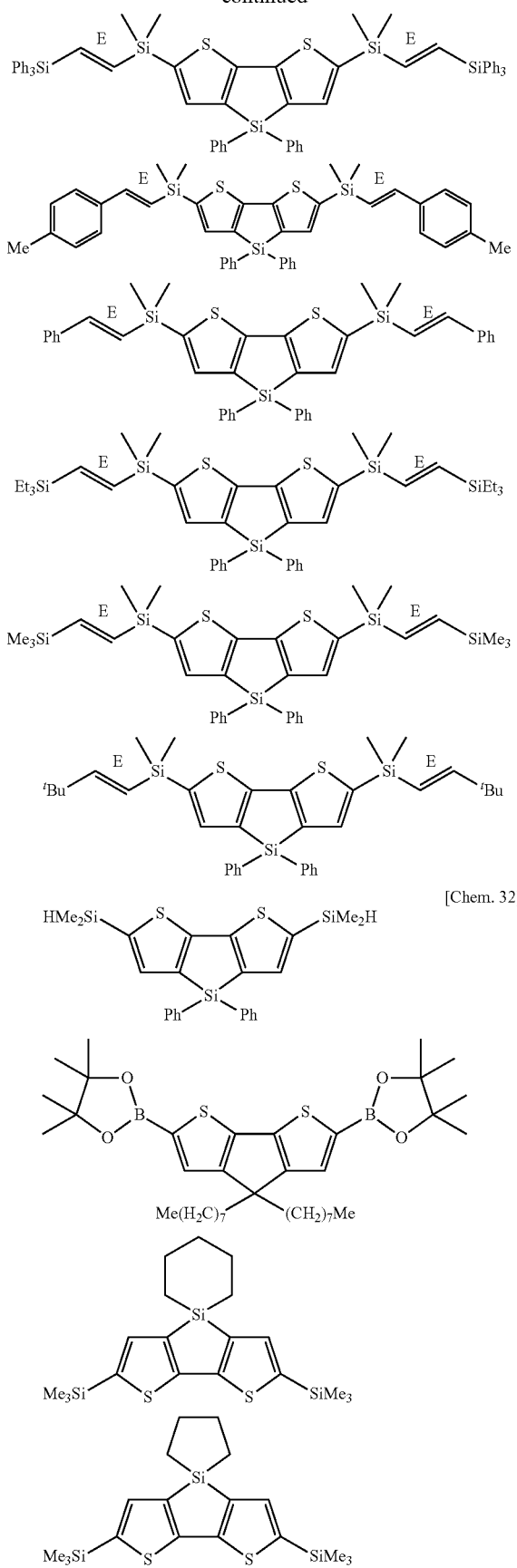
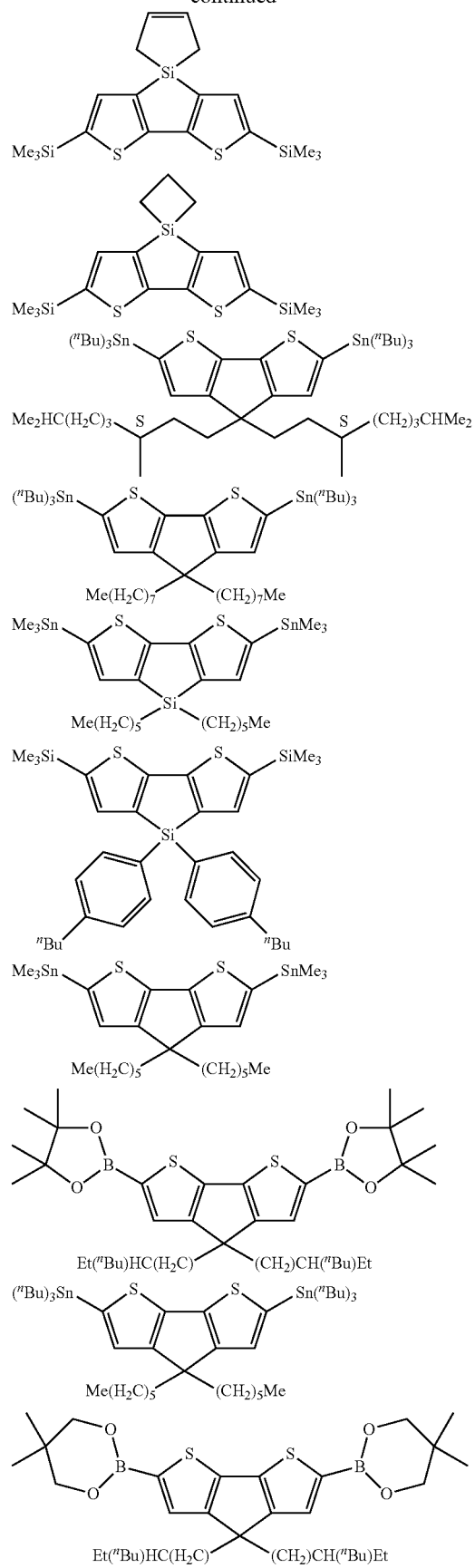

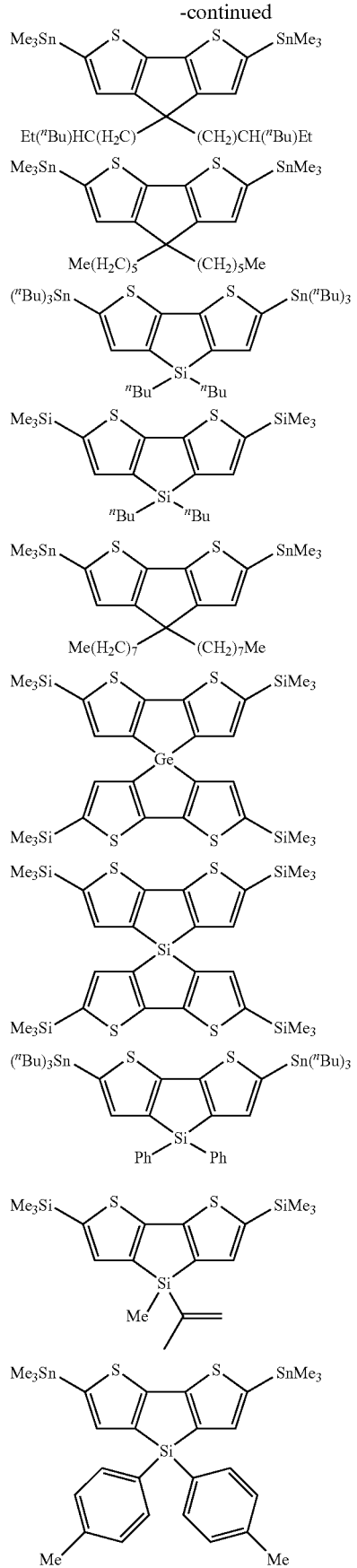
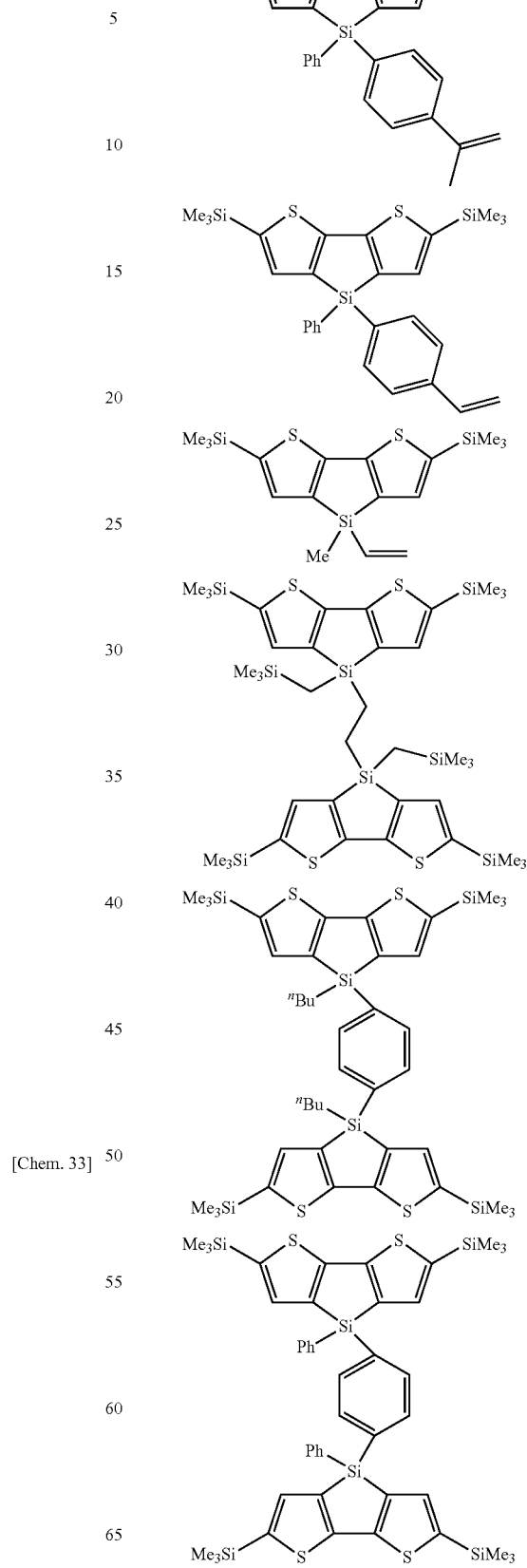
[Chem. 33]

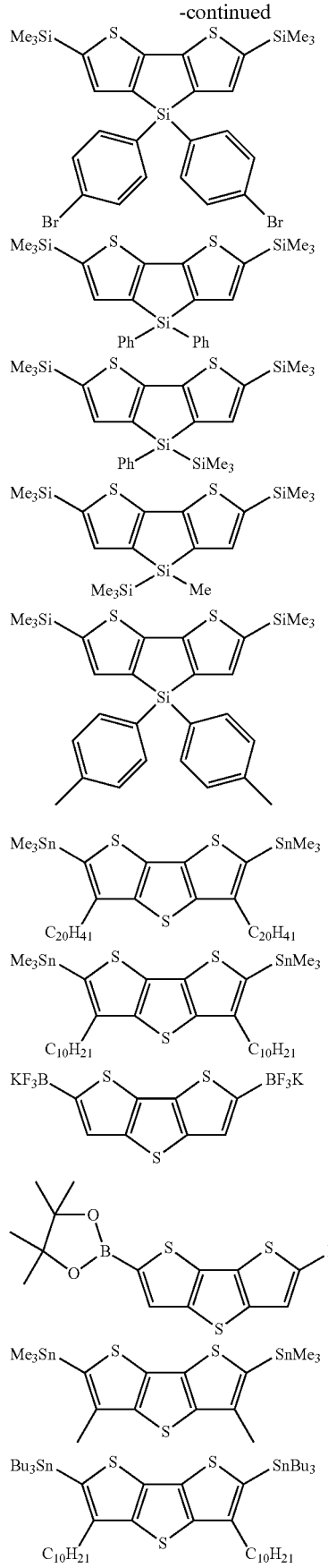
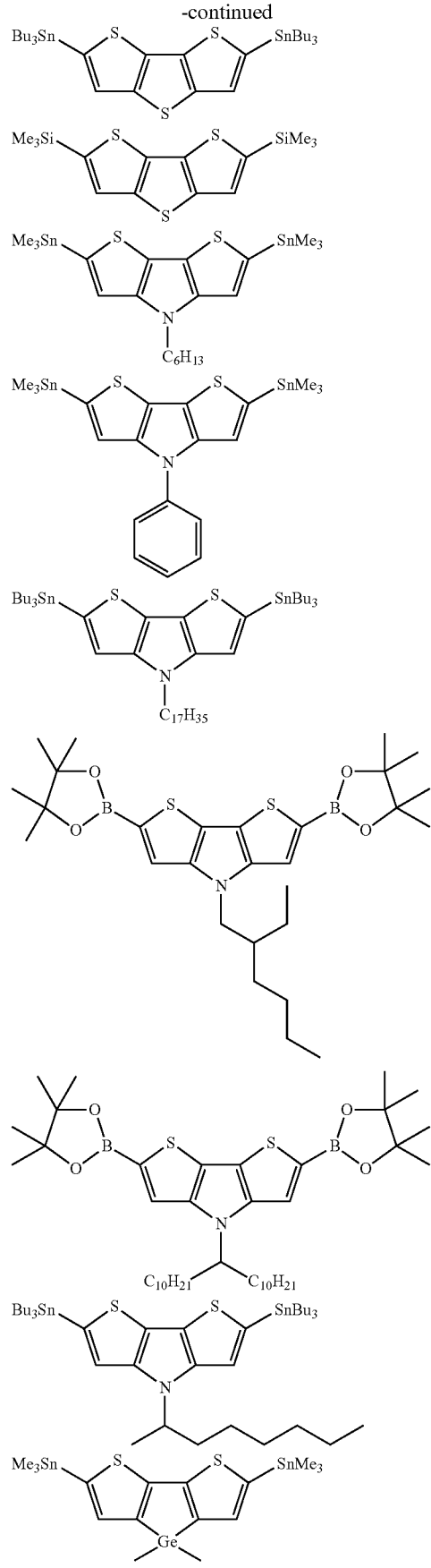

-continued
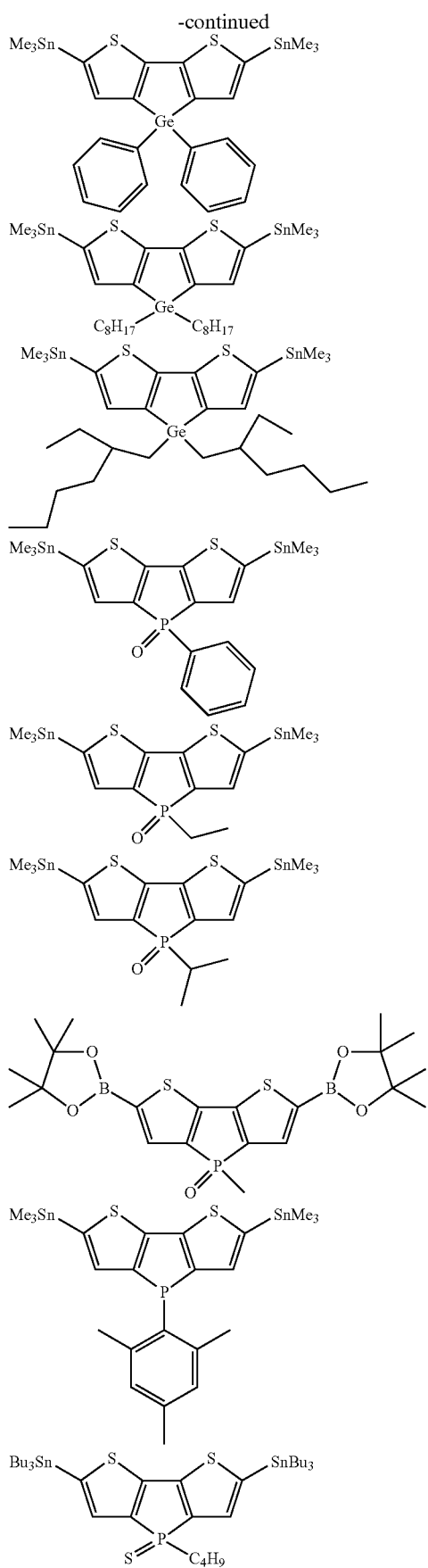
-continued
[Chem. 35]
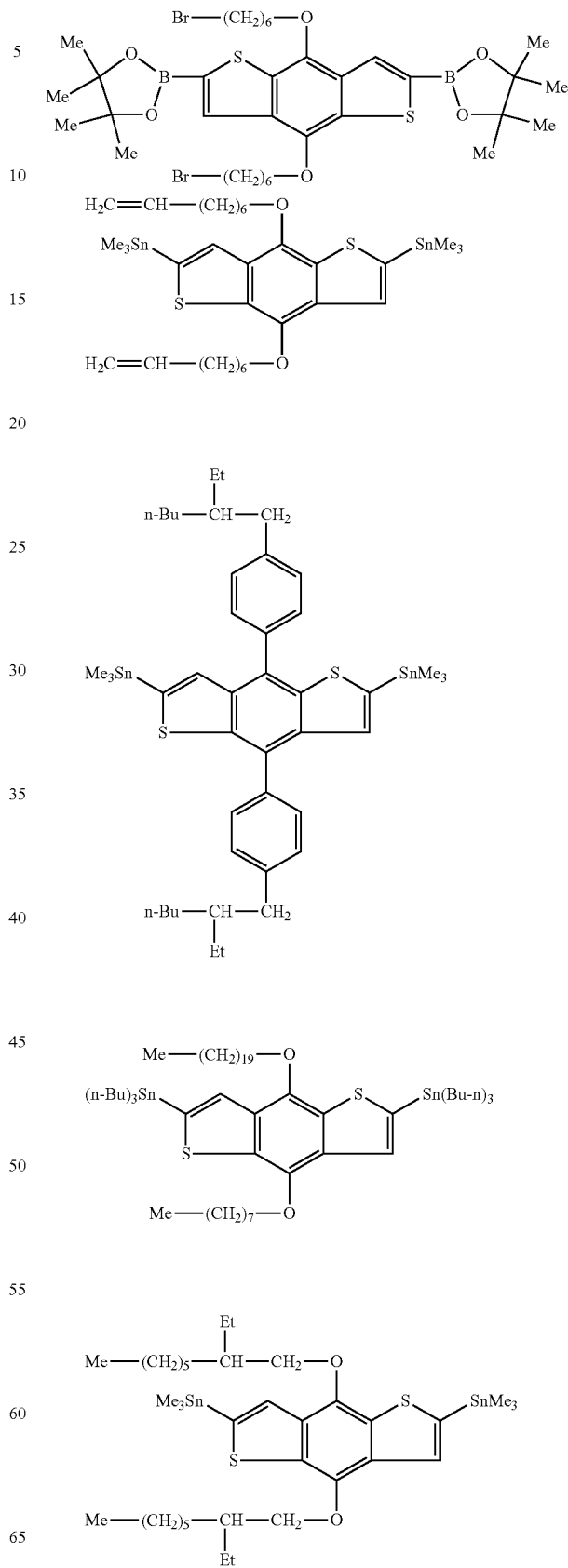

49
-continued
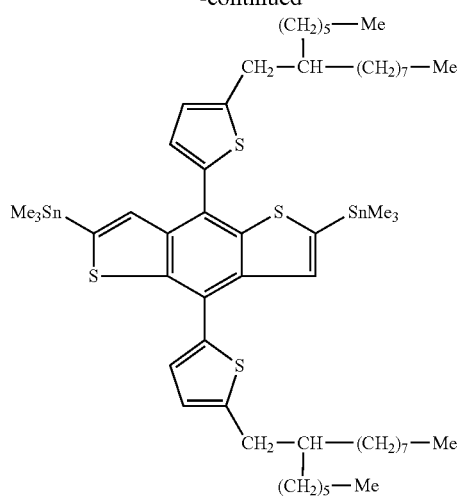
[Chem. 36]
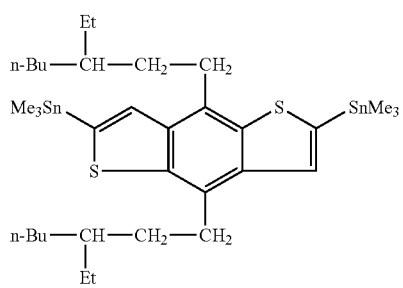
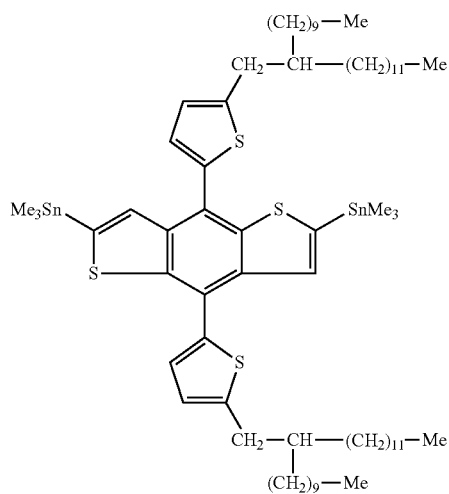
50
-continued
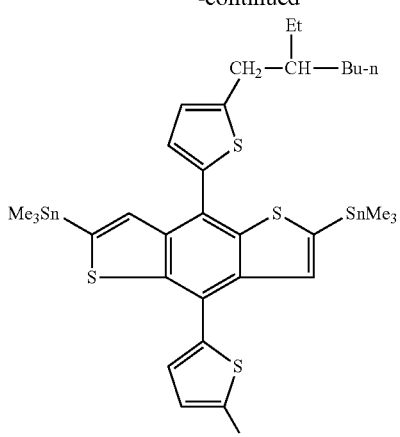
[Chem. 37]
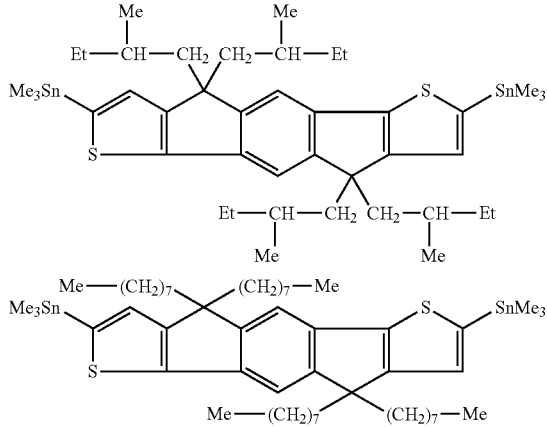

51
-continued
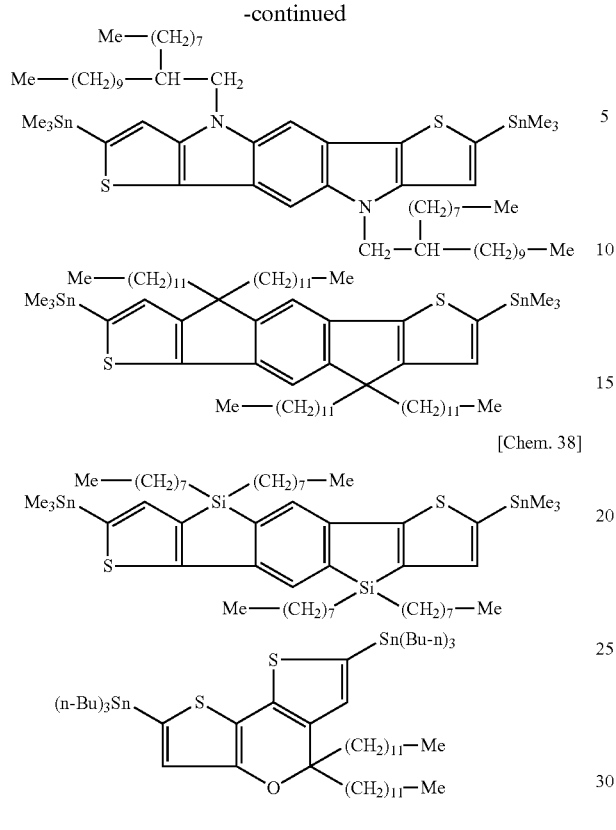
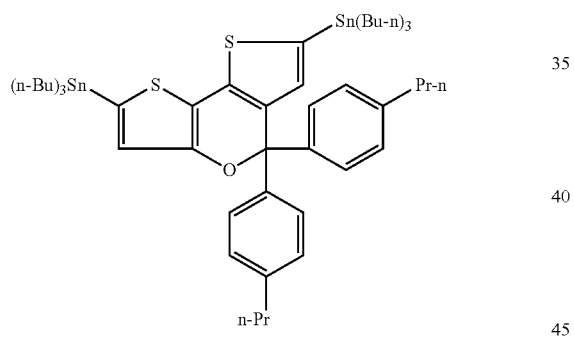
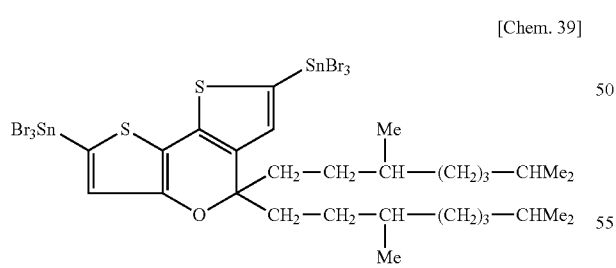
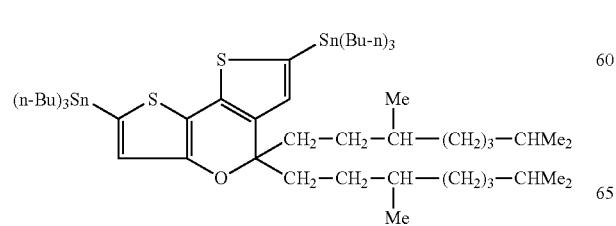
52
-continued
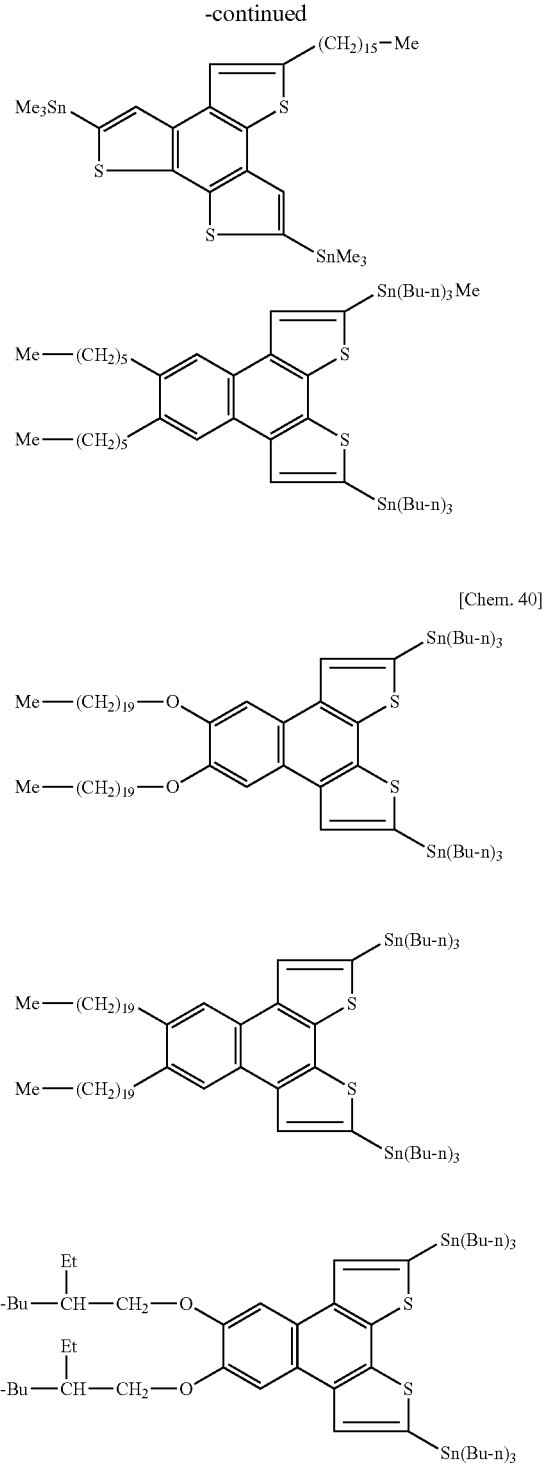
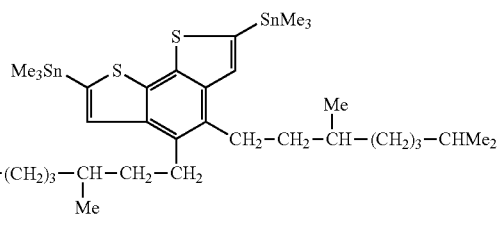

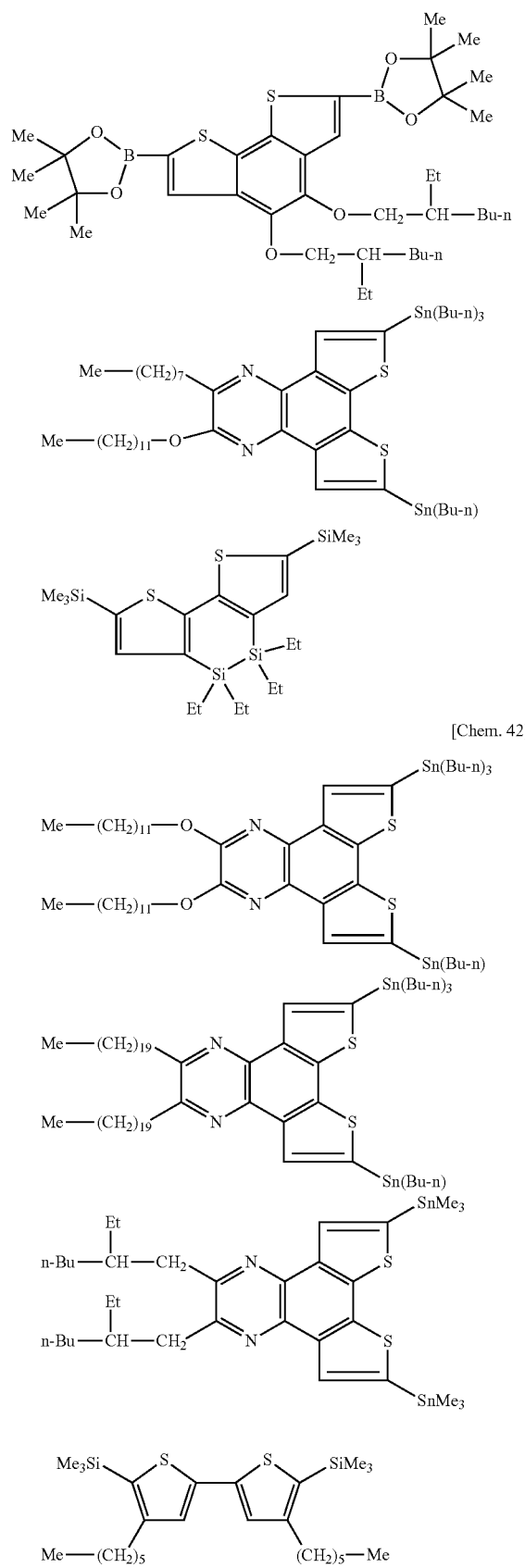
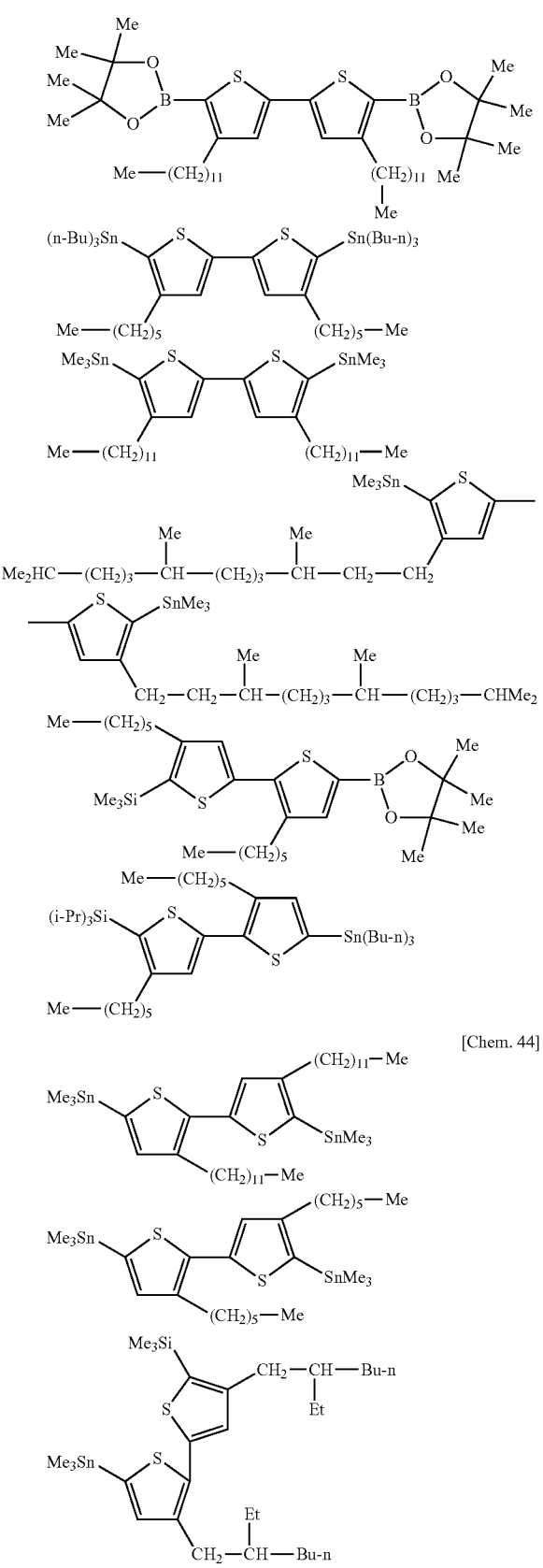

Examples of the compound represented by the formula (A2) include, for example, the following:
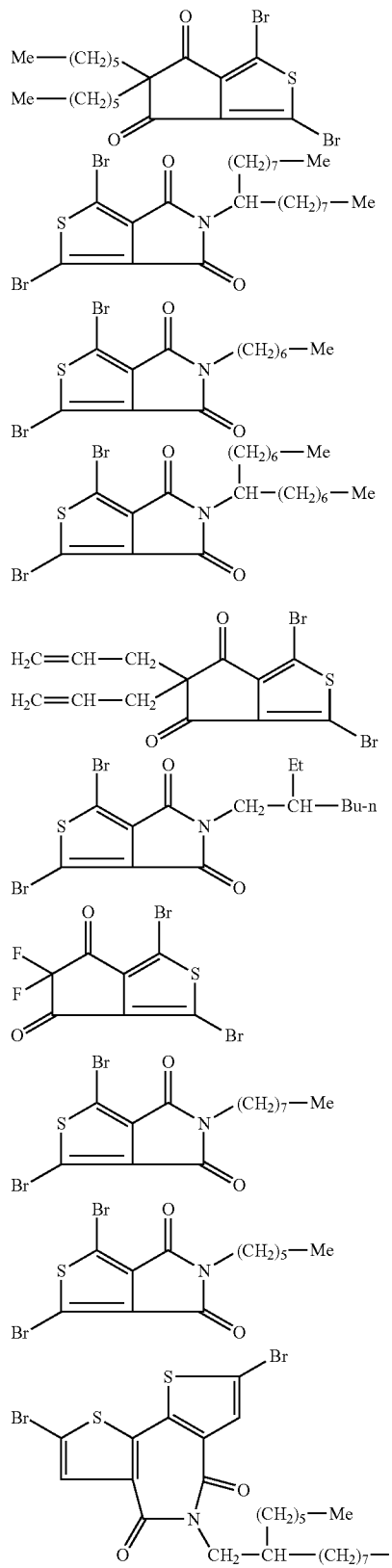
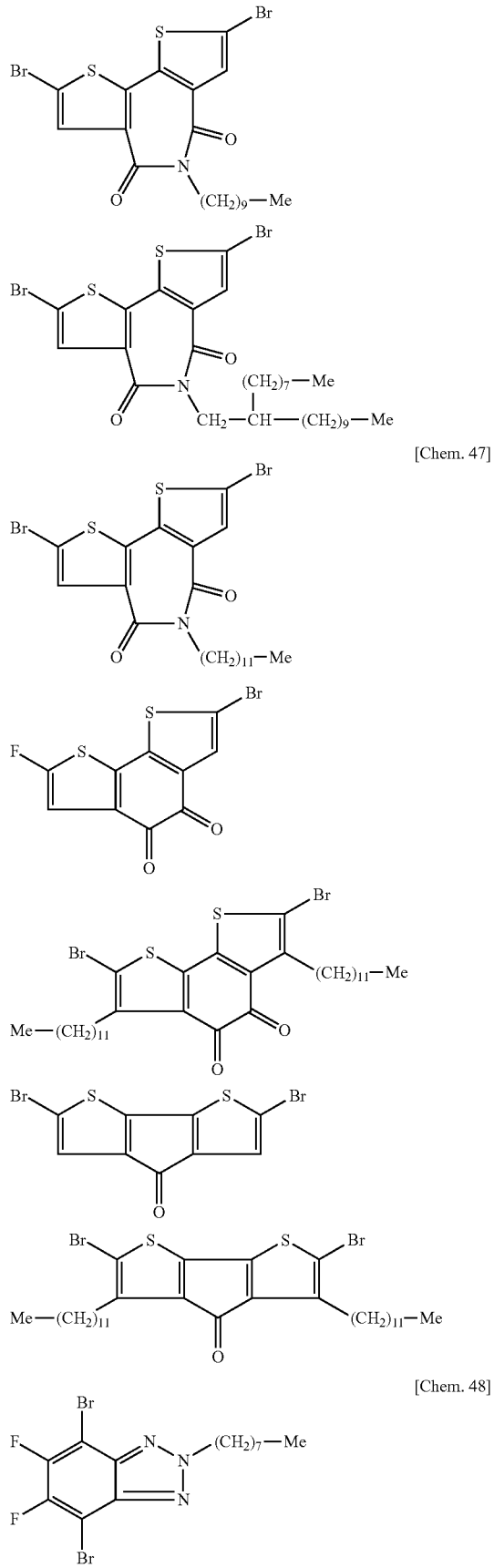

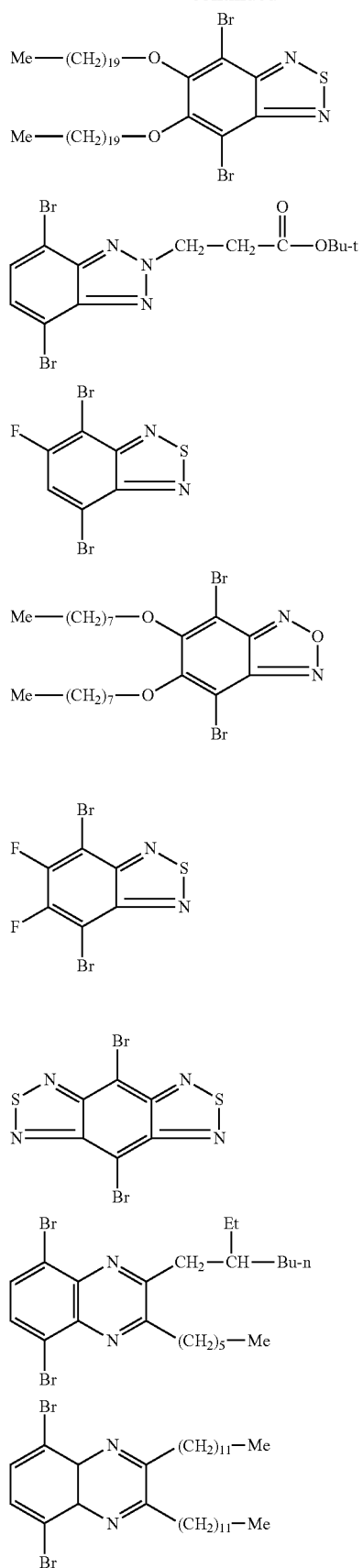
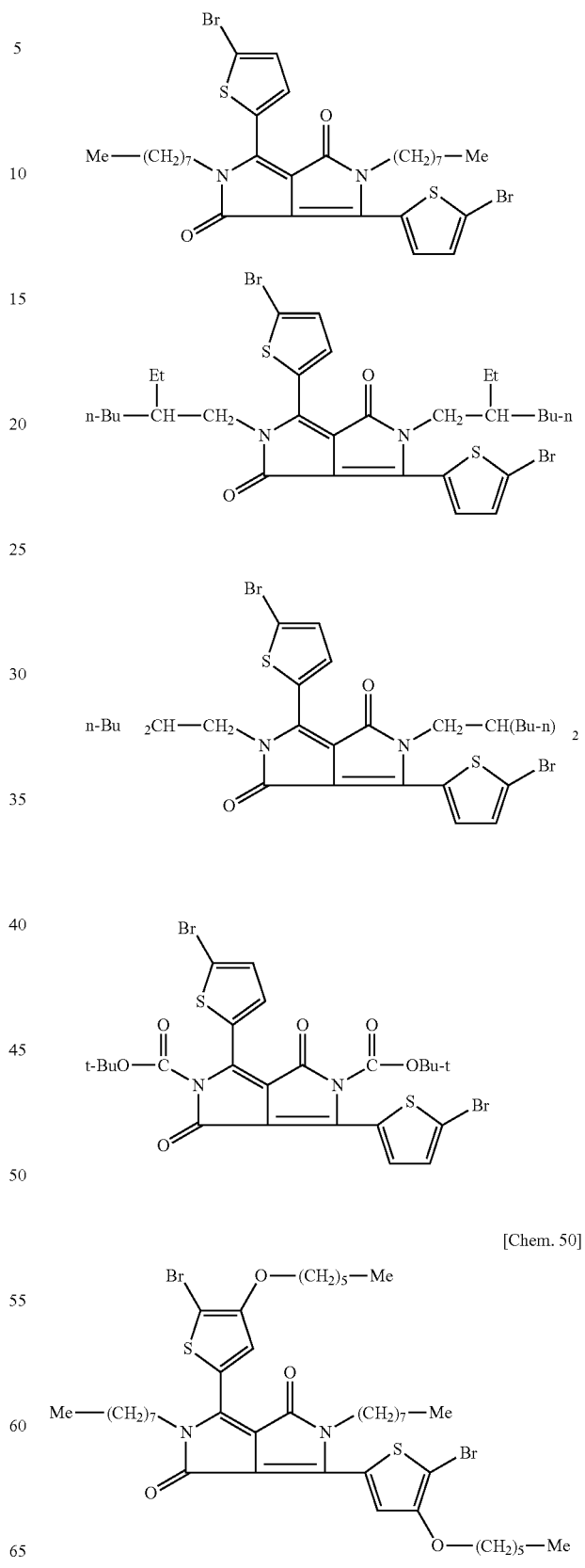

-continued

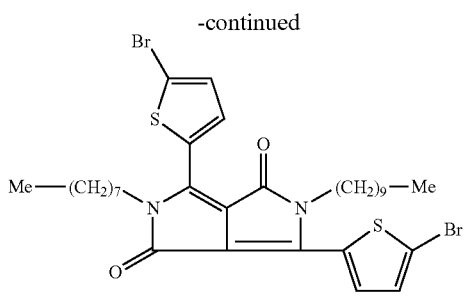

[Production Method for Monomer]

The method for producing the monomer in the invention is not specifically defined, and the monomer may be produced according to any known method. For example, the compound represented by the formula (A7) may be produced according to the method described in J. Mater. Chem., 21, 3895 (201), and J. Am. Chem. Soc., 130, 16144-16145 (2008).

The compound represented by the formula (A8) may be produced according to the method described in Journal of the American Chemical Society (2009), 131 (22), 7792-7799.

The compound represented by the formula (A9) may be produced according to the method described in Chemical Communications (Cambridge, United Kingdom) (2010), 46 (35), 6503-6505.

The compound represented by the formula (A10) may be produced according to the method described in WO2011/052709.

The compound represented by the formula (A13) may be produced according to the method described in Advanced Materials (Weinheim, Germany) (2008), 20 (13), 2556-2560, or Macromolecules (Washington, D.C., United States) (2009), 42 (17), 6564-6571.

The compound represented by the formula (A14) may be produced according to the method described in J. Am. Chem. Soc., 132, 7595-7597 (2010).

The compound represented by the formula (A15) may be produced according to the method described in Advanced Materials (Weinheim, Germany) (2003), 15 (12), 988-991, or Macromolecules (2005), 38 (2), 244-253.

The compound represented by the formula (A16) may be produced according to the method described in Macromolecules (Washington, D.C., United States) (2008), 41 (16), 6012-6018, or Advanced Functional Materials (2007), 17 (18), 3836-3842.

The compound represented by the formula (A18) may be produced according to the method described in Journal of the American Chemical Society (2007), 129 (46), 14372-14380, or Chemistry of Materials (1999), 11 (2), 458-465.

The compound represented by the formula (A19) may be produced according to the method described in Chemistry of Materials (2004), 16 (19), 3667-3676, or Macromolecules (Washington, D.C., United States) (2008), 41 (18), 6664-6671.

The compound represented by the formula (A20) may be produced according to the method described in Chemistry—A European Journal (2010), 16 (6), 1911-1928, or WO2009/115413.

The compound represented by the formula (A21) may be produced according to the method described in WO2010/136401.

The compound represented by the formula (A22) may be produced according to the method described in Journal of the American Chemical Society (2008), 130 (30), 9679-9694, or Journal of the American Chemical Society (2011), 133 (5), 1405-1418.

The composition obtained after synthesis reaction may be brought into contact with zeolite to purify the above-mentioned compound. The embodiment is preferred from the viewpoint of improving the polymer synthesis efficiency, since decomposed products of the compound would not be produced as side products and since impurities could be removed.

<3. Reaction Condition>

Reaction conditions for the coupling reaction are described in detail hereinunder.

[Chem. 51]

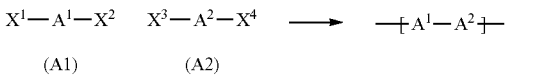

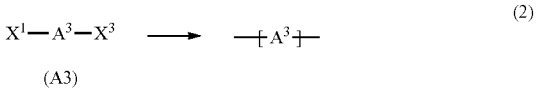

For obtaining a conjugated polymer according to the above-mentioned reaction formulae (1) and (2), active groups (above $X^1$ to $X^4$) are needed. For obtaining the conjugated polymer as one having a high molecular weight, it is necessary that the monomer is converted into an oligomer within a short period of time so as to prevent the active group from being decomposed. Since the active group decomposition speed of the oligomer tends to lower, the oligomer could resist more to long-term stirring under heat than the monomer.

From this viewpoint, for obtaining a conjugated polymer having a high molecular weight, it is desirable that, first using a transition metal complex catalyst having a large TOF (turnover frequency), a monomer is converted into an oligomer within a short period of time, and subsequently using a transition metal complex catalyst having a large TON (turnover number), the reaction is fully promoted. By taking a good balance between TOF and TON, a conjugated polymer can be obtained effectively.

Concretely, a transition metal complex catalyst having a large TOF may be a homogeneous transition metal complex catalyst and a transition metal complex having a large TON may be a heterogeneous transition metal complex catalyst; a transition metal complex catalyst having a large TOF may be a homogeneous transition metal complex catalyst and a transition metal complex having a large TON may be a heterogeneous transition metal complex catalyst.

<3.1 Catalyst and Catalyst Amount>

Of the two or more kinds of transition metal complex catalysts, it is desirable that one has a large TON (turnover number) and the other has a high reactivity (for example, having a high reaction speed (turnover frequency (TOF))) for obtaining a conjugated polymer having a high molecular weight. Also preferably, the respective transition metal complex catalysts have the same type of transition metal in order not to make the reaction complicated.

However, in case where the active species are generated from the individual metal salts and ligands, the above shall not apply to the case. The catalyst amount is generally $1 \times 10^{-4}$ mol % or more, preferably $1 \times 10^{-3}$ mol % or more, more preferably $1 \times 10^{-2}$ mol % or more; while on the other hand, the catalyst amount is generally 5 mol % or less, more preferably 3 mol % or less. The catalyst amount falling within the range is preferred from the viewpoint that the reaction speed could be increased and the amount of the transition metal to remain in the conjugated polymer could be reduced.

Here, in coupling the compound A1 and the compound A2 as in the reaction formula (1), the catalyst amount is represented by the molar ratio relative to the compound of which the amount is smaller. In coupling the compound A3 to each other as in the reaction formula (2), the catalyst amount is represented by the molar ratio relative to the compound A3.

For obtaining a conjugated polymer having a higher molecular weight, it is desirable that the homogeneous transition metal complex catalyst and the heterogeneous transition metal complex catalyst are mixed at the same time in the monomer-containing solution. Here, mixing the two at the same time means that the distance between the time when one is put into the solution and the time when the other is put into the solution is within 10 minutes or less.

A catalyst composition for conjugated polymer production, which contains one or more homogeneous transition metal complex catalysts and one or more heterogeneous transition metal complex catalysts, is prepared and the composition may be added to the monomer-containing solution at the start of the reaction; and the method is preferred for facilitating the reaction control.

The catalyst composition for conjugated polymer production may contain a solvent for use in the reaction, in addition to the above-mentioned transition metal complex catalysts. Not detracting from the advantageous effects of the invention, the catalyst composition for conjugated polymer production may contain any additive such as dispersant, etc.

In case where an acceptor-like compound and a donor-like compound are coupled, it is desirable to employ cross-coupling reaction. Of cross-coupling reaction, more preferred is use of Suzuki-Miyaura reaction, Negishi reaction, Stille reaction, or Hiyama reaction.

Especially when a heterocyclic compound having a thiophene ring is coupled, preferred is use of Stille reaction, Negishi reaction or Hiyama reaction. In particular, Stille reaction is preferred as increasing the pace of the catalyst cycle.

The catalyst for cross-coupling is preferably a late transition metal catalyst from the viewpoint of the reactivity thereof. Especially preferred is use of palladium, nickel, iron or copper as the transition metal. The ligand is preferably a phosphine ligand such as that mentioned above from the viewpoint of the reactivity, and especially preferred is use of a trialkyl phosphine or a triaryl phosphine.

Examples of using Stille reaction for synthesis of electronic materials are summarized in Yu et al's Chem. Rev., 111, 1493-1528 (2011). In case of using Stille reaction, $X^1$ and $X^2$ in the reaction formulae (1) and (2) each are an alkylstannyl group, and $X^3$ and $X^4$ each are a halogen atom. Preferably, Stille coupling reaction is carried out in a nitrogen ($N_2$) or argon (Ar) atmosphere.

<3.2 Amount of Monomer>

In case where the compound A1 and the compound A2 are coupled as in the reaction formula (1), the molar ratio of the compound A2 to the compound A1 may vary depending on the molecular weight distribution of the conjugated polymer to be obtained, but is generally 0.75 or more, preferably 0.85 or more, and is, on the other hand, generally 1.3 or less, preferably 1.2 or less.

In particular, in case where the imidothiophene derivative compound A14 represented by the formula (A14) and the tri-condensed ring compound A7 represented by the formula (A7) are coupled, the molar ratio of the compound A14 to the compound A7 is generally 0.9 or more, preferably 0.95 or more, and is, on the other hand, generally 1.3 or less, preferably 1.2 or less. The above range secures production of a high-molecular-weight product at a higher yield.

<3.3 Solvent>

The solvent to be used in the reaction includes, for example, saturated hydrocarbons such as pentane, hexane, heptane, octane, cyclohexane, etc.; aromatic hydrocarbons such as benzene, toluene, ethylbenzene, xylene, etc.; halogenoaromatic hydrocarbons such as chlorobenzene, dichlorobenzene, trichlorobenzene, fluorobenzene, etc.; alcohols such as methanol, ethanol, propanol, isopropanol, butanol, t-butyl alcohol, etc.; water; ethers such as dimethyl ether, diethyl ether, methyl t-butyl ether, tetrahydrofuran, tetrahydropyran, dioxane, etc.; amine solvents such as butylamine, triethylamine, diisopropylethylamine, diisopropylamine, diethylamine, pyrrolidine, piperidine, pyridine, etc.; aprotic polar organic solvents such as N,N-dimethylformamide, dimethylsulfoxide, N-methylpyrrolidone, etc. For improving the solubility of the conjugated polymer to be produced, one alone of the solvents may be used, or two or more such solvents may be used in combination.

The amount of the solvent to be used is generally $1 \times 10^{-2}$ mL or more relative to 1 g of the total weight, preferably $1 \times 10^{-1}$ mL or more, more preferably 1 mL or more, for sufficiently dissolving the monomer and the conjugated polymer to be produced. On the other hand, for facilitating the purification of the conjugated polymer, the amount is generally $1 \times 10^5$ mL or less, preferably $1 \times 10^3$ mL or less, more preferably $2 \times 10^2$ mL or less.

<3.4 Reaction Atmosphere>

For preventing the monomer and the produced conjugated polymer from being deteriorated, the reaction is preferably carried out in an inert gas. In particular, it is desirable to carry out the reaction in a nitrogen atmosphere or an argon atmosphere. However, for oxidative coupling, it is unnecessary to carry out the reaction in an inert gas.

<3.5 Reaction Temperature>

The reaction temperature is not specifically defined. In general, the reaction is carried out at room temperature or higher, or at a temperature not higher than the boiling point of the solvent. For increasing the reaction speed, the system may be pressurized and/or heated in an autoclave or with microwaves.

<3.6 Reaction Time>

The reaction time depends on the reactivity of the monomer. From the viewpoint of fully completing the reaction within a short period of time, the reaction time is generally 5 minutes or more, preferably 30 minutes or more, more preferably 1 hour or more, and is, on the other hand, generally 48 hours or less, preferably 24 hours or less, more preferably 15 hours, even more preferably 12 hours, still more preferably 6 hours, further more preferably 3 hours. The period does not include the time to be taken for the terminal treatment to be mentioned below. In general, whether or not the reaction has completed is confirmed according to a method of analytical GPC or the like, and then the product is processed for the terminal treatment to be mentioned below.

<3.7 Reaction Scale>

The reaction scale of the production method of the invention is not specifically defined. It may be a small scale for 500 mg or more and 5 g or less or so, or may be a large scale for 5 g or more. The upper limit of the large scale is not specifically defined. In the production method of the invention, a monomer is converted into an oligomer within a short period of time while the active group in the monomer is prevented from being decomposed, and the oligomer, in which the decomposition speed of the active group tends to lower, is polymerized through coupling reaction; and consequently, it is considered that, as compared with already-existing reaction systems, the production method of the invention could be a more stable synthesis system, or that is, a reaction system having high reproducibility. Accordingly, it is considered that the production method of the invention could be a reaction system more suitable for large-scale production that is required to secure reproducibility.

<3.8 Base>

In addition to the monomer, the catalyst and the solvent, a base may be further added to the reaction solution. Adding a base is preferred from the point of increasing the reaction speed. Examples of the base include inorganic bases such as sodium hydrogencarbonate, sodium carbonate, potassium carbonate, cesium carbonate, calcium carbonate, calcium phosphate, sodium hydroxide, potassium hydroxide, cesium hydroxide, cerium fluoride, potassium fluoride, etc.; organic bases such as potassium t-butoxide, sodium t-butoxide, sodium methoxide, sodium ethoxide, pyridine, lutidine, di(t-butyl)pyridine, triethylamine, lithium diisopropylamide, lithium hexamethyldisilazide, t-butyllithium, n-butyllithium, etc. In particular, adding a cesium salt or a fluoride salt is preferred from the point of more promoting the reaction.

<3.9 Phase-Transfer Catalyst>

In addition to the monomer, the catalyst and the solvent, a phase-transfer catalyst may be further added to the reaction solution. Examples of the phase-transfer catalyst include ammonium salts, heterocyclic ammonium salts, phosphonium salts, etc. In case where a two-layer solvent is used here, trialkylammonium bromide, trialkylammonium chloride, trialkylammonium iodide, tetrabutylphosphonium bromide, tetraethylammonium phosphonium chloride, Aliquant, ionic liquid or the like may be used as a phase-transfer catalyst.

The amount of the phase-transfer catalyst to be used is generally $1 \times 10^{-4}$ mol % or more, preferably $1 \times 10^{-3}$ mol % or more, more preferably $1 \times 10^{-2}$ mol % or more, and is, on the other hand, generally 5 mol % or less, more preferably 3 mol % or less. The amount of the phase-transfer catalyst falling within the range is preferred from the point of increasing more the reaction speed and from the point of reducing the contamination of the conjugated polymer by the phase-transfer catalyst. The definition of the amount of the phase-transfer catalyst to be used is the same as that of the amount of the catalyst described above.

<3.10 Purification>

After the coupling reaction, the product is, after quenched in water, extracted with an organic solvent according to a known method, and then the organic solvent is evaporated away in ordinary post-treatment to give a crude conjugated polymer. Subsequently, for removing metal therefrom, the crude conjugated polymer is preferably purified through reprecipitation purification, Soxhlet extraction or gel permeation chromatography or by a scavenger. Above all, reprecipitation is preferred as enabling purification of a large amount of the conjugated polymer.

<3.11 Terminal Treatment>

Preferably, the conjugated polymer after polymerization is processed for terminal treatment. Terminal treatment of the conjugated polymer reduces the residual amount of halogen atom such as bromine (Br), iodine (I) or the like or the terminal residue (above $X^1$ to $X^4$) such as alkylstannyl group contained in the conjugated polymer. The terminal treatment is preferred for obtaining a conjugated polymer having better performance in point of the semiconductor performance and the durability thereof.

The terminal treatment method for the conjugated polymer is not specifically defined, for which the following methods may be mentioned. In case where the conjugated polymer is obtained through Stille coupling reaction, the product may be processed for terminal treatment for the halogen atom such as bromine (Br), iodine (I) or the like and the alkylstannyl group existing at the terminal of the conjugated polymer.

Regarding the treatment method for halogen atom, an aryltrialkyltin serving as a terminal treating agent is added to the reaction system, which is then stirred under heat. Through this operation, the halogen atom existing at the terminal of the conjugated polymer may be converted to an aryl group. This is preferred as capable of stabilizing more the conjugated polymer according to the conjugation stabilization effect.

Examples of the aryltrialkyltin usable here include phenyltrimethyltin, thienyltrimethyltin, etc. The amount of the aryltrialkyltin to be added is not specifically defined. In general, the amount is $1.0 \times 10^{-2}$ equivalents or more relative to the monomer having a halogen atom (compound A2), preferably 0.1 equivalents or more, more preferably 1 equivalent or more, and is, on the other hand, generally 50 equivalents or less, preferably 20 equivalents or less, more preferably 10 equivalents or less. The heating time is not also specifically defined. In general, the time is 30 minutes or more, preferably 1 hour or more, and is, on the other hand, generally 50 hours or less, preferably 20 hours or less. The reaction carried out under the reaction condition as above enables the intended terminal treatment within a shorter period of time and at a hither conversion ratio.

Regarding the treatment method for the alkylstannyl group, an aryl halide serving as a terminal treating agent is added to the reaction system, which is then stirred under heat. Through the operation, the alkynstannyl group existing at the terminal of the conjugated polymer can be converted into an aryl group. This is preferred as capable of stabilizing more the conjugated polymer according to the conjugation stabilization effect. In addition, since the alkylstannyl group that is easy to thermally decompose is removed from the conjugated polymer, the conjugated polymer could be expected to be prevented from being deteriorated with time.

Examples of the aryl halide usable here include iodothiophene, iodobenzene, bromothiophene, bromobenzene, etc. The amount of the aryl halide to be added is not specifically defined. The amount is generally $1.0 \times 10^{-2}$ equivalents or more relative to the alkylstannyl group-having monomer (compound A 1), preferably 0.1 equivalents or more, more preferably 1 equivalent or more, and is, on the other hand, generally 50 equivalents or less, preferably 20 equivalents or less, more preferably 10 equivalents or less. The heating time is not also specifically defined. In general, the time is 30 minutes or more, preferably 1 hour or more, and is, on the other hand, generally 50 hours or less, preferably 10 hours or less. The reaction carried out under the reaction condition as above enables the intended terminal treatment within a shorter period of time and at a hither conversion ratio.

The terminal treatment operation is not specifically defined. For preventing the terminal treating agents from reacting with each other, it is desirable that the treatment for halogen atom and the treatment for alkylstannyl group are carried out separately. Any of the treatment for halogen atom and the treatment for alkylstannyl group may be carried out first. The terminal treatment may be carried out before purification of the conjugated polymer or after purification of the conjugated polymer.

In case where the terminal treatment is carried out after the purification, the conjugated polymer and one terminal treating agent (aryl halide or aryltrimethyltin) are dissolved in an organic solvent, then a transition metal catalyst such as a palladium catalyst is added thereto and stirred under heat in nitrogen. Further, the other terminal treating agent (aryltrimethyltin or aryl halide) is added to the system and stirred under heat. The heating time is not specifically defined, but is generally 30 minutes or more, preferably 1 hour or more, and is, on the other hand, generally 25 hours or less, preferably 10 hours or less. The process in that order is preferred since the terminal residue can be efficiently removed within a short period of time at a high conversion rate.

In case where Suzuki-Miyaura reaction or Negishi reaction is employed as the coupling reaction, the terminal treatment method for the case may comprise adding an arylboronic acid or a boronic acid derivative, or an arylzinc derivative to the system followed by stirring the system under heat.

The purification after the terminal treatment may be carried out in the manner as above through reprecipitation purification, Soxhlet extraction or gel permeation chromatography or by a scavenger.

<4. Conjugated Polymer>

The conjugated polymer produced according to the production method for conjugated polymer of the invention is described below.

The weight-average molecular weight (Mw) of the conjugated polymer produced according to the production method of the invention is generally $1 \times 10^4$ or more, preferably $5 \times 10^4$ or more, more preferably $7.0 \times 10^4$ or more, even more preferably $10.0 \times 10^4$ or more. On the other hand, the molecular weight is preferably $1 \times 10^7$ or less, more preferably $1 \times 10^6$ or less, even more preferably $9 \times 10^5$ or less, still more preferably $5 \times 10^5$ or less. The range is preferred from the viewpoint of prolonging the light absorption wavelength and increasing the absorbance. The range is also preferred from the viewpoint that the use of the polymer as a material for photoelectric conversion elements increases the conversion efficiency.

The number-average molecular weight (Mn) of the conjugated polymer produced according to the production method of the invention is generally $1.0 \times 10^4$ or more, preferably $2.0 \times 10^4$ or more, more preferably $3.0 \times 10^4$ or more, even more preferably $4.0 \times 10^4$ or more. On the other hand, the molecular weight is preferably $1 \times 10^8$ or less, more preferably $1 \times 10^7$ or less, even more preferably $9 \times 10^6$ or less. The number-average molecular weight falling within the range is preferred from the viewpoint of prolonging the light absorption wavelength and realizing high absorbance. The range is also preferred from the viewpoint that the use of the polymer as a material for photoelectric conversion elements increases the conversion efficiency.

The molecular weight distribution (PDI, (weight-average molecular weight/number-average molecular weight (Mw/Mn)) of the conjugated polymer produced according to the production method of the invention is generally 1.0 or more, preferably 1.1 or more, more preferably 1.2 or more, even more preferably 1.3 or more. On the other hand, the molecular weight distribution is preferably 20.0 or less, more preferably 15.0 or less, even more preferably 10.0 or less. The molecular weight distribution falling within the range is preferred from the viewpoint that the solubility of the conjugated polymer could fall within a range suitable to coating.

The weight-average molecular weight and the number-average molecular weight of the conjugated polymer may be determined through gel permeation chromatography (GPC). Concretely, columns of Shim-pac GPC-803 and GPC-804 (by Shimadzu, inner diameter 8.0 mm, length 30 cm) of each one are connected in series, and a pump of LC-10AT, an oven of CTO-10A, and detectors of a differential refractometer (Shimadzu's RID-10A) and a UV-vis detector (Shimadzu's SPD-10A) are used for the measurement. The conjugated polymer to be analyzed is dissolved in chloroform, and 5 μL of the resulting solution is injected into the columns. Chloroform is used as the mobile phase, and the sample is analyzed at a flow rate of 1.0 mL/min. For the analysis, used is LC-Solution (by Shimadzu).

The photoabsorption maximum wavelength (λmax) of the conjugated polymer produced according to the production method of the invention is generally 470 nm or more, preferably 480 nm or more, and is, on the other hand, generally 1200 nm or less, preferably 1000 nm or less, more preferably 900 nm or less. The half-value width is generally 10 nm or more, preferably 20 nm or more, and is, on the other hand, generally 300 nm or less. In case where the conjugated polymer produced according to the production method of the invention is used for solar cells, it is desirable that the absorption wavelength range of the conjugated polymer is nearer to the sunlight absorption wavelength range.

The solubility of the conjugated polymer produced according to the production method of the invention is not specifically defined, but it is desirable that the solubility thereof in chlorobenzene at 25° C. is generally 0.1% by weight or more, preferably 0.5% by weight or more, more preferably 1.0% by weight or more, and is, on the other hand, it is desirable that the solubility is generally 30% by weight or less, preferably 20% by weight or less. The higher solubility is preferred as enabling formation of a film having a sufficient thickness.

The solvent usable here for film formation to be mentioned below may be, not specifically defined, any one capable of uniformly dissolving or dispersing the conjugated polymer therein, and for example, includes aliphatic hydrocarbons such as hexane, heptane, octane, isooctane, nonane, decane, etc.; aromatic hydrocarbons such as toluene, xylene, chlorobenzene, orthodichlorobenzene, etc.; lower alcohols such as methanol, ethanol, propanol, etc.; ketones such as acetone, methyl ethyl ketone, cyclopentanone, cyclohexanone, etc.; esters such as ethyl acetate, butyl acetate, methyl lactate, etc.; halogenohydrocarbons such as chloroform, methylene chloride, dichloroethane, trichloroethane, trichloroethylene, etc.; ethers such as ethyl ether, tetrahydrofuran, dioxane, etc.; amides such as dimethylformamide, dimethylacetamide, etc. Of those, preferred are aromatic hydrocarbons such as toluene, xylene, chlorobenzene, orthodichlorobenzene, etc.; and halogenohydrocarbons such as chloroform, methylene chloride, dichloroethane, trichloroethane, trichloroethylene, etc.

Preferably, the amount of the impurities in the conjugated polymer produced according to the production method of the invention is preferably smaller. In particular, when the transition metal catalyst such as palladium, nickel, copper, iron or the like remains in the polymer, then there may occur exciton trap owing to the heavy element effect of the transition metal so that the charge transfer would be thereby inhibited and, as a result, the photoelectric conversion efficiency of the photoelectric conversion element where the polymer is used would be lowered. The concentration of the transition metal catalyst is generally 1000 ppm or less per g of the conjugated polymer, preferably 500 ppm or less, more preferably 100 ppm or less. On the other hand, the concentration is generally more than 0 ppm, preferably 1 ppm or more, more preferably 3 ppm or more.

The residual amount of the terminal residue ($X^1$ to $X^4$ in the reaction formulae (1) and (2)) in the conjugated polymer is not specifically defined, but is generally 6000 ppm or less per g of the conjugated polymer, preferably 4000 ppm or less, more preferably 3000 ppm or less, even more preferably 2000 ppm or less, still more preferably 1000 ppm or less, further more preferably 500 ppm or less, most preferably 200 ppm or less. On the other hand, the amount is generally more than 0 ppm, preferably 1 ppm or more, more preferably 3 ppm or more.

In particular, in case where the conjugated polymer is produced according to Stille reaction, the residual amount of the Sn atom in the conjugated polymer is generally 5000 ppm or less per g of the conjugated polymer, preferably 4000 ppm or less, more preferably 2500 ppm or less, even more preferably 1000 ppm or less, still more preferably 750 ppm or less, further more preferably 500 ppm or less, most preferably 100 ppm or less. On the other hand, the amount is generally more than 0 ppm, preferably 1 ppm or more, more preferably 3 ppm or more. The residual amount of the Sn atom of not more than 5000 ppm is preferred since the amount of the alkylstannyl group that is easy to thermally decompose could be reduced and the polymer could therefore secure higher stability.

The residual amount of halogen atom is generally 5000 ppm or less per g of the conjugated polymer, preferably 4000 ppm or less, more preferably 2500 ppm or less, even more preferably 1000 ppm or less, still more preferably 750 ppm or less, further more preferably 500 ppm or less, most preferably 100 ppm or less. On the other hand, the amount is generally more than 0 ppm, preferably 1 ppm or more, more preferably 3 ppm or more. The residual amount of halogen atom not more than 5000 ppm is preferred since the photoelectric conversion characteristics and the durability of the conjugated polymer tend to improve.

The residual amount of the terminal residue in the conjugated polymer may be determined by measuring the element amount except carbon, hydrogen and nitrogen. As the measurement method, employable is ICP mass spectrometry for bromide ion ($Br^-$) and iodide ion ($I^-$), and ICP mass spectrometry is also employable for Pd and Sn.

ICP mass spectrometry may be carried out according to the method described in a publication ("Plasma Ion Source Mass Spectrometry" (by Academic Publishing Center)). Concretely, Pd and Sn may be determined as follows: A sample is decomposed in wet, and Pd and Sn in the decomposed solution are quantified according to a calibration method using an ICP mass spectrometer (Agilent Technologies' ICP Mass Spectrometer 7500 ce Model).

$Br^-$ and $I^-$ may be determined as follows: A sample is burnt in a combustion apparatus (Mitsubishi Chemical Analytic's Sample Combustion Apparatus QF-02 Model), the combustion gas is absorbed by a reducing agent-containing alkaline absorbent liquid, and $Br^-$ and $I^-$ in the absorbed liquid are quantified according to a calibration method using an ICP mass spectrometer (Agilent Technologies' ICP Mass Spectrometer 7500 ce Model).

Specific examples of the conjugated polymer produced according to the production method for conjugated polymer of the invention are described below. The conjugated polymer obtained according to the reaction formulae (1) and (2) comprises one type of a recurring unit. However, it is possible to couple three or more kinds of monomers as described above, and in the case, the conjugated polymer to be obtained has two or more kinds of recurring units. In this case, the number of the recurring units is not specifically defined, but is generally 8 types or less, preferably 5 types or less.

The conjugated polymer to be obtained in the case of using the compound A14 and the compound A7 as the monomers is one having a recurring unit represented by the following formula (P1).

[Chem. 52]

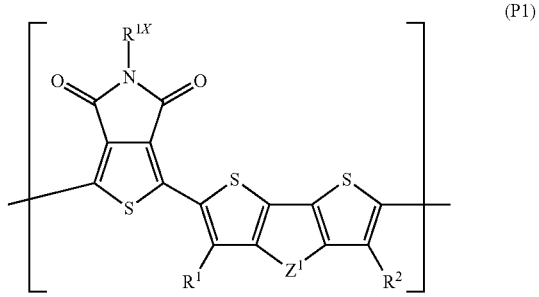

(P1)

The conjugated polymer is preferred here, since it can absorb light having a longer wavelength and has high absorbance. In the formula (P1), $R^{1x}$, $R^1$, $R^2$ and $Z^1$ have the same meanings as in the formula (A14) and the formula (A7). A case where $Z^1$ is $Z^{11}(R^3)(R^4)$ is described as an example. $R^3$, $R^4$ and $Z^{11}$ are the same as in the formula (A7).

In the formula (P1), $R^{1x}$ represents an alkyl group optionally having a substituent, an alkenyl group optionally having a substituent, an alkynyl group optionally having a substituent, or an aromatic group optionally having a substituent. $R^{1x}$ of any of these groups is preferred, since the solubility of the conjugated polymer having the recurring unit represented by the formula (P1) in an organic solvent is excellent and therefore the conjugated polymer of the type is advantageous in a process of film formation by coating.

More preferably, $R^{1x}$ is an alkyl group optionally having a substituent, or an aromatic group optionally having a substituent. The alkyl group is preferably a linear, branched or cyclic alkyl group. Above all, preferred is a linear or branched alkyl group. $R^{1x}$ of a linear alkyl group is preferred from the viewpoint that the crystallinity of the conjugated polymer having the recurring unit represented by the formula (P1) can increase and therefore the mobility thereof can increase.

$R^{1x}$ of a branched alkyl group is preferred from the viewpoint that the solubility of the conjugated polymer having the recurring unit represented by the formula (P1) can increase. $R^{1x}$ of an aromatic group optionally having a substituent is preferred from the viewpoint that the conjugated polymer having the recurring unit represented by the formula (P1) can absorb light having a longer wavelength. In addition, $R^{1x}$ of an aromatic group optionally having a substituent is also preferred from the viewpoint that the crystallinity of the conjugated polymer having the recurring unit represented by the formula (P1) can increase and therefore the mobility thereof can increase.

Preferably, at least one of $R^3$ and $R^4$ is an alkyl group or an aromatic group optionally having a substituent, and more preferably, both $R^3$ and $R^4$ are alkyl groups or aromatic groups optionally having a substituent.

The embodiment where at least one of $R^3$ and $R^4$ is an alkyl group optionally having a substituent is preferred from the viewpoint that the conjugated polymer having the recurring unit represented by the formula (P1) can absorb light having a longer wavelength.

The embodiment where at least one of $R^3$ and $R^4$ is a linear alkyl group optionally having a substituent is preferred from the viewpoint that the crystallinity of the conjugated polymer represented by the formula (P1) can increase and therefore the mobility thereof can increase.

The embodiment where at least one of $R^3$ and $R^4$ is a branched alkyl group optionally having a substituent is preferred from the viewpoint that the solubility of the conjugated polymer having the recurring unit represented by the formula (P1) can increase therefore facilitating film formation according to a coating process. From these viewpoints, it is desirable that at least one of $R^3$ and $R^4$ is an alkyl group having from 1 to 20 carbon atoms, more preferably an alkyl group having from 6 to 20 carbon atoms.

The embodiment where at least one of $R^3$ and $R^4$ is an aromatic group optionally having a substituent is preferred since the intermolecular interaction increases owing to the interaction between the n-electrons therein, and therefore the mobility of the material that contains the conjugated polymer having the recurring unit represented by the formula (P1) tends to increase, and in addition, the stability of the cyclic skeleton containing the atom $Z^{11}$ tends to better.

In the embodiment where $R^3$ is a branched alkyl group optionally having a substituent, $R^4$ is a linear alkyl group optionally having a substituent or an aromatic group optionally having a substituent, the steric hindrance around the atom $Z^{11}$ can be prevented and therefore the intermolecular interaction of the conjugated polymer having the recurring unit represented by the formula (P1) can suitably better. This is preferred from the viewpoint that the absorption wavelength of the conjugated polymer having the recurring unit represented by the formula (P1) can be prolonged and the mobility of the material containing the conjugated polymer having the recurring unit represented by the formula (P1) tends to increase and, in addition, the stability of the cyclic skeleton containing the atom $Z^{11}$ tends to better.

The invention of the embodiment is preferred in that both the effect of the branched alkyl group ($R^3$) to increase the solubility of the conjugated polymer and the effect of the linear alkyl group or the aromatic group ($R^4$) to increase the crystallinity of the conjugated polymer and to better the intermolecular interaction of the conjugated polymer can be secured not detracting from any of these effects.

From the viewpoint of increasing the steric hindrance around the atom $Z^{11}$ to thereby enhance the durability of the conjugated polymer, it is desirable that $R^3$ and $R^4$ each are an alkyl group optionally having a substituent, an alkenyl group optionally having a substituent, or an aromatic group optionally having a substituent.

From the viewpoint of enhancing the intermolecular interaction of the conjugated polymer, it is desirable that at least one of $R^{1x}$, $R^3$ and $R^4$ is a linear alkyl group or an aromatic group, and more preferably $R^{1x}$, $R^3$ and $R^4$ are linear alkyl groups or aromatic groups.

The embodiment where $R^{1x}$, $R^3$ and $R^4$ are aromatic groups is preferred in point of the mobility, and the embodiment where $R^{1x}$, $R^3$ and $R^4$ are linear alkyl groups is preferred in that the conjugated polymer can absorb light having a longer wavelength. Here, the linear alkyl group is preferably an alkyl group having from 1 to 20 carbon atoms, more preferably an alkyl group having from 6 to 20 carbon atoms.

Also preferably, at least one of $R^1$ and $R^2$ is a halogen atom. The embodiment is preferred from the viewpoint that the heat resistance, the weather resistance, the chemical resistance, the water repellency and the oil repellency of the conjugated polymer having the recurring unit represented by the formula (P1) can be better.

The conjugated polymer having the recurring unit represented by the formula (P1) can have an absorption in a long wavelength region (600 nm or more) and can show a high open voltage (Voc). The conjugated polymer of the type has an advantage of showing a high-level photoelectric conversion performance, and in particular, when combined with a fullerene compound and used in solar cells, the polymer exhibits excellent solar cell characteristics. Another advantage of the polymer of the type is that the HOMO level thereof is low and the polymer is therefore hardly oxidized.

In addition, the conjugated polymer having the recurring unit represented by the formula (P1) has high solubility. Since the solubility in solvent of the polymer is high in film formation by coating, and since the latitude in selecting the solvent is broad, it is easy to use the solvent most suitable for use conditions, and therefore the film quality of the organic semiconductor layer to be formed can be thereby enhanced.

Preferred examples of the preferred recurring unit to be in the conjugated polymer of the invention further include the following recurring units in addition to the recurring unit represented by the formula (P1). As described above, one molecule may contain one alone or two or more different kinds of recurring units.

(a) Recurring unit formed through coupling reaction of the compound (A7) and the compound (A15).
(b) Recurring unit formed through coupling reaction of the compound (A7) and the compound (A16).
(c) Recurring unit formed through coupling reaction of the compound (A7) and the compound (A13).
(d) Recurring unit formed through coupling reaction of the compound (A7) and the compound (A18).
(e) Recurring unit formed through coupling reaction of the compound (A7) and the compound (A22).
(f) Recurring unit formed through coupling reaction of the compound (A8) and the compound (A14).
(g) Recurring unit formed through coupling reaction of the compound (A8) and the compound (A15).
(h) Recurring unit formed through coupling reaction of the compound (A8) and the compound (A16).
(i) Recurring unit formed through coupling reaction of the compound (A8) and the compound (A13).
(j) Recurring unit formed through coupling reaction of the compound (A8) and the compound (A 18).
(k) Recurring unit formed through coupling reaction of the compound (A8) and the compound (A22).
(l) Recurring unit formed through coupling reaction of the compound (A9) and the compound (A 14).
(m) Recurring unit formed through coupling reaction of the compound (A9) and the compound (A15).
(n) Recurring unit formed through coupling reaction of the compound (A9) and the compound (A16).
(o) Recurring unit formed through coupling reaction of the compound (A9) and the compound (A13).
(p) Recurring unit formed through coupling reaction of the compound (A9) and the compound (A18).
(q) Recurring unit formed through coupling reaction of the compound (A9) and the compound (A22).
(r) Recurring unit formed through coupling reaction of the compound (A10) and the compound (A 14).
(s) Recurring unit formed through coupling reaction of the compound (A10) and the compound (A15).
(t) Recurring unit formed through coupling reaction of the compound (A10) and the compound (A16).
(u) Recurring unit formed through coupling reaction of the compound (A10) and the compound (A 13).
(v) Recurring unit formed through coupling reaction of the compound (A10) and the compound (A18).
(w) Recurring unit formed through coupling reaction of the compound (A10) and the compound (A22).

Above all, the recurring units represented by the formula (P1), (a), (c), (e), (f), (g), (i), (k), (l), (m), (o), (q), (r), (s), (u) or (w) are more preferred as the recurring units to be in the conjugated polymer of the invention; the recurring units represented by the formula (P1), (a), (e), (f), (g), (k), (l), (m), (q), (r), (s) or (w) are even more preferred; and the recurring units represented by the formula (P1), (a), (e), (f), (g), (k) or (s) are especially preferred.

Preferred examples of the conjugated polymer obtainable according to the method of the invention are shown below. The conjugated polymers shown below can be synthesized using the corresponding monomer and according to the above-mentioned method. In the following formulae, $C_4H_9$, $C_6H_{13}$, $C_8H_{17}$, $C_{10}H_{21}$, $C_{12}H_{25}$ and $C_{15}H_{31}$ are linear alkyl groups having a given number of carbon atoms. EH represents a 2-ethylhexyl group. In the conjugated polymers of the following formulae that contain multiple recurring units, the ratio by number of the constituent recurring units is not specifically defined. The conjugated polymers shown below have silicon atom-containing 5-membered ring, in which, however, the silicon atom may be any other atom of Group 14 elements of the Periodic Table such as a carbon atom, a germanium atom or the like.

[Chem. 53]

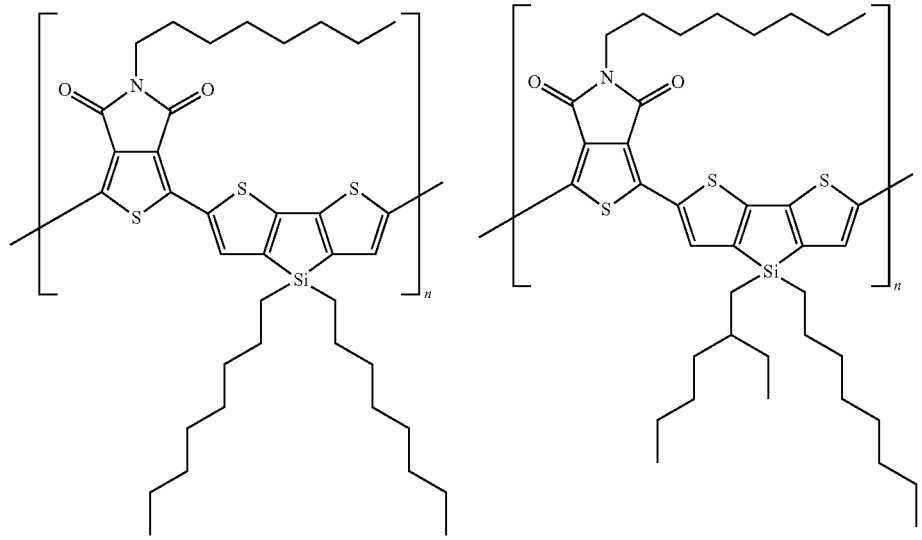

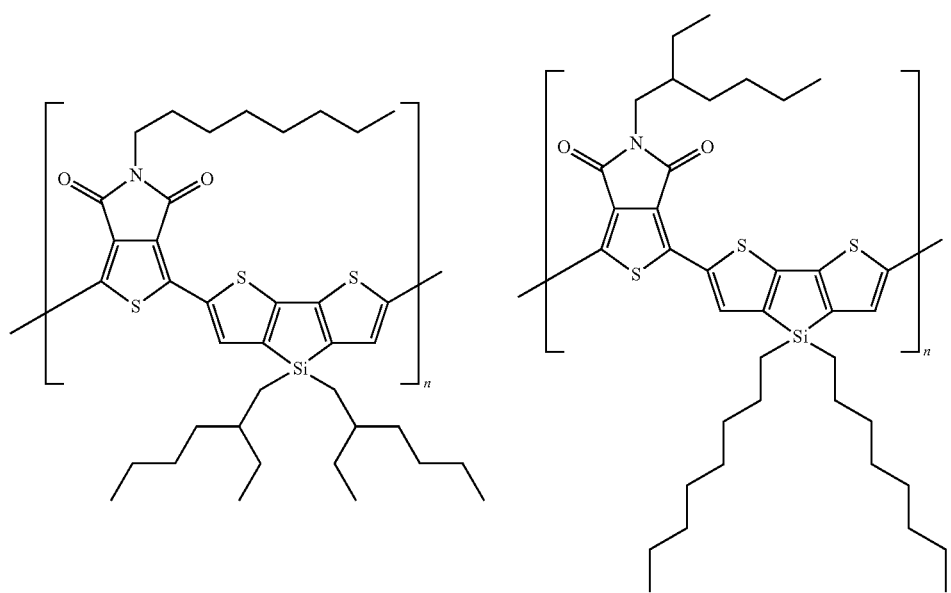

-continued
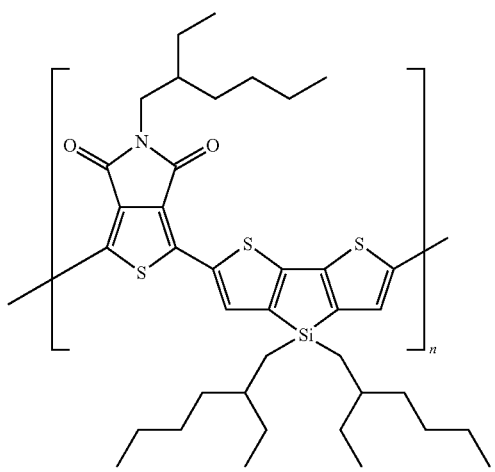
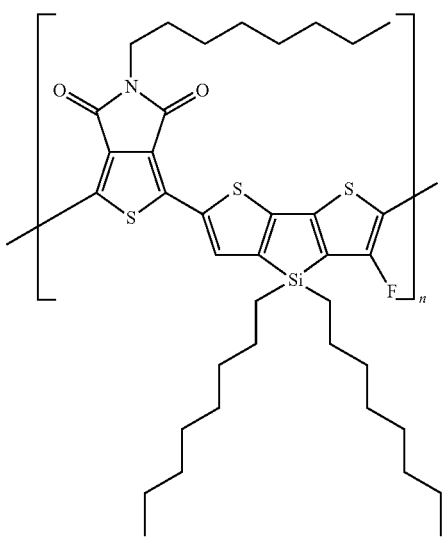
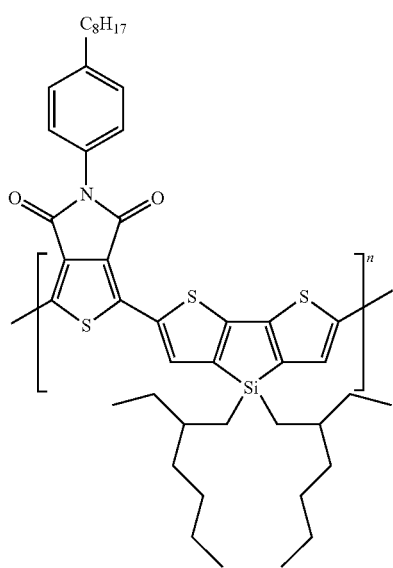
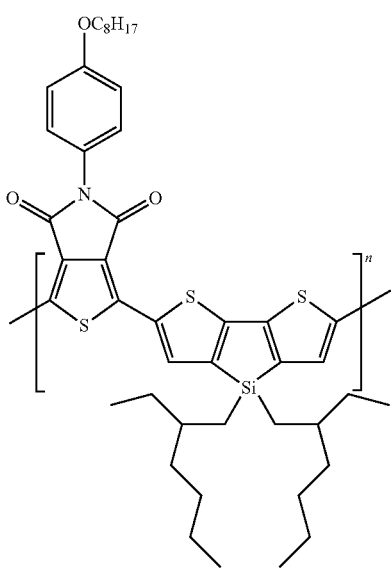
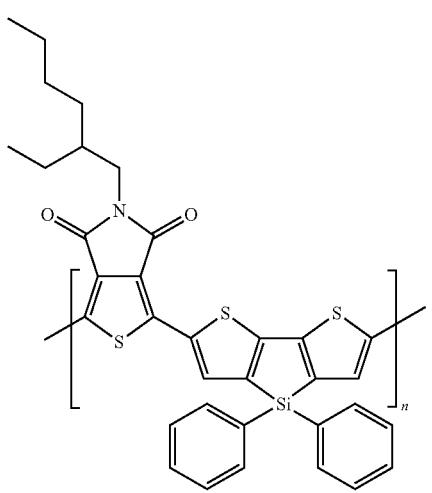
[Chem. 54]
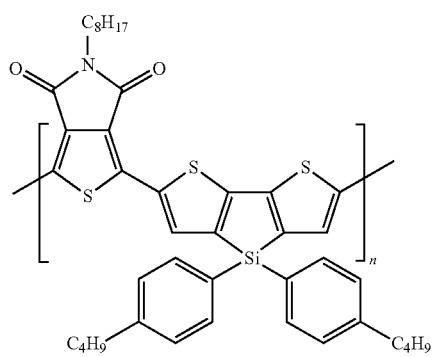

-continued
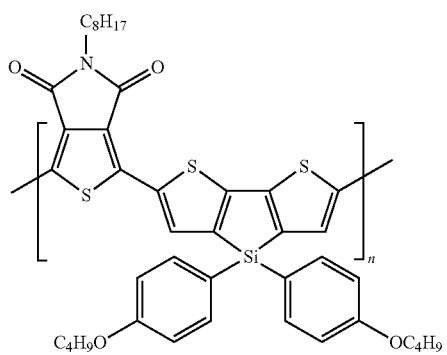
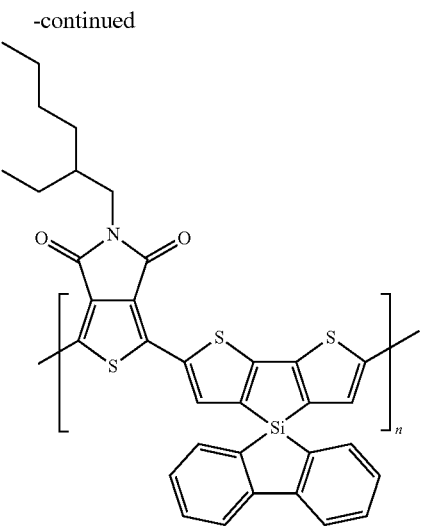
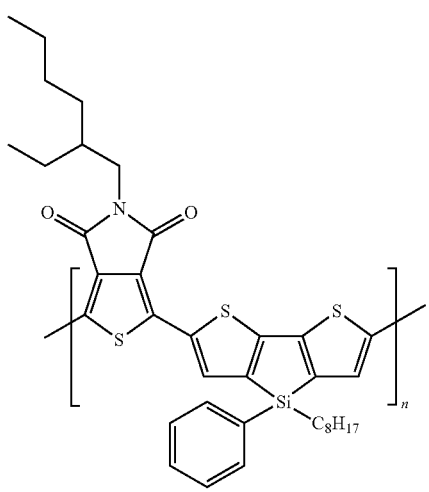
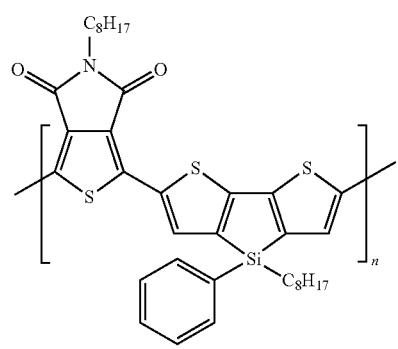
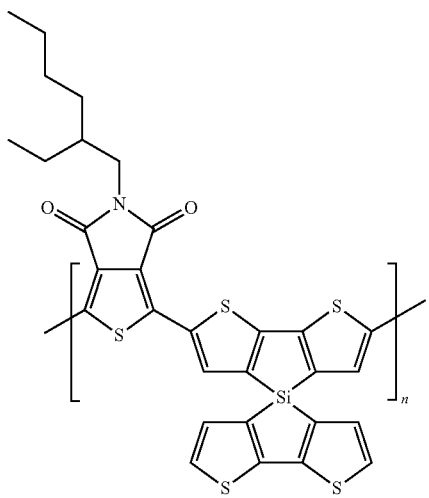
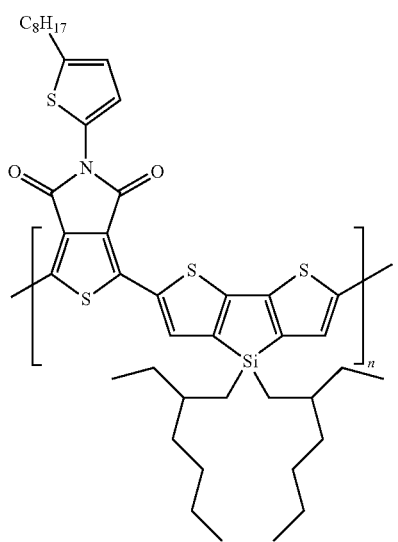

-continued
[Chem. 55]
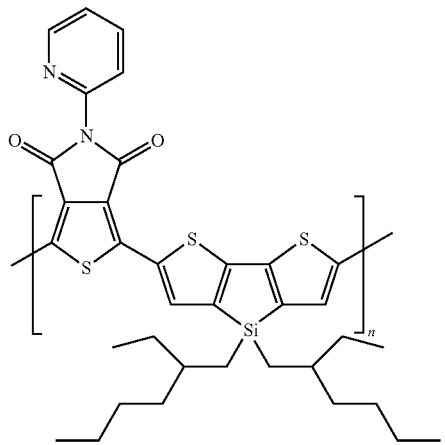
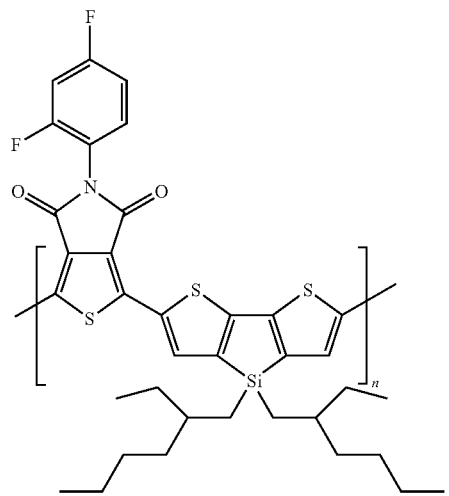
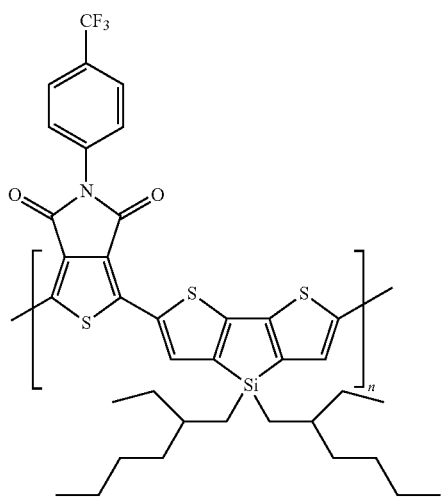
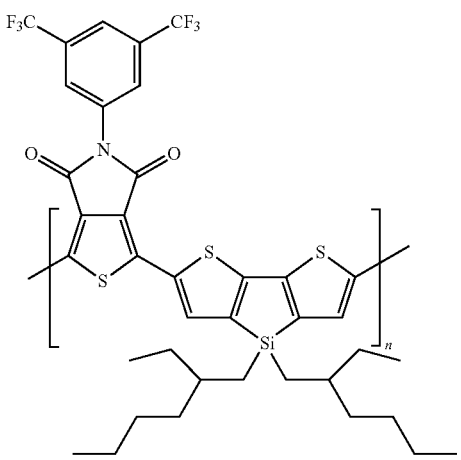
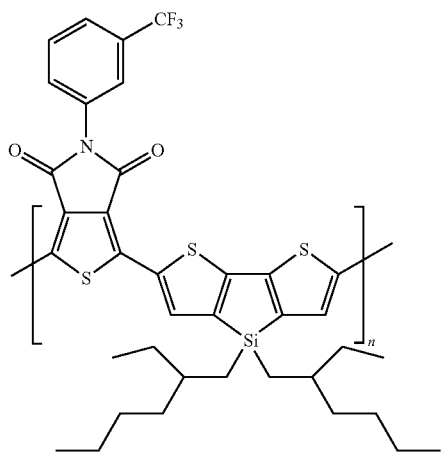
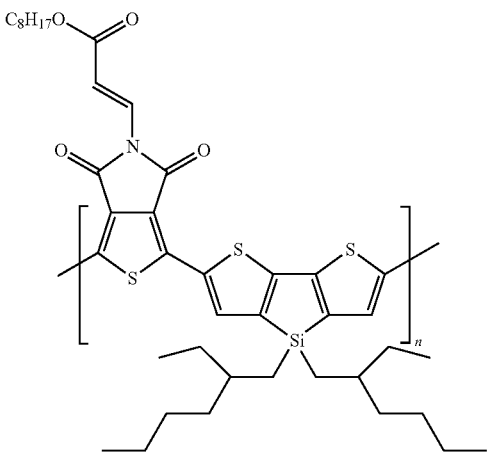

-continued
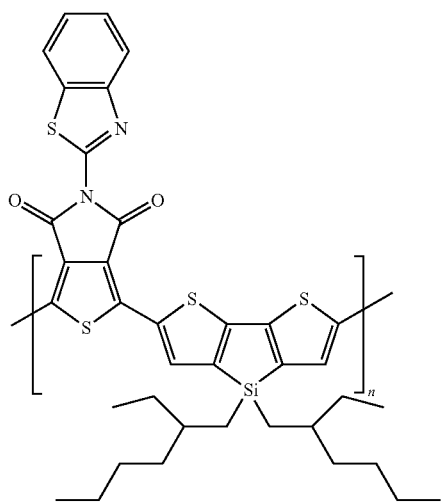
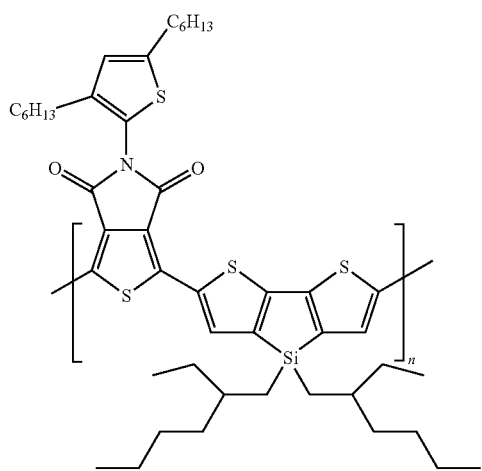
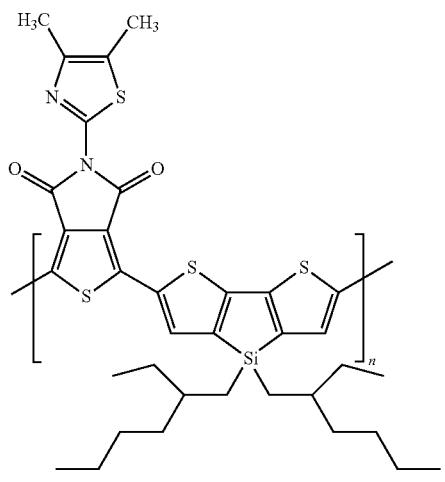
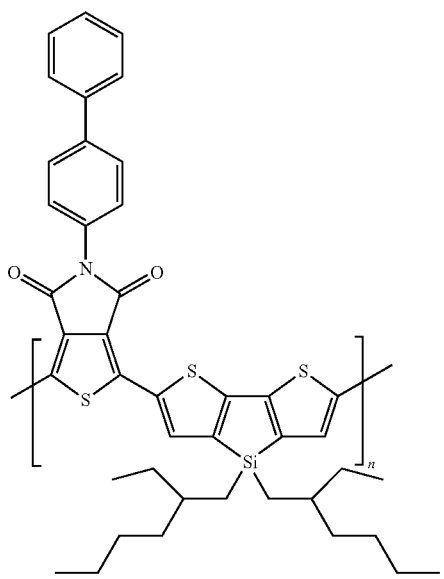
[Chem. 56]
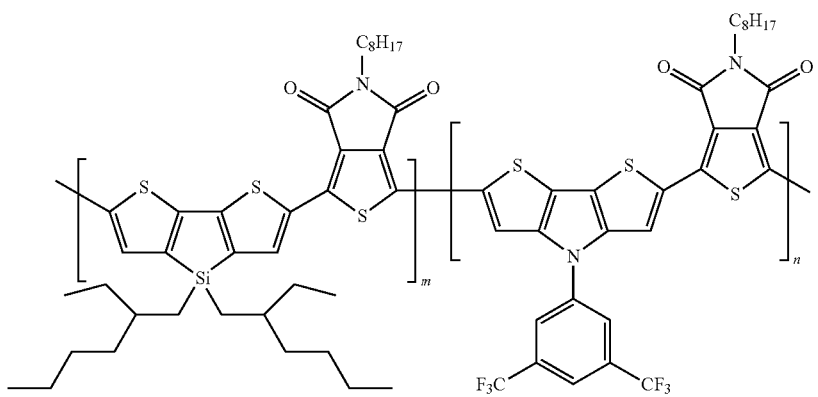

-continued
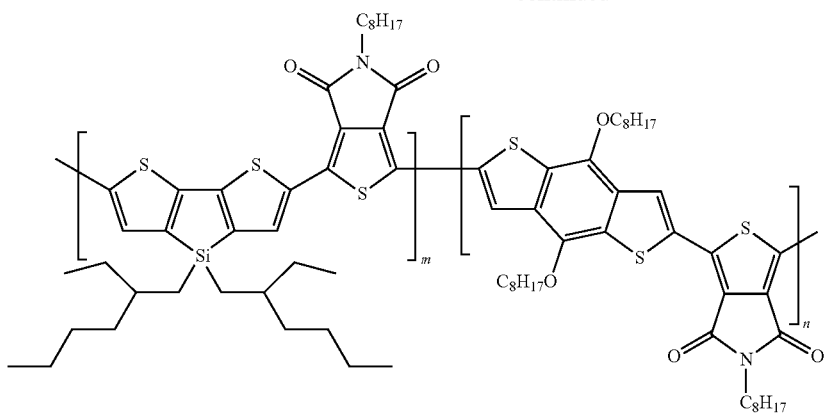
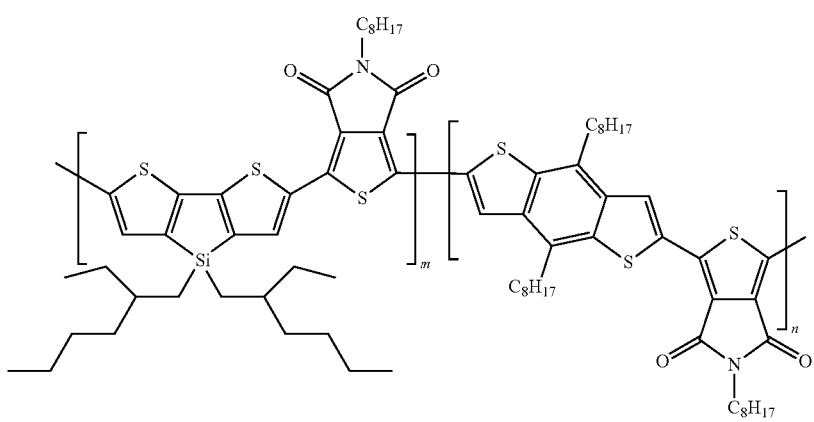
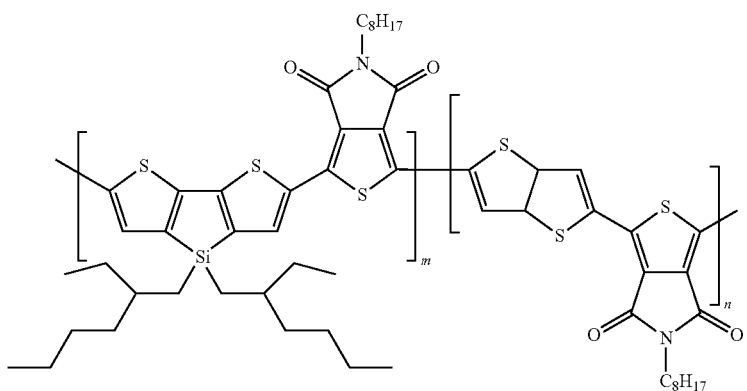
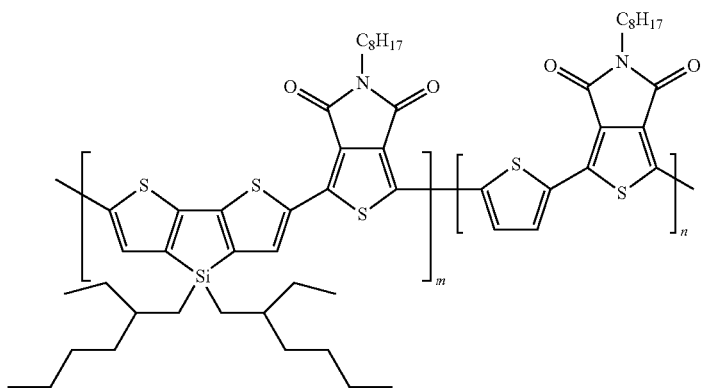

-continued
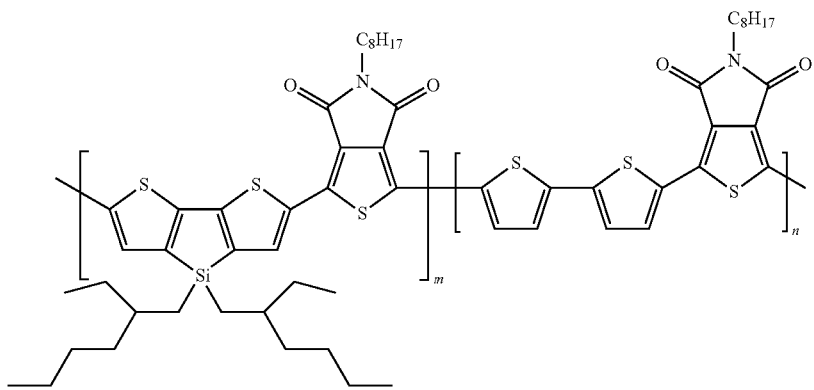
[Chem. 57]
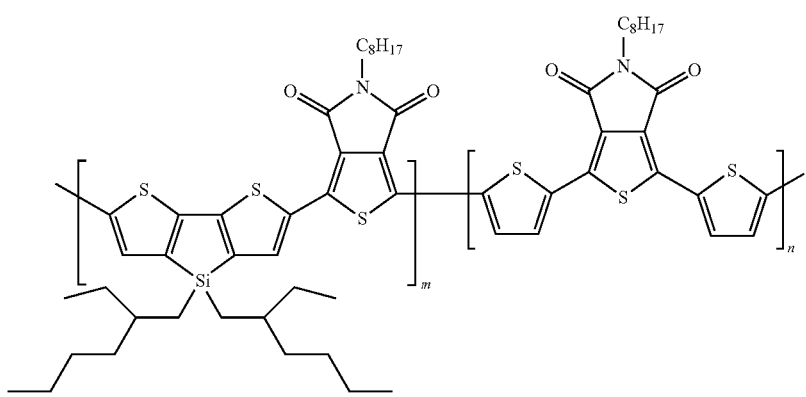
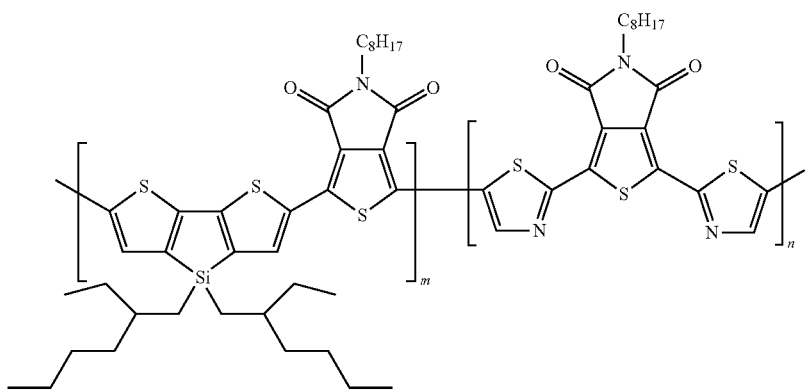
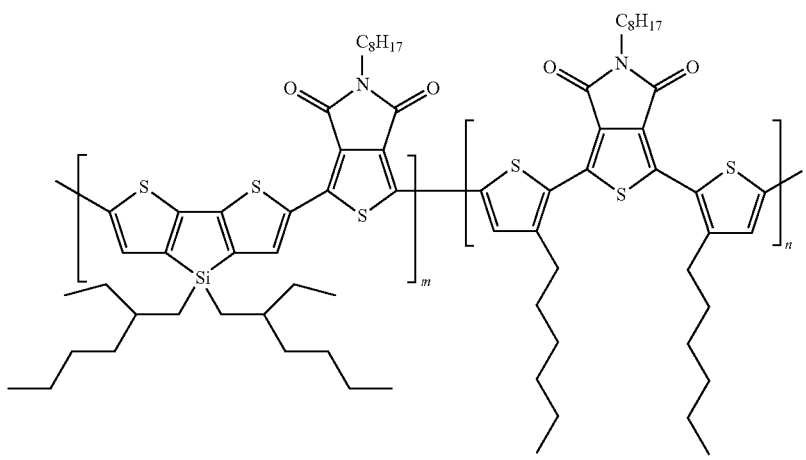

-continued
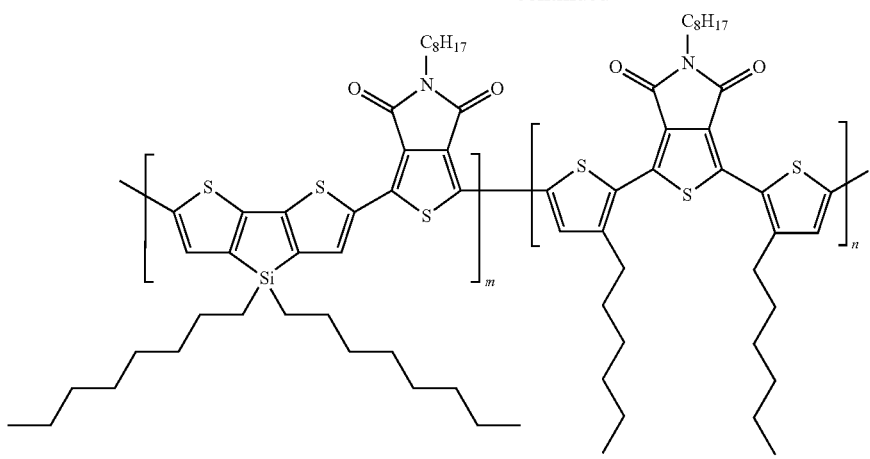
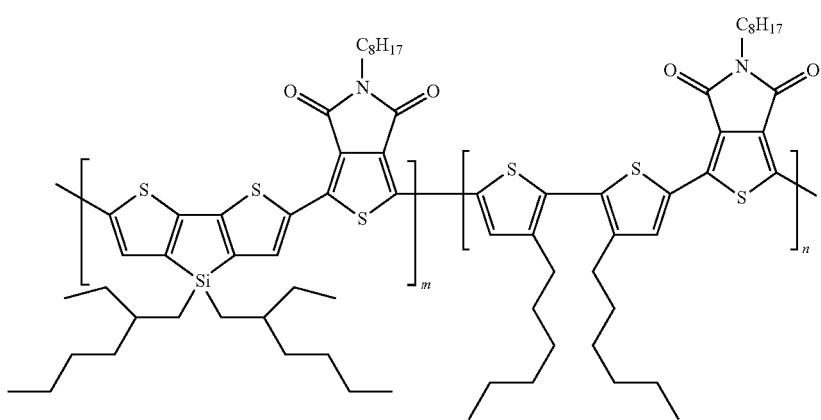
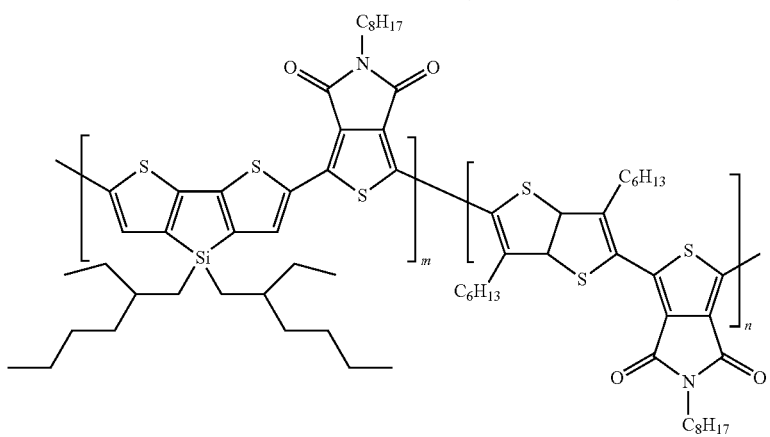
[Chem. 58]
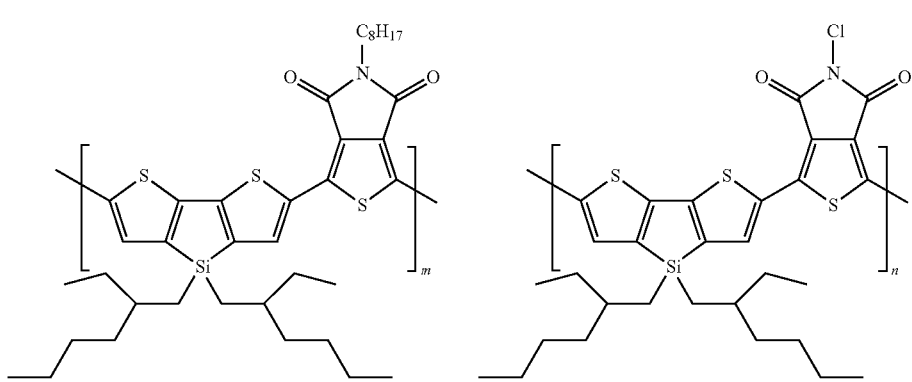

-continued
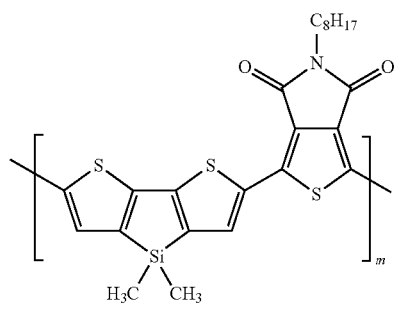
87
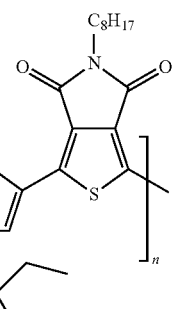
88
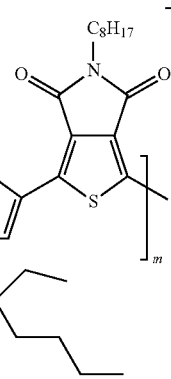
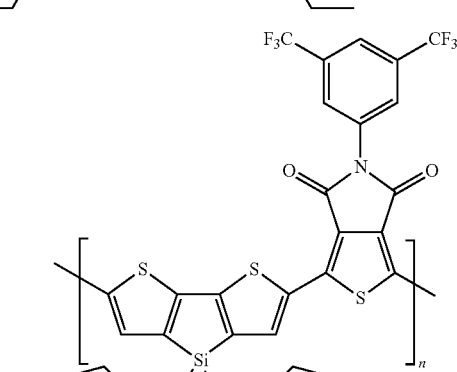
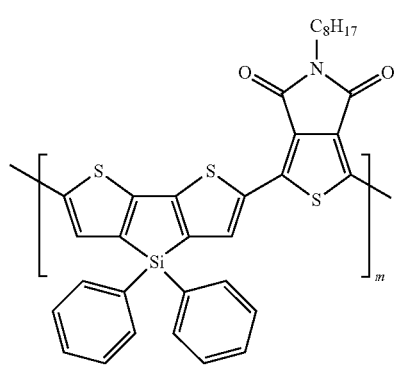
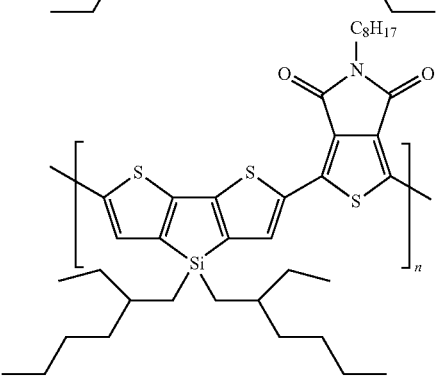
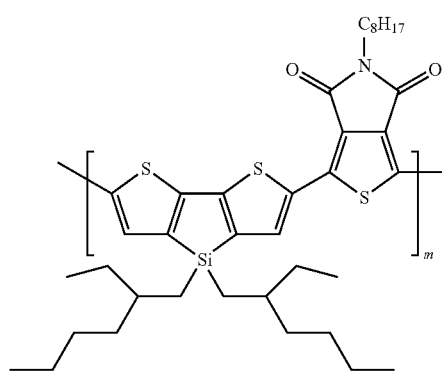
[Chem. 59]
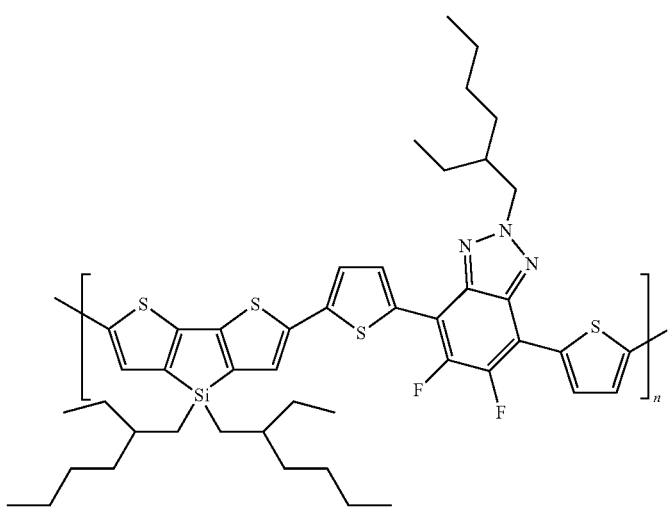

-continued
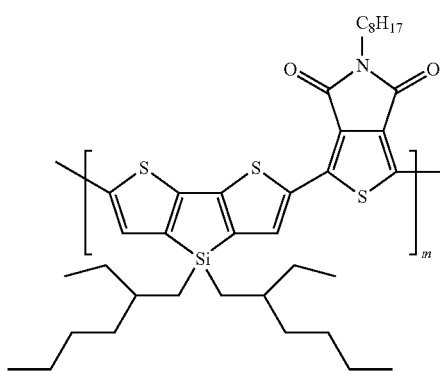
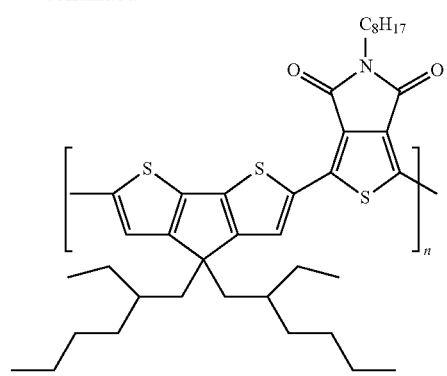
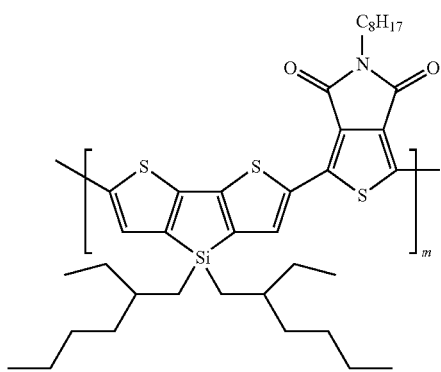
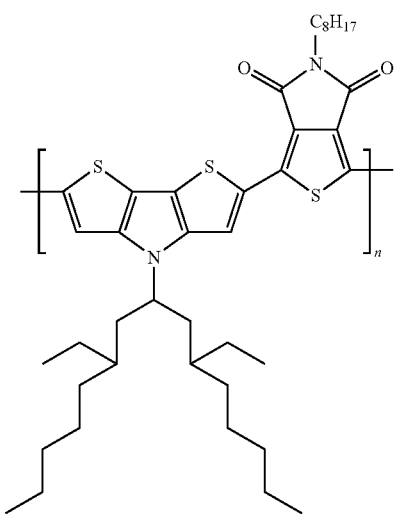
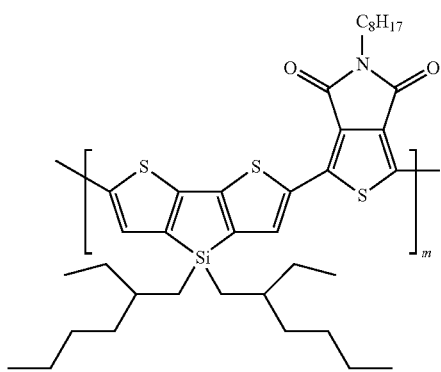
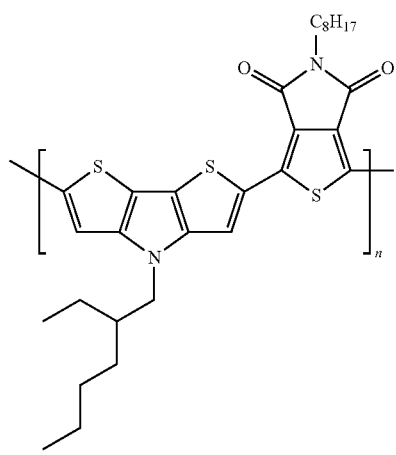

-continued
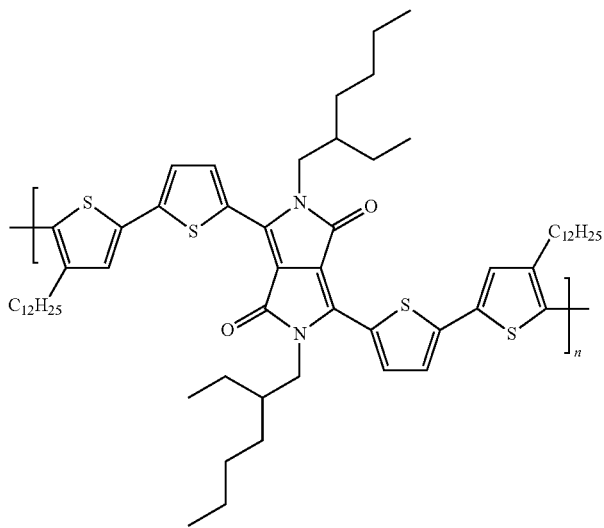
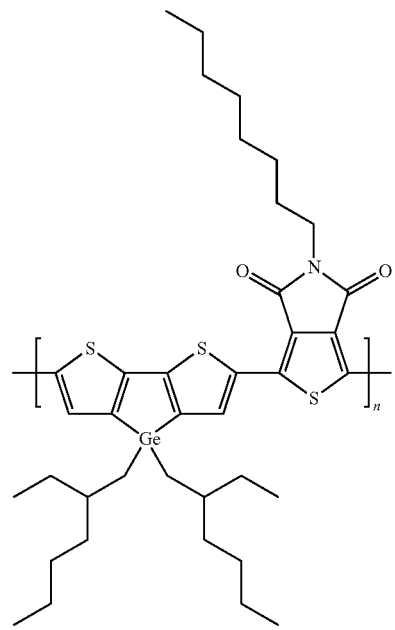
[Chem. 60]
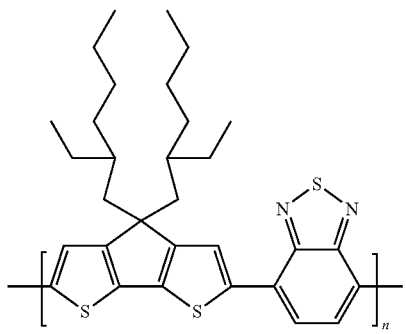
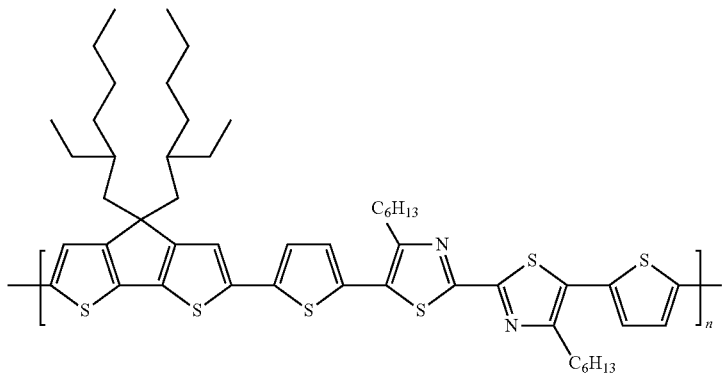
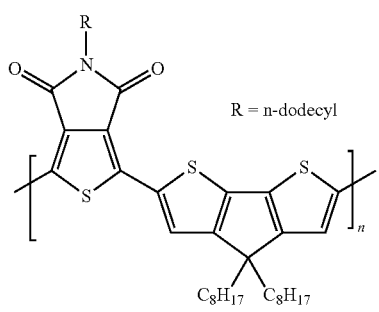
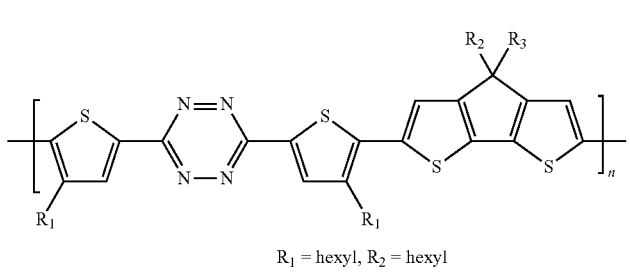
R₁ = hexyl, R₂ = hexyl 93 94
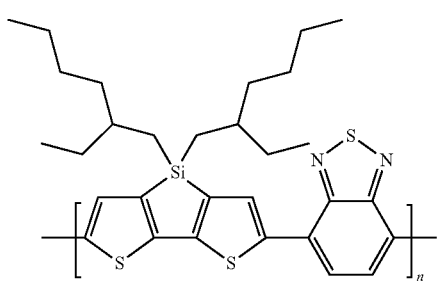 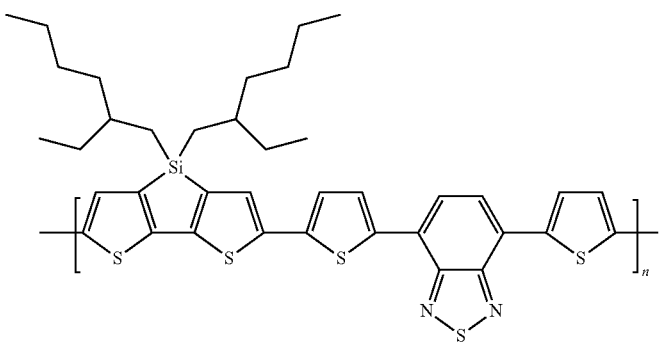
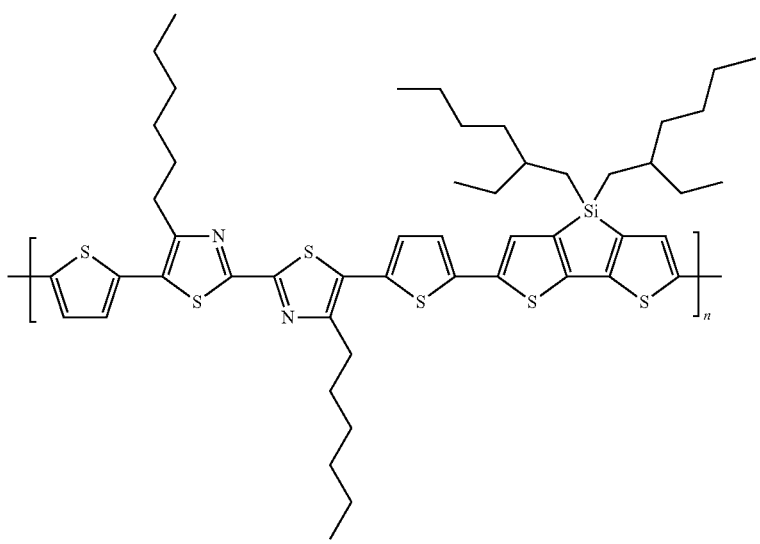
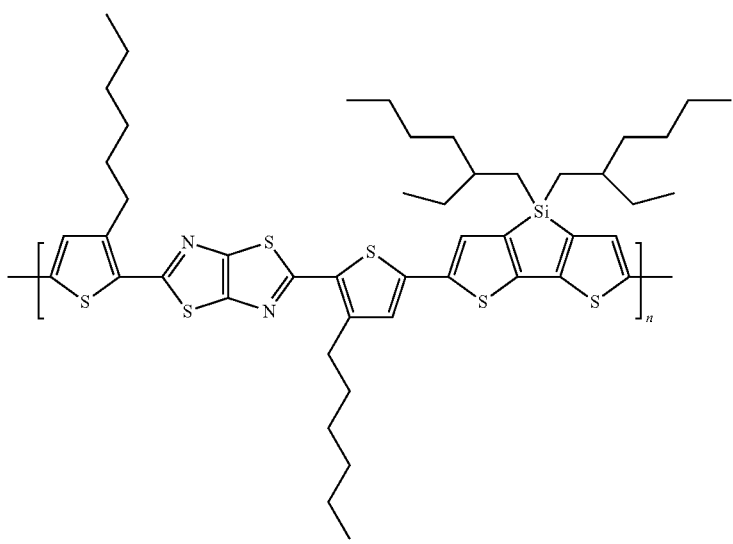
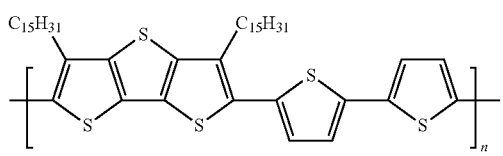

-continued
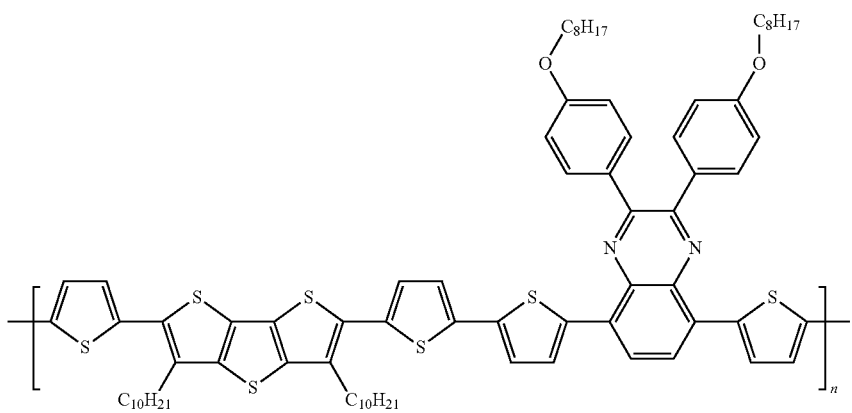
[Chem. 61]
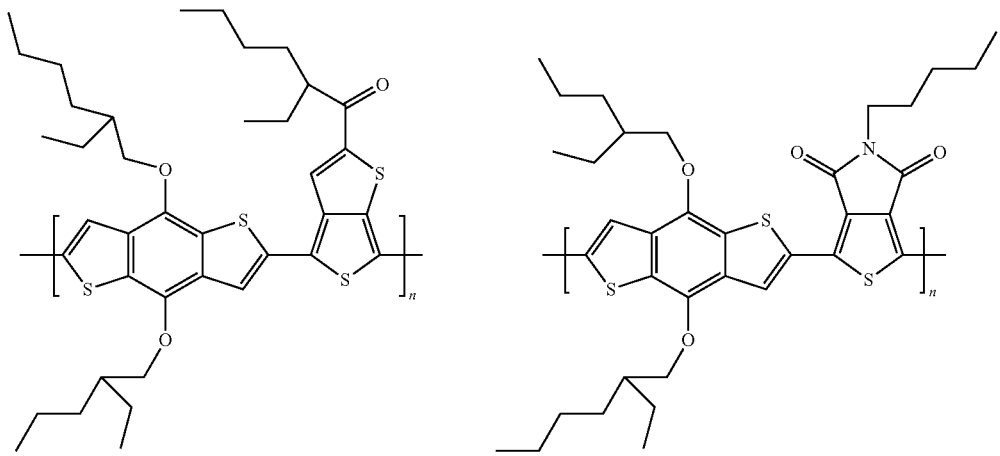
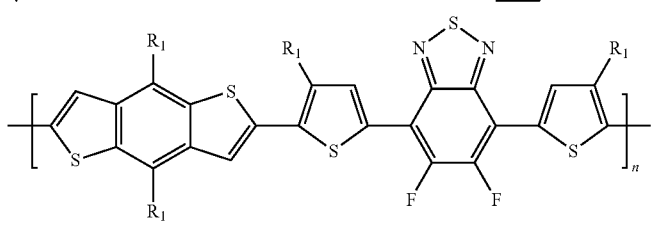
R₁ = 2-ethylhexyl
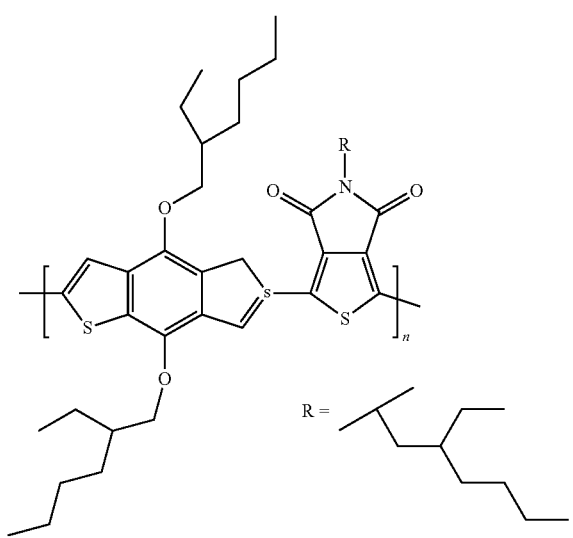
R =

-continued
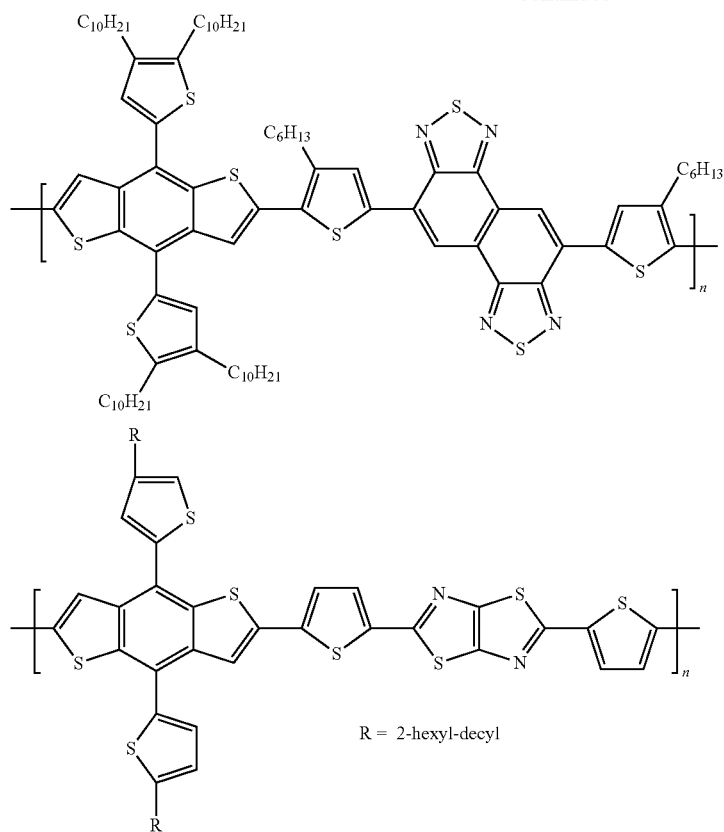
R = 2-hexyl-decyl
[Chem. 62]
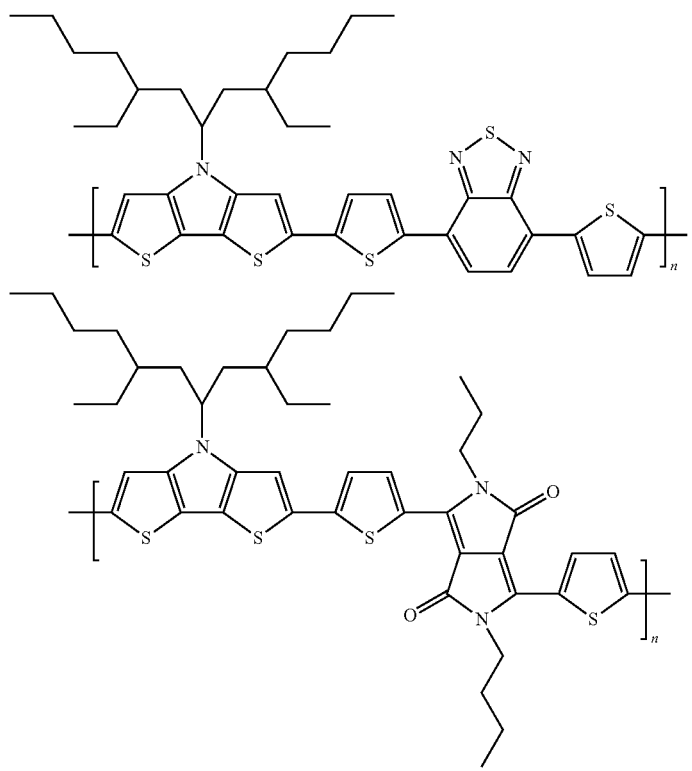

-continued
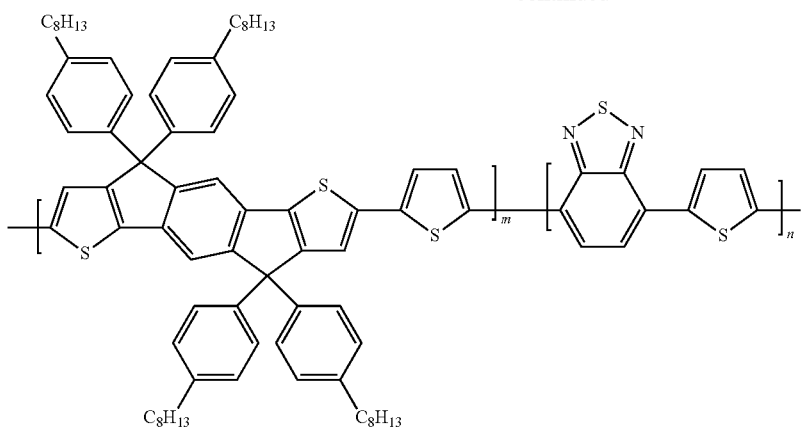
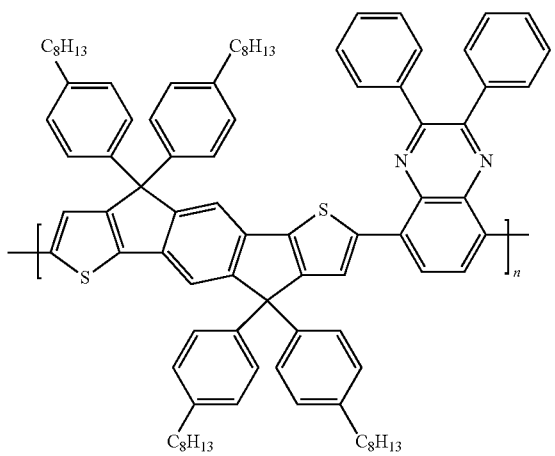
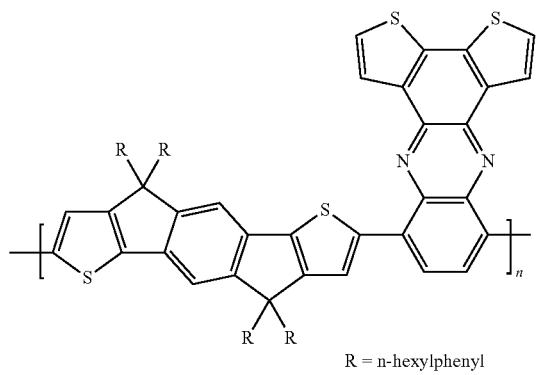
R = n-hexylphenyl
[Chem. 63]
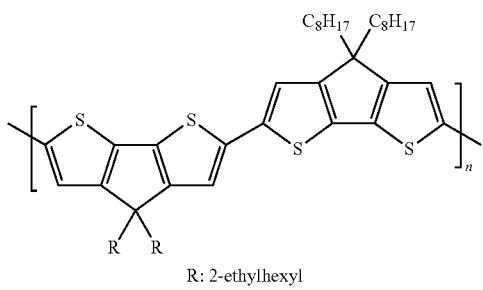
R: 2-ethylhexyl
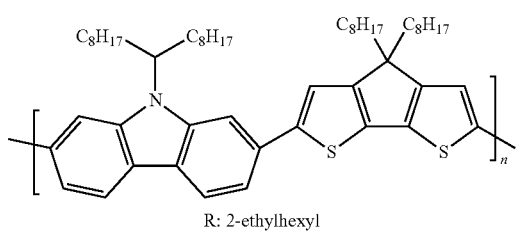
R: 2-ethylhexyl
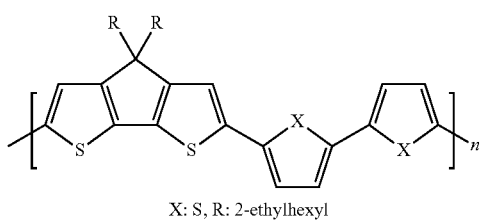
X: S, R: 2-ethylhexyl -continued
[Chem. 64]
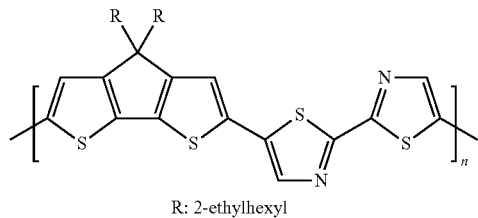
R: 2-ethylhexyl
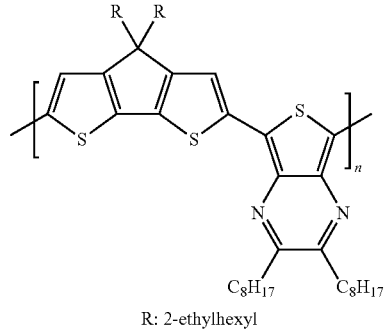
R: 2-ethylhexyl
[Chem. 65]
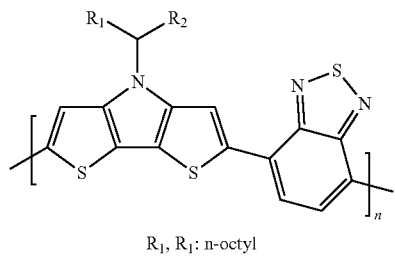
$R_1$, $R_1$: n-octyl
[Chem. 66]
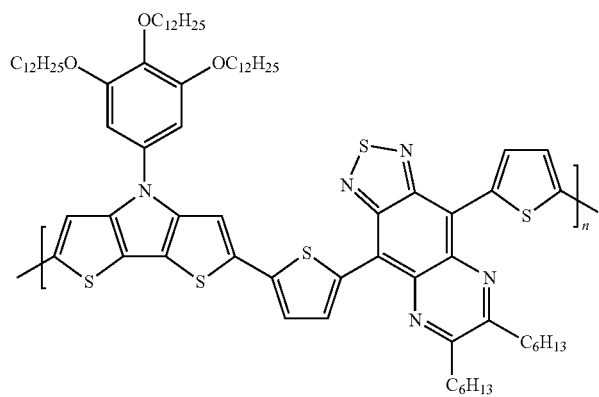
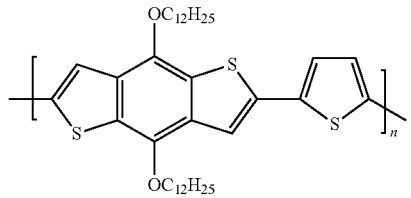
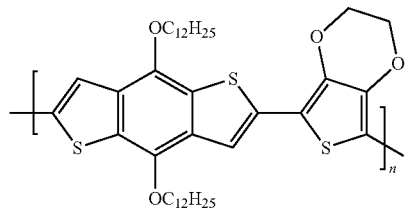
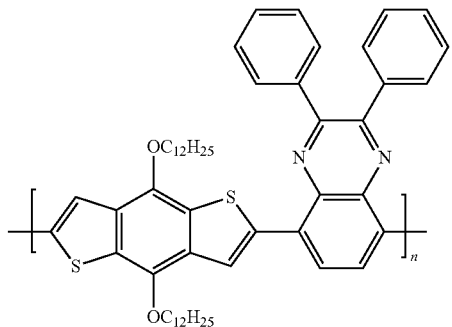
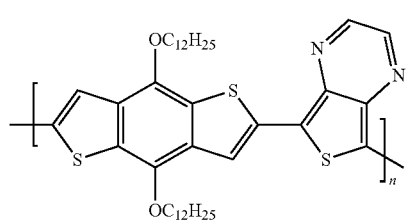
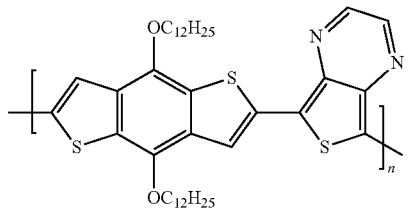

-continued
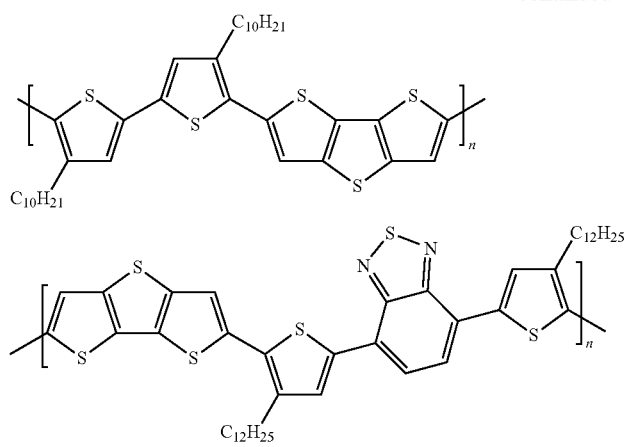
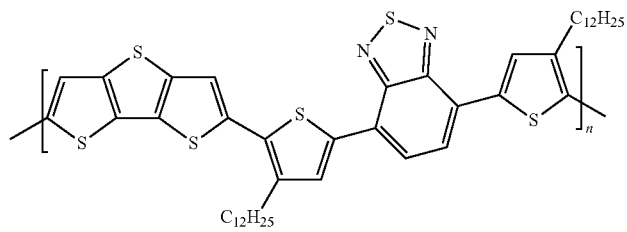
[Chem. 67]
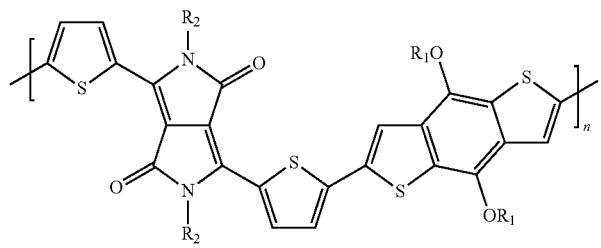
R: octyl, R₂: 2-ethyhexyl
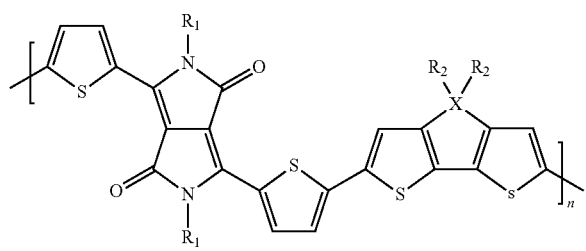
X = Si, R₁, R₂: 2-ethylhexyl
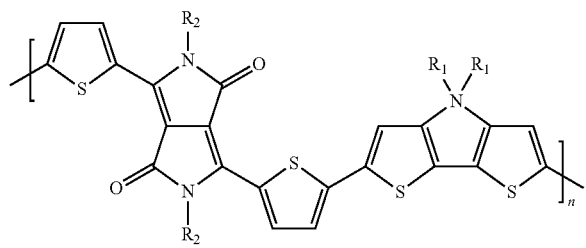
R₁, R₂: 2-ethylhexyl
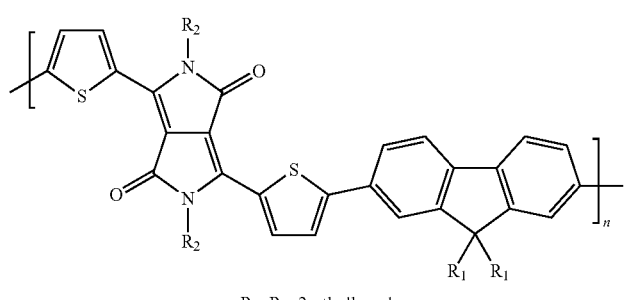
R₁, R₂: 2-ethylhexyl

[Chem. 68]
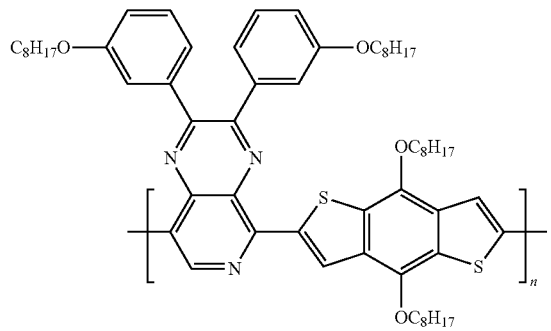
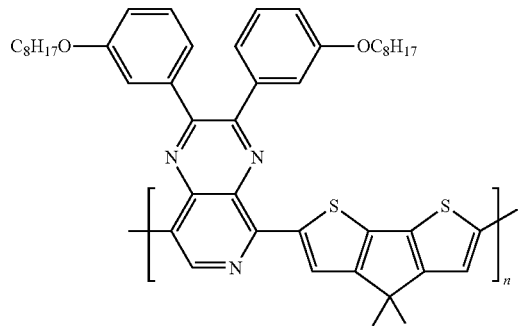
R: 2-ethylhexyl
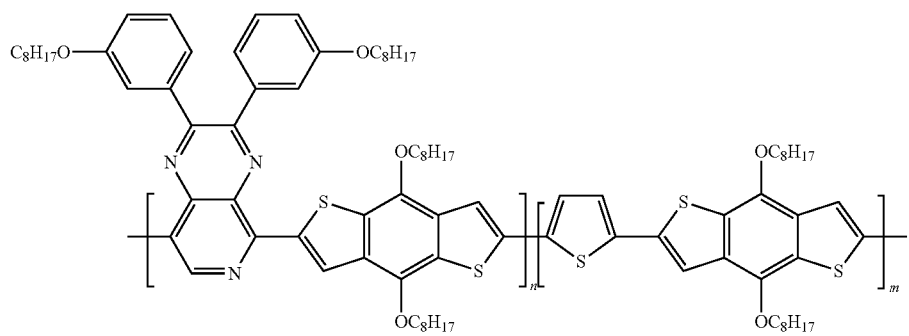
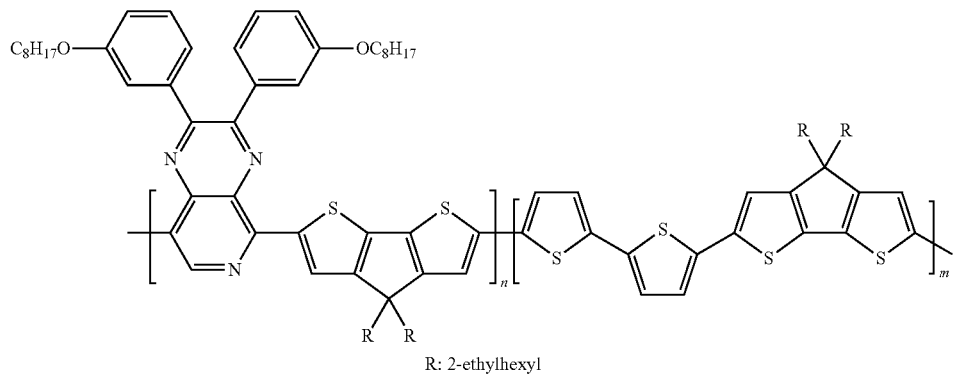
R: 2-ethylhexyl
[Chem. 69]
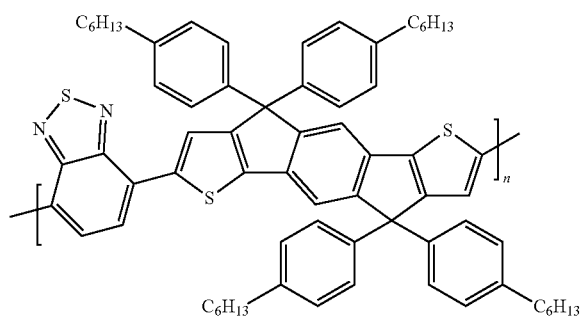

-continued
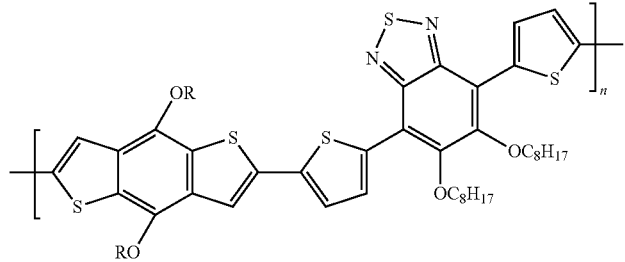
R: 2-ethylhexyl
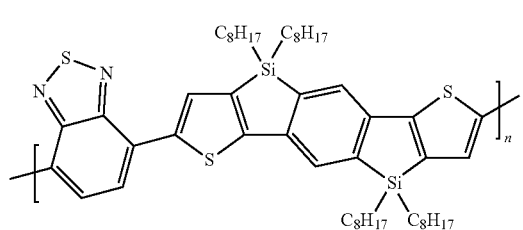
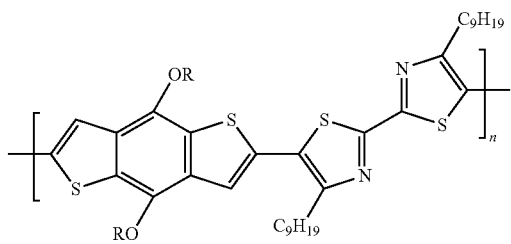
R: 2-ethylhexyl
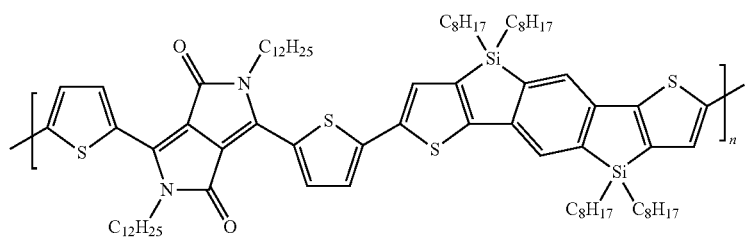
[Chem. 70]
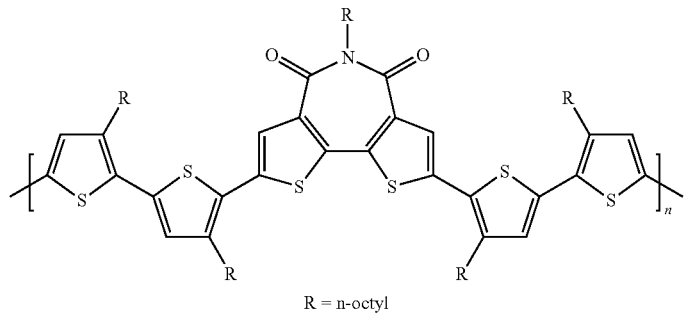
R = n-octyl
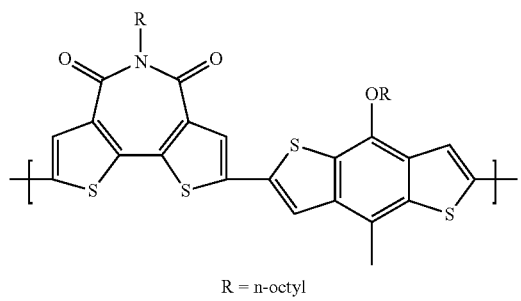
R = n-octyl
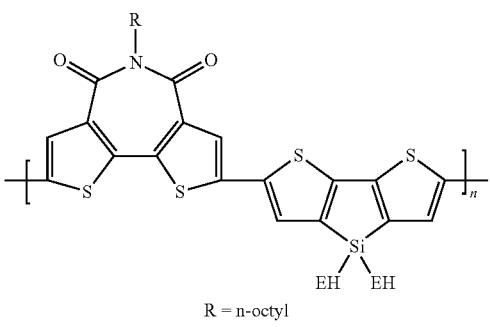
R = n-octyl 109
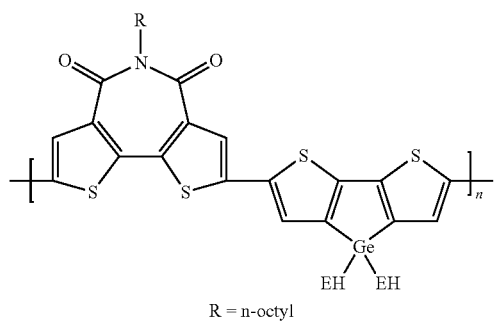
R = n-octyl
110
-continued
[Chem. 71]
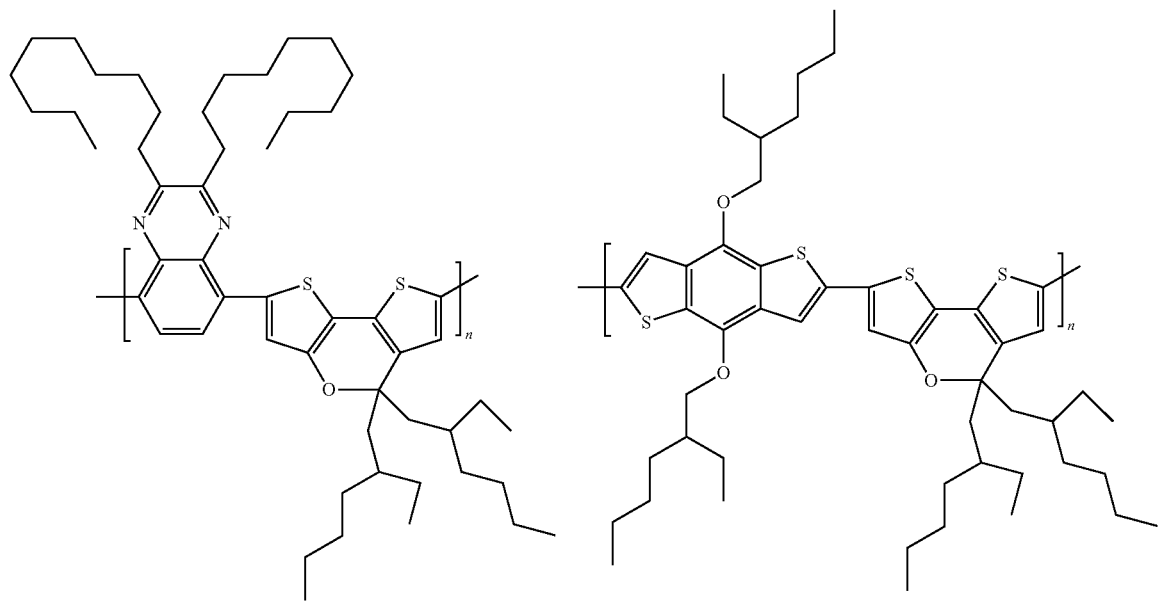
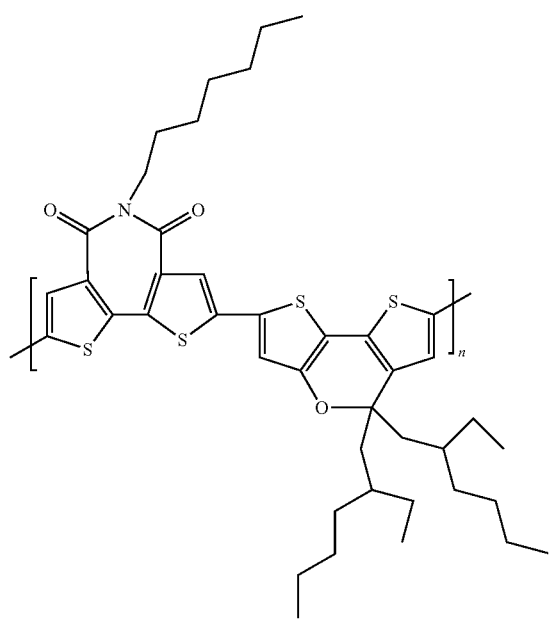

[Chem. 72]
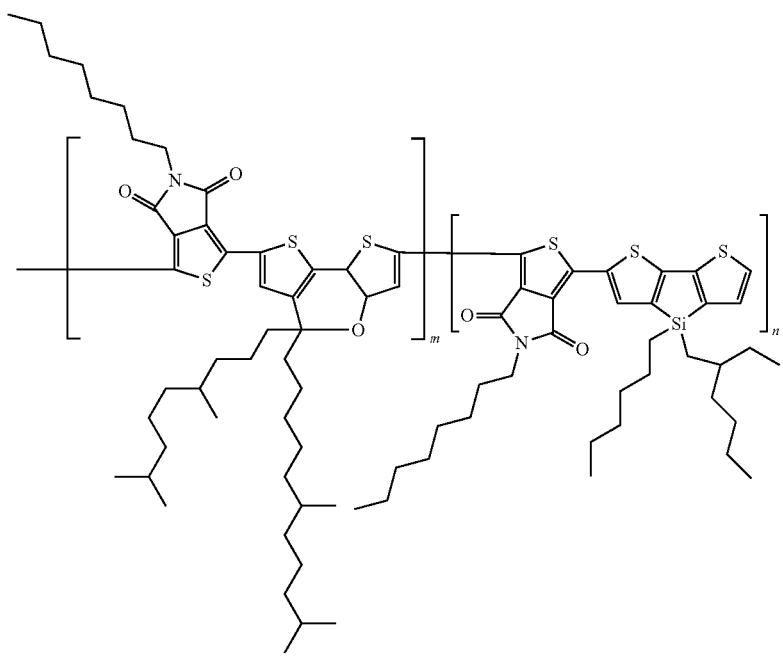
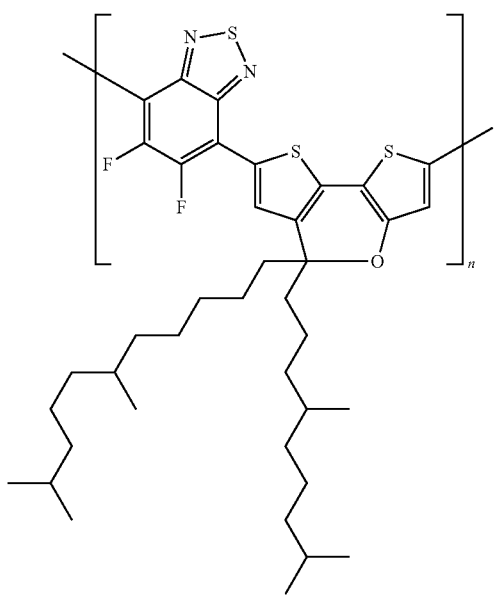

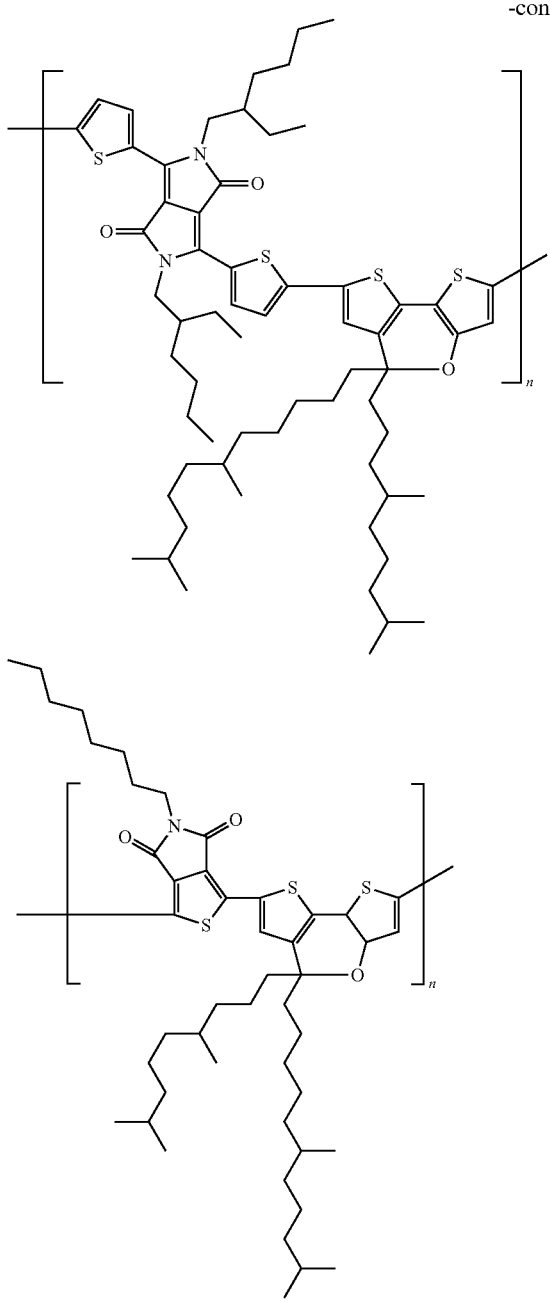

<5. Organic Semiconductor Material and Organic Electronic Device Using Same>

[Organic Semiconductor Material]

The conjugated polymer obtained according to the production method of the invention (hereinafter referred to as the conjugated polymer of the invention) may be used as an organic semiconductor material. The organic semiconductor material containing the conjugated polymer of the invention (hereinafter referred to as the organic semiconductor material of the invention) is described below.

The organic semiconductor material of the invention contains at least the conjugated polymer of the invention. The organic semiconductor material of the invention may contain one type of the conjugated polymer of the invention alone, or may contain two or more types thereof. The organic semiconductor material of the invention may contain any other component than the conjugated polymer of the invention (for example, any other polymer and monomer, various additives, etc.).

The organic semiconductor material of the invention is favorable for the organic semiconductor layer (organic active layer) of the organic electronic device to be mentioned below. In this case, it is desirable that the organic semiconductor material is formed into a film to be the layer. It is advantageous that the organic semiconductor material is soluble in solvent, since the organic semiconductor material can be formed into a film according to a coating method.

The organic semiconductor material of the invention may be used alone, or may be used as mixed and/or laminated with any other organic semiconductor material. The other organic semiconductor material that may be used along with the organic semiconductor material of the invention includes known organic semiconductor materials such as poly(3-hexylthiophene (P3HT), poly[2,6-(4,4-bis[2-ethylhexyl]-4H-cyclopenta[2,1-b:3,4-b']dithiophene)-alt-4,7-(2,1,3-benzothiadiazole)](PCPDTBT), benzoporphyrin (BP), pentacene, etc. There are further mentioned other known organic semiconductor materials that are known as n-type semiconductor compounds, perylene-bisimide, fullerene derivatives such as [6,6]-phenyl-$C_{61}$-methyl butyrate ([60]PCBM) and PCBM having a larger fullerene such as $C_{70}$ or the like, [6,6]-phenyl-$C_{61}$-n-butyl butyrate ([60]PCBNB) and PCBNB having a larger fullerene such as $C_{70}$ or the like, etc. Needless-to-say, the other organic semiconductor material is not limited to these.

The organic semiconductor material of the invention exhibits semiconductor characteristics, and for example, in electron field-effect mobility measurement, the hole mobility of the material is generally $1.0 \times 10^{-5}$ cm$^2$/Vs or more, preferably $1.0 \times 10^{-4}$ cm$^2$/Vs or more and, on the other hand, the hole mobility thereof is generally $1.0 \times 10^{4}$ cm$^2$/Vs or less, preferably $1.0 \times 10^{3}$ cm$^2$V/s or less, more preferably $1.0 \times 10^{2}$ cm$^2$/Vs or less. As the measurement method for the hole mobility, there is mentioned an FET method. The measurement according to an FET method may be carried out according to the method described in a publication (JP-A 2010-045186).

[Organic Electronic Device]

The organic semiconductor material of the invention may be used in an organic electronic device. The organic electronic device produced by the use of the organic semiconductor material of the invention (the organic electronic device of the invention) is described below. The type of the organic electronic device is not specifically defined so far as the organic semiconductor material of the invention is applicable thereto. As examples, there are mentioned a light-emitting element, a switching element, a photoelectric conversion element, a light sensor using photoconductivity, etc.

The light-emitting element includes various kinds of light-emitting elements usable in display devices. As specific examples, there are mentioned a liquid-crystal display element, a polymer dispersion-type liquid-crystal display element, an electrophoretic display element, an electroluminescent element, an electrochromic element, etc.

Specific examples of the switching element include diodes (pn junction diode, Schottky diode, MOS diode, etc.), transistors (bipolar transistor, field-effect transistor (FET), etc.), thyristors, as well as their composite elements (for example, TTL), etc.

Specific examples of the photoelectric conversion element include thin-film solar cells, charge-coupled devices (CCD), photomultipliers, photocouplers, etc. The light sensor using photoconductivity includes those that use these photoelectric conversion elements.

For the configuration and the production method for the above-mentioned organic electronic devices, usable are known techniques. Concretely, herein employable are the techniques described in publications such as Solar Energy Materials & Solar Cells 96 (2012), 155-159, WO2011/016430, JP-A 2012-191194, etc.

As to in what site of an organic electronic device the organic semiconductor material of the invention is to be used, there is no specific limitation, and the material may be used in any site of the device. In particular, in the case of a photoelectric conversion element, the organic semiconductor material of the invention is generally used in forming the organic active layer of the photoelectric conversion element.

<6. Photoelectric Conversion Element>

The photoelectric conversion element produced by the use of the organic semiconductor material of the invention (hereinafter referred to as the photoelectric conversion element of the invention) is described below. The photoelectric conversion element of the invention comprises a pair of electrodes and an active layer arranged between the electrodes.

The photoelectric conversion element of the invention is produced by the use of the organic semiconductor material of the invention. Specifically, the photoelectric conversion element of the invention includes the conjugated polymer produced according to the production method of the invention. The organic semiconductor material of the invention is generally contained in the active layer of the photoelectric conversion element.

FIG. 1 shows a photoelectric conversion element used in an ordinary organic thin-film solar cell, but the invention is not limited thereto. The photoelectric conversion element 107 as one embodiment of the invention has a layered configuration of, as formed in that order, a substrate 106, an anode 101, a hole extraction layer 102, an organic active layer 103 (mixed layer of p-type semiconductor compound and n-type semiconductor material), an electron extraction layer 104 and a cathode 105. The photoelectric conversion element 107 may also have a layered configuration of, as formed in that order, a substrate 106, a cathode 105, an electron extraction layer 104, an organic active layer 103, a hole extraction layer 102 and an anode 101. Between the layers, any other layer may be inserted in the degree not having any influence on the function of each layer.

For the material, the configuration and the production method for each layer mentioned above, usable are known techniques. Concretely, herein employable are the techniques described in publications such as Solar Energy Materials & Solar Cells 96 (2012), 155-159, WO2011/016430, JP-A 2012-191194, etc.

<7. Solar Cell>

Figure 2:
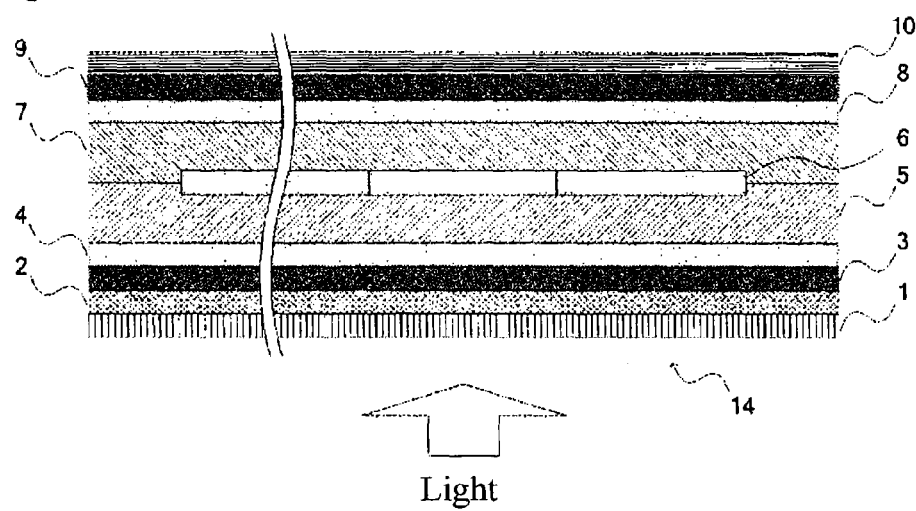
FIG. 2 This is a cross-sectional view schematically showing the constitution of a solar cell as one embodiment of the invention.

It is desirable that the photoelectric conversion element of the above-mentioned embodiments is used as a solar cell element in a solar cell, especially in a thin-film solar cell. FIG. 2 is a cross-sectional view schematically showing the constitution of a thin-film solar cell as one embodiment of the invention. As shown in FIG. 2, the thin-film solar cell 14 of this embodiment comprises, as arranged in that order, a weather-resistant protective film 1, a UV-ray cut film 2, a gas-barrier film 3, a getter material film 4, a sealant material 5, a solar cell element 6, a sealant material 7, a getter material film 8, a gas-barrier film 9, and a back sheet 10. Light is given to the side on which the weather-resistant protective film 1 is formed (the lower side in the drawing), and the solar cell element 6 generates power.

In case where a highly-waterproof sheet such as a sheet of an aluminium foil coated with a fluororesin film on both sides thereof is used as the back sheet 10 to be mentioned below, the getter material film 8 and/or the gas-barrier film 9 may be omitted depending on the intended use.

For the configuration and the production method, any known techniques may be used. Concretely, herein employable are the techniques described in publications such as WO2011/016430, JP-A 2012-191194, etc.

The use of the solar cell of the invention, especially the use of the above-mentioned thin-film solar cell 14 is not specifically defined, and the solar cell may be used in any intended case. Examples of the field to which the thin-film solar cell of the invention is applicable include solar cells for building materials, solar cells for automobiles, solar cells for interior accessories, solar cells for railroads, solar cells for ships, solar cells for airplanes, solar cells for space systems, solar cells for household use, solar cells for mobile phones, solar cells for toys, etc.

Figure 3:
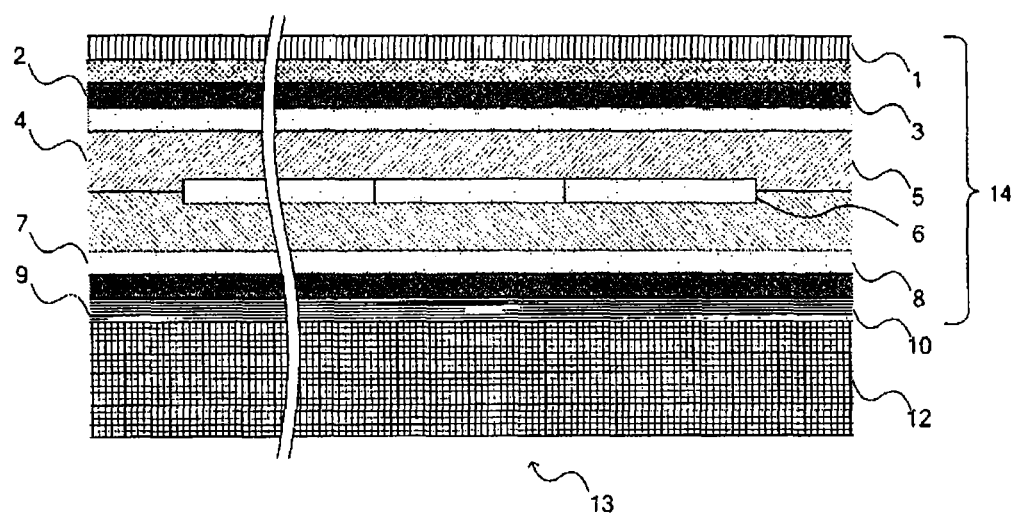
FIG. 3 This is a cross-sectional view schematically showing the constitution of a solar cell module as one embodiment of the invention.

The solar cell, especially the thin-film solar cell of the invention may be used as it is, or the solar cell may be set on a substrate and used as a solar cell module. For example, as schematically shown in FIG. 3, a solar cell module 13 that comprises a thin-film solar cell 14 on a substrate 12 is prepared, and this may be placed in the intended service space. For the substrate 12, usable is any known technique. Concretely, herein employable are the techniques described in publications such as WO2011/016430, JP-A 2012-191194, etc.

A concrete example is mentioned. In case where a board for building materials is used as the substrate 12, the thin-film solar cell 14 may be arranged on the board to be the solar cell module 13 as a solar cell panel.

EXAMPLES

Embodiments of the invention are described with reference to Examples given below. However, not overstepping the scope and the spirit thereof, the invention is not limited to these Examples. The items described in the Examples were determined according to the methods mentioned below.
[Measurement of Weight-Average Molecular Weight (Mw), and Molecular Weight Distribution (PDI)]

The weight-average molecular weight (Mw) and the molecular weight distribution (PDI) of copolymer were determined through gel permeation chromatography (GPC). Concretely, columns of Shim-pac GPC-803 and GPC-804 (by Shimadzu, inner diameter 8.0 mm, length 30 cm) of each one are connected in series, and a pump of LC-10AT, an oven of CTO-10A, and detectors of a differential refractometer (Shimadzu's RID-10A) and a UV-vis detector (Shimadzu's SPD-10A) were used. For the measurement, the conjugated polymer to be analyzed was dissolved in chloroform, and 5 μL of the resulting solution was injected into the columns. Chloroform was used as the mobile phase, and the sample was analyzed at a flow rate of 1.0 mL/min. For the analysis, used was LC-Solution (by Shimadzu).
[Proton NMR Measurement]

An NMR apparatus (name of apparatus: Bruker's 400 MHz) was used for proton NMR. Concretely, heavy chloroform was used as the deuterated solvent, and tetramethylsilane was used as the internal standard to provide the chemical shift. The chemical shift of the aromatic moiety unsubstituted, or mono-substituted or di-substituted with an active group (trimethylstannyl group) was identified through proton NMR, and the ratio of the above compounds was identified from the integral values of the peaks.
[Measurement of Stability of Monomer]

The stability of monomer was measured under the condition mentioned below.

Silica gel (Kanto Chemical's trade name, Silica Gel 60N, spherical neutral, 20 g) and anhydrous potassium carbonate (Aldrich's Catalog No. 347825, powder, 2.0 g) were suspended in hexane (50 mL), and charged in a column (inner diameter 15 mm, length 5 cm). 1.0 g of an active group (trimethylstannyl group)-disubstituted compound, aromatic compound (A2) (before charged in column, this is referred to as Ar(2)) was dissolved in hexane (5.0 mL), and charged in the column. Using hexane as a developing solvent (flow rate 50 ml/min), the solution having passed through the column at room temperature in 3 minutes was collected. The solvent was evaporated away from the solution under reduced pressure, thereby giving compounds after charging in the column.

The compositional ratio of the compound (Ar(1)) mono-substituted with the active group (trimethylstannyl group), the compound (Ar(2)) disubstituted with the group, and the unsubstituted compound (Ar(0)) in the resulting composition was confirmed through the above-mentioned proton NMR.

From the proton NMR data, the total ratio (by mol) of the aromatic compounds Ar(1) and Ar(0) in which the number of the active groups is less than 2, relative to Ar(2) before charging in the above column was calculated.

In the following Examples and Comparative Examples, used were Pd-EnCat® TPP 30, Pd-EnCat® TOTPP 30, Pd-EnCat® 30, and Pd-EnCat® 40 (by Aldrich). These are encapsulated catalysts of palladium supported by porous urea resin beads. Pd-EnCat® 30, and Pd-EnCat® 40 do not contain a ligand, but Pd-EnCat® TPP 30 is encapsulated along with triphenyl phosphine and Pd-EnCat® TOTPP 30 is encapsulated along with tri(o-tolyl) phosphine. FibreCat 1026 (by Wako Pure Chemicals) is a solidified catalyst with a ligand incorporated therein and supported by a carrier of fibrously graft-polymerized polyethylene resin.
[Evaluation of Photoelectric Conversion Element]

A metal mask having a size of 4 mm square was attached to the photoelectric conversion element to be analyzed. Using a solar simulator having an air mass (AM) of 1.5 G and a radiation intensity of 100 mW/cm$^2$ as a radiation light source, the current-voltage characteristic between the ITO electrode and the aluminium electrode was measured with a source meter (Keithley's 2400 Model). From the found data, the open voltage Voc (V), the short-circuit current density Jsc (mA/cm$^2$), the form factor (FF) and the photoelectric conversion efficiency (PCE) (%) were calculated.

Here, the open voltage Voc is a voltage value at a current value=0 (mA/cm$^2$); the short-circuit current density Jsc is a current density at a voltage value=0 (V). The form factor FF is a factor indicating the internal resistance, and is expressed by the following formula where Pmax means the maximum power.

$$FF = Pmax/(Voc \times Jsc).$$

The photoelectric conversion efficiency PCE is given by the following formula where Pin means the incident energy.

$$PCE = (Pmax/Pin) \times 100$$
$$= (Vox \times Jsc \times FF/Pin) \times 100.$$

Synthesis Example 1

[Chem. 73]

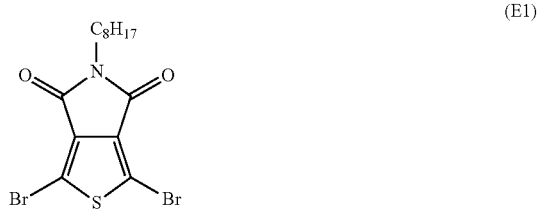

(E1)

1,3-Dibromo-5-octyl-4H-thieno[3,4-c]pyrrole-4,6-(5H)-dione (compound E1) was obtained with reference to the method descried in a publication (Organic Letters, Vol. 6, pp. 3381-3384, 2004).

Synthesis Example 2

[Chem. 74]

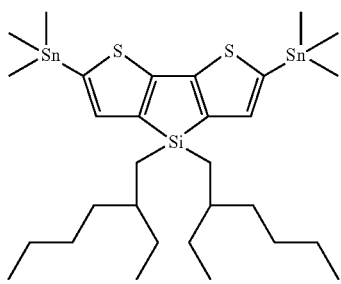

(E2)

4,4-Bis(2-ethylhexyl)-2,6-bis(trimethylstannyl)-dithieno[3,2-b:2',3'-d]silole (compound E2) was obtained with reference to the method descried in a publication (Journal of the American Chemical Society, Vol. 130, pp. 16144-16145 (2008)). Concretely, the compound was synthesized as follows:

[Chem. 75]

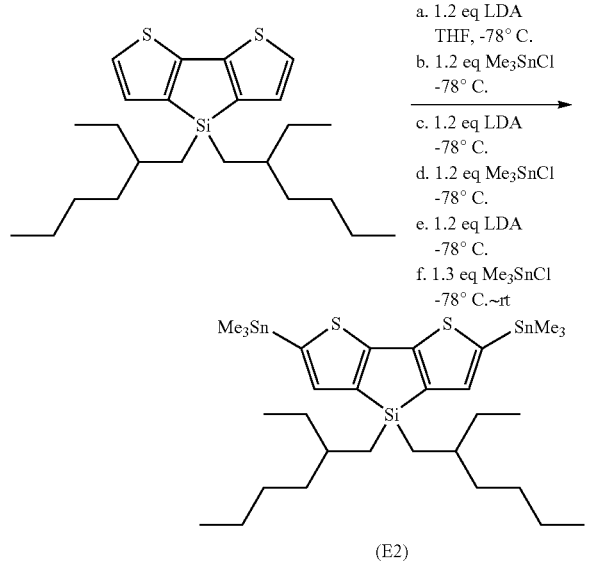

a. 1.2 eq LDA THF, -78° C.
b. 1.2 eq Me$_3$SnCl -78° C.
c. 1.2 eq LDA -78° C.
d. 1.2 eq Me$_3$SnCl -78° C.
e. 1.2 eq LDA -78° C.
f. 1.3 eq Me$_3$SnCl -78° C.~rt (E2)

In a 100-mL two-neck flask in a nitrogen atmosphere, 4,4-Bis(2-ethylhexyl)-dithieno[3,2-b:2',3'-d]silole (1 g, 2.39 mmol) was dissolved in tetrahydrofuran (THF, 25 mL), and cooled to −78° C. Further, a tetrahydrofuran/hexane solution of lithium diisopropylamide (LDA) (by Kanto Chemical, concentration 1.11 M, 2.6 mL, 1.2 eq) was dropwise added thereto and stirred for 40 minutes.

Further, a tetrahydrofuran solution of trimethyltin chloride (by Aldrich, 1.0 M, 2.9 mL, 1.2 eq) was dropwise added thereto, and stirred for 40 minutes. Further, a tetrahydrofuran/hexane solution of lithium diisopropylamide (by Kanto Chemical, concentration 1.11 M, 2.6 mL, 1.2 eq) was dropwise added thereto, and stirred for 40 minutes. Further, a tetrahydrofuran solution of trimethyltin chloride (by Aldrich, 1.0 M, 2.9 mL, 1.2 eq) was dropwise added thereto, and stirred for 40 minutes.

Further, a tetrahydrofuran/hexane solution of lithium diisopropylamide (by Kanto Chemical, concentration 1.11 M, 2.6 mL, 1.2 eq) was dropwise added thereto and stirred for 40 minutes. Further, a tetrahydrofuran solution of trimethyltin chloride (by Aldrich, 1.0 M, 3.1 mL, 1.3 eq) was dropwise added, and then gradually heated up to room temperature. Water was added to the reaction liquid, the product was extracted with hexane, and the organic layer was washed with water. The organic layer was dried on sodium sulfate, filtered, concentrated under reduced pressure and dried in vacuum to give the compound E2 as a yellow-green oil.

Compound E2: $^1$H-NMR (400 MHz, solvent: heavy chloroform): δ 7.07 (s, 2H), 1.45-1.37 (m, 2H), 1.32-1.08 (m, 16H), 0.99-0.80 (m, 10H), 0.77 (t, 6H, J=7.3 Hz), 0.36 (s, 18H).

Synthesis Example 3

Zeolite A-3 (Wako Pure Chemicals' product name Zeolite, Synthetic, A-3, Powder, through 75 μm, 30 g) was suspended in hexane (50 mL), and charged in a column (inner diameter 15 mm). The compound E2 (1.0 g) obtained in Synthesis Example 2 was dissolved in hexane (5.0 mL), and charged in the column. Using hexane as the developing solvent (flow rate 50 ml/min), the solution having passed through the column at room temperature in 3 minutes was collected. The solvent was evaporated away from the solution under reduced pressure to give an oily compound (0.97 g, yield 97%).

Through proton NMR, the obtained compound was identified as the compound E2. In this, neither the presence of the compound S1 to be formed by removing one trimethylstannyl group from the compound E2 nor the presence of the compound S2 to be formed by removing two trimethylstannyl groups from the compound E2 was confirmed.

Zeolite after brought into contact with the compound E2 obtained in Synthesis Example 2 changed from colorless to pale yellow, from which it is known that the zeolite adsorbed impurities. In addition, from the recovery rate, it is also known that the zeolite adsorbed impurities. Zeolite A-3 is a synthetic zeolite, having a chemical composition of (0.4 K+0.6 Na)$_2$O.Al$_2$O$_3$.2SiO$_2$ and a mean pore size of 3 angstroms (Wako Analytical Circle No. 22, p. 14 (9. 2001)).

[Chem. 76]

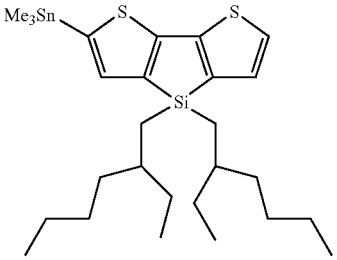

(S1)

Synthesis Example 4

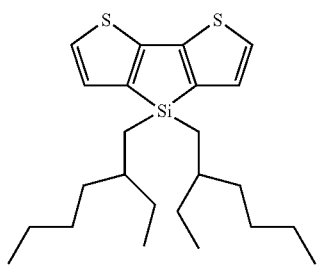

(S2)

[Chem. 77]

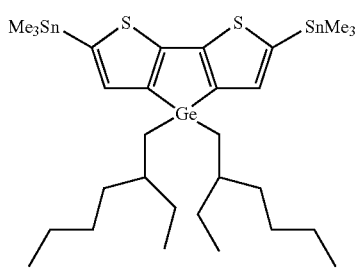

(E3)

4,4-Bis(2-ethylhexyl)-2,6-bis(trimethylstannyl)-dithieno[3,2-b:2',3'-d]germole (compound E3) was obtained in the same manner as in Synthesis Example 2 except that a compound 4,4-bis(2-ethylhexyl)-dithieno[3,2-b:2',3'-d]germole that had been synthesized with reference to the method described in a publication (Macromolecules, Vol. 44, pp. 7188-7193 (2011)) was used in place of 4,4-bis(2-ethylhexyl)-dithieno[3,2-b:2',3'-d]silole as the starting material in Synthesis Example 2.

Synthesis Example 5

An oily compound (0.48 g, yield 96%) was obtained in the same manner as in Synthesis Example 3 except that the compound E3 (0.5 g) obtained in Synthesis Example 4 was used in place of the compound E2 obtained in Synthesis Example 2. Through proton NMR, the obtained compound was identified as the compound E3, in which a destannylated compound was not confirmed. Zeolite after brought into contact with the compound E3 obtained in Synthesis Example 4 changed from colorless to pale yellow, from which it is known that the zeolite adsorbed impurities. From the recovery rate, it is also known that the zeolite adsorbed impurities.

Synthesis Example 6

[Chem. 78]

(E4)

4,4-Bis(2-ethylhexyl)-2,6-bis(trimethylstannyl)-cyclopenta[2,1-b:3,4-b']dithiophene (compound E4) was obtained in the same manner as in Synthesis Example 2 except that 4,4-bis(2-ethylhexyl)-cyclopenta[2,1-b:3,4-b']dithiophene that had been synthesized with reference to the method described in a publication (Journal of Materials Chemistry, Vol. 21, pp. 3895-3902 (2011)) was used in place of 4,4-bis(2-ethylhexyl)-dithieno[3,2-b:2',3'-d]silole as the starting material in Synthesis Example 2.

Synthesis Example 7

An oily compound (0.49 g, yield 98%) was obtained in the same manner as in Synthesis Example 3 except that the compound E4 (0.5 g) obtained in Synthesis Example 6 was used in place of the compound E2 obtained in Synthesis Example 2. Through proton NMR, the obtained compound was identified as the compound E4, in which a destannylated compound was not confirmed. Zeolite after brought into contact with the compound E4 obtained in Synthesis Example 6 changed from colorless to pale yellow, from which it is known that the zeolite adsorbed impurities. From the recovery rate, it is also known that the zeolite adsorbed impurities.

Synthesis Example 8

[Chem. 79]

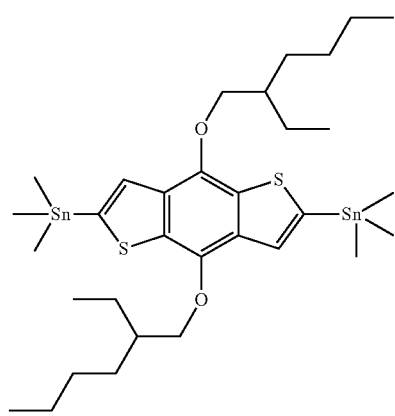

(E5)

1,1'-(4,8-Bis((2-ethylhexyl)oxy)benzo(1,2-b:4,5-b')dithiophene-2,6-diyl)bis(1,1,1-trimethylstanyl) (compound E5) was obtained in the same manner as in Synthesis Example 2 except that (4,8-bis((2-ethylhexyl)oxy)benzo(1,2-b:4,5-b') dithiophene that had been synthesized with reference to the method described in a publication (Macromolecules, Vol. 45, pp. 3732-3739 (2012)) was used in place of 4,4-bis(2-ethylhexyl)-dithieno[3,2-b:2',3'-d]silole as the starting material in Synthesis Example 2.

Synthesis Example 9

An oily compound (5.6 g, yield 98%) was obtained in the same manner as in Synthesis Example 3 except that the compound E5 (5.7 g) obtained in Synthesis Example 8 was used in place of the compound E2 obtained in Synthesis Example 2. Through proton NMR, the obtained compound was identified as the compound E5, in which a destannylated compound was not confirmed. Zeolite after brought into contact with the compound E5 obtained in Synthesis Example 8 changed from colorless to pale yellow, from which it is known that the zeolite adsorbed impurities. From the recovery rate, it is also known that the zeolite adsorbed impurities.

Synthesis Example 10

[Chem. 80]

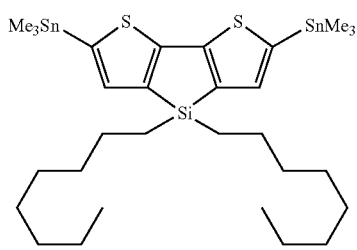

(E6)

4,4-Di-n-octyl-2,6-bis(trimethylstannyl)-dithieno[3,2-b:2',3'-d]silole (compound E6) was obtained in the same manner as in Synthesis Example 2 except that 4,4-bis(n-octyl)-dithieno[3,2-b:2',3'-d]silole was used in place of 4,4-bis(2-ethylhexyl)-dithieno[3,2-b:2',3'-d]silole as the starting material in Synthesis Example 2. The compound E6 was obtained quantitatively.

Synthesis Example 11

An oily compound (2.9 g, yield 94%) was obtained in the same manner as in Synthesis Example 3 except that the compound E6 (3.1 g) obtained in Synthesis Example 10 was used in place of the compound E2 obtained in Synthesis Example 2. Through proton NMR, the obtained compound was identified as the compound E6, in which a destannylated compound was not confirmed.

Synthesis Example 12

[Chem. 81]

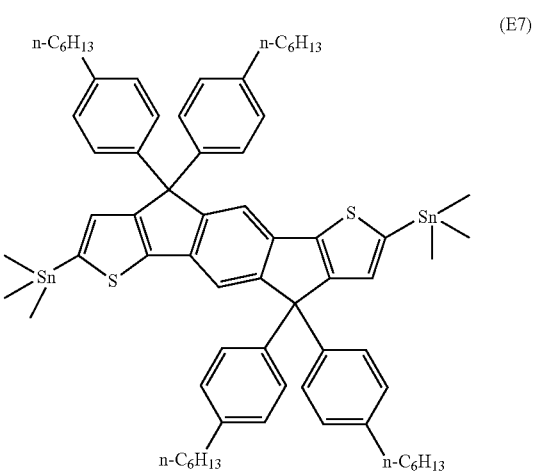

(E7)

1,1'-[4,4,9,9-tetrakis(4-hexylphenyl)-4,9-dihydro-s-indaceno[1,2-b:5,6-b']dithiophene-2,7-diyl]bis[1,1,1-trimethylstannyl](compound E7) was obtained in the same manner as in Synthesis Example 2 except that 4,4,9,9-tetrakis(4-hexylphenyl)-4,9-dihydro-s-indaceno[1,2-b:5,6-b'] dithiophene that had been synthesized with reference to the method described in a publication (Chemistry of Materials (2011) 2289-2291) was used in place of 4,4-bis(2-ethylhexyl)-dithieno[3,2-b:2',3'-d]silole as the starting material in Synthesis Example 2.

Synthesis Example 13

An oily compound (5.9 g, yield 98%) was obtained in the same manner as in Synthesis Example 3 except that the compound E7 (6.0 g) obtained in Synthesis Example 12 was used in place of the compound E2 obtained in Synthesis Example 2. Through proton NMR, the obtained compound was identified as the compound E7, in which a destannylated compound was not confirmed. Zeolite after brought into contact with the compound E7 obtained in Synthesis Example 12 changed from colorless to pale yellow, from which it is known that the zeolite adsorbed impurities. From the recovery rate, it is also known that the zeolite adsorbed impurities.

Synthesis Example 14

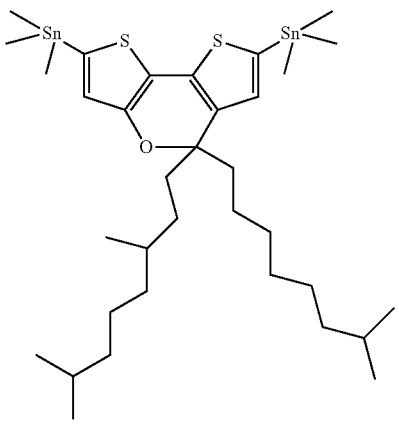

[Chem. 82]

(E8)

1,1'-[5,5-Bis(3,7-dimethyloctyl)-5H-dithieno[3,2-b:2',3'-d]pyran-2,7-diyl]bis[1,1,1-trimethylstannyl](compound E8) was obtained in the same manner as in Synthesis Example 2 except that 5,5-bis(3,7-dimethyloctyl)-5H-dithieno[3,2-b:2',3'-d]pyran that had been synthesized with reference to the method described in a publication (WO2012/050070) was used in place of 4,4-bis(2-ethylhexyl)-dithieno[3,2-b:2',3'-d]silole as the starting material in Synthesis Example 2.

Synthesis Example 15

An oily compound (3.1 g, yield 97%) was obtained in the same manner as in Synthesis Example 3 except that the compound E8 (3.2 g) obtained in Synthesis Example 14 was used in place of the compound E2 obtained in Synthesis Example 2. Through proton NMR, the obtained compound was identified as the compound E8, in which a destannylated compound was not confirmed. Zeolite after brought into contact with the compound E8 obtained in Synthesis Example 14 changed from colorless to pale yellow, from which it is known that the zeolite adsorbed impurities. From the recovery rate, it is also known that the zeolite adsorbed impurities.

Synthesis Example 16

[Chem. 83]

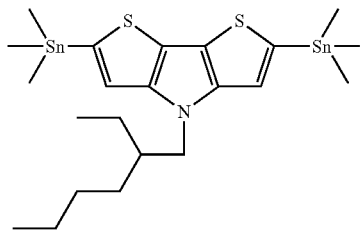

(E12)

4-(2-Ethylhexyl)-2,6-bis(trimethylstannyl)-4H-dithieno[3,2-b:2',3'-d]pyrrole (compound E12) was obtained in the same manner as in Synthesis Example 2 except that 4-(2-ethylhexyl)-4H-dithieno[3,2-b:2',3'-d]pyrrole that had been synthesized with reference to the method described in a publication (Journal of Polymer Science, Part A: Polymer Chemistry (2011), 49, 1453-1461) was used in place of 4,4-bis(2-ethylhexyl)-dithieno[3,2-b:2',3'-d]silole as the starting material in Synthesis Example 2.

Synthesis Example 17

An oily compound (3.3 g, yield 94%) was obtained in the same manner as in Synthesis Example 3 except that the compound E12 (3.5 g) obtained in Synthesis Example 16 was used in place of the compound E2 obtained in Synthesis Example 2. Through proton NMR, the obtained compound was identified as the compound E12, in which a destannylated compound was not confirmed. Zeolite after brought into contact with the compound E12 obtained in Synthesis Example 16 changed from colorless to pale yellow, from which it is known that the zeolite adsorbed impurities. From the recovery rate, it is also known that the zeolite adsorbed impurities.

Synthesis Example 18

[Chem. 84]

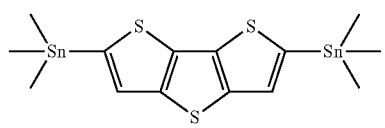

(E13)

A Tokyo Chemical's product 1,1'-dithieno[3,2-b:2',3'-d]thiophene was used and stannylated as in Synthesis Example 1, and 1,1'-dithieno[3,2-b:2',3'-d]thiophene-2,6-diiyl]bis[1,1,1-trimethylstannyl](compound E13) was obtained in the same manner as in Synthesis Example 2 except that 1,1'-dithieno[3,2-b:2',3'-d]thiophene (by Tokyo Chemical) was used in place of 4,4-bis(2-ethylhexyl)-dithieno[3,2-b:2',3'-d]silole as the starting material in Synthesis Example 2.

Synthesis Example 19

An oily compound (2.5 g, yield 93%) was obtained in the same manner as in Synthesis Example 3 except that the compound E13 (2.7 g) obtained in Synthesis Example 18 was used in place of the compound E2 obtained in Synthesis Example 2. Through proton NMR, the obtained compound was identified as the compound E13, in which a destannylated compound was not confirmed. Zeolite after brought into contact with the compound E13 obtained in Synthesis Example 18 changed from colorless to pale yellow, from which it is known that the zeolite adsorbed impurities. From the recovery rate, it is also known that the zeolite adsorbed impurities.

Synthesis Example 20

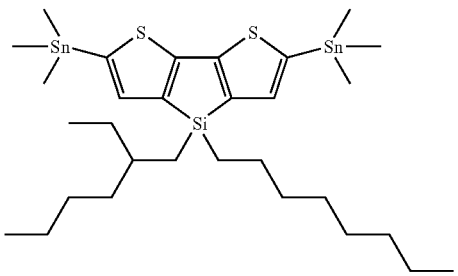

(E15)

[Chem. 85]

4,4-N-octyl-2-ethylhexyl-2,6-bis(trimethylstannyl)-dithieno[3,2-b:2',3'-d]silol (compound E15) was obtained in the same manner as in Synthesis Example 2 except that 4,4-n-octyl-2-ethylhexyl-dithieno[3,2-b:2',3'-d]silol was used in place of 4,4-bis(2-ethylhexyl)-dithieno[3,2-b:2',3'-d]silole as the starting material in Synthesis Example 2. The compound E15 was obtained quantitatively.

Synthesis Example 21

An oily compound (2.94 g, yield 98%) was obtained in the same manner as in Synthesis Example 3 except that the compound E15 (3.0 g) obtained in Synthesis Example 20 was used in place of the compound E2 obtained in Synthesis Example 2. Through proton NMR, the obtained compound was identified as the compound E15, in which a destannylated compound was not confirmed.

Reference Example 1

Measurement of Stability of Compound E2

A hexane solution (5.0 mL) containing 1.0 g of the compound E2 obtained in Synthesis Example 2 (4,4'-bis(2-ethylhexyl)-5,5-bis(trimethylstannyl)-dithieno[3,2-b:2',3'-d]silol) was prepared, and the stability of the compound was measured as in the above. The solvent was evaporated away under reduced pressure from the solution collected from the column to give an oily compound (yield 96%).

The obtained compound was analyzed through proton NMR, which confirmed the absence of both the di-substituted form (compound E2) and the mono-substituted form (compound S1) and confirmed the presence of only the compound S2 formed by removing the two trimethylstannyl groups from the compound E2. The presence of the compound E2 could not be confirmed.

[Chem. 86]

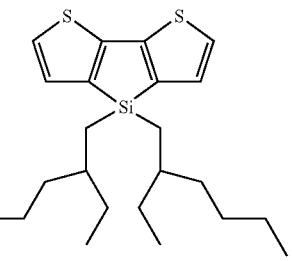

(S2)

Reference Example 2

Measurement of Stability of Compound E5

In the same manner as in Reference Example 1 except that the compound E5 obtained in Synthesis Example 8 was used in place of the compound E2 obtained in Synthesis Example 2, the solution having passed through the column was collected. The solvent was evaporated away from the solution under reduced pressure to give an oily compound (yield 98%).

The obtained compound was analyzed through proton NMR, which confirmed the absence of the di-substituted form, and the compound was a mixture of the mono-substituted form and the unsubstituted form (2/3).

Relative to the compound E5 (di-substituted with trimethylstannyl group) before charged into the column, the proportion of the compound form mono-substituted with trimethylstannyl group and the unsubstituted compound form (by mol) was 98%.

Reference Example 3

Measurement of Stability of Compound E7

In the same manner as in Reference Example 1 except that the compound E7 obtained in Synthesis Example 12 was used in place of the compound E2 obtained in Synthesis Example 1, the solution having passed through the column was collected. The solvent was evaporated away from the solution under reduced pressure to give an oily compound (yield 98%).

The obtained compound was analyzed through proton NMR, which confirmed the absence of the di-substituted form, and the compound was a mixture of the mono-substituted form and the unsubstituted form (1/4). Relative to the compound E7 (di-substituted with trimethylstannyl group) before charged into the column, the proportion of the compound form mono-substituted with trimethylstannyl group and the unsubstituted compound form (by mol) was 98%.

Reference Example 4

Measurement of Stability of Compound E8

In the same manner as in Reference Example 1 except that the compound E8 obtained in Synthesis Example 14 was used in place of the compound E2 obtained in Synthesis Example 2, the solution having passed through the column was collected. The solvent was evaporated away from the solution under reduced pressure to give an oily compound (yield 98%).

The obtained compound was analyzed through proton NMR, which confirmed the absence of the di-substituted form, and the compound was a mixture of the mono-substituted form and the unsubstituted form (2/1). Relative to the compound E8 (di-substituted with trimethylstannyl group) before charged into the column, the proportion of the compound form mono-substituted with trimethylstannyl group and the unsubstituted compound form (by mol) was 98%.

Reference Example 5

Measurement of Stability of Compound E12

In the same manner as in Reference Example 1 except that the compound E12 obtained in Synthesis Example 16 was used in place of the compound E2 obtained in Synthesis Example 2, the solution having passed through the column was collected. The solvent was evaporated away from the solution under reduced pressure to give an oily compound (yield 98%).

The obtained compound was analyzed through proton NMR, which confirmed the absence of the di-substituted form, and the compound was a mixture of the mono-substituted form and the unsubstituted form (1/5).

Relative to the compound E12 (di-substituted with trimethylstannyl group) before charged into the column, the proportion of the compound form mono-substituted with trimethylstannyl group and the unsubstituted compound form (by mol) was 98%.

Reference Example 6

Measurement of Stability of Compound E13

In the same manner as in Reference Example 1 except that the compound E13 obtained in Synthesis Example 18 was used in place of the compound E2 obtained in Synthesis Example 2, the solution having passed through the column was collected. The solvent was evaporated away from the solution under reduced pressure to give an oily compound (yield 98%).

The obtained compound was analyzed through proton NMR, which confirmed the absence of the di-substituted form, and the compound was a mixture of the mono-substituted form and the unsubstituted form (1/4).

Relative to the compound E13 (di-substituted with trimethylstannyl group) before charged into the column, the proportion of the compound form mono-substituted with trimethylstannyl group and the unsubstituted compound form (by mol) was 98%.

Example 1

Conjugated Polymer A, $Pd(PPh_3)_4$ 3 mol %+Pd-EnCat® TPP30 3 mol %

In a 50-mL eggplant flask in nitrogen, the compound E1 (138 mg) obtained in Synthesis Example 1, the compound E2 (255 mg) obtained in Synthesis Example 3, tetrakis(triphenylphosphine)palladium(0) (12 mg, 3 mol % relative to the compound E2), a heterogeneous complex catalyst Pd-EnCat® TPP30 (by Aldrich, 25 mg, 3 mol % relative to the compound E2), toluene (5.3 mL) and N,N-dimethylformamide (1.3 mL) were put, and stirred at 90° C. for 1 hour and then at 100° C. for 10 hours therein.

The reaction liquid was diluted 4-fold with toluene, then stirred under heat for 0.5 hours, and thereafter for terminal treatment, trimethyl(phenyl)tin (0.043 mL) was added thereto and stirred under heat for 6 hours, and further, bromobenzene (2 mL) was added and stirred under heat for 11 hours, and the reaction solution was poured into methanol, and the deposited precipitate was taken out through filtration. The obtained solid was dissolved in chloroform, then diamine silica gel (by Fuji Silicia) was added thereto and stirred at room temperature for 1 hour, and led to pass through a short column of an acidic silica gel. The solution was concentrated and reprecipitated using a solvent of chloroform/ethyl acetate, and the deposited precipitate was taken out through filtration to give a conjugated polymer A. Of the obtained conjugated polymer A, the weight-average molecular weight Mw was $1.4 \times 10^5$, and PDI was 3.3. The yield of the conjugated polymer A was 81%.

Example 2

Conjugated Polymer A, $Pd(PPh_3)_4$ 3 mol %+Pd-EnCat® TOTPP30 3 mol %

The compound E1 (122 mg) obtained in Synthesis Example 1, the compound E2 (226 mg) obtained in Synthesis Example 3, tetrakis(triphenylphosphine)palladium(0) (11 mg, 3 mol % relative to the compound E2), a heterogeneous complex catalyst Pd-EnCat® TOTPP30 (by Aldrich, 23 mg, 3 mol % relative to the compound E2), toluene (4.7 mL) and N,N-dimethylformamide (1.2 mL) were put in a reactor, and stirred at 90° C. for 1 hour and then at 100° C. for 10 hours therein. The reaction liquid was diluted 4-fold with toluene, then stirred under heat for 0.5 hours, and thereafter for terminal treatment, trimethyl(phenyl)tin (0.04 mL) was added thereto and stirred under heat for 6 hours, and further, bromobenzene (2 mL) was added and stirred under heat for 11 hours, and the reaction solution was poured into methanol, and the deposited precipitate was taken out through filtration.

The obtained solid was dissolved in chloroform, then diamine silica gel (by Fuji Silicia) was added thereto and stirred at room temperature for 1 hour, and led to pass through a short column of an acidic silica gel. The solution was concentrated and reprecipitated using a solvent of chloroform/ethyl acetate, and the deposited precipitate was taken out through filtration to give a conjugated polymer A. Of the obtained conjugated polymer A, the weight-average molecular weight Mw was $1.5 \times 10^5$, and PDI was 4.0. The yield of the conjugated polymer A was 77%.

Example 3

Conjugated Polymer A, $Pd(PPh_3)_4$ 3 mol %+Pd-EnCat® TPP30 1 mol %

In a 50-mL eggplant flask in nitrogen, the compound E1 (130 mg) obtained in Synthesis Example 1, the compound E2 (240 mg) obtained in Synthesis Example 3, tetrakis(triphenylphosphine)palladium(0) (11 mg, 3 mol % relative to the compound E2), a heterogeneous complex catalyst Pd-EnCat® TPP30 (by Aldrich, 8 mg, 1 mol % relative to the compound E2), toluene (5 mL) and N,N-dimethylformamide (1.2 mL) were put, and stirred at 90° C. for 1 hour and then at 100° C. for 10 hours therein.

The reaction liquid was diluted 4-fold with toluene, then stirred under heat for 0.5 hours, and thereafter for terminal treatment, trimethyl(phenyl)tin (0.043 mL) was added thereto and stirred under heat for 6 hours, and further, bromobenzene (2 mL) was added and stirred under heat for 11 hours, and the reaction solution was poured into methanol, and the deposited precipitate was taken out through filtration. The obtained solid was dissolved in chloroform, then diamine silica gel (by Fuji Silicia) was added thereto and stirred at room temperature for 1 hour, and led to pass through a short column of an acidic silica gel. The solution was concentrated and reprecipitated using a solvent of chloroform/ethyl acetate, and the deposited precipitate was taken out through filtration to give a conjugated polymer A. Of the obtained conjugated polymer A, the weight-average molecular weight Mw was $1.4 \times 10^5$, and PDI was 4.2. The yield of the conjugated polymer A was 80%.

Example 4

Conjugated Polymer A, Pd(P(o-tol)$_3$)$_4$ 3 mol %+Pd-EnCat® TPP30 3 mol %

The same process as in Example 1 was carried out except that, in place of tetrakis(triphenylphosphine)palladium(0), tetrakis(tri(o-tolyl)phosphine)palladium(0) was used in an amount of 3 mol % relative to the compound E2. Of the obtained conjugated polymer A, the weight-average molecular weight Mw was $8.6 \times 10^4$, and PDI was 3.4. The yield of the conjugated polymer A was 78%.

Example 5

Conjugated Polymer A, Pd(PPh$_3$)$_4$ 3 mol %+Pd-EnCat® 30 3 mol %

The same process as in Example 1 was carried out except that, in place of the heterogeneous complex catalyst Pd-EnCat® TPP30, a heterogeneous complex catalyst Pd-EnCat® 30 (by Aldrich) was used in an amount of 3 mol % relative to the compound E2. Of the obtained conjugated polymer A, the weight-average molecular weight Mw was $1.0 \times 10^5$, and PDI was 3.1. The yield of the conjugated polymer A was 73%.

Example 6

Conjugated Polymer A, Pd(PPh$_3$)$_4$ 3 mol %+Pd-EnCat® 40 3 mol %

The same process as in Example 1 was carried out except that, in place of the heterogeneous complex catalyst Pd-EnCat® TPP30, a heterogeneous complex catalyst Pd-EnCat® 40 (by Aldrich) was used in an amount of 3 mol % relative to the compound E2. Of the obtained conjugated polymer A, the weight-average molecular weight Mw was $9.5 \times 10^4$, and PDI was 3.2. The yield of the conjugated polymer A was 71%.

Example 7

Conjugated Polymer A, Pd(P(tBu)$_3$)$_4$ 3 mol %+Pd-EnCat® TPP30 3 mol %

In a 50-mL eggplant flask in nitrogen, the compound E1 (0.19 mg) obtained in Synthesis Example 1, the compound E2 (0.35 mg) obtained in Synthesis Example 3, a toluene solution of tetrakis(t-butylphosphine)palladium(0) (3 mol % relative to the compound E2) that had been prepared from tris(dibenzylideneacetone)bispalladium chloroform complex and tri(t-butyl) phosphine, a heterogeneous complex catalyst Pd-EnCat® TPP30 (35 mg, 3 mol % relative to the compound E2), toluene (7.3 mL) and N,N-dimethylformamide (1.8 mL) were put, and stirred at 90° C. for 1 hour and then at 100° C. for 10 hours therein.

The reaction liquid was diluted 4-fold with toluene, then stirred under heat for 0.5 hours, and thereafter for terminal treatment, trimethyl(phenyl)tin (0.06 mL) was added thereto and stirred under heat for 6 hours, and further, bromobenzene (1 mL) was added and stirred under heat for 11 hours, and the reaction solution was poured into methanol, and the deposited precipitate was taken out through filtration. The obtained solid was dissolved in chloroform, then diamine silica gel (by Fuji Silicia) was added thereto and stirred at room temperature for 1 hour, and led to pass through a short column of an acidic silica gel.

The obtained solution was concentrated and reprecipitated using a solvent of chloroform/ethyl acetate, and the deposited precipitate was taken out through filtration to give a conjugated polymer A. Of the obtained conjugated polymer A, the weight-average molecular weight Mw was $9.0 \times 10^4$, and PDI was 3.0. The yield of the conjugated polymer A was 77%.

Example 8

Conjugated Polymer B, Pd(PPh$_3$)$_4$ 3 mol %+Pd-EnCat® TPP30 3 mol %

[Chem. 87]

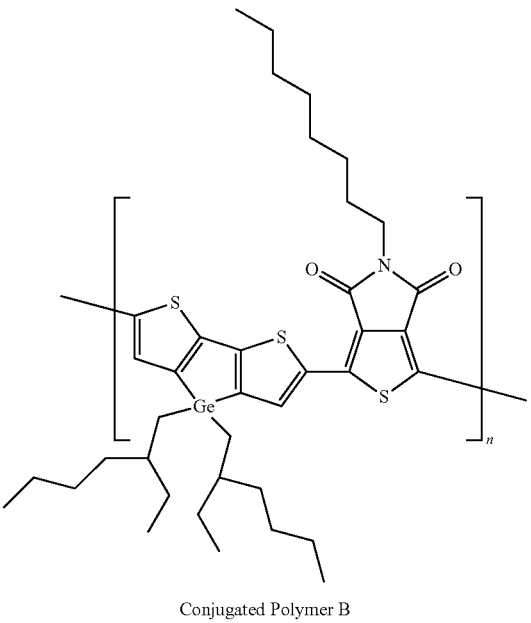

Conjugated Polymer B

A conjugated polymer B was produced in the same manner as in Example 1 except that the compound E3 obtained in Synthesis Example 5 was used in place of the compound E2, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E2. Of the obtained conjugated polymer B, the weight-average molecular weight Mw was $1.9 \times 10^5$, and PDI was 5.7. The yield of the conjugated polymer B was 82%.

Example 9

Conjugated Polymer C, Pd(PPh$_3$)$_4$ 3 mol %+Pd-EnCat® TPP30 3 mol %

[Chem. 88]

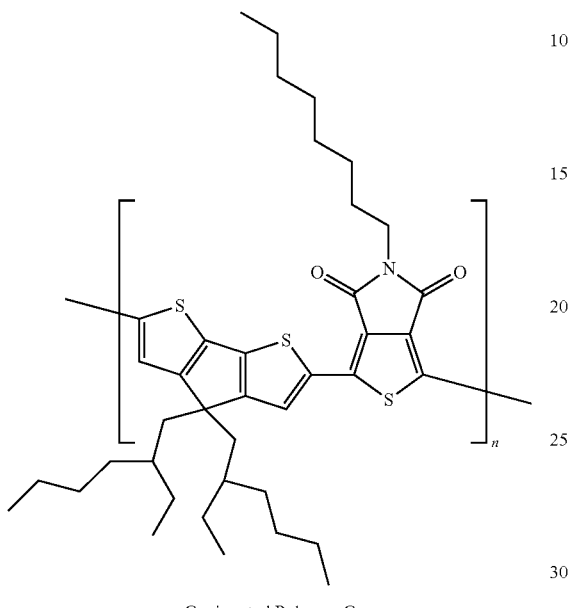

Conjugated Polymer C

A conjugated polymer C was produced in the same manner as in Example 1 except that the compound E4 obtained in Synthesis Example 7 was used in place of the compound E2, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E4. Of the obtained conjugated polymer C, the weight-average molecular weight Mw was 1.3×10$^5$, and PDI was 3.4. The yield of the conjugated polymer C was 73%.

Example 10

Conjugated Polymer D, Pd(PPh$_3$)$_4$ 3 mol %+Pd-EnCat® TPP30 3 mol %

[Chem. 89]

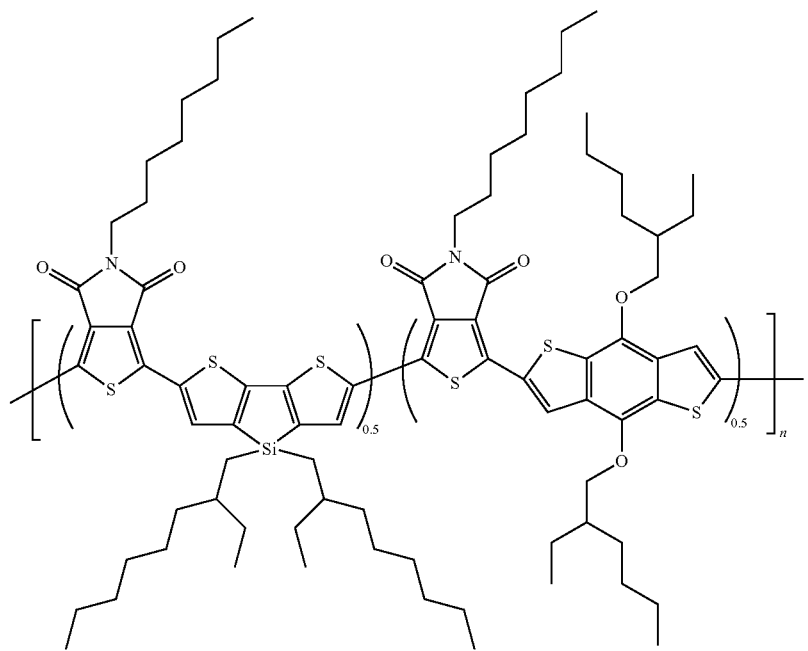

A conjugated polymer D was produced in the same manner as in Example 1 except that the compound E1 (0.861 mmol), the compound E2 (0.453 mmol) and the compound E5 (0.453 mmol) obtained in Synthesis Example 9 were used as the monomers in place of the compound E1 and the compound E2, and that in place of using $Pd(PPh_3)_4$ and Pd-EnCat® TPP30 each in an amount of 3 mol % relative to the compound E2 as the catalysts, the two were used each in an amount of 3 mol % relative to the compound E1. Of the obtained conjugated polymer D, the weight-average molecular weight Mw was $1.6 \times 10^5$, and PDI was 4.1. The yield of the conjugated polymer D was 71%.

Example 11

Conjugated Polymer E, $Pd(PPh_3)_4$ 3 mol %+Pd-EnCat® TPP30 3 mol %

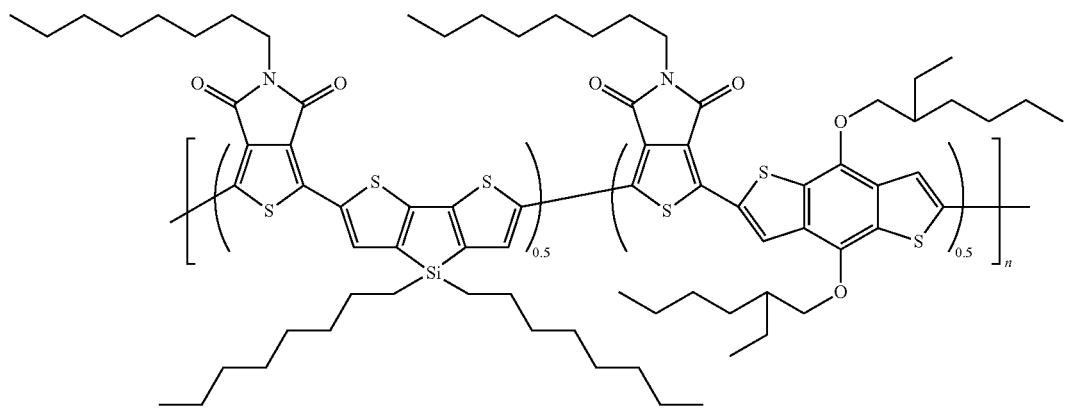

[Chem. 90]

A conjugated polymer E was produced in the same manner as in Example 1 except that the compound E1 (0.566 mmol), the compound E5 (0.298 mmol) and the compound E6 (0.298 mmol) obtained in Synthesis Example 11 were used as the monomers in place of the compound E1 and the compound E2, and that in place of using $Pd(PPh_3)_4$ and Pd-EnCat® TPP30 each in an amount of 3 mol % relative to the compound E2 as the catalysts, the two were used each in an amount of 3 mol % relative to the compound E1. Of the obtained conjugated polymer E, the weight-average molecular weight Mw was $1.0 \times 10^5$, and PDI was 2.7. The yield of the conjugated polymer E was 69%.

Example 12

Conjugated Polymer F, Pd(PPh$_3$)$_4$ 3 mol %+Pd-EnCat® TPP30 3 mol %

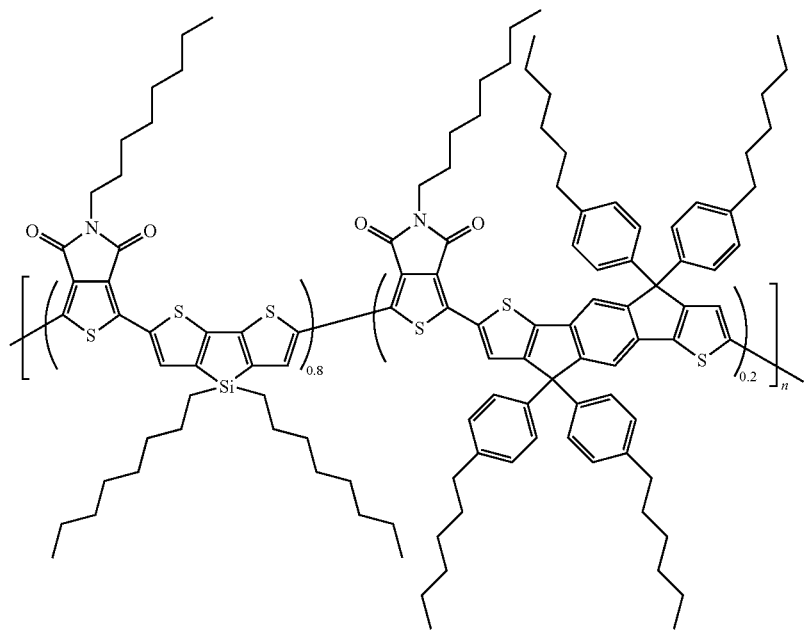

[Chem. 91]

A conjugated polymer F was produced in the same manner as in Example 1 except that the compound E1 (0.810 mmol), the compound E6 (0.682 mmol) obtained in Synthesis Example 11 and the compound E7 (0.171 mmol) obtained in Synthesis Example 13 were used as the monomers in place of the compound E1 and the compound E2, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E1. Of the obtained conjugated polymer F, the weight-average molecular weight Mw was $4.4 \times 10^5$, and PDI was 5.6. The yield of the conjugated polymer F was 79%.

Example 13

Conjugated Polymer G, Pd(PPh$_3$)$_4$ 3 mol %+Pd-EnCat® TPP30 3 mol %

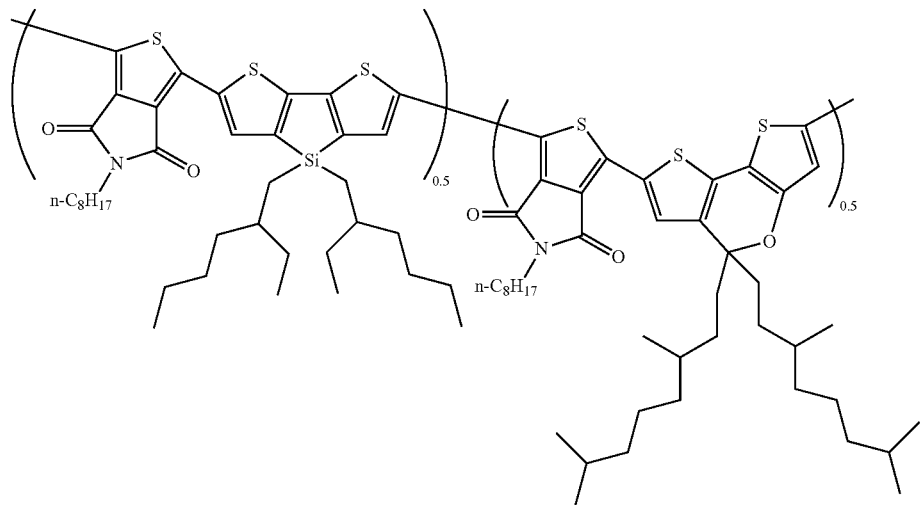

[Chem. 92]

A conjugated polymer G was produced in the same manner as in Example 1 except that the compound E1 (0.851 mol), the compound E2 (0.448 mmol) and the compound E8 (0.448 mmol) obtained in Synthesis Example 15 were used as the monomers in place of the compound E1 and the compound E2, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E1. Of the obtained conjugated polymer G, the weight-average molecular weight Mw was $5.1 \times 10^4$, and PDI was 2.1. The yield of the conjugated polymer G was 68%.

Example 14

Conjugated Polymer H, Pd(PPh$_3$)$_4$ 3 mol %+Pd-EnCat® TPP30 3 mol %

[Chem. 93]

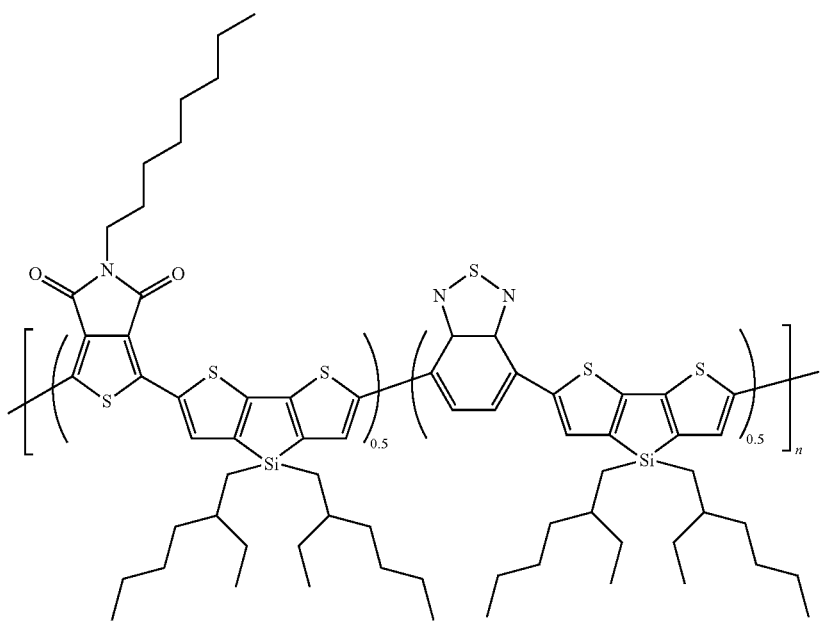

A conjugated polymer H was produced in the same manner as in Example 1 except that the compound E1 (0.396 mmol), the compound E2 (0.834 mmol) and 4,7-dibromobenzo[c][1,2,5]thiadiazole (compound E9 (0.396 mmol, by Tokyo Chemical)) were used as the monomers in place of the compound E1 and the compound E2. Of the obtained conjugated polymer H, the weight-average molecular weight Mw was $1.0 \times 10^5$, and PDI was 3.6. The yield of the conjugated polymer H was 73%.

[Chem. 94]

(E9)

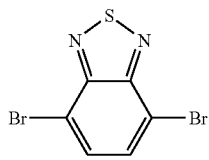

Example 15

Conjugated Polymer I, Pd(PPh$_3$)$_4$ 3 mol %+Pd-EnCat® TPP30 3 mol %

[Chem. 95]

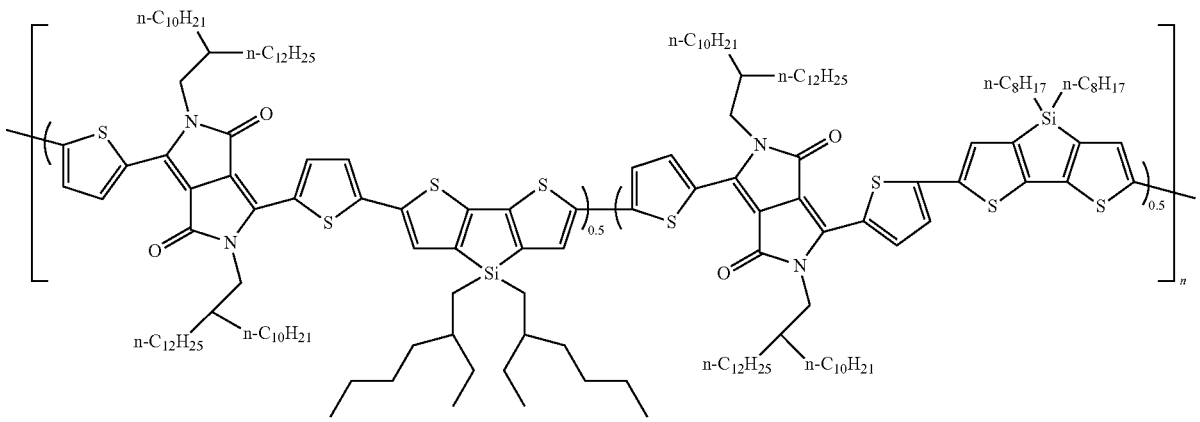

A conjugated polymer I was produced in the same manner as in Example 1 except that the compound E2 (0.341 mmol), the compound E6 (0.341 mmol) obtained in Synthesis Example 9 and 3,6-bis(5-bromo-2-thienyl)-2,5-bis(2-decyltetradecyl)-2,5-dihydro-pyrrolo[3,4-c]pyrrole-1,4-dione (compound E10 (0.648 mmol), by Lumtec) were used as the monomers in place of the compound E1 and the compound E2, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E10. Of the obtained conjugated polymer I, the weight-average molecular weight Mw was $2.6 \times 10^5$, and PDI was 3.9. The yield of the conjugated polymer I was 71%.

[Chem. 96]

(E10)

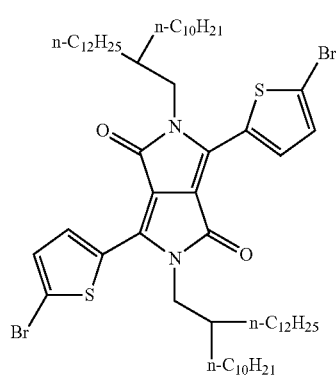

Example 16

Conjugated Polymer J, Pd(PPh$_3$)$_4$ 3 mol %+Pd-EnCat® TPP30 3 mol %

[Chem. 97]

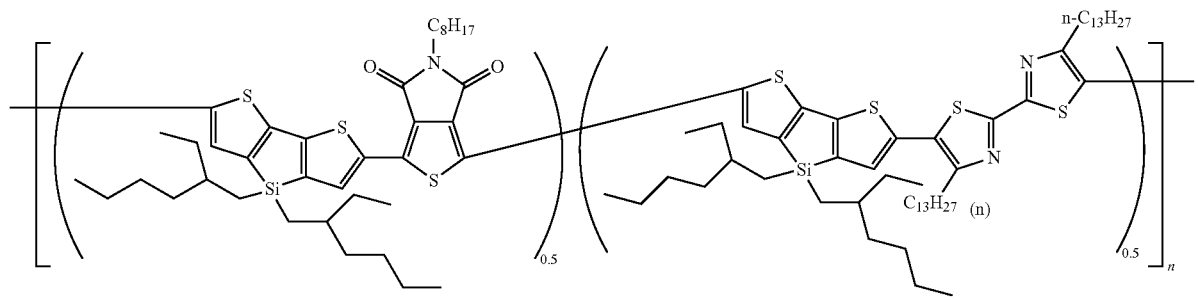

A conjugated polymer J was produced in the same manner as in Example 1 except that the compound E1 (0.338 mmol), the compound E2 (0.712 mmol) and 3,6-bis(5-bromo-2-thienyl)-2,5-bis(2-decyltetradecyl)-2,5-dihydro-pyrrolo[3,4-c]pyrrole-1,4-dione (compound E11 (0.338 mmol, by Lumtec)) were used as the monomers in place of the compound E1 and the compound E2. Of the obtained conjugated polymer J, the weight-average molecular weight Mw was $1.0 \times 10^5$, and PDI was 2.8. The yield of the conjugated polymer J was 79%.

[Chem. 98]

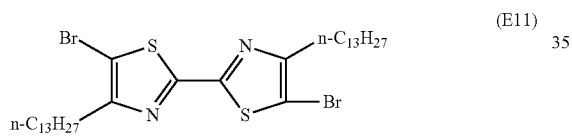

(E11)

Example 17

Conjugated Polymer K, Pd(PPh$_3$)$_4$ 3 mol %+Pd-EnCat® TPP30 3 mol %

[Chem. 99]

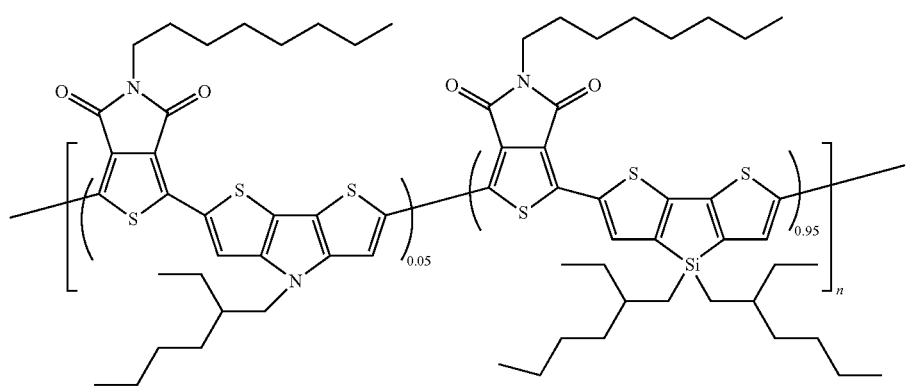

A conjugated polymer K was produced in the same manner as in Example 1 except that the compound E1 (0.801 mmol), the compound E2 (0.801 mmol) and the compound E12 (0.0422 mmol) obtained in Synthesis Example 17 were used as the monomers in place of the compound E1 and the compound E2, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E1. Of the obtained conjugated polymer K, the weight-average molecular weight Mw was $1.8 \times 10^5$, and PDI was 3.6. The yield of the conjugated polymer K was 77%.

Example 18

Conjugated Polymer L, Pd(PPh$_3$)$_4$ 3 mol %+Pd-EnCat® TPP30 3 mol %

[Chem. 100]

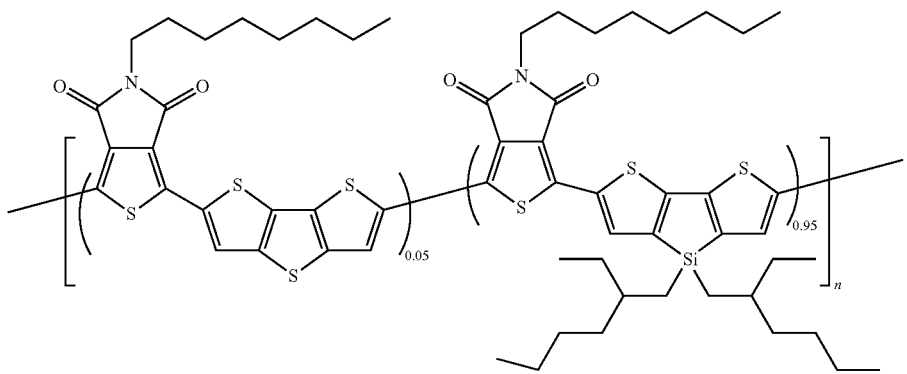

A conjugated polymer L was produced in the same manner as in Example 1 except that the compound E1 (0.794 mol), the compound E2 (0.794 mmol) and the compound E13 (0.042 mol) obtained in Synthesis Example 19 were used as the monomers in place of the compound E1 and the compound E2, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E1. Of the obtained conjugated polymer L, the weight-average molecular weight Mw was $2.6 \times 10^5$, and PDI was 5.2. The yield of the conjugated polymer L was 75%.

Example 19

Conjugated Polymer M, Pd(PPh$_3$)$_4$ 3 mol %+Pd-EnCat® TPP30 3 mol %

[Chem. 101]

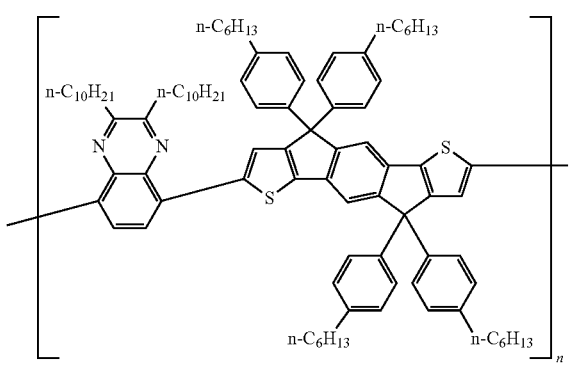

A conjugated polymer M was produced in the same manner as in Example 1 except that the compound E7 (0.642 mmol) obtained in Synthesis Example 13 and 5,8-dibromo-2,3-dimethyl-quinoxaline (compound E14 (0.616 mmol, by Lumtec)) were used as the monomers in place of the compound E1 and the compound E2, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E7. Of the obtained conjugated polymer M, the weight-average molecular weight Mw was $1.5 \times 10^5$, and PDI was 1.9. The yield of the conjugated polymer M was 70%.

Example 20

Conjugated Polymer N, Pd(PPh$_3$)$_4$ 3 mol %+Pd-EnCat® TPP30 3 mol %

[Chem. 102]

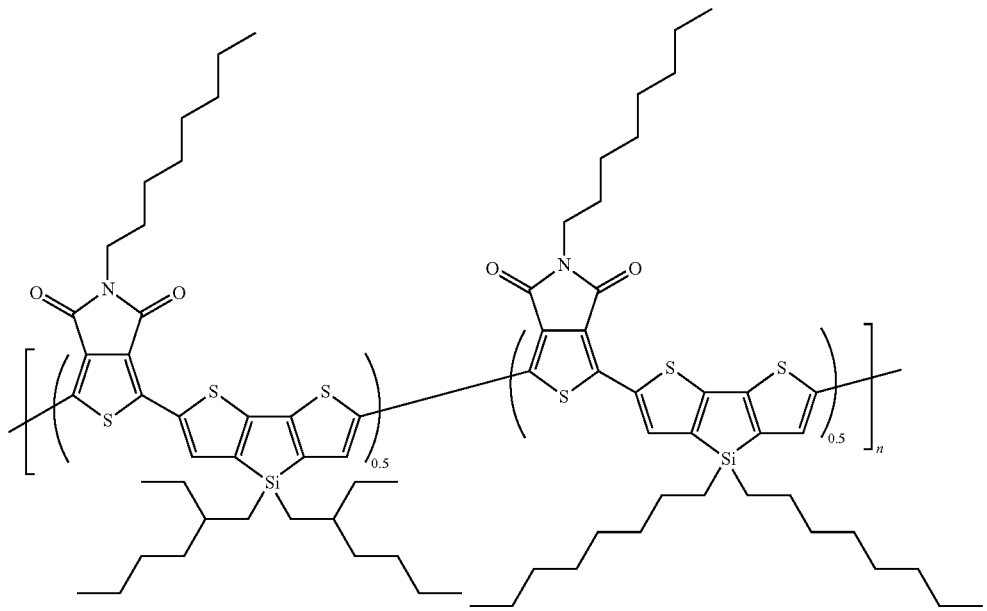

A conjugated polymer N was produced in the same manner as in Example 1 except that the compound E1 (98.9 mmol), the compound E2 (47.0 mmol) and the compound E6 (47.0 mmol) obtained in Synthesis Example 10 were used as the monomers in place of the compound E1 and the compound E2, that in place of using Pd(PPh$_3$)$_4$ and Pd-EnCat® TPP30 each in an amount of 3 mol % relative to the compound E2 as the catalysts, the two were used each in an amount of 3 mol % relative to the compound E1, and that the reaction time was 1 hour at 90° C. plus 2 hours at 100° C. in place of 1 hour at 90° C. plus 10 hours at 100° C. Of the obtained conjugated polymer N, the weight-average molecular weight Mw was $3.2 \times 10^5$, and PDI was 5.2. The yield of the conjugated polymer N was 83%.

Example 21

Conjugated Polymer O, Pd(PPh$_3$)$_4$ 3 mol %+Pd-EnCat® TPP30 3 mol %

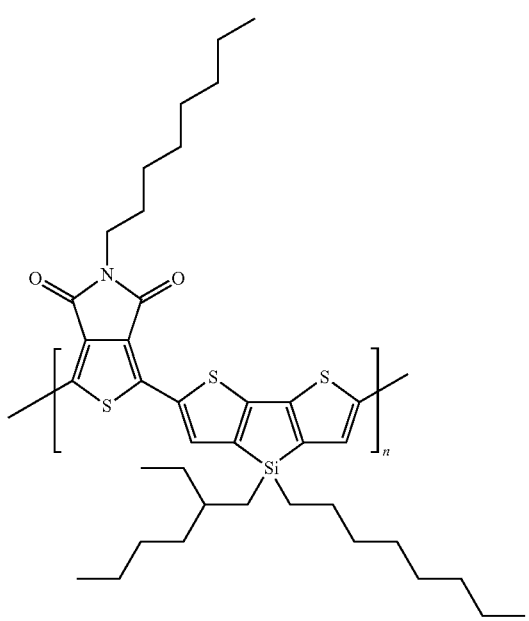

[Chem. 103]

A conjugated polymer O was produced in the same manner as in Example 1 except that the compound E15 (0.986 mmol) obtained in Synthesis Example 21 was used in place of the compound E2 as the monomer, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E15. Of the obtained conjugated polymer O, the weight-average molecular weight Mw was $2.1\times10^5$, and PDI was 4.6. The yield of the conjugated polymer O was 81%.

Example 22

Conjugated Polymer P, Pd(PPh$_3$)$_4$ 3 mol %+Pd-EnCat® TPP30 3 mol %

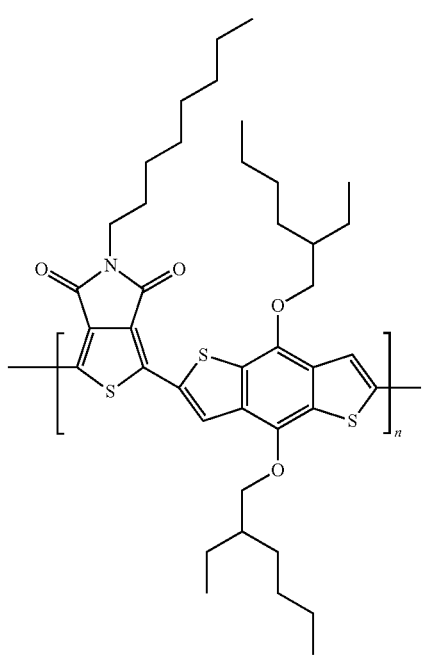

[Chem. 104]

A conjugated polymer P was produced in the same manner as in Example 1 except that the compound E5 (0.612 mmol) obtained in Synthesis Example 9 was used in place of the compound E2 as the monomer, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E5. Of the obtained conjugated polymer P, the weight-average molecular weight Mw was $3.6\times10^5$, and PDI was 5.7. The yield of the conjugated polymer P was 80%.

Example 23

Conjugated Polymer Q, Pd(PPh$_3$)$_4$ 3 mol %+Pd-EnCat® TPP30 3 mol %

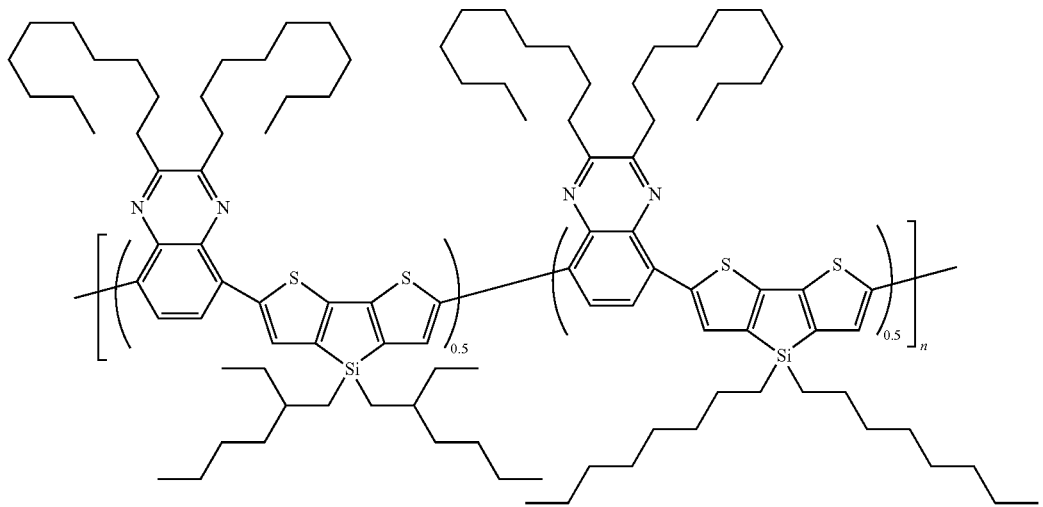

[Chem. 105]

A conjugated polymer Q was produced in the same manner as in Example 1 except that the compound E2 (0.312 mmol), the compound E6 (0.312 mmol) obtained in Synthesis Example 11 and 5,8-dibromo-2,3-didecyl-quinoxaline (compound E14(0.657 mmol, by Lumtec)) were used in place of the compound E1 and the compound E2 as the monomers, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E14. Of the obtained conjugated polymer Q, the weight-average molecular weight Mw was $3.2 \times 10^5$, and PDI was 5.2. The yield of the conjugated polymer Q was 67%.

Example 24

Conjugated Polymer R, Pd(PPh$_3$)$_4$ 3 mol %+Pd-EnCat® TPP30 3 mol %

[Chem. 106]

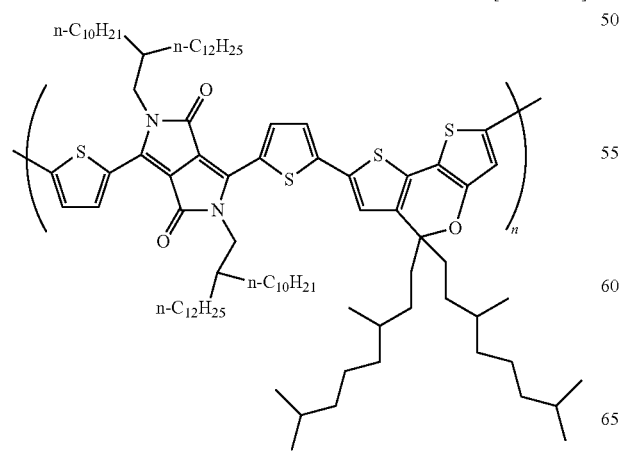

A conjugated polymer R was produced in the same manner as in Example 1 except that the compound E8 (0.863 mmol) obtained in Synthesis Example 15 and 3,6-bis(5-bromo-2-thienyl)-2,5-bis(2-decyltetradecyl)-2,5-dihydro-pyrrolo[3,4-c]pyrrole-1,4-dione (compound E10 (0.810 mol, by Lumtec)) were used in place of the compound E1 and the compound E2 as the monomers, and that in place of using Pd(PPh$_3$)$_4$ and Pd-EnCat® TPP30 each in an amount of 3 mol % relative to the compound E2 as the catalysts, the two were used each in an amount of 3 mol % relative to the compound E8. Of the obtained conjugated polymer R, the weight-average molecular weight Mw was $4.1 \times 10^5$, and PDI was 1.9. The yield of the conjugated polymer R was 74%.

Example 25

Conjugated Polymer S, Pd(PPh$_3$)$_4$ 3 mol %+Pd-EnCat® TPP30 3 mol %

[Chem. 107]

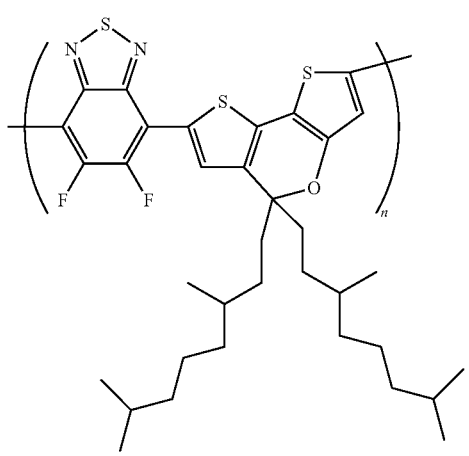

A conjugated polymer S was produced in the same manner as in Example 1 except that the compound E8 (0.931 mmol) obtained in Synthesis Example 15 and 4,7-dibromo-5,6-difluoro-2,1,3-benzothiazole (compound E99 (mol, by Lumtec)) were used as the monomers in place of the compound E1 and the compound E2, that in place of using Pd(PPh$_3$)$_4$ and Pd-® TPP30 each in an amount of 3 mol % relative to the compound E2 as the catalysts, the two Pd(PPh$_3$)$_4$ and Pd-EnCat® TOTPP30 were used each in an amount of 3 mol % relative to the compound E8, and that the reaction time was 1 hour at 90° C. plus 8 hours at 100° C. in place of 1 hour at 90° C. plus 10 hours at 100° C. Of the obtained conjugated polymer S, the weight-average molecular weight Mw was $2.9 \times 10^5$, and PDI was 2.3. The yield of the conjugated polymer S was 65%.

[Chem. 108]

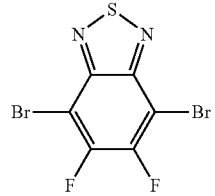

(E99)

Example 26

Conjugated Polymer A, Pd(PPh$_3$)$_4$ 1 mol %+Pd-EnCat® TPP30 3 mol %

A conjugated polymer A was produced in the same manner as in Example 1 except that in place of using Pd(PPh$_3$)$_4$ and Pd-EnCat® TPP30 each in an amount of 3 mol % relative to the compound E2 as the catalysts, Pd(PPh$_3$)$_4$ was used in an amount of 1 mol % relative to the compound E2 and Pd-EnCat® TPP30 was used in an amount of 3 mol % relative to the compound E2. Of the obtained conjugated polymer A, the weight-average molecular weight Mw was $2.6 \times 10^5$, and PDI was 2.5. The yield of the conjugated polymer A was 66%.

Example 27

Conjugated Polymer N, Pd(PPh$_3$)$_4$ 3 mol %+Fibrecat 1026 3 mol %

A conjugated polymer N was produced in the same manner as in Example 1 except that the compound E1 (43.0 mmol), the compound E2 (21.5 mmol) and the compound E6 (21.5 mmol) obtained in Synthesis Example 10 were used as the monomers in place of the compound E1 and the compound E2, that in place of using Pd(PPh$_3$)$_4$ and Fibrecat (by Wako Pure Chemicals) each in an amount of 3 mol % relative to the compound E2 as the catalysts, the two were used each in an amount of 3 mol % relative to the compound E1, and that the reaction time was 1 hour at 90° C. plus 3 hours at 100° C. in place of 1 hour at 90° C. plus 10 hours at 100° C. Of the obtained conjugated polymer N, the weight-average molecular weight Mw was $1.8 \times 10^6$, and PDI was 2.9. The yield of the conjugated polymer N was 74%.

Comparative Example 1

Conjugated Polymer A, Pd(PPh$_3$)$_4$ 3 mol %

[Chem. 109]

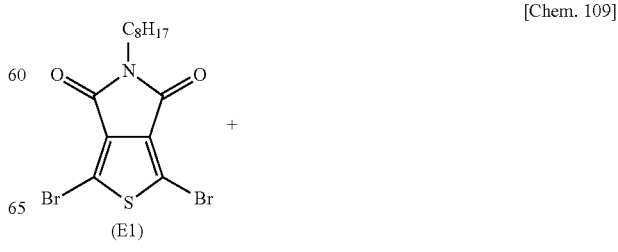

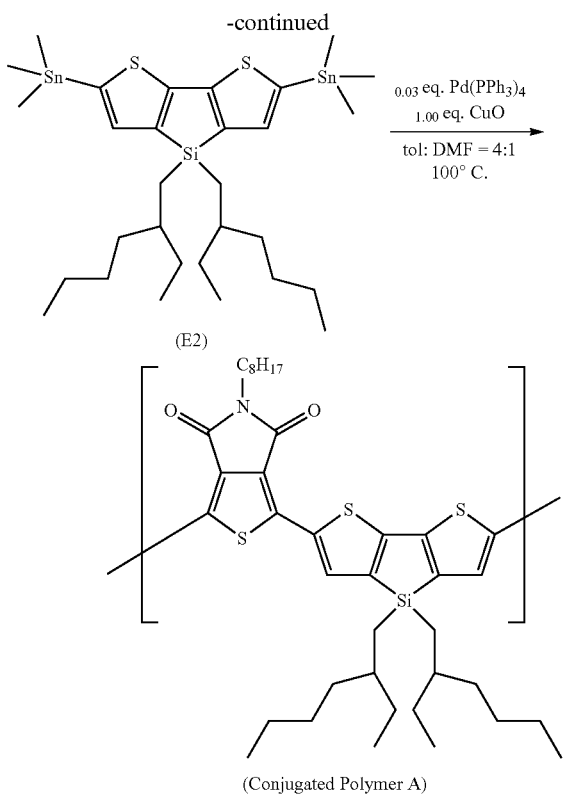

(E2)

(Conjugated Polymer A)

In a 50-mL eggplant flask in nitrogen, the compound E1 (1,3-dibromo-5-octyl-4H-thieno[3,4-c]pyrrole-4,6-(5H)-dione, 187 mg, 0.443 mmol) obtained in Synthesis Example 1, the compound E2 (4,4'-bis(2-ethylhexyl)-5,5-bis(trimethylstannyl)-dithieno[3,2-b:2',3'-d]silole, 340 mg, 0.443 mmol) obtained in Synthesis Example 3, tetrakis(triphenylphosphine)palladium(0) (15 mg, 3 mol % relative to the compound E2), copper(II) oxide (35 mg, 0.443 mmol), toluene (6.8 mL) and N,N-dimethylformamide (1.6 mL) were put, and stirred at 100° C. for 20 hours therein. Subsequently, for terminal treatment, bromobenzene (0.1 mL) was added thereto and stirred under heat for 3 hours, and further, trimethyl(phenyl)tin (0.1 mL) was added and stirred under heat for 3 hours. The reaction solution was diluted 5-fold with toluene, and dropwise put into methanol (400 mL). The precipitated polymer was taken out through filtration, and purified through a silica gel column to give a crude polymer containing the intended conjugated polymer A.

Using an apparatus JAL908-C60 (Japan Analytical Industry) equipped with JAIGEL-3H (40φ) and 2H (40φ) and using chloroform as a developer, a chloroform solution (10 mL) of the crude polymer was charged in the column and purified through GPC preparative purification at a flow rate of 14 mL/min. The weight-average molecular weight Mw of the separated conjugated polymer A was $5.5 \times 10^4$ and PDI thereof was 1.3. The yield of the conjugated polymer A was 27%.

Comparative Example 2

Conjugated Polymer A, Pd(PPh$_3$)$_4$ 5 mol %

A crude polymer containing the conjugated polymer A was obtained in the same manner as in Comparative Example 1 except that tetrakis(triphenylphosphine)palladium(0) was used in an amount of 5 mol % relative the compound E2.

Using an apparatus JAL908-C60 (Japan Analytical Industry) equipped with JAIGEL-3H (40φ) and 2H (40φ) and using chloroform as a developer, a chloroform solution (10 mL) of the crude polymer was charged in the column and purified through GPC preparative purification at a flow rate of 14 mL/min. The weight-average molecular weight Mw of the separated conjugated polymer A was $4.1 \times 10^4$ and PDI thereof was 1.5. The yield of the conjugated polymer A was 30%.

Comparative Example 3

Conjugated Polymer A, Pd(PPh$_3$)$_4$ 10 mol %

A crude polymer containing the conjugated polymer A was obtained in the same manner as in Comparative Example 1 except that tetrakis(triphenylphosphine)palladium(0) was used in an amount of 10 mol % relative the compound E2.

Using an apparatus JAL908-C60 (Japan Analytical Industry) equipped with JAIGEL-3H (40φ) and 2H (40φ) and using chloroform as a developer, a chloroform solution (10 mL) of the crude polymer was charged in the column and purified through GPC preparative purification at a flow rate of 14 mL/min. The weight-average molecular weight Mw of the separated conjugated polymer A was $4.1 \times 10^4$ and PDI thereof was 1.5. The yield of the conjugated polymer A was 31%.

Comparative Example 4

Conjugated Polymer A, Pd(P(o-tol)$_3$)$_4$ 3 mol %

The same process as in Comparative Example 1 was carried out except that, in place of tetrakis(triphenylphosphine)palladium(0), tetrakis(tri(o-tolyl)phosphine)palladium(0) was used in an amount of 3 mol % relative to the compound E2.

Using an apparatus JAL908-C60 (Japan Analytical Industry) equipped with JAIGEL-3H (40φ) and 2H (40φ) and using chloroform as a developer, a chloroform solution (10 mL) of the crude polymer was charged in the column and purified through GPC preparative purification at a flow rate of 14 mL/min. The weight-average molecular weight Mw of the separated conjugated polymer A was $4.7 \times 10^4$ and PDI thereof was 1.8. The yield of the conjugated polymer A was 25%.

Comparative Example 5

Conjugated Polymer A, Pd-EnCat® TPP30 3 mol %

In a 50-mL eggplant flask in nitrogen, the compound E1 (135 mg) obtained in Synthesis Example 1, the compound E2 (243 mg) obtained in Synthesis Example 3, a heterogeneous complex catalyst Pd-EnCat® TPP30 (by Aldrich, 24 mg, 3 mol % relative to the compound E2), toluene (5.1 mL) and N,N-dimethylformamide (1.3 mL) were put, and stirred at 90° C. for 1 hour therein, and then at 100° C. for 6 hours. Subsequently, the reaction liquid was diluted 4-fold with toluene, further stirred under heat for 0.5 hours, and for terminal treatment, trimethyl(phenyl)tin (0.03 mL) was added thereto and stirred under heat for 10 hours, and further, bromobenzene (0.5 mL) was added and stirred under heat for 6 hours. The reaction solution was poured into methanol, and the deposited precipitate was taken out through filtration. The obtained solid was dissolved in chloroform, diamine silica gel (by Fuji Silicia) was added thereto and stirred for 1 hour at room temperature, and thereafter led to pass through a short column of an acidic silica gel. The obtained solution was concentrated, then reprecipitated with a solvent of chloroform/ethyl acetate, and the deposited precipitated was taken out through filtration to give a conjugated polymer A. Of the obtained conjugated polymer A, the weight-average molecular weight Mw was $2.2 \times 10^4$, and PDI was 2.0. The yield of the conjugated polymer A was 85%.

In the above process, a part of the reaction liquid after stirring at 90° C. for 1 hour followed by stirring at 100° C. for 2 hours was sampled, and analyzed through gel permeation chromatography (GPC). The time for the maximum value of the GPC profile of the intended product was the same as that for the polymer (after stirred at 90° C. for 1 hour and then at 100° C. for 6 hours). This confirms that the reaction in Comparative Example 5 almost finished in about 2 hours.

Comparative Example 6

Conjugated Polymer A, Pd-EnCat® TOTPP30 3 mol %

The same process as in Comparative Example 5 was carried out except that, in place of the heterogeneous complex catalyst Pd-EnCat® TPP30, a heterogeneous complex catalyst Pd-EnCat® TOTPP30 (by Aldrich) was used in an amount of 3 mol % relative to the compound E2. Of the obtained conjugated polymer A, the weight-average molecular weight Mw was $3.1 \times 10^4$, and PDI was 2.2. The yield of the conjugated polymer A was 86%.

In the above process, a part of the reaction liquid after stirring at 90° C. for 1 hour followed by stirring at 100° C. for 2 hours was sampled, and analyzed through gel permeation chromatography (GPC). The time for the maximum value of the GPC profile of the intended product was the same as that for the polymer (after stirred at 90° C. for 1 hour and then at 100° C. for 6 hours). This confirms that the reaction in Comparative Example 6 almost finished in about 2 hours.

Comparative Example 7

Conjugated Polymer F, $Pd(PPh_3)_4$ 3 mol %

The conjugated polymer F was obtained in the same manner as in Example 12, except that, in place of using $Pd(PPh_3)_4$ 3 mol %+Pd-EnCat® TPP30 3 mol % relative to the compound E1 as the catalysts, $Pd(PPh_3)_4$ 3 mol % alone was used relative to the compound E1, and that the reaction time was 20 hours at 100° C. in place of 1 hour at 90° C. plus 10 hours at 100° C. Of the obtained conjugated polymer F, the weight-average molecular weight Mw was $1.7 \times 10^4$, and PDI was 1.4. The yield of the conjugated polymer F was 38%.

Comparative Example 8

Conjugated Polymer G, $Pd(PPh_3)_4$ 3 mol %

The conjugated polymer G was obtained in the same manner as in Example 13, except that, in place of using $Pd(PPh_3)_4$ 3 mol %+Pd-EnCat® TPP30 3 mol % relative to the compound E1 as the catalysts, $Pd(PPh_3)_4$ 3 mol % alone was used relative to the compound E1, and that the reaction time was 20 hours at 100° C. in place of 1 hour at 90° C. plus 10 hours at 100° C. Of the obtained conjugated polymer G, the weight-average molecular weight Mw was $1.2 \times 10^4$, and PDI was 2.4. The yield of the conjugated polymer G was 29%.

Comparative Example 9

Conjugated Polymer K, $Pd(PPh_3)_4$ 3 mol %

The conjugated polymer K was obtained in the same manner as in Example 17, except that, in place of using $Pd(PPh_3)_4$ 3 mol %+Pd-EnCat® TPP30 3 mol % relative to the compound E1 as the catalysts, $Pd(PPh_3)_4$ 3 mol % alone was used relative to the compound E1, and that the reaction time was 20 hours at 100° C. in place of 1 hour at 90° C. plus 10 hours at 100° C. Of the obtained conjugated polymer K, the weight-average molecular weight Mw was $6.2 \times 10^4$, and PDI was 2.0. The yield of the conjugated polymer K was 24%.

Comparative Example 10

Conjugated Polymer L, $Pd(PPh_3)_4$ 3 mol %

The conjugated polymer L was obtained in the same manner as in Example 18, except that, in place of using $Pd(PPh_3)_4$ 3 mol %+Pd-EnCat® TPP30 3 mol % relative to the compound E1 as the catalysts, $Pd(PPh_3)_4$ 3 mol % alone was used relative to the compound E1, and that the reaction time was 20 hours at 100° C. in place of 1 hour at 90° C. plus 10 hours at 100° C. Of the obtained conjugated polymer L, the weight-average molecular weight Mw was $7.0 \times 10^4$, and PDI was 2.3. The yield of the conjugated polymer L was 21%.

Comparative Example 11

Conjugated Polymer M, $Pd(PPh_3)_4$ 3 mol %

The conjugated polymer M was obtained in the same manner as in Example 18, except that, in place of using $Pd(PPh_3)_4$ 3 mol %+Pd-EnCat® TPP30 3 mol % relative to the compound E7 as the catalysts, $Pd(PPh_3)_4$ 3 mol % alone was used relative to the compound E7, and that the reaction time was 20 hours at 100° C. in place of 1 hour at 90° C. plus 10 hours at 100° C. Of the obtained conjugated polymer M, the weight-average molecular weight Mw was $3.1 \times 10^4$, and PDI was 2.6. The yield of the conjugated polymer M was 32%.

Comparative Example 12

Conjugated Polymer P, $Pd(PPh_3)_4$ 3 mol %

The conjugated polymer P was obtained in the same manner as in Example 22, except that, in place of using $Pd(PPh_3)_4$ 3 mol %+Pd-EnCat® TPP30 3 mol % relative to the compound E5 as the catalysts, $Pd(PPh_3)_4$ 3 mol % alone was used relative to the compound E5, and that the reaction time was 20 hours at 100° C. in place of 1 hour at 90° C. plus 10 hours at 100° C. Of the obtained conjugated polymer P, the weight-average molecular weight Mw was $5.9 \times 10^4$, and PDI was 5.4. The yield of the conjugated polymer P was 45%.

Comparative Example 13

Conjugated Polymer Q, $Pd(PPh_3)_4$ 3 mol %

The conjugated polymer Q was obtained in the same manner as in Example 23, except that, in place of using $Pd(PPh_3)_4$ 3 mol %+Pd-EnCat® TPP30 3 mol % relative to the compound E14 as the catalysts, $Pd(PPh_3)_4$ 3 mol % alone was used relative to the compound E14, and that the reaction time was 20 hours at 100° C. in place of 1 hour at 90° C. plus 10 hours at 100° C. Of the obtained conjugated polymer Q, the weight-average molecular weight Mw was $7.0 \times 10^4$, and PDI was 4.1. The yield of the conjugated polymer Q was 24%.

Comparative Example 14

Conjugated Polymer I, $Pd(PPh_3)_4$ 3 mol %

The conjugated polymer I was obtained in the same manner as in Example 15, except that, in place of using $Pd(PPh_3)_4$ 3 mol %+Pd-EnCat® TPP30 3 mol % relative to the compound E10 as the catalysts, Pd(PPh$_3$)$_4$ 3 mol % alone was used relative to the compound E10, and that the reaction time was 20 hours at 100° C. in place of 1 hour at 90° C. plus 10 hours at 100° C. Of the obtained conjugated polymer I, the weight-average molecular weight Mw was 1.0×10$^5$, and PDI was 2.5. The yield of the conjugated polymer I was 36%.

Comparative Example 15

Conjugated Polymer H, Pd(PPh$_3$)$_4$ 3 mol %

The conjugated polymer H was obtained in the same manner as in Example 14, except that, in place of using Pd(PPh$_3$)$_4$ 3 mol %+Pd-EnCat® TPP30 3 mol % relative to the compound E2 as the catalysts, Pd(PPh$_3$)$_4$ 3 mol % alone was used relative to the compound E2, and that the reaction time was 20 hours at 100° C. in place of 1 hour at 90° C. plus 10 hours at 100° C. Of the obtained conjugated polymer H, the weight-average molecular weight Mw was 2.7×10$^4$, and PDI was 2.6. The yield of the conjugated polymer H was 27%.

Comparative Example 16

Conjugated Polymer R, Pd(PPh$_3$)$_4$ 3 mol %

The conjugated polymer R was obtained in the same manner as in Example 24, except that, in place of using Pd(PPh$_3$)$_4$ 3 mol %+Pd-EnCat® TPP30 3 mol % relative to the compound E8 as the catalysts, Pd(PPh$_3$)$_4$ 3 mol % alone was used relative to the compound E8, and that the reaction time was 20 hours at 100° C. in place of 1 hour at 90° C. plus 10 hours at 100° C. Of the obtained conjugated polymer R, the weight-average molecular weight Mw was 1.1×10$^4$, and PDI was 3.1. The yield of the conjugated polymer R was 35%.

Comparative Example 17

Conjugated Polymer N, Pd(PPh$_3$)$_4$ 3 mol %

The conjugated polymer N was obtained in the same manner as in Example 20, except that, in place of using Pd(PPh$_3$)$_4$ 3 mol %+Pd-EnCat® TPP30 3 mol % relative to the compound E1 as the catalysts, Pd(PPh$_3$)$_4$ 3 mol % alone was used relative to the compound E1, and that the reaction time was 20 hours at 100° C. in place of 1 hour at 90° C. plus 10 hours at 100° C. Of the obtained conjugated polymer N, the weight-average molecular weight Mw was 8.9×10$^4$, and PDI was 4.1. The yield of the conjugated polymer N was 36%.

Comparative Example 18

Conjugated Polymer A, Pd(PPh$_3$)$_4$ 3 mol %

In Comparative Example 1, in place of GPC preparative purification of the conjugated polymer A-containing crude polymer through the silica gel column under the purification condition therein, the conjugate polymer A-containing crude polymer that had been purified through the silica gel column was reprecipitated with a solvent of chloroform/ethyl acetate and the deposited precipitate was taken out through filtration to give the conjugated polymer A. Of the obtained conjugated polymer A, the weight-average molecular weight Mw was 4.3×10$^4$, and PDI was 2.4. The yield of the conjugated polymer A was 38%.

Comparative Example 19

Conjugated Polymer N, Fibrecat 1026 3 mol %

In a 50-mL eggplant flask in nitrogen, the compound E1 (43.9 mmol) obtained in Synthesis Example 1, the compound E2 (23.1 mmol) obtained in Synthesis Example 3, the compound E6 (23.1 mmol) obtained in Synthesis Example 10, a heterogeneous complex catalyst Fibrecat 1026 (by Wako Pure Chemicals, 37 mg, 3 mol % relative to the compound E1), toluene (12 mL) and N,N-dimethylformamide (2.5 mL) were put, and stirred at 90° C. for 1 hour therein, and then at 100° C. for 2 hours. The reaction solution was poured into methanol, and the deposited precipitate was taken out through filtration. The obtained solid was dissolved in chloroform, diamine silica gel (by Fuji Silicia) was added thereto and stirred for 10 minutes at room temperature, and thereafter led to pass through a short column of an acidic silica gel. The obtained solution was concentrated, then reprecipitated with a solvent of chloroform/ethyl acetate, and the deposited precipitated was taken out through filtration to give a conjugated polymer N. Of the obtained conjugated polymer N, the weight-average molecular weight Mw was 3.0×10$^4$, and PDI was 3.2. The yield of the conjugated polymer N was 79%.

The synthesis results of the above conjugated polymers are collectively shown in Tables 1 to 4.

TABLE 1

| | Monomer 1 | Monomer 2 | Monomer 3 | Homogeneous Catalyst | Heterogeneous Catalyst | Reaction Condition | Mw | Yield (%) |
|---|---|---|---|---|---|---|---|---|
| Example 1 (conjugated polymer A) | E1 | E2 | — | Pd(PPh$_3$)$_4$ (3 mol % relative to E2) | Pd-EnCat ® TPP30 (3 mol % relative to E2) | 1 hr, 90° C. → 10 hr, 100° C. | 1.4 × 10$^5$ | 81 |
| Example 2 (conjugated polymer A) | E1 | E2 | — | Pd(PPh$_3$)$_4$ (3 mol % relative to E2) | Pd-EnCat ® TOTPP30 (3 mol % relative to E2) | 1 hr, 90° C. → 10 hr, 100° C. | 1.5 × 10$^5$ | 77 |
| Example 3 (conjugated polymer A) | E1 | E2 | — | Pd(PPh$_3$)$_4$ (3 mol % relative to E2) | Pd-EnCat ® TPP30 (1 mol % relative to E2) | 1 hr, 90° C. → 10 hr, 100° C. | 1.4 × 10$^5$ | 80 |
| Example 4 (conjugated polymer A) | E1 | E2 | — | Pd(P(o-tol)$_3$)$_4$ (3 mol % relative to E2) | Pd-EnCat ® TPP30 (3 mol % relative to E2) | 1 hr, 90° C. → 10 hr, 100° C. | 8.6 × 10$^4$ | 78 |
| Example 5 (conjugated polymer A) | E1 | E2 | — | Pd(PPh$_3$)$_4$ (3 mol % relative to E2) | Pd-EnCat ® 30 (3 mol % relative to E2) | 1 hr, 90° C. → 10 hr, 100° C. | 1.0 × 10$^5$ | 73 |
| Example 6 (conjugated polymer A) | E1 | E2 | — | Pd(PPh$_3$)$_4$ (3 mol % relative to E2) | Pd-En Cat ® 40 (3 mol % relative to E2) | 1 hr, 90° C. → 10 hr, 100° C. | 9.5 × 10$^4$ | 71 |

TABLE 1-continued

| | Monomer 1 | Monomer 2 | Monomer 3 | Homogeneous Catalyst | Heterogeneous Catalyst | Reaction Condition | Mw | Yield (%) |
|---|---|---|---|---|---|---|---|---|
| Example 7 (conjugated polymer A) | E1 | E2 | — | Pd(P(t-Bu)$_3$)$_4$ (3 mol % relative to E2) | Pd-EnCat ® TPP30 (3 mol % relative to E2) | 1 hr, 90° C. → 10 hr, 100° C. | $9.0 \times 10^4$ | 77 |
| Example 8 (conjugated polymer B) | E1 | E3 | — | Pd(PPh$_3$)$_4$ (3 mol % relative to E3) | Pd-EnCat ® TPP30 (3 mol % relative to E3) | 1 hr, 90° C. → 10 hr, 100° C. | $1.9 \times 10^5$ | 82 |
| Example 9 (conjugated polymer C) | E1 | E4 | — | Pd(PPh$_3$)$_4$ (3 mol % relative to E4) | Pd-EnCat ® TPP30 (3 mol % relative to E4) | 1 hr, 90° C. → 10 hr, 100° C. | $1.3 \times 10^5$ | 73 |
| Example 10 (conjugated polymer D) | E1 | E2 | E5 | Pd(PPh$_3$)$_4$ (3 mol % relative to E1) | Pd-EnCat ® TPP30 (3 mol % relative to E1) | 1 hr, 90° C. → 10 hr, 100° C. | $1.6 \times 10^5$ | 71 |
| Example 11 (conjugated polymer E) | E1 | E5 | E6 | Pd(PPh$_3$)$_4$ (3 mol % relative to E1) | Pd-EnCat ® TPP30 (3 mol % relative to E1) | 1 hr, 90° C. → 10 hr, 100° C. | $1.0 \times 10^5$ | 69 |

TABLE 2

| | Monomer 1 | Monomer 2 | Monomer 3 | Homogeneous Catalyst | Heterogeneous Catalyst | Reaction Condition | Mw | Yield (%) |
|---|---|---|---|---|---|---|---|---|
| Example 12 (conjugated polymer F) | E1 | E6 | E7 | Pd(PPh$_3$)$_4$ (3 mol % relative to E1) | Pd-EnCat ® TPP30 (3 mol % relative to E1) | 1 hr, 90° C. → 10 hr, 100° C. | $4.4 \times 10^5$ | 79 |
| Example 13 (conjugated polymer G) | E1 | E2 | E8 | Pd(PPh$_3$)$_4$ (3 mol % relative to E1) | Pd-EnCat ® TPP30 (3 mol % relative to E1) | 1 hr, 90° C. → 10 hr, 100° C. | $5.1 \times 10^4$ | 68 |
| Example 14 (conjugated polymer H) | E1 | E2 | E9 | Pd(PPh$_3$)$_4$ (3 mol % relative to E2) | Pd-EnCat ® TPP30 (3 mol % relative to E2) | 1 hr, 90° C. → 10 hr, 100° C. | $1.0 \times 10^5$ | 73 |
| Example 15 (conjugated polymer I) | E2 | E6 | E10 | Pd(PPh$_3$)$_4$ (3 mol % relative to E10) | Pd-EnCat ® TPP30 (3 mol % relative to E10) | 1 hr, 90° C. → 10 hr, 100° C. | $2.6 \times 10^5$ | 71 |
| Example 16 (conjugated polymer J) | E1 | E2 | E11 | Pd(PPh$_3$)$_4$ (3 mol % relative to E2) | Pd-EnCat ® TPP30 (3 mol % relative to E2) | 1 hr, 90° C. → 10 hr, 100° C. | $1.0 \times 10^5$ | 79 |
| Example 17 (conjugated polymer K) | E1 | E2 | E12 | Pd(PPh$_3$)$_4$ (3 mol % relative to E1) | Pd-EnCat ® TPP30 (3 mol % relative to E1) | 1 hr, 90° C. → 10 hr, 100° C. | $1.8 \times 10^5$ | 77 |
| Example 18 (conjugated polymer L) | E1 | E2 | E13 | Pd(PPh$_3$)$_4$ (3 mol % relative to E1) | Pd-EnCat ® TPP30 (3 mol % relative to E1) | 1 hr, 90° C. → 10 hr, 100° C. | $2.6 \times 10^5$ | 75 |
| Example 19 (conjugated polymer M) | E7 | E14 | — | Pd(PPh$_3$)$_4$ (3 mol % relative to E7) | Pd-EnCat ® TPP30 (3 mol % relative to E7) | 1 hr, 90° C. → 10 hr, 100° C. | $1.5 \times 10^5$ | 70 |
| Example 20 (conjugated polymer N) | E1 | E2 | E6 | Pd(PPh$_3$)$_4$ (3 mol % relative to E1) | Pd-EnCat ® TPP30 (3 mol % relative to E1) | 1 hr, 90° C. → 2 hr, 100° C. | $3.2 \times 10^5$ | 83 |
| Example 21 (conjugated polymer O) | E1 | E15 | — | Pd(PPh$_3$)$_4$ (3 mol % relative to E15) | Pd-EnCat ® TPP30 (3 mol % relative to E15) | 1 hr, 90° C. → 10 hr, 100° C. | $2.1 \times 10^5$ | 81 |
| Example 22 (conjugated polymer P) | E1 | E5 | — | Pd(PPh$_3$)$_4$ (3 mol % relative to E5) | Pd-EnCat ® TPP30 (3 mol % relative to E5) | 1 hr, 90° C. → 10 hr, 100° C. | $3.6 \times 10^5$ | 80 |

TABLE 3

| | Monomer 1 | Monomer 2 | Monomer 3 | Homogeneous Catalyst | Heterogeneous Catalyst | Reaction Condition | Mw | Yield (%) |
|---|---|---|---|---|---|---|---|---|
| Example 23 (conjugated polymer Q) | E2 | E6 | E14 | Pd(PPh$_3$)$_4$ (3 mol % relative to E14) | Pd-EnCat ® TPP30 (3 mol % relative to E14) | 1 hr, 90° C. → 10 hr, 100° C. | $3.2 \times 10^5$ | 67 |
| Example 24 (conjugated polymer R) | E8 | E10 | — | Pd(PPh$_3$)$_4$ (3 mol % relative to E8) | Pd-EnCat ® TPP30 (3 mol % relative to E8) | 1 hr, 90° C. → 10 hr, 100° C. | $4.1 \times 10^5$ | 74 |

TABLE 3-continued

| | Monomer 1 | Monomer 2 | Monomer 3 | Homogeneous Catalyst | Heterogeneous Catalyst | Reaction Condition | Mw | Yield (%) |
|---|---|---|---|---|---|---|---|---|
| Example 25 (conjugated polymer S) | E8 | E99 | — | Pd(PPh$_3$)$_4$ (3 mol % relative to E8) | Pd-EnCat ® TOTPP30 (3 mol % relative to E8) | 1 hr, 90° C. → 8 hr, 100° C. | $2.9 \times 10^5$ | 65 |
| Example 26 (conjugated polymer A) | E1 | E2 | — | Pd(PPh$_3$)$_4$ (1 mol % relative to E2) | Pd-EnCat ® TPP30 (3 mol % relative to E2) | 1 hr, 90° C. → 10 hr, 100° C. | $2.6 \times 10^5$ | 66 |
| Example 27 (conjugated polymer N) | E1 | E2 | E6 | Pd(PPh$_3$)$_4$ (3 mol % relative to E1) | Fibrecat 1026 (3 mol % relative to E1) | 1 hr, 90° C. → 3 hr, 100° C. | $1.8 \times 10^6$ | 74 |
| Comparative Example 1 (conjugated polymer A) | E1 | E2 | — | Pd(PPh$_3$)$_4$ (3 mol % relative to E2) | none | 20 hr, 100° C. | $5.5 \times 10^4$ | 27 |
| Comparative Example 2 (conjugated polymer A) | E1 | E2 | — | Pd(PPh$_3$)$_4$ (5 mol % relative to E2) | none | 20 hr, 100° C. | $4.1 \times 10^4$ | 30 |
| Comparative Example 3 (conjugated polymer A) | E1 | E2 | — | Pd(PPh$_3$)$_4$ (10 mol % relative to E2) | none | 20 hr, 100° C. | $4.1 \times 10^4$ | 31 |
| Comparative Example 4 (conjugated polymer A) | E1 | E2 | — | Pd(P(o-tol)$_3$)$_4$ (3 mol % relative to E2) | none | 20 hr, 100° C. | $4.7 \times 10^4$ | 25 |
| Comparative Example 5 (conjugated polymer A) | E1 | E2 | — | none | Pd-EnCat ® TPP30 (3 mol % relative to E2) | 1 hr, 90° C. → 6 hr, 100° C | $2.2 \times 10^4$ | 85 |
| Comparative Example 6 (conjugated polymer A) | E1 | E2 | — | none | Pd-EnCat ® TOTPP30 (3 mol % relative to E2) | 1 hr, 90° C. → 6 hr, 100° C. | $3.1 \times 10^4$ | 86 |
| Comparative Example 7 (conjugated polymer F) | E1 | E6 | E7 | Pd(PPh$_3$)$_4$ (3 mol % relative to E1) | none | 20 hr, 100° C. | $1.7 \times 10^4$ | 38 |
| Comparative Example 8 (conjugated polymer G) | E1 | E2 | E8 | Pd(PPh$_3$)$_4$ (3 mol % relative to E1) | none | 20 hr, 100° C. | $1.2 \times 10^4$ | 29 |

TABLE 4

| | Monomer 1 | Monomer 2 | Monomer 3 | Homogeneous Catalyst | Heterogeneous Catalyst | Reaction Condition | Mw | Yield (%) |
|---|---|---|---|---|---|---|---|---|
| Comparative Example 9 (conjugated polymer K) | E1 | E2 | E12 | Pd(PPh$_3$)$_4$ (3 mol % relative to E1) | none | 20 hr, 100° C. | $6.2 \times 10^4$ | 24 |
| Comparative Example 10 (conjugated polymer L) | E1 | E2 | E13 | Pd(PPh$_3$)$_4$ (3 mol % relative to E1) | none | 20 hr, 100° C. | $7.0 \times 10^4$ | 21 |
| Comparative Example 11 (conjugated polymer M) | E7 | E14 | — | Pd(PPh$_3$)$_4$ (3 mol % relative to E7) | none | 20 hr, 100° C. | $3.1 \times 10^4$ | 32 |
| Comparative Example 12 (conjugated polymer P) | E1 | E5 | — | Pd(PPh$_3$)$_4$ (3 mol % relative to E5) | none | 20 hr, 100° C. | $5.9 \times 10^4$ | 45 |
| Comparative Example 13 (conjugated polymer Q) | E2 | E6 | E14 | Pd(PPh$_3$)$_4$ (3 mol % relative to E14) | none | 20 hr, 100° C. | $7.0 \times 10^4$ | 24 |
| Comparative Example 14 (conjugated polymer I) | E2 | E6 | E10 | Pd(PPh$_3$)$_4$ (3 mol % relative to E10) | none | 20 hr, 100° C. | $1.0 \times 10^5$ | 36 |
| Comparative Example 15 (conjugated polymer H) | E1 | E2 | E9 | Pd(PPh$_3$)$_4$ (3 mol % relative to E2) | none | 20 hr, 100° C. | $2.7 \times 10^4$ | 27 |
| Comparative Example 16 (conjugated polymer R) | E8 | E10 | — | Pd(PPh$_3$)$_4$ (3 mol % relative to E8) | none | 20 hr, 100° C. | $1.1 \times 10^4$ | 35 |

TABLE 4-continued

| | Monomer 1 | Monomer 2 | Monomer 3 | Homogeneous Catalyst | Heterogeneous Catalyst | Reaction Condition | Mw | Yield (%) |
|---|---|---|---|---|---|---|---|---|
| Comparative Example 17 (conjugated polymer N) | E1 | E2 | E6 | Pd(PPh$_3$)$_4$ (3 mol % relative to E1) | none | 20 hr, 100° C. | $8.9 \times 10^4$ | 36 |
| Comparative Example 18 (conjugated polymer A) | E1 | E2 | — | Pd(PPh$_3$)$_4$ (3 mol % relative to E2) | none | 20 hr, 100° C. | $4.3 \times 10^4$ | 38 |
| Comparative Example 19 (conjugated polymer N) | E1 | E2 | E6 | none | Fibrecat 1026 (3 mol % relative to E1) | 20 hr, 100° C. | $3.0 \times 10^4$ | 79 |

Element Example 1

Production of Active Layer Coating Liquid

The conjugated polymer A obtained in Example 1 as a p-type semiconductor compound, and a mixture of fullerene compounds PC$_{61}$BM (phenyl C61-butyric acid methyl ester) and PC$_{71}$BM (phenyl C71-butyric acid methyl ester) as n-type semiconductor compounds (Frontier Carbon's nanom spectra E123) were mixed in a ratio of 1/2 by weight, and the resulting mixture was dissolved in a mixed solvent of o-xylene and tetralin (9/1 by volume) in a nitrogen atmosphere to have a concentration of 1.8% by weight. The solution was stirred and mixed on a hot stirrer at a temperature of 80° C. for 1 hour. After stirred and mixed, the solution was filtered through a 1-µm polytetrafluoroethylene (PTFE) filter to give an active layer coating liquid.
<Production of Photoelectric Conversion Element>

A glass substrate (by Geomatec) with an indium tin oxide (ITO) transparent electroconductive film patterned thereon was ultrasonically washed with acetone, then ultrasonically washed with isopropanol, dried with a nitrogen blow and subjected to UV-ozone treatment.

Next, a solution (about 0.1 mL) that had been prepared by dissolving zinc(II) acetate dehydrate (by Wako Pure Chemicals) in a mixed solvent of 2-methoxyethanol (by Aldrich) and ethanolamine (by Aldrich) (100/3 by volume) to have a concentration of 105 mg/mL therein was applied to the substrate by spin coating at a speed of 3000 rpm, then subjected to UV-ozone treatment, and heated in an oven at 200° C. for 15 minutes to form an electron extraction layer.

The substrate with the electron extraction layer formed thereon was put into a globe box, heated in a nitrogen atmosphere at 150° C. for 3 minutes therein, then cooled, and thereafter coated with the active layer coating liquid Ink (0.12 mL) prepared in the manner as above, in a mode of spin coating at a speed of 500 rpm, thereby forming an active layer.

Further, on the active layer, a molybdenum trioxide (MoO$_3$) film having a thickness of 1.5 nm as a hole extraction layer, and then a silver film having a thickness of 100 nm as an electrode layer were formed in order according to a resistance heating vacuum evaporation method, thereby producing a photoelectric conversion element having a size of 5 mm square.

Thus produced, the photoelectric conversion element was evaluated by measuring the current-voltage characteristic thereof in the manner as above. The result is shown in Table 5.

Element Comparative Example 1

A photoelectric conversion element was produced in the same manner as in Element Example 1 except that the conjugated polymer A obtained in Comparative Example 2 was used as the p-type semiconductor compound in place of the conjugated polymer A obtained in Example 1, and the element was evaluated by measuring the current-voltage characteristic thereof. The result is shown in Table 5.

Element Example 2

A photoelectric conversion element was produced in the same manner as in Element Example 1 except that the conjugated polymer H obtained in Example 14 was used as the p-type semiconductor compound in place of the conjugated polymer A obtained in Example 1, and the element was evaluated by measuring the current-voltage characteristic thereof. The result is shown in Table 5.

Element Comparative Example 2

A photoelectric conversion element was produced in the same manner as in Element Example 1 except that the conjugated polymer H obtained in Comparative Example 15 was used as the p-type semiconductor compound in place of the conjugated polymer A obtained in Example 1, and the element was evaluated by measuring the current-voltage characteristic thereof. The result is shown in Table 5.

Element Example 3

A photoelectric conversion element was produced in the same manner as in Element Example 1 except that the conjugated polymer F obtained in Example 12 was used as the p-type semiconductor compound in place of the conjugated polymer A obtained in Example 1, and the element was evaluated by measuring the current-voltage characteristic thereof. The result is shown in Table 5.

Element Comparative Example 3

A photoelectric conversion element was produced in the same manner as in Element Example 1 except that the conjugated polymer F obtained in Comparative Example 7 was used as the p-type semiconductor compound in place of the conjugated polymer A obtained in Example 1, and the element was evaluated by measuring the current-voltage characteristic thereof. The result is shown in Table 5.

Element Example 4

A photoelectric conversion element was produced in the same manner as in Element Example 1 except that the conjugated polymer K obtained in Example 17 was used as the p-type semiconductor compound in place of the conjugated polymer A obtained in Example 1, and the element was evaluated by measuring the current-voltage characteristic thereof. The result is shown in Table 5.

Element Comparative Example 4

A photoelectric conversion element was produced in the same manner as in Element Example 1 except that the conjugated polymer K obtained in Comparative Example 16 was used as the p-type semiconductor compound in place of the conjugated polymer A obtained in Example 1, and the element was evaluated by measuring the current-voltage characteristic thereof. The result is shown in Table 5.

Element Example 5

A photoelectric conversion element was produced in the same manner as in Element Example 1 except that the conjugated polymer L obtained in Example 18 was used as the p-type semiconductor compound in place of the conjugated polymer A obtained in Example 1, and the element was evaluated by measuring the current-voltage characteristic thereof. The result is shown in Table 5.

Element Comparative Example 5

A photoelectric conversion element was produced in the same manner as in Element Example 1 except that the conjugated polymer L obtained in Comparative Example 17 was used as the p-type semiconductor compound in place of the conjugated polymer A obtained in Example 1, and the element was evaluated by measuring the current-voltage characteristic thereof. The result is shown in Table 5.

Element Example 6

A photoelectric conversion element was produced in the same manner as in Element Example 1 except that the conjugated polymer I obtained in Example 15 was used as the p-type semiconductor compound in place of the conjugated polymer A obtained in Example 1, and the element was evaluated by measuring the current-voltage characteristic thereof. The result is shown in Table 5.

Element Comparative Example 6

A photoelectric conversion element was produced in the same manner as in Element Example 1 except that the conjugated polymer I obtained in Comparative Example 14 was used as the p-type semiconductor compound in place of the conjugated polymer A obtained in Example 1, and the element was evaluated by measuring the current-voltage characteristic thereof. The result is shown in Table 5.

Element Example 7

A photoelectric conversion element was produced in the same manner as in Element Example 1 except that the conjugated polymer M obtained in Example 19 was used as the p-type semiconductor compound in place of the conjugated polymer A obtained in Example 1, and the element was evaluated by measuring the current-voltage characteristic thereof. The result is shown in Table 5.

Element Comparative Example 7

A photoelectric conversion element was produced in the same manner as in Element Example 1 except that the conjugated polymer M obtained in Comparative Example 11 was used as the p-type semiconductor compound in place of the conjugated polymer A obtained in Example 1, and the element was evaluated by measuring the current-voltage characteristic thereof. The result is shown in Table 5.

Element Example 8

A photoelectric conversion element was produced in the same manner as in Element Example 1 except that the conjugated polymer P obtained in Example 22 was used as the p-type semiconductor compound in place of the conjugated polymer A obtained in Example 1, and the element was evaluated by measuring the current-voltage characteristic thereof. The result is shown in Table 5.

Element Comparative Example 8

A photoelectric conversion element was produced in the same manner as in Element Example 1 except that the conjugated polymer P obtained in Comparative Example 12 was used as the p-type semiconductor compound in place of the conjugated polymer A obtained in Example 1, and the element was evaluated by measuring the current-voltage characteristic thereof. The result is shown in Table 5.

Element Example 9

A photoelectric conversion element was produced in the same manner as in Element Example 1 except that the conjugated polymer Q obtained in Example 23 was used as the p-type semiconductor compound in place of the conjugated polymer A obtained in Example 1, and the element was evaluated by measuring the current-voltage characteristic thereof. The result is shown in Table 5.

Element Comparative Example 9

A photoelectric conversion element was produced in the same manner as in Element Example 1 except that the conjugated polymer Q obtained in Comparative Example 18 was used as the p-type semiconductor compound in place of the conjugated polymer A obtained in Example 1, and the element was evaluated by measuring the current-voltage characteristic thereof. The result is shown in Table 5.

TABLE 5

|  | Polymer | Voc [V] | Jsc [mA/cm$^2$] | FF | PCE [%] |
| --- | --- | --- | --- | --- | --- |
| Element Example 1 | conjugated polymer A (Example 1) | 0.82 | 11.48 | 0.63 | 5.86 |
| Element Comparative Example 1 | conjugated polymer A (Comparative Example 2) | 0.83 | 6.3 | 0.51 | 2.67 |
| Element Example 2 | conjugated polymer H (Example 14) | 0.71 | 13.04 | 0.55 | 5.16 |
| Element Comparative Example 2 | conjugated polymer H (Comparative Example 15) | 0.7 | 10.02 | 0.52 | 3.63 |

TABLE 5-continued

|  | Polymer | Voc [V] | Jsc [mA/cm$^2$] | FF | PCE [%] |
|---|---|---|---|---|---|
| Element Example 3 | conjugated polymer F (Example 12) | 0.89 | 11.25 | 0.69 | 6.84 |
| Element Comparative Example 3 | conjugated polymer F (Comparative Example 7) | 0.87 | 7.65 | 0.7 | 4.71 |
| Element Example 4 | conjugated polymer K (Example 17) | 0.81 | 12.77 | 0.73 | 7.53 |
| Element Comparative Example 4 | conjugated polymer K (Comparative Example 16) | 0.83 | 10.21 | 0.67 | 5.67 |
| Element Example 5 | conjugated polymer L (Example 18) | 0.85 | 13.27 | 0.72 | 8.04 |
| Element Comparative Example 5 | conjugated polymer L (Comparative Example 17) | 0.84 | 8.14 | 0.74 | 5.08 |
| Element Example 6 | conjugated polymer I (Example 15) | 0.76 | 3.51 | 0.57 | 1.52 |
| Element Comparative Example 6 | conjugated polymer I (Comparative Example 14) | 0.75 | 2.09 | 0.6 | 0.94 |
| Element Example 7 | conjugated polymer M (Example 19) | 0.84 | 6.01 | 0.52 | 2.61 |
| Element Comparative Example 7 | conjugated polymer M (Comparative Example 11) | 0.8 | 5.35 | 0.46 | 1.98 |
| Element Example 8 | conjugated polymer P (Example 22) | 0.73 | 9.89 | 0.52 | 3.78 |
| Element Comparative Example 8 | conjugated polymer P (Comparative Example 12) | 0.62 | 4.21 | 0.43 | 1.12 |
| Element Example 9 | conjugated polymer Q (Example 23) | 0.6 | 4.16 | 0.63 | 1.58 |
| Element Comparative Example 9 | conjugated polymer Q (Comparative Example 18) | 0.57 | 2.86 | 0.62 | 1.01 |

CONCLUSION

Regarding the conjugated polymer A, the weight-average molecular weight Mw of the obtained conjugated polymer was not more than $5.5 \times 10^4$ when produced through the reaction with the homogeneous transition metal complex catalyst alone, as shown in Comparative Examples 1 to 6 and 18.

Concretely, when one type of tetrakis(triphenylphosphine)palladium alone was used as the transition metal complex catalyst (Comparative Examples 1 to 3), the weight-average molecular weight Mw of the obtained conjugated polymer was merely within from $4.1 \times 10^4$ to $5.5 \times 10^4$, and the yield of the obtained conjugated polymer was merely with from 27 to 38%. From Comparative Examples 1 to 3, it is known that even though the amount of the homogeneous transition metal complex catalyst was increased, the weight-average molecular weight of the conjugated polymer did not increase but rather decreased.

In the case where one type alone of tetrakis(tritolylphosphine)palladium which is the homogeneous transition metal complex catalyst was used as the transition metal complex catalyst (Comparative Example 4), the weight-average molecular weight Mw of the obtained conjugated polymer was merely $4.7 \times 10^4$, and the yield of the obtained conjugated polymer was merely 25%. This result is on the same level as in Comparative Example 1, from which it is known that the reaction system with only the homogeneous transition metal complex catalyst provides no difference in point of the weight-average molecular weight and the yield of the obtained conjugated polymer despite of the difference in the ligand in the palladium catalyst used.

In the reaction system using the homogeneous transition metal complex catalyst alone, the weight-average molecular weight of the obtained conjugated polymer was lower than in Examples and the yield thereof was also lower. This is considered because the trimethylstannyl group would be more readily removed from the compound E2 than the cross-coupling reaction between the compound E2 and the compound E1 in the reaction system.

Further, in case where one type alone of a palladium complex catalyst supported by a porous polymer carrier which is the homogeneous transition metal complex catalyst was used as the transition metal complex catalyst, the yield of the obtained conjugated polymer was from 85 to 86% and was high, but the weight-average molecular weight Mw of the obtained conjugated polymer was within from $2.2 \times 10^4$ to $3.1 \times 10^4$. In addition, it is known that the reaction finished in 2 hours or so after the start of the reaction.

In the reaction system using the heterogeneous transition metal complex catalyst alone, the yield of the obtained conjugated polymer was from 85 to 86% and was high, but the weight-average molecular weight of the obtained conjugated polymer was lower than in Examples. This is considered because the compound E2 and the compound E1 could react with each other rapidly through cross-coupling reaction near the heterogeneous transition metal complex catalyst in the reaction system, but when the formed polymer grow to a certain level ($2.0 \times 10^4$ or so), then it could not be kept in contact with the active center of the heterogeneous transition metal complex catalyst existing in the porous polymer carrier and therefore there polymer synthesis could no more grow further.

On the other hand, as shown in Examples 1 to 7, when the homogeneous transition metal complex catalyst and the heterogeneous transition metal complex catalyst were used together, the reaction time was shorter and the conjugated polymer having a larger weight average molecular weight Mw was obtained, as compared with Comparative Examples 1 to 6 and 18. In other words, it is known that according to the production method of the present application, the coupling reaction speed significantly increases.

In addition, the yield of the obtained conjugated polymer was from 71 to 80%, and as compared with the case of using the homogeneous transition metal complex catalyst alone was used (Comparative Examples 1 to 4, 18), it is known that the yield significantly increased. In other words, it is known that the production method of the present application secures high reproducibility.

For example, in the case where tetrakis(triphenylphosphine)palladium as the homogeneous transition metal complex catalyst and a palladium complex catalyst supported by a porous polymer as the heterogeneous transition metal complex catalyst were used together (Examples 1 to 3), the weight-average molecular weight Mw of the obtained conjugated polymer was from $1.4 \times 10^5$ to $1.5 \times 10^5$ and was extremely high, and the yield of the obtained conjugated polymer was from 77 to 81% and was also extremely high.

Also in the case where tetrakis(tri(o-tolyl)phosphine)palladium or tetrakis(tributylphosphine)palladium as the homogeneous transition metal complex catalyst and a palladium complex catalyst supported by a porous polymer as the heterogeneous transition metal complex catalyst were used together (Examples 4, 7), the weight-average molecular weight Mw of the obtained conjugated polymer was from $8.6 \times 10^4$ to $9.0 \times 10^4$ and was extremely high, and the yield of the obtained conjugated polymer was from 77 to 78% and was also extremely high.

It is known that, according to the production method of the present application, the weight-average molecular weight (Mw) of the obtained conjugated polymer is extremely high and the yield of the obtained conjugated polymer is also high, not depending on the ligand for palladium in the homogeneous transition metal complex catalyst.

Further, even in the case of using together the palladium catalyst supported by a porous polymer support (Pd-EnCat® 30, Pd-EnCat® 40), which is a heterogeneous transition metal catalyst not previously having a phosphine ligand, and tetrakis(triphenylphosphine)palladium as the homogeneous transition metal complex catalyst (Examples 5, 6), the weight-average molecular weight Mw of the obtained conjugated polymer was from $9.5 \times 10^4$ to $1.0 \times 10^5$ and was extremely high and the yield of the obtained conjugated polymer was from 71 to 73% and was also high. This is considered because the phosphine ligand existing in the reaction system would be coordinated with the palladium catalyst supported by the porous polymer support in the reaction system to give a heterogeneous transition metal complex catalyst therein.

In Comparative Examples 1 to 3, the reaction was continued for 20 hours. However, when the molecular weight of the conjugated polymer A was measured through gel permeation chromatography (GPC) in 10 hours after the start of the reaction, the weight-average molecular weight Mw was from $2.0 \times 10^4$ to $4.0 \times 10^4$, and it is known that the speed of increasing the molecular weight was low. In the state where the coupling reaction is not as yet finished, when the coupling reaction is slow, then the reaction mechanism of releasing the active group from the monomer would be predominant, and in that condition even though the reaction is kept continued for a long period of time, it would be difficult to further increase the molecular weight of the polymer. On the other hand, in Examples 1 to 3, it is known that the reaction taken for 11 hours gave the conjugated polymer A having a higher molecular weight than in Comparative Examples 1 to 6 and 18. To that effect, it is known that, in Examples 1 to 3, the conjugated polymer having a higher weight-average molecular weight Mw than in Comparative Examples 1 to 3 was obtained within a short period of time and at a yield.

It is obvious that the above results are not from only the coupling reaction of the compound E1 and the compound E2, when the data in Examples 7 to 27 are compared with the data in Comparative Examples 7 to 19.

In addition, it is known that, also in the case of using tetrakis(triphenylphosphine)palladium as the homogeneous transition metal complex catalyst and a solidified catalyst supported on a fibrously graft-polymerized polyethylene resin (Fibrecat 1026) as the heterogeneous transition metal complex catalyst (Example 27), the weight-average molecular weight Mw of the obtained conjugated polymer is $1.8 \times 10^5$ and is extremely high and the yield of the obtained conjugated polymer is 74% and is high, as compared with Comparative Example 19.

Further, it is known that the photoelectric conversion element using the conjugated polymer obtained in the above Examples provides an increased photoelectric conversion efficiency irrespective of the type of the conjugated polymer used therein, as compared with the photoelectric conversion element using the conjugated polymer obtained in Comparative Examples. In other words, it is known that the photoelectric conversion element using the conjugated polymer having a large weight-average molecular weight provides an increased photoelectric conversion efficiency as compared with the photoelectric conversion element using the conjugated polymer having a small weight-average molecular weight.

While the present invention has been described in detail and with reference to specific embodiments thereof, it will be apparent to one skilled in the art that various changes and modifications can be made therein without departing from the spirit and scope thereof. The present application is based on a Japanese patent application filed on Nov. 2, 2011 (Patent Application 2011-241499) and a Japanese patent application filed on Nov. 29, 2011 (Patent Application 2011-260973), the entire contents of which are herein incorporated by reference.

INDUSTRIAL APPLICABILITY

According to coupling reaction of monomers by the use of both homogeneous and heterogeneous transition metal complex catalysts, a conjugated polymer having a larger molecular weight can be obtained. Using the conjugated polymer, a photoelectric conversion element excellent in photoelectric conversion efficiency can be obtained. Accordingly, the invention is favorable for solar cells and modules thereof, and can be utilized for energy sources having a low environment load.

REFERENCE SIGNS LIST

1 Weather-Resistant Protective Film
2 UV-Cut Film
3, 9 Gas-Barrier Film
4, 8 Getter Material Film
5, 7 Sealant Material
6 Solar Cell Element
10 Back Sheet
12 Substrate
13 Solar Cell Module
14 Thin-Film Solar Cell
101 Anode
102 Hole Extraction Layer
103 Active Layer (mixed layer of p-type semiconductor compound and n-type semiconductor compound)
104 Electron Extraction Layer
105 Cathode
106 Substrate
107 Photoelectric Conversion Element

The invention claimed is:
1. A method for producing a conjugated polymer, the method comprising:
polymerizing a monomer via a coupling reaction, wherein the coupling reaction is carried out in the coexistence of a combination of a homogeneous transition metal complex catalyst and a heterogeneous transition metal complex catalyst, wherein the monomer is an aromatic compound having formula (A4) or formula (A4'):

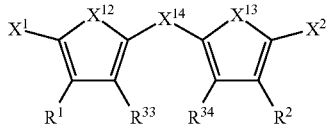
(A4)

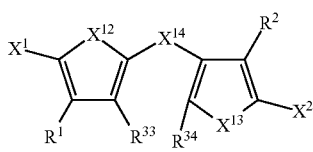
(A4')

wherein:

$R^1$ and $R^2$ are each independently a hydrogen atom, a halogen atom, an alkyl group optionally having a substituent, an alkenyl group optionally having a substituent, an alkynyl group optionally having a substituent, or an aromatic group optionally having a substituent, or $R^1$ and $R^{33}$, or $R^2$ and $R^{34}$ may bond to each other to from a ring;

$R^{33}$ and $R^{34}$ are each independently a hydrogen atom, a halogen atom, or an organic group having an atom selected from Group 14 elements of the Periodic Table, or may bond to each other to form a ring;

$X^1$ and $X^2$ are each independently an active group;

$X^{12}$ and $X^{13}$ are each independently an atom selected from Group 16 elements;

$X^{14}$ a is a group that links the two conjugated systems of five-membered rings bonding thereto or a direct bond.

2. The method of claim 1, wherein the heterogeneous transition metal complex catalyst comprises a transition metal complex supported by a carrier.

3. The method of claim 1, wherein each transition metal that constitutes the homogeneous transition metal complex catalyst and the heterogeneous transition metal complex catalyst is a late transition metal.

4. The method of claim 1, wherein, in formula (A4) and (A4'), $X^1$ and $X^2$ are each independently active groups having an atom selected from Li, Mg, Zn, B, and Group 14 elements of the Periodic Table, wherein when 5 ml of a hexane solution containing 1.0 g of the aromatic compound is charged in a column having an inner diameter of 15 mm and a length of 5 cm with 50 mL of a hexane solution containing 20 g of spherical, neutral silica gel having a particle size of from 63 to 210 μm, and 2 g of anhydrous potassium carbonate, and developed with a developing solvent of hexane at a flow rate of 50 ml/min, the total proportion of aromatic compounds in which the number of the active groups is smaller than the aromatic compound, in the solution having passed through the column in 3 minutes at room temperature is 5 mol % or more relative to the aromatic compound before charged in the column.

5. The method of claim 1, wherein the compound represented by formula (A4) or formula (A4') is a compound having formulae (A6) or (A6'):

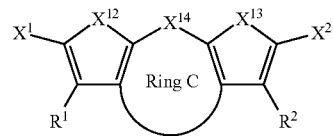
(A6)

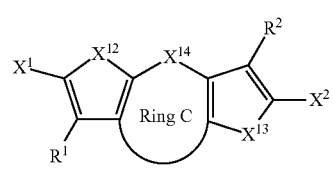
(A6')

wherein, in formulae (A6) and (A6'):
$R^1, R^2, X^1, X^2, X^{12}, X^{13}$ and $X^{14}$ have the same meanings as in the formula (A4); and
the Ring C is a ring optionally having a substituent.

6. The method of claim 5, wherein the Ring C is a 5-membered single ring, a 6-membered single ring, or a condensed ring of from 2 to 6 such rings.

7. The method of claim 1, wherein the monomer further comprises an aromatic compound selected from the group consisting of compounds having formulae (A11), (A12), (A13), and (A17):

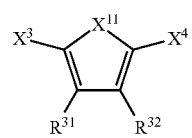
(A11)

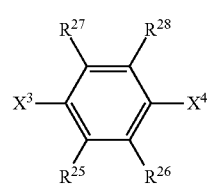
(A12)

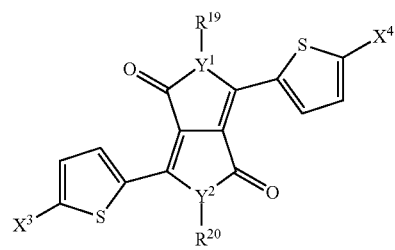
(A13)

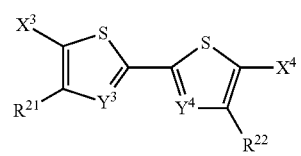
(A17)

wherein, in formulae (A11), (A12), (A13), and (A17):
$X^3$ and $X^4$ are each a halogen atom, an alkylsulfonyloxy group, or an arylsulfonyloxy group,
wherein in formula (A11):
$R^{31}$ and $R^{32}$ are each a hydrogen atom, a hydrocarbon group having from 1 to 20 carbon atoms and optionally having a substituent, an aromatic heterocyclic group having from 2 to 20 carbon atoms and optionally having a substituent, an acyl group optionally having a substituent, an alkoxy group optionally having a substituent, or an aryloxy group optionally having a substituent, wherein in formula (A12):

$R^{25}$ and $R^{26}$ are each a hydrogen atom, a halogen atom, a hydrocarbon group having from 1 to 20 carbon atoms and optionally having a substituent, an aromatic heterocyclic group having from 2 to 20 carbon atoms and optionally having a substituent, or an acyl group optionally having a substituent; and $R^{27}$ and $R^{28}$ are each a hydrogen atom, a halogen atom, a hydrocarbon group having from 1 to 20 carbon atoms and optionally having a substituent, or an aromatic heterocyclic group having from 2 to 20 carbon atoms and optionally having a substituent, wherein in formula (A13);

$Y^1$ and $Y^2$ are each independently an atom selected from Group 15 elements of the Periodic Table; and $R^{19}$ and $R^{20}$ are each a hydrogen atom, a halogen atom, or a hydrocarbon group having from 1 to 20 carbon atoms and optionally having a substituent, wherein in formula (A17):

$Y^3$ and $Y^4$ are each independently a nitrogen atom, or a carbon atom having one substituent ($C(R^{43})$), where $R^{43}$ is a hydrogen atom, a halogen atom, a hydrocarbon group having from 1 to 20 carbon atoms and optionally having a substituent, or an aromatic heterocyclic group having from 2 to 20 carbon atoms and optionally having a substituent; and $R^{21}$ and $R^{22}$ are each a hydrogen atom, a halogen atom, a hydrocarbon group having from 1 to 20 carbon atoms and optionally having a substituent, or an aromatic heterocyclic group having from 2 to 20 carbon atoms and optionally having a substituent.

* * * * *